United States Patent
Kim et al.

(10) Patent No.: US 9,287,300 B2
(45) Date of Patent: Mar. 15, 2016

(54) METHODS FOR FABRICATING SEMICONDUCTOR DEVICES

(71) Applicant: Samsung Electronics Co., Ltd., Suwon-Si, Gyeonggi-Do (KR)

(72) Inventors: Eunjung Kim, Daegu (KR); Yong Kwan Kim, Yongin-si (KR); Jemin Park, Suwon-si (KR); Semyeong Jang, Anyang-si (KR); Sangyeon Han, Suwon-si (KR); Yoosang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/569,980

(22) Filed: Dec. 15, 2014

(65) Prior Publication Data

US 2015/0340284 A1 Nov. 26, 2015

(30) Foreign Application Priority Data

May 23, 2014 (KR) .................. 10-2014-0062484

(51) Int. Cl.
*H01L 21/311* (2006.01)
*H01L 29/06* (2006.01)
*H01L 27/12* (2006.01)
*H01L 21/768* (2006.01)

(52) U.S. Cl.
CPC ........ *H01L 27/1288* (2013.01); *H01L 21/7688* (2013.01)

(58) Field of Classification Search
CPC ................. H01L 27/1288; H01L 21/7688
USPC ............... 438/700, 424, 387; 257/622, 397
See application file for complete search history.

(56) References Cited

U.S. PATENT DOCUMENTS

| 7,064,051 | B2 | 6/2006 | Lee et al. | |
|---|---|---|---|---|
| 7,759,197 | B2 | 7/2010 | Tran | |
| 7,892,977 | B2 | 2/2011 | Jung | |
| 7,939,408 | B2 | 5/2011 | Choi et al. | |
| 8,435,876 | B2 | 5/2013 | Park et al. | |
| 8,614,148 | B2 | 12/2013 | Park et al. | |
| 8,865,547 | B2 * | 10/2014 | Kang | H01L 27/10876 438/259 |
| 8,916,447 | B2 * | 12/2014 | Park | H01L 27/0207 438/381 |
| 2005/0070080 | A1 | 3/2005 | Lee et al. | |
| 2007/0049011 | A1 | 3/2007 | Tran | |
| 2009/0140398 | A1 | 6/2009 | Jung | |
| 2011/0086483 | A1 | 4/2011 | Choi et al. | |
| 2012/0040528 | A1 | 2/2012 | Kim et al. | |

(Continued)

FOREIGN PATENT DOCUMENTS

| JP | H11-186517 A | 7/1999 |
|---|---|---|
| KR | 10-2006-0066504 A | 6/2006 |
| KR | 10-2008-0044448 A | 5/2008 |
| KR | 10-2008-0088951 A | 10/2008 |
| KR | 10-2009-0055818 A | 6/2009 |

(Continued)

*Primary Examiner* — Calvin Lee
(74) *Attorney, Agent, or Firm* — Harness, Dickey & Pierce

(57) ABSTRACT

The present inventive concepts provide methods for fabricating semiconductor devices. The method may comprise providing a substrate, stacking a conductive layer and a lower mask layer on the substrate, forming a plurality of hardmask layers each having an island shape on the lower mask layer, forming a plurality of upper mask patterns having island shapes arranged to expose portions of the lower mask layer, etching the exposed portions of the lower mask layer to expose portions of the conductive layer, and etching the exposed portions of the conductive layer to form a plurality of contact holes each exposing a portion of the substrate.

18 Claims, 149 Drawing Sheets

(56) References Cited

U.S. PATENT DOCUMENTS

| | | |
|---|---|---|
| 2012/0142179 A1 | 6/2012 | Park et al. |
| 2013/0196477 A1 | 8/2013 | Kang |
| 2013/0260559 A1 | 10/2013 | Park et al. |
| 2013/0260562 A1 | 10/2013 | Park et al. |

FOREIGN PATENT DOCUMENTS

| | | |
|---|---|---|
| KR | 10-2009-0067373 A | 6/2009 |
| KR | 10-2009-0077195 A | 7/2009 |
| KR | 10-2010-0088292 A | 8/2010 |
| KR | 10-2010-0134415 A | 12/2010 |

* cited by examiner

METHODS FOR FABRICATING SEMICONDUCTOR DEVICES

CROSS-REFERENCE TO RELATED APPLICATION

This U.S. nonprovisional patent application claims priority under 35 U.S.C. §119 of Korean Patent Application 10-2014-0062484 filed on May 23, 2014, the entire contents of which are hereby incorporated by reference.

1. TECHNICAL FIELD

The present inventive concepts relates to semiconductor and, more particularly, to methods for fabricating semiconductor devices.

2. DISCUSSION OF RELATED ART

The fine patterns are essential to form highly integrated semiconductor devices. It is desired to form devices as small as possible and to reduce widths of patterns and pitch of patterns to integrate many devices on a small area.

SUMMARY

Embodiments of the present inventive concepts provide methods for fabricating semiconductor devices capable of forming highly integrated fine patterns.

According to an example embodiment of the present inventive concepts, a method for fabricating a semiconductor device may comprise: providing a substrate including an active region formed therein forming a conductive layer on the substrate, forming a lower mask layer covering the conductive layer, forming a plurality of hardmask layers on the lower mask layer, the hardmask layers having island shapes spaced apart from each other in a first direction and in a second direction crossing the first direction; forming a plurality of upper mask patterns having island shapes spaced apart from each other in the first and second directions on the lower mask layer to expose portions of the lower mask layer, the exposed potions of the lower mask layer each having an island shape surrounded by the upper mask pattern and the hardmask layer, etching the exposed portions of the lower mask layer to expose portions of the conductive layer, the exposed portions of the conductive layer each having an island shape; and etching the exposed portions of the conductive layer to form a plurality of contact holes that expose portions of the active region, the exposed portions of the active region each having an island shape.

In some embodiments, the method may further comprise filling the contact hole with a conductive material to form a contact that is in contact with the conductive layer and is electrically connected to the active region.

In some embodiments, the forming a plurality of the hardmask layers may comprise depositing a material different from that of the upper mask patterns.

In some embodiments, the forming a plurality of the upper mask patterns may comprise depositing a material substantially identical to that of the lower mask layer.

In some embodiments, the method may further comprise depositing a material having an etch selectivity with respect to the upper mask patterns on the lower mask layer to form an etch stop layer.

In some embodiments, the etching exposed portions of the conductive layer may comprise patterning the lower mask layer by an etching process using the hardmask layers as an etch mask to form a plurality of lower mask patterns having island shapes spaced apart from each other in the first and second directions.

In some embodiments, before the etching exposed portions of the conductive layer, the method may further comprise shrinking the lower mask patterns by a wet etching process.

In some embodiments, before the etching exposed portions of the conductive layer, the method may further comprise: forming a spacer layer covering the lower mask patterns; and etching the spacer layer to form spacers on sidewalls of the lower mask patterns.

According to an example embodiment of the present inventive concepts, a method for fabricating a semiconductor device may comprise, providing a substrate, stacking a conductive layer and a lower mask layer on the substrate; forming a plurality of hardmask layers each having an island shape on the lower mask layer, forming a plurality of upper mask patterns on the lower mask layer, the plurality of upper mask patterns having island shapes arranged to expose portions of the lower mask layer; etching the exposed portions of the lower mask layer to expose portions of the conductive layer, and etching the exposed portions of the conductive layer to form a plurality of contact holes each exposing a portion of the substrate.

In some embodiments, the providing may comprise forming a plurality of active regions having a herringbone shape arranged in a zigzag fashion along a first direction on the substrate.

In some embodiments, the forming a plurality of active regions may comprise: forming a first mask layer on the substrate; forming a plurality of second mask patterns on the first mask layer, the plurality of second mask patterns being spaced apart from each other along a second direction crossing the first direction and extending in a zigzag fashion along the first direction; patterning the first mask layer by an etching process using the second mask patterns as an etch mask to form a plurality of first mask patterns that are spaced apart from each other along the second direction and extend in a zigzag fashion along the first direction; and patterning the substrate by an etching process using the first mask patterns as an etch mask to form the active regions having the herringbone shape arranged in a zigzag fashion along the first direction and spaced apart from each other along the second direction. The active regions may have island shapes discontinuously extending along the first direction. The island shaped active regions may be arranged in a zigzag fashion along the first direction to constitute the herringbone shape.

In some embodiments, the providing may comprise: forming a plurality of active regions having parallel line shapes extending in a zigzag fashion along a direction across the substrate.

In some embodiments, the forming a plurality of active regions may comprise forming a first mask layer on the substrate; forming a plurality of second mask patterns on the first mask layer, the second mask layers extending along the direction, patterning the first mask layer by an etching process using the second mask patterns as an etch mask to form a plurality of first mask patterns extending along the direction, and patterning the substrate by an etching process using the first mask patterns as an etch mask to form the line shaped active regions extending along the direction.

In some embodiments, the etching exposed portions of the conductive layer may comprise: patterning the lower mask layer by an etching process using the hardmask layers as an etch mask to form a plurality of lower mask patterns each having an island shape; and patterning the conductive layer by an etching process using the lower mask patterns as an etch mask to form the contact holes each exposing the portion of the substrate.

In some embodiments, the method may further comprise: removing the lower mask patterns to expose the conductive layer depositing a conductive material to fill the contact holes, and planarizing the conductive material until the conductive layer is exposed so as to form contacts that fill the contact holes and are electrically connected to the active region.

In an embodiment, a method for fabricating a semiconductor device comprises forming a plurality of active regions having parallel line shapes extending in a zigzag fashion along a direction across a substrate, stacking a conductive layer and a lower mask layer on the substrate, forming a plurality of hardmask layers each having an island shape on the lower mask layer, forming a plurality of upper mask patterns on the lower mask layer, the plurality of upper mask patterns having island shapes arranged to expose portions of the lower mask layer, patterning the lower mask layer by an etching process using the hardmask layers as an etch mask to form a plurality of lower mask patterns each having an island shape, and patterning the conductive layer by an etching process using the lower mask patterns as an etch mask to form contact holes each exposing the portion of the substrate.

BRIEF DESCRIPTION OF THE DRAWINGS

The foregoing and other features and advantages of example embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIGS. 1A to 13A are plan views illustrating a method for fabricating a semiconductor device according to an example embodiment of the present inventive concepts;

FIGS. 1B to 13B are cross-sectional views taken along the lines A1-A2 of FIGS. 1A to 13A;

FIGS. 1C to 13C are cross-sectional views taken along the lines B1-B2 of FIGS. 1A to 13A;

FIGS. 16A to 28A are plan views illustrating a method for forming an active region according to an example embodiment of the present inventive concepts;

FIGS. 16B to 28B are cross-sectional views taken along the lines D1-D2 in cell regions of FIGS. 16A to 28A;

FIGS. 16C to 28C are cross-sectional views taken along the lines E1-E2 in cell regions of FIGS. 16A to 28A;

FIGS. 16D to 28D are cross-sectional view of peripheral regions of FIGS. 16A to 28A;

FIGS. 30A to 42A are plan views illustrating a method for forming an active region according to another example embodiment of the present inventive concepts;

FIGS. 30B to 42B are cross-sectional views taken along the lines G1-G2 in cell regions of FIGS. 30A to 42A;

FIGS. 30C to 42C are cross-sectional views taken along the lines H1-H2 in cell regions of FIGS. 30A to 42A;

FIGS. 30D to 42D are cross-sectional view of peripheral regions of FIGS. 30A to 42A;

DETAILED DESCRIPTION OF EXAMPLE EMBODIMENTS

Figure 1A:
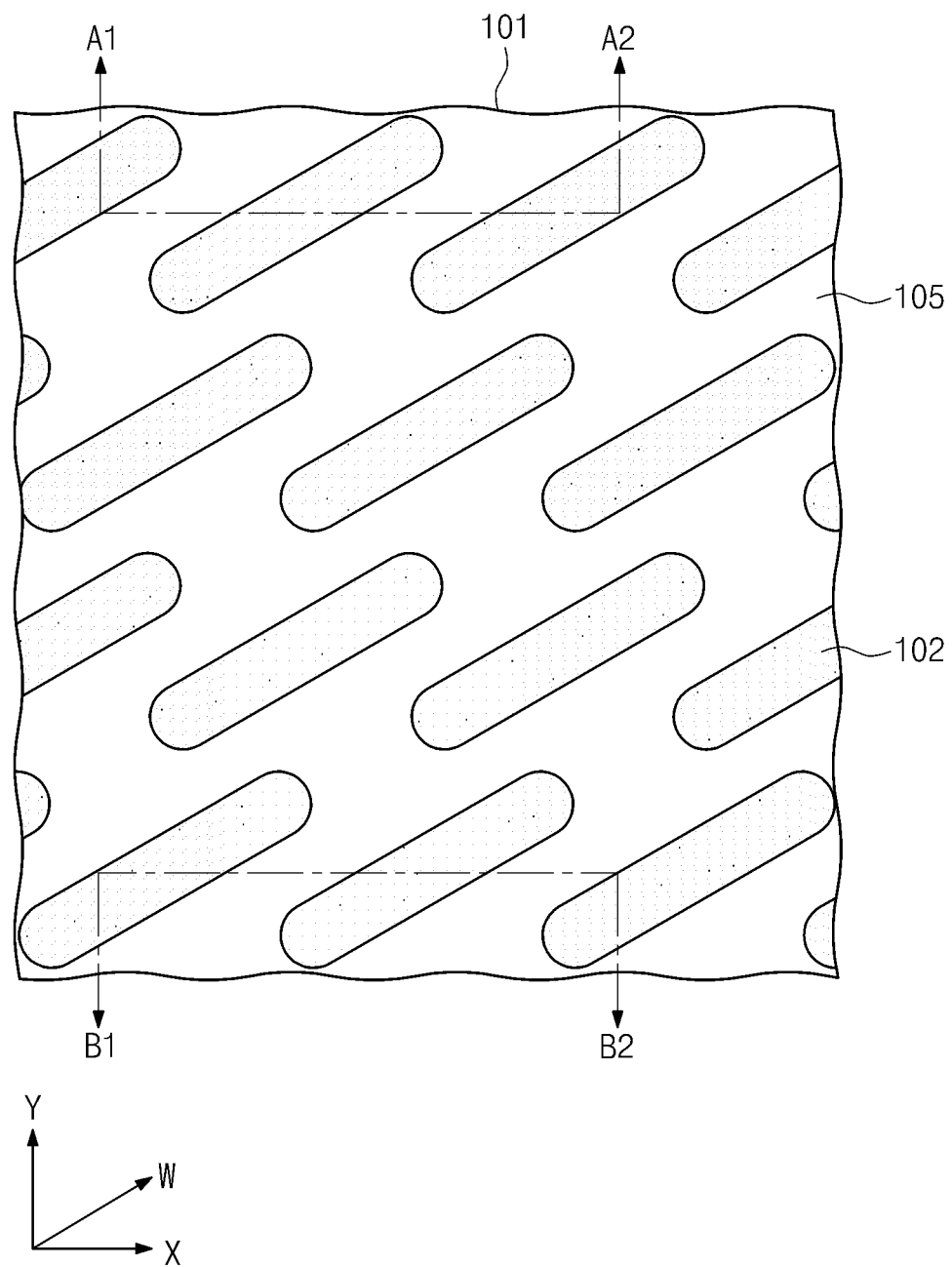

Detailed example embodiments of the inventive concepts are disclosed herein. However, specific structural and functional details disclosed herein are merely representative for purposes of describing example embodiments. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A to 13A are plan views illustrating a method for fabricating a semiconductor device according to an example embodiment of the present inventive concepts. FIGS. 1B to 13B are cross-sectional views taken along lines A1-A2 of FIGS. 1A to 13A. FIGS. 1C to 13C are cross-sectional views taken along lines B1-B2 of FIGS. 1A to 13A. FIG. 13D is a cross-sectional view taken along a line C1-C2 of FIG. 1A.

Figure 1B:
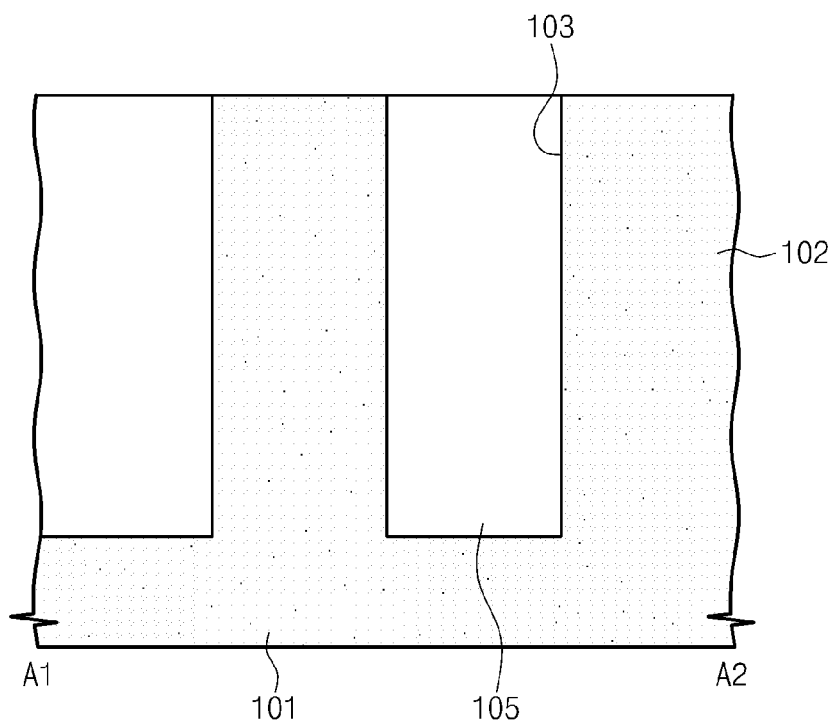
Figure 1C:
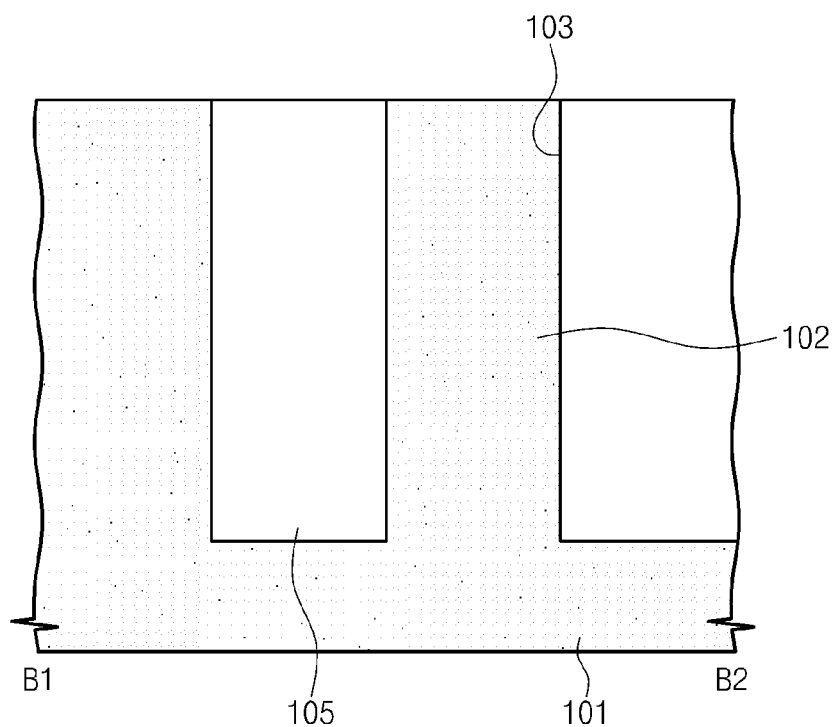

Referring to FIGS. 1A, 1B and 1C, an active region 102 may be defined at a substrate 101. For example, the substrate 101 such as a silicon wafer may be etched to form a trench 103, and the trench 103 may be filled with an insulating material such as SiN or SiON to form a device isolation layer 105. The device isolation layer 105 may define the active region 102 having an island shape that extends in a diagonal direction W as illustrated in FIG. 1A. The active region 102 may have a pillar shape vertically extending from the substrate 101 as illustrated in FIG. 1B or 1C. The active region 102 in a cell region may have a shape substantially identical or similar to that of the active region 102 in a peripheral region. The active region 102 may be formed to have a herringbone shape or a parallel shape which will be described later.

Impurities may be provided to the substrate 101 such that a top portion of the active region 102 may be doped with the impurities. For example, the top portion of the active region 102 may be doped with n-type impurities in case the substrate 101 is doped with p-type impurities.

Figure 2A:
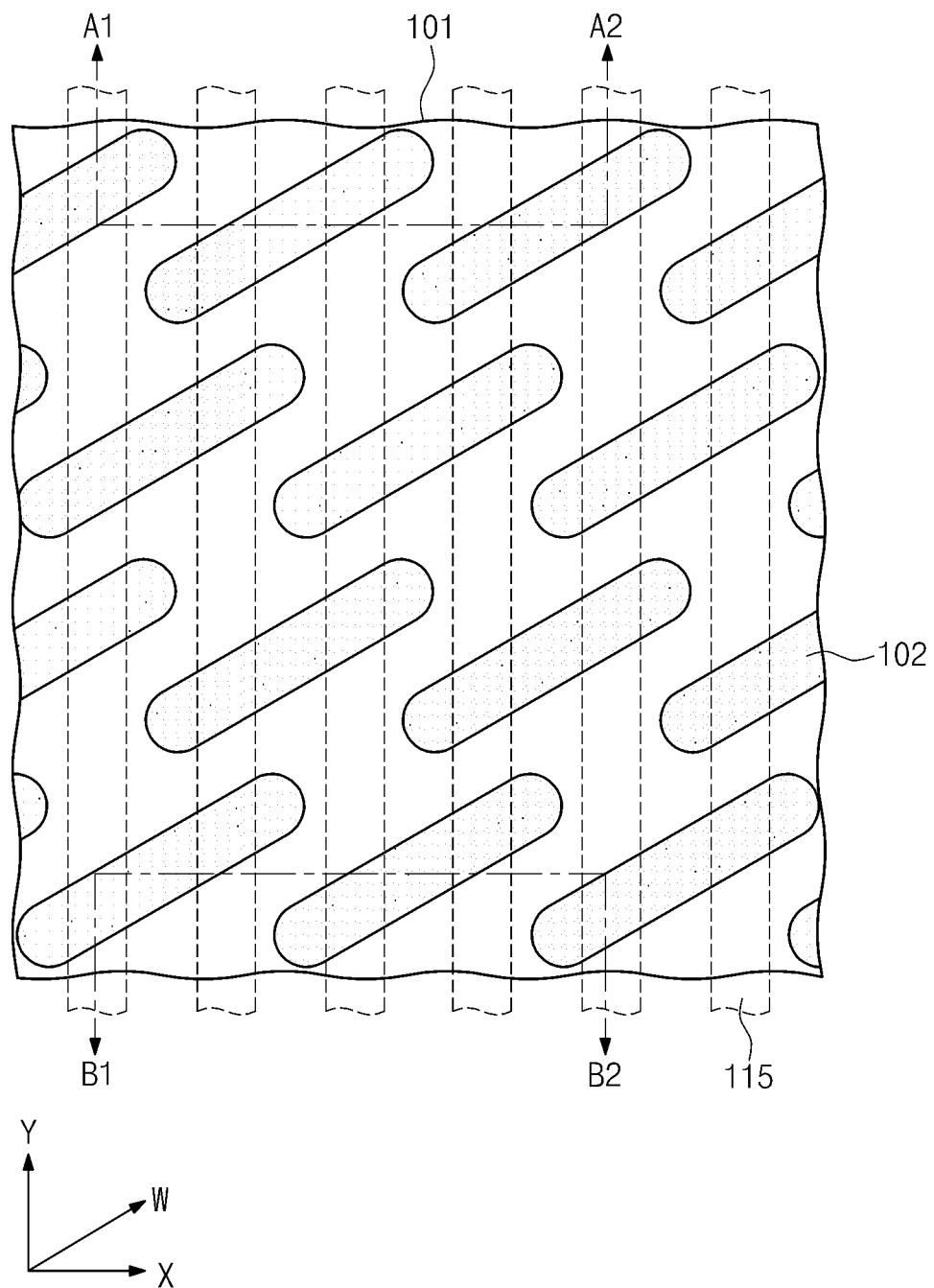
Figure 2B:
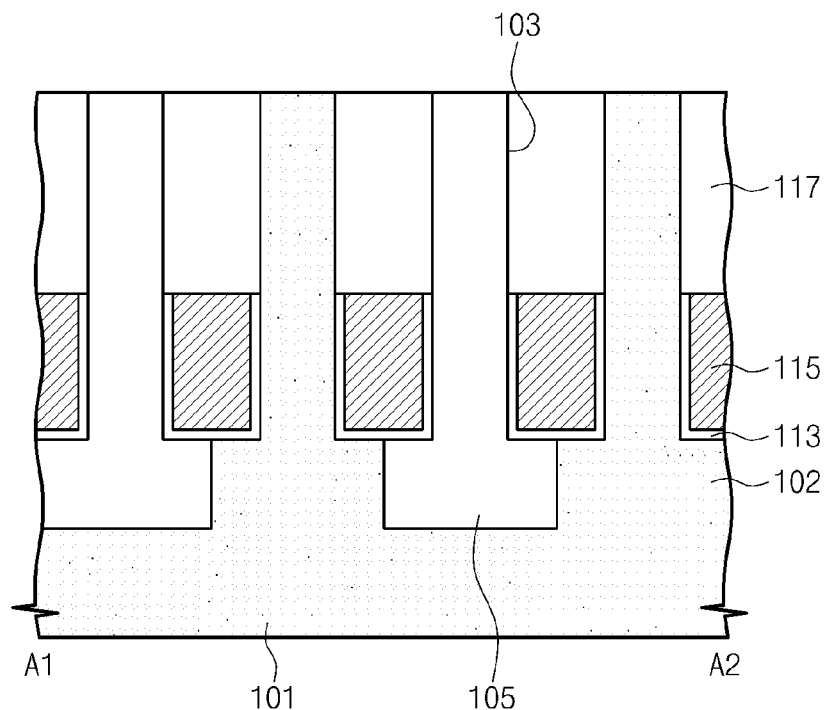
Figure 2C:
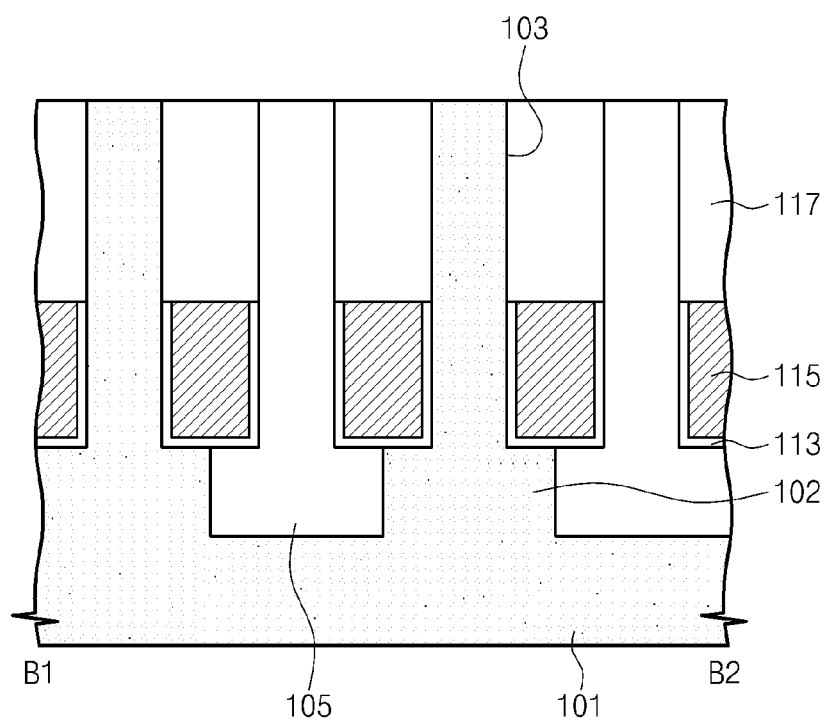

Referring to FIGS. 2A, 2B and 2C, a plurality of word lines 115 may be formed to extend in a first direction Y across the active region 102 and to be spaced apart from each other in a second direction X. For example, a groove 103 may be formed in the substrate 101 to extend in the first direction Y. The groove 103 may partially expose the active region 102. A gate dielectric layer 113 may be formed by thermally oxidizing the exposed active region 102 or depositing a silicon oxide layer on an inner surface of the groove 103. The groove 102 having the gate dielectric layer 113 formed therein may be partially filled with a conductive material (e.g., polysilicon, metal, metal silicide, etc.) to form a recessed gate or the word line 115.

The word line 115 may overlap with an edge of the active region 102. The unfilled portion of the groove 103 may be filled with an insulating layer such as silicon oxide to form a capping layer 117. In some embodiments, portions of the semiconductor substrate 101 below lateral and bottom sides of the word line 115 may serve as a bending-shaped channel having a relatively longer length compared to a straight channel such that short channel effects are improved.

Figure 3A:
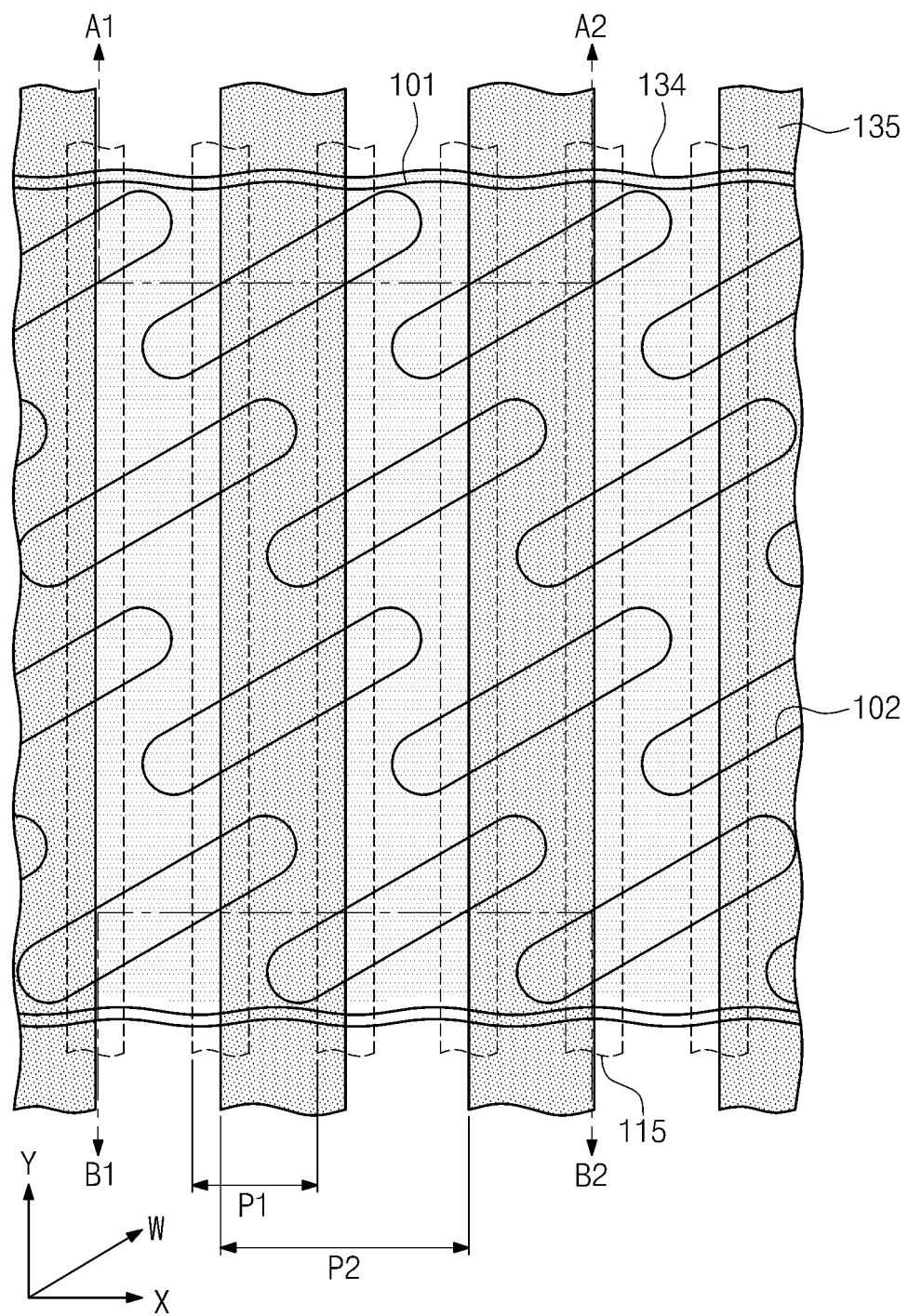
Figure 3B:
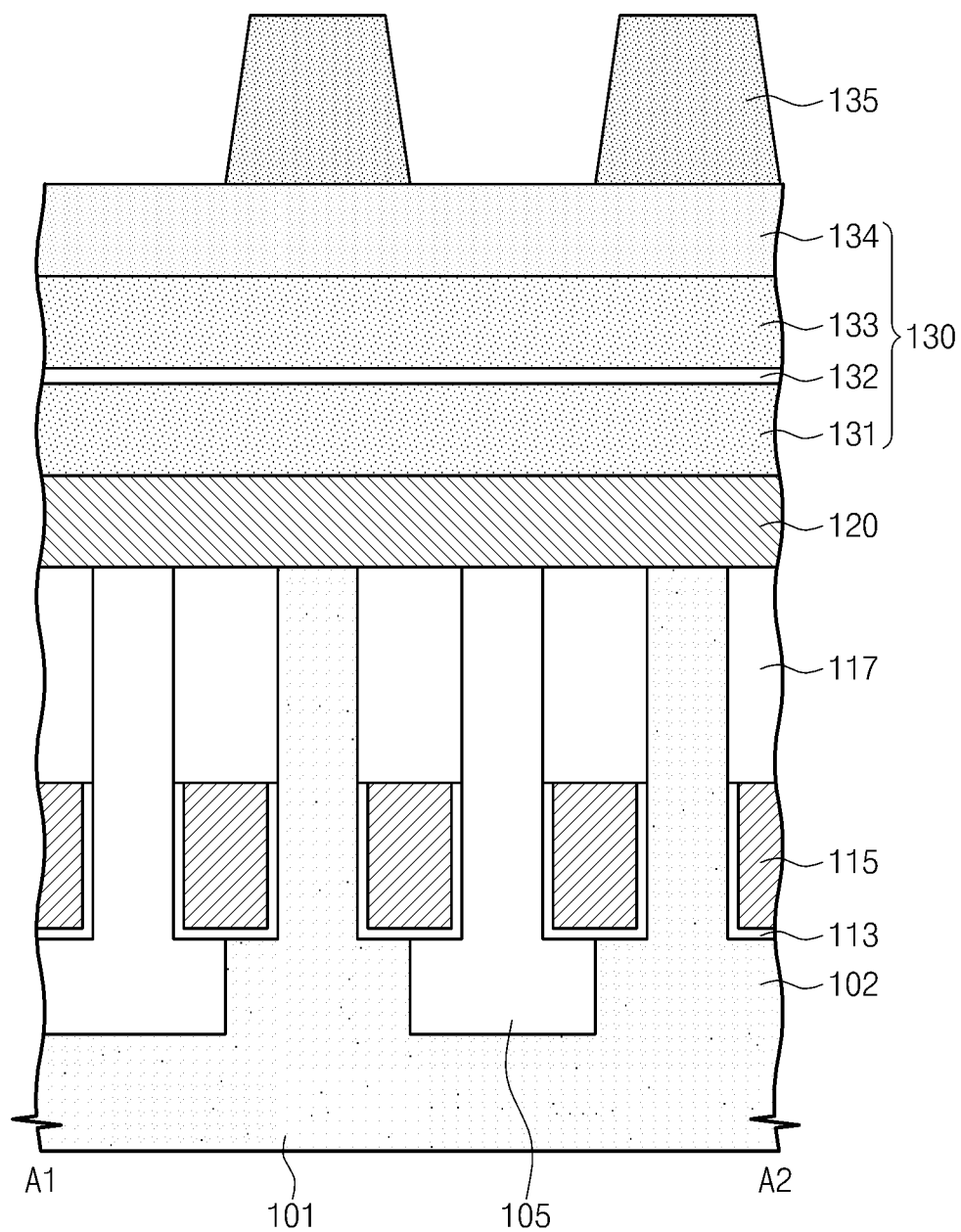
Figure 3C:
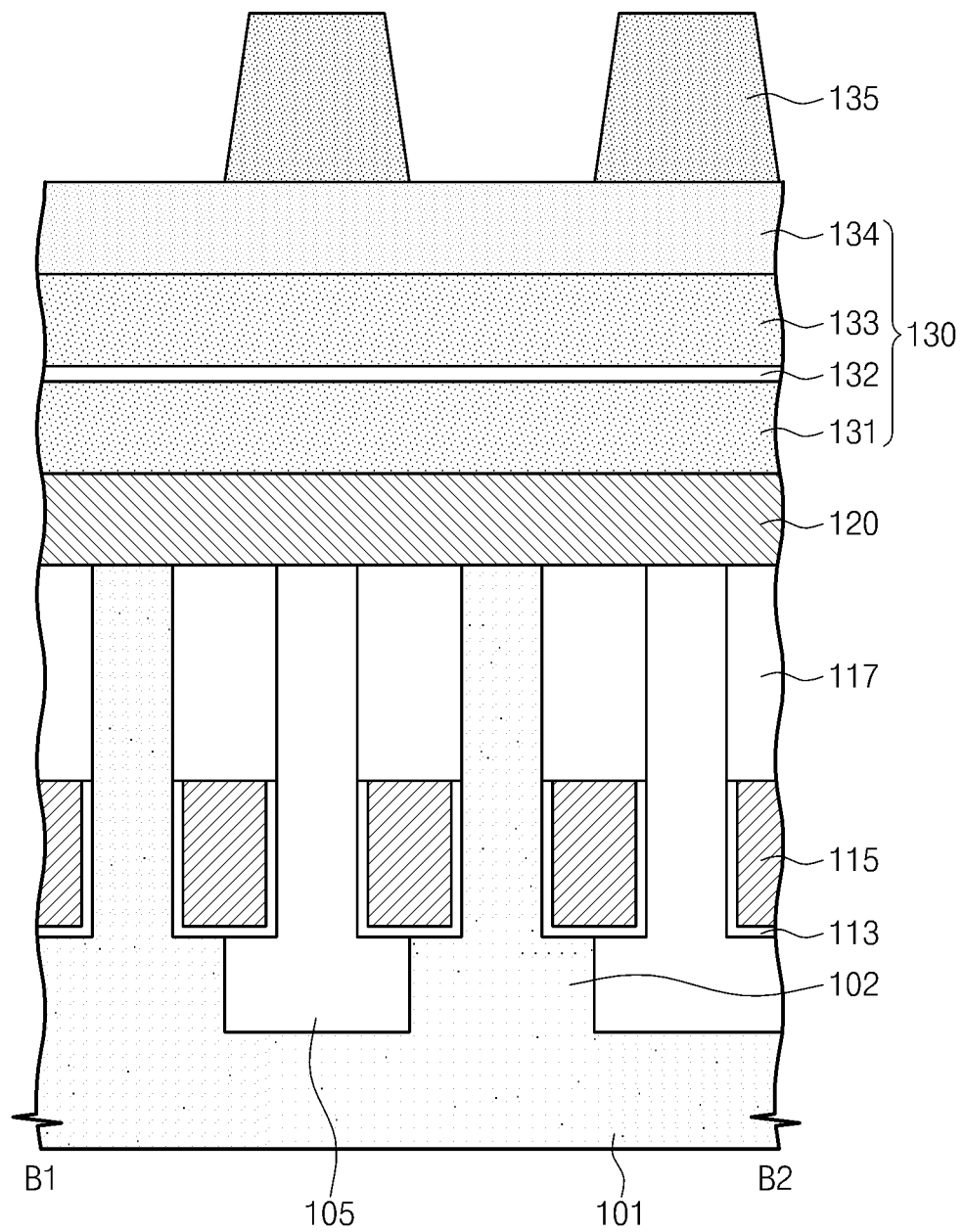

Referring to FIGS. 3A, 3B and 3C, a conductive layer 120 may be formed on the substrate 101 and a mask layer 130 may be formed on the conductive layer 120. The mask layer 130 may include first to forth mask layers 131, 132, 133 and 134. For example, the first and third mask layers 131 and 133 may include an oxide layer (e.g., SiO2), the second mask layer 132 may include a nitride layer having an etch selectivity with respect to the oxide layer, and the fourth mask layer 134 may include a conductive layer (e.g., a polysilicon layer) or an insulating layer having an etch selectivity with respect to the third mask layer 133. The materials of the first to fourth mask layers 131, 132, 133 and 134 may be not limited thereto. Any materials having an etch selectivity different from each other may be used to form the first to fourth mask layers 131, 132, 133 and 134.

A plurality of first photomask layers 135 may be formed on the fourth mask layer 134. The first photomask layers 135 may have line shapes extending in the first direction Y and spaced apart from each other in the second direction X. The first photomask layer 135 may have a larger width and/or pitch than the word line 115. For example, the word lines 115 may be arranged at a first pitch P1 and the first photomask layers 135 may be arranged at a second pitch P2 greater than the first pitch P1. The second pitch P2 may be twice as great as the first pitch P1. The first photomask layer 135 may vertically overlap with portions of adjacent word lines 115.

Figure 4A:
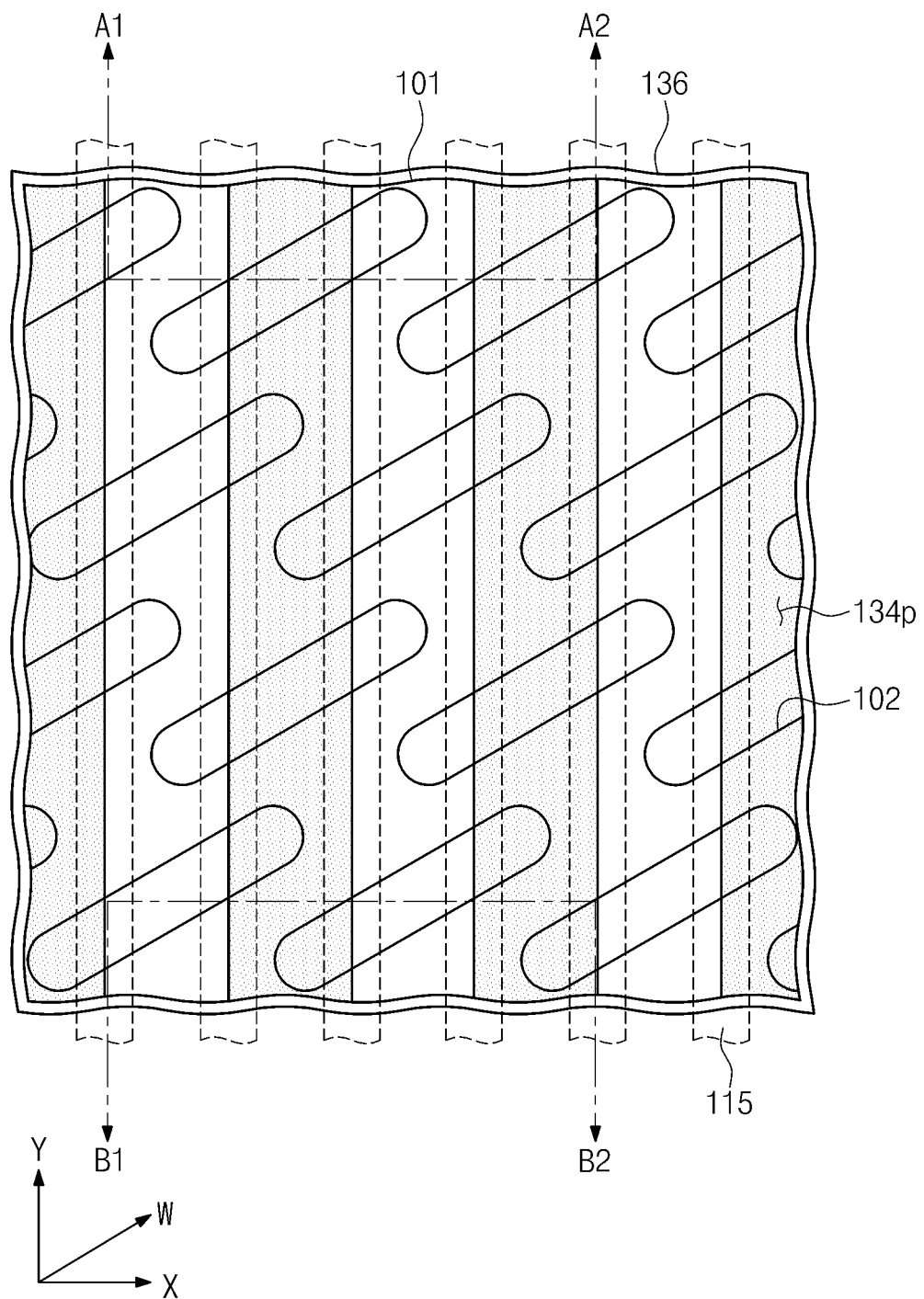
Figure 4B:
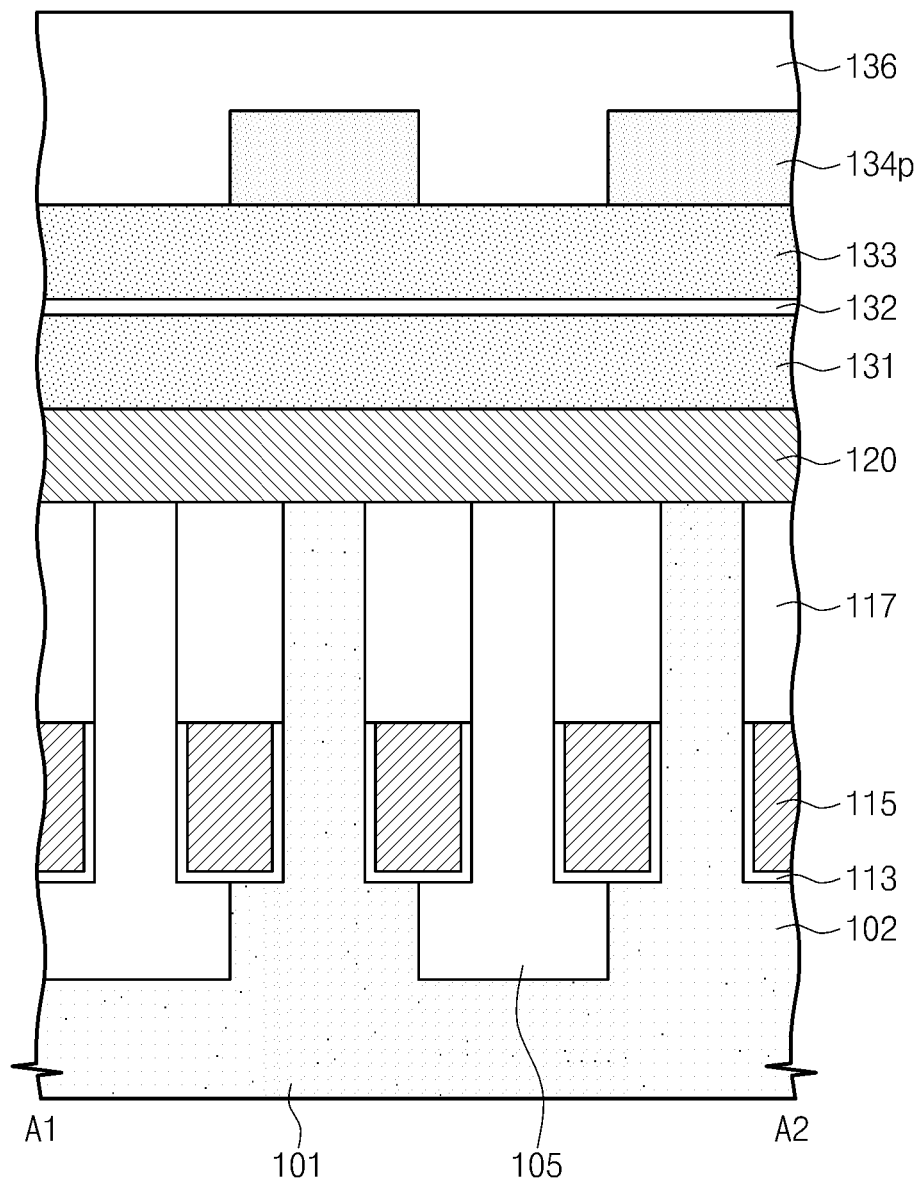
Figure 4C:
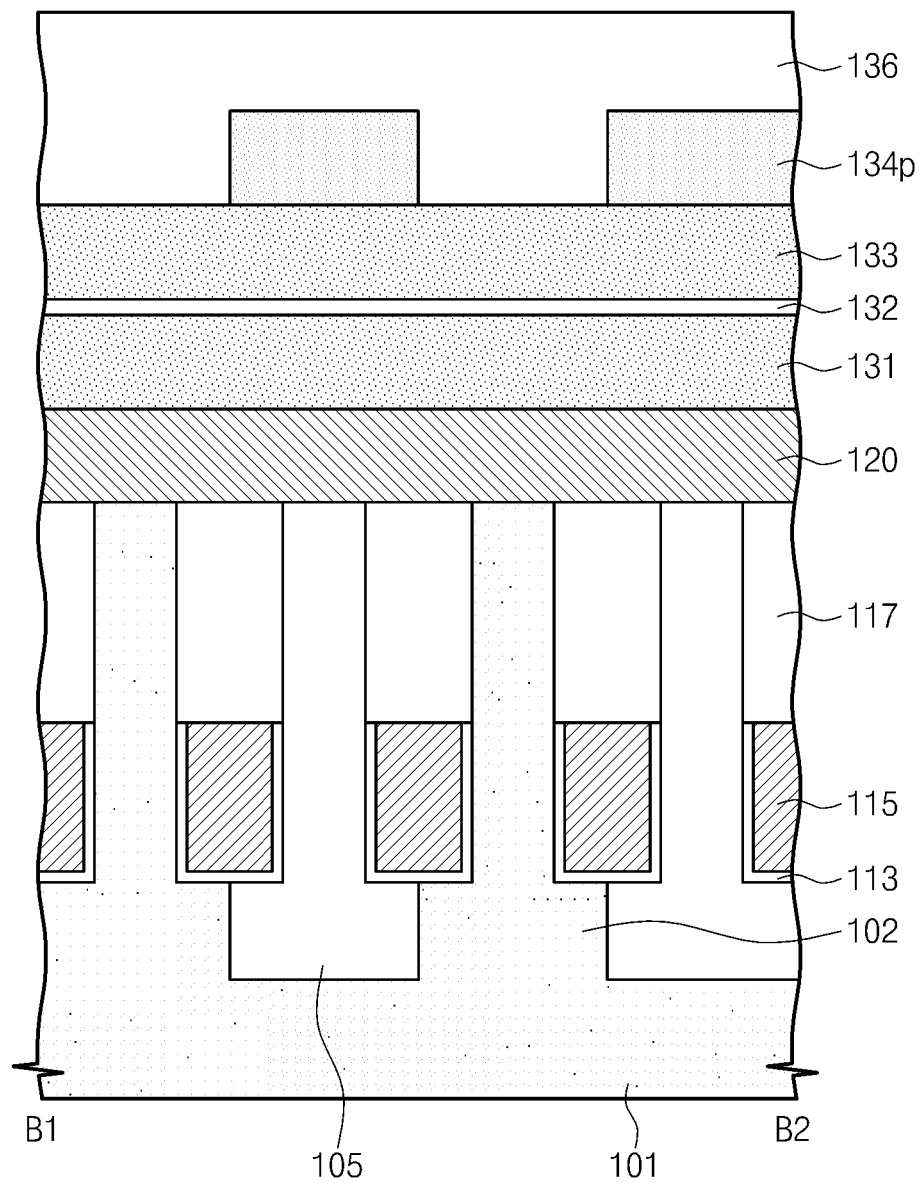

Referring to FIGS. 4A, 4B and 4C, the fourth mask layer 134 may be patterned by an etching process using the first photomask layer 135 as an etch mask. A plurality of fourth mask patterns 134p may be formed on the third mask layer 133 by the patterning process. The fourth mask patterns 134p may have straight lines extending in the first direction Y and spaced apart from each other in the second direction X. After forming the fourth mask patterns 134p, the first photomask layers 135 may be removed by an ashing process.

A first hardmask layer 136 may be formed on the third mask layer 133 having the fourth mask patterns 134p formed thereon. The first hardmask layer 136 may cover an entirety of the substrate 101. The first hardmask layer 136 may include a material (e.g., SiON, SiC, SiN, or SiCN) having an etch selectivity with respect to the fourth mask pattern 134p.

Figure 5A:
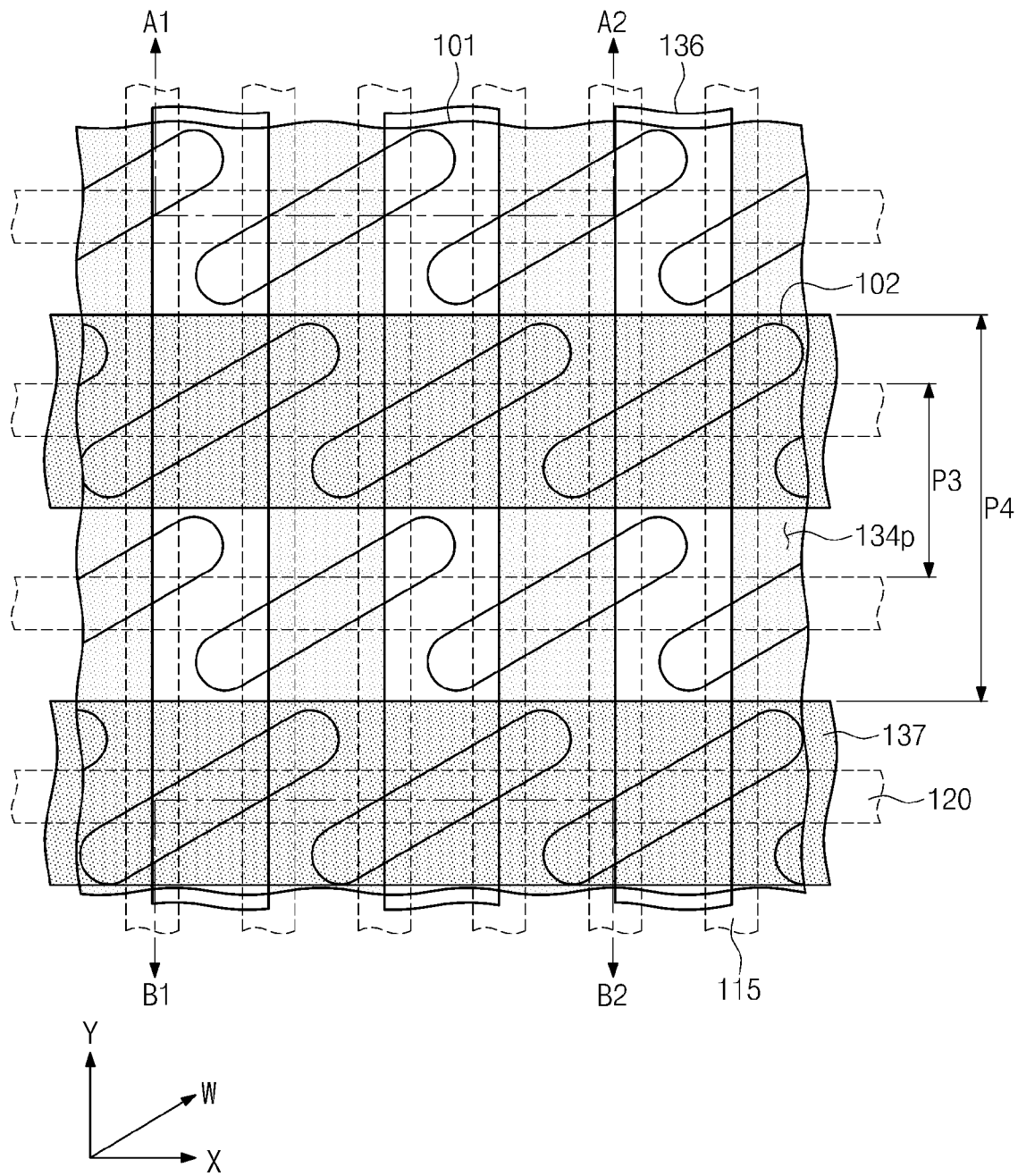
Figure 5B:
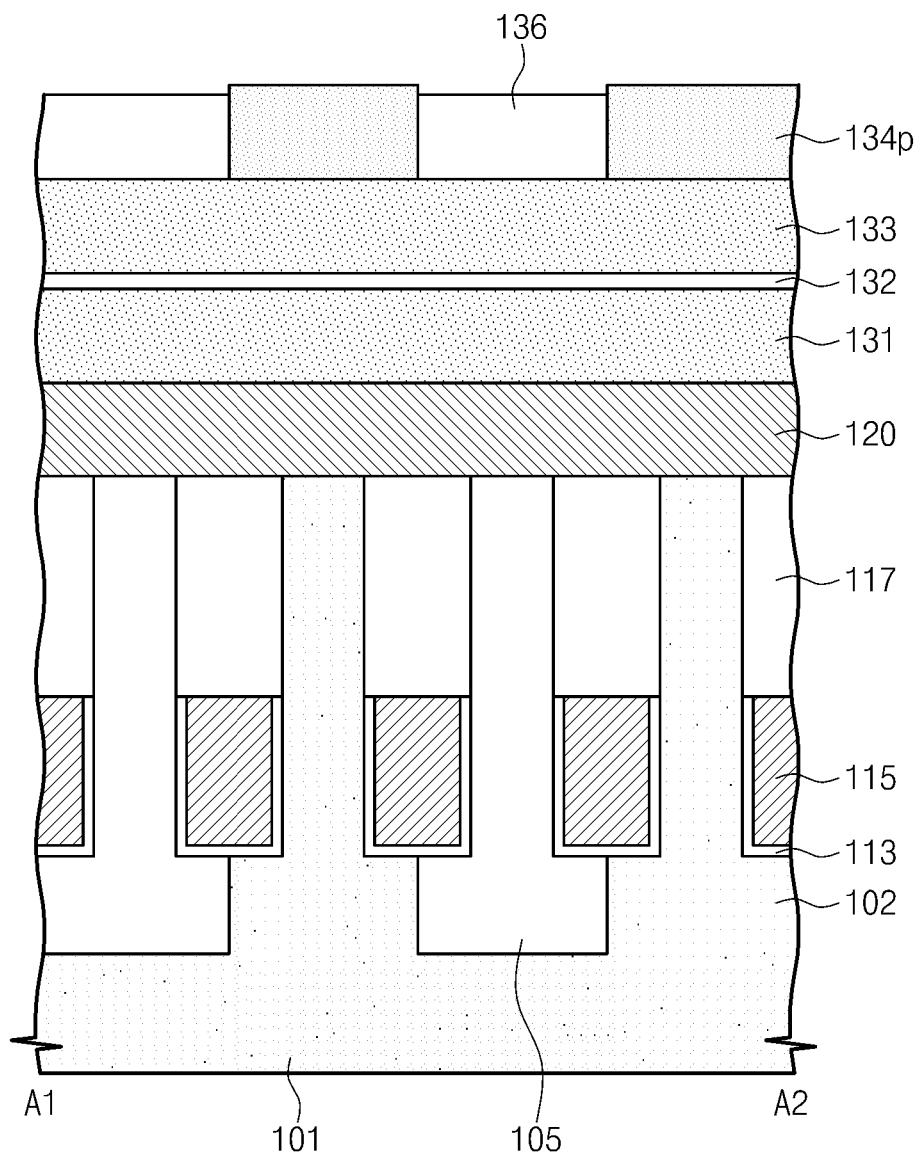
Figure 5C:
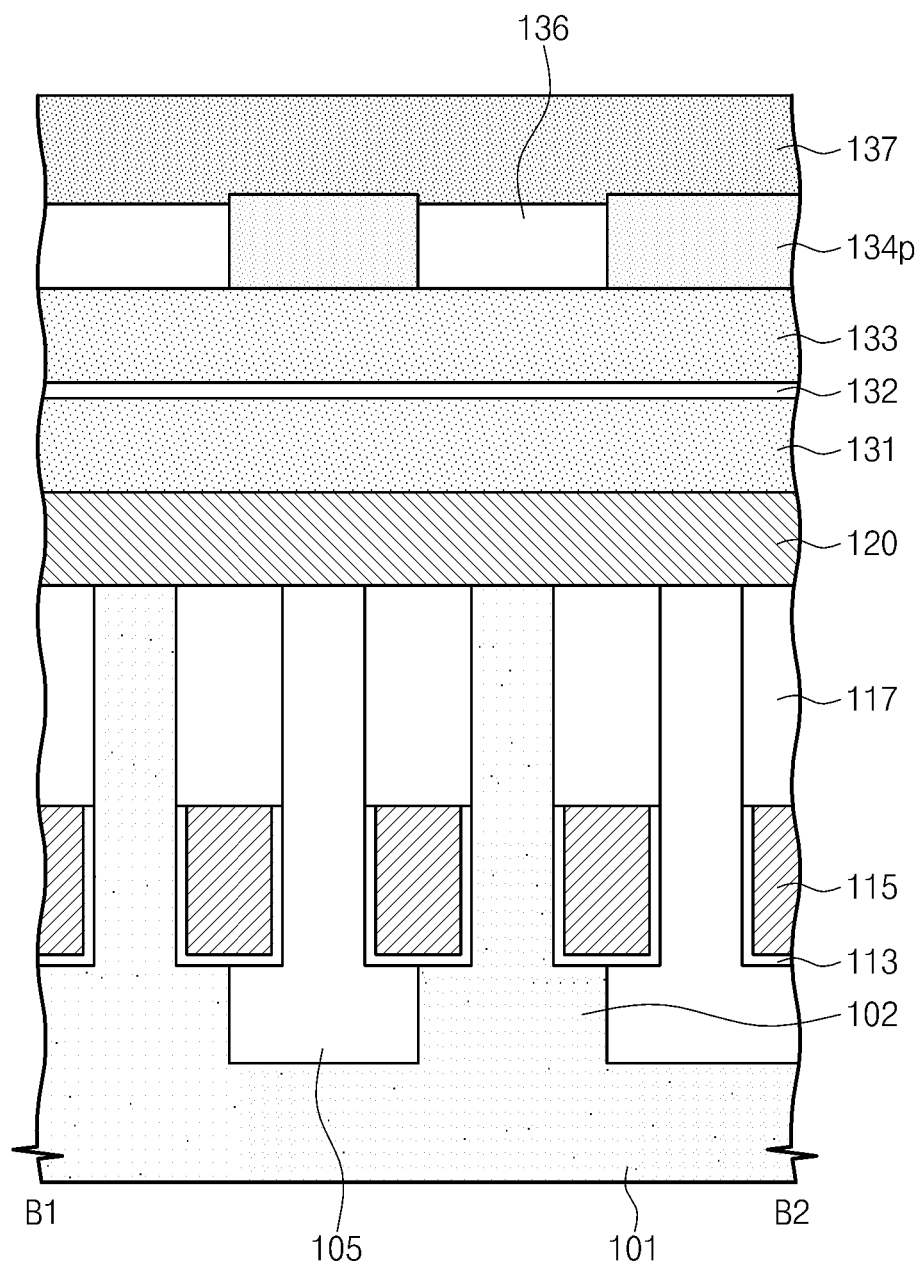

Referring to FIGS. 5A, 5B and 5C, the first hardmask layer 136 may be recessed to expose the fourth mask patterns 134p, and a plurality of second photomask layers 137 may be formed to have straight lines extending in the first direction Y across the exposed fourth mask patterns 134p and spaced apart from each other in the second direction X.

The second photomask layers 137 may be formed on an area in which bit lines 120, which will be described later, are disposed. The second photomask layers 137 may have a larger width and/or pitch than the succeeding bit lines 120. For example, the succeeding bit lines 120 may be arranged at a third pitch P3 and the second photomask layers 137 may be arranged at a fourth pitch P4 greater than the third pitch P3. The fourth pitch P4 may be twice as great as the third pitch P3.

Figure 6A:
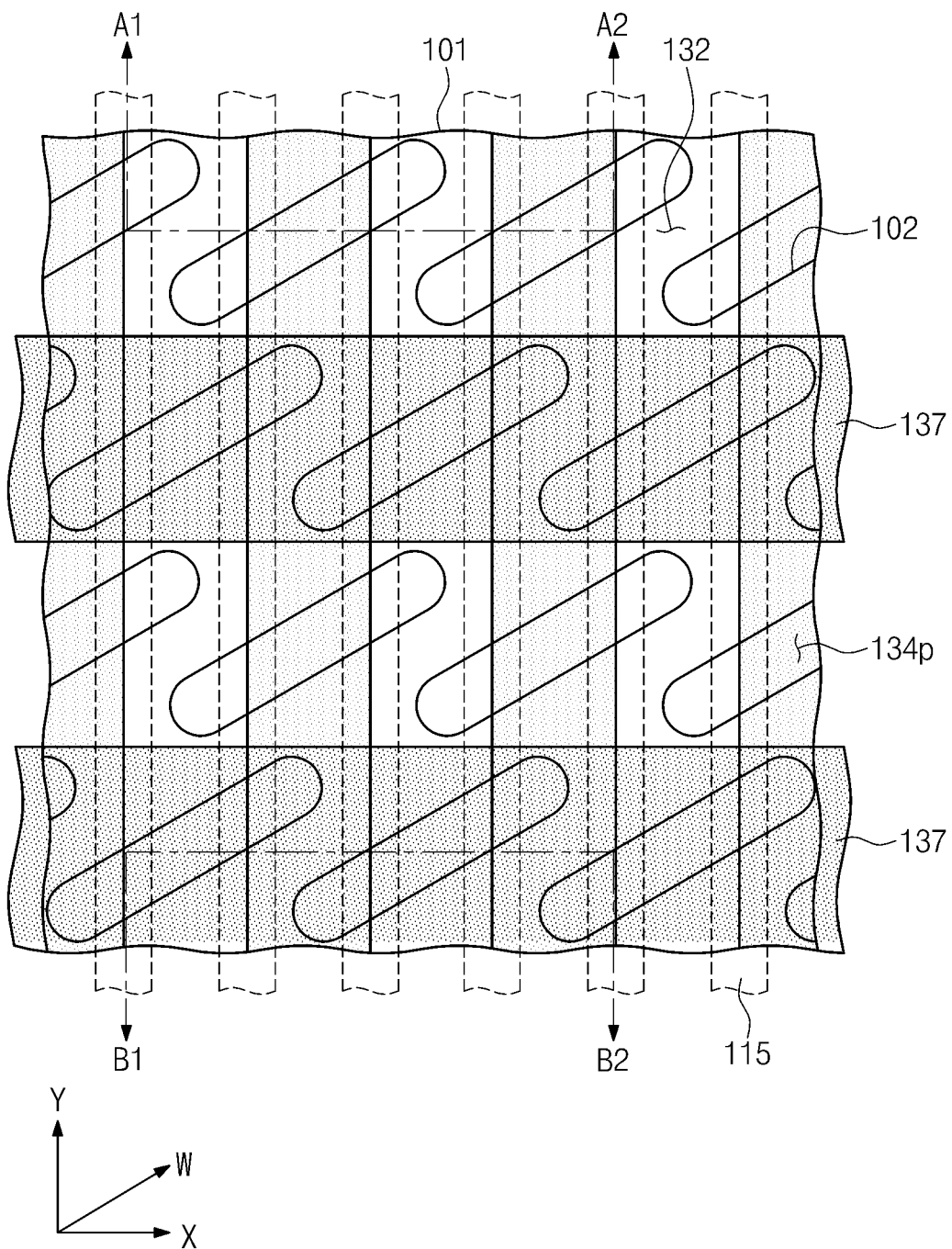
Figure 6B:
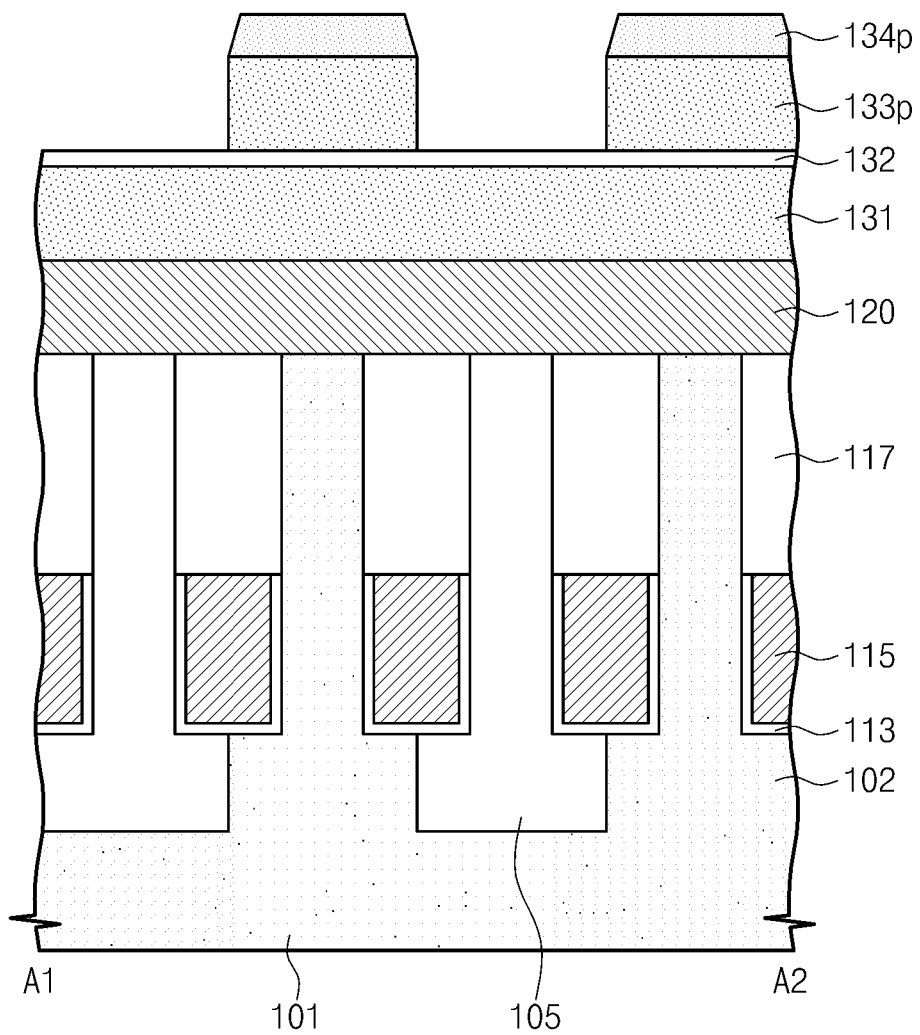
Figure 6C:
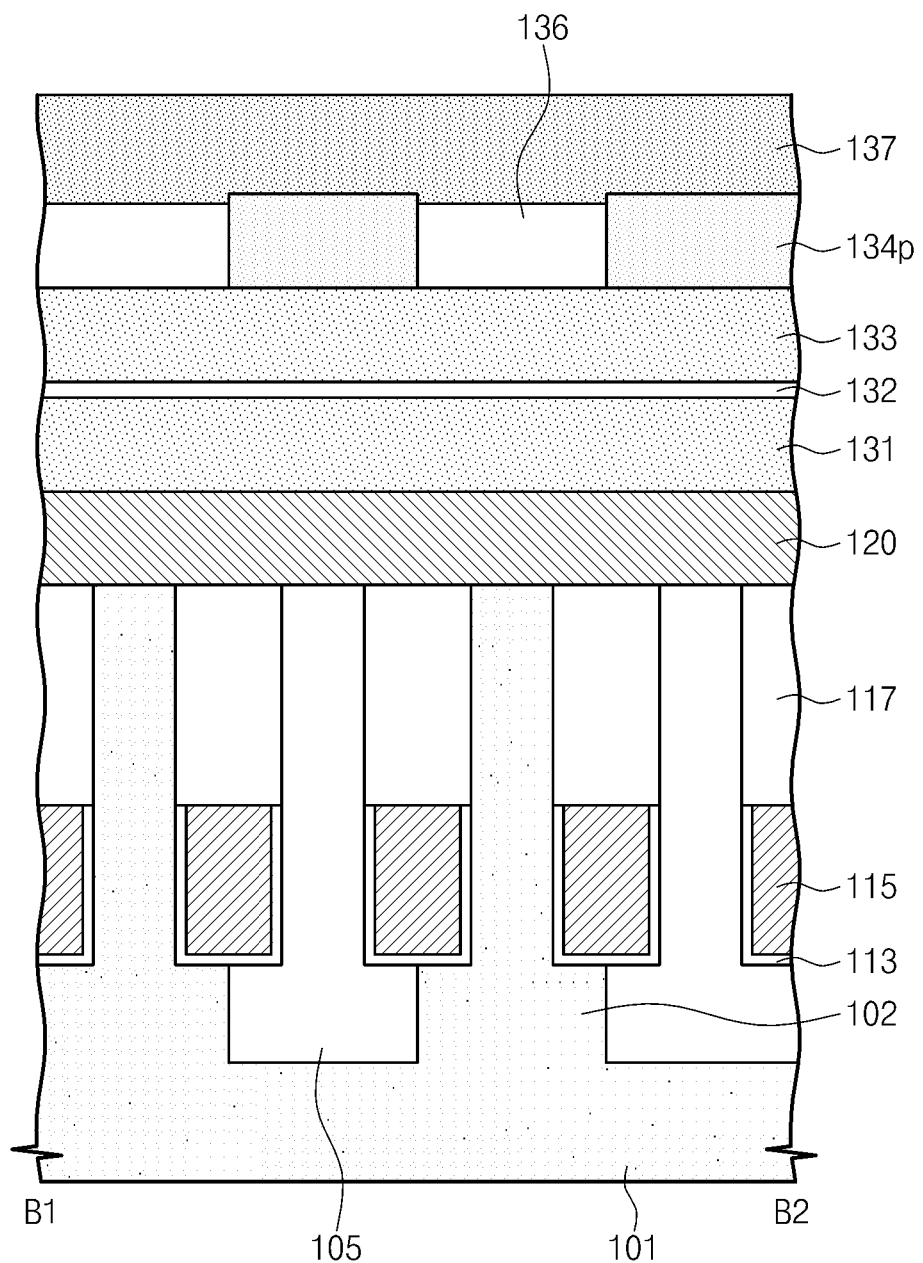

Referring to FIGS. 6A, 6B and 6C, the exposed first hardmask layer 136 may be etched to expose the third mask layer 133, and the exposed third mask layer 133 may be etched to form third mask patterns 133p. When the third mask layer 133 is etched, a portion of the fourth mask pattern 134p which is not covered with the second photomask layer 137 may be recessed. In other words, the fourth mask pattern 134p on the line A1-A2 where the second photomask layer 137 is not formed may have relatively less height or thickness, and the fourth mask pattern 134p on the line B1-B2 where the second photomask layer 137 is formed may have relatively greater height or thickness.

The third mask layer 133 may be etched until the second mask layer 132 is exposed. For example, the second mask layer 132 may serve as an etch mask. Since the second mask layer 132 acts as an etch mask, the first mask layer 131 may be formed of a material substantially identical or similar to that of the third mask layer 133. Alternatively, the first mask layer 131 may be formed of a material having an etch selectivity substantially identical to or slightly different from that of the third mask layer 133. After forming the third mask pattern 133p, the second photomask layer 137 may be removed. Differently, the second photomask layer 137 may be removed together with remaining first hardmask layer 136.

Figure 7A:
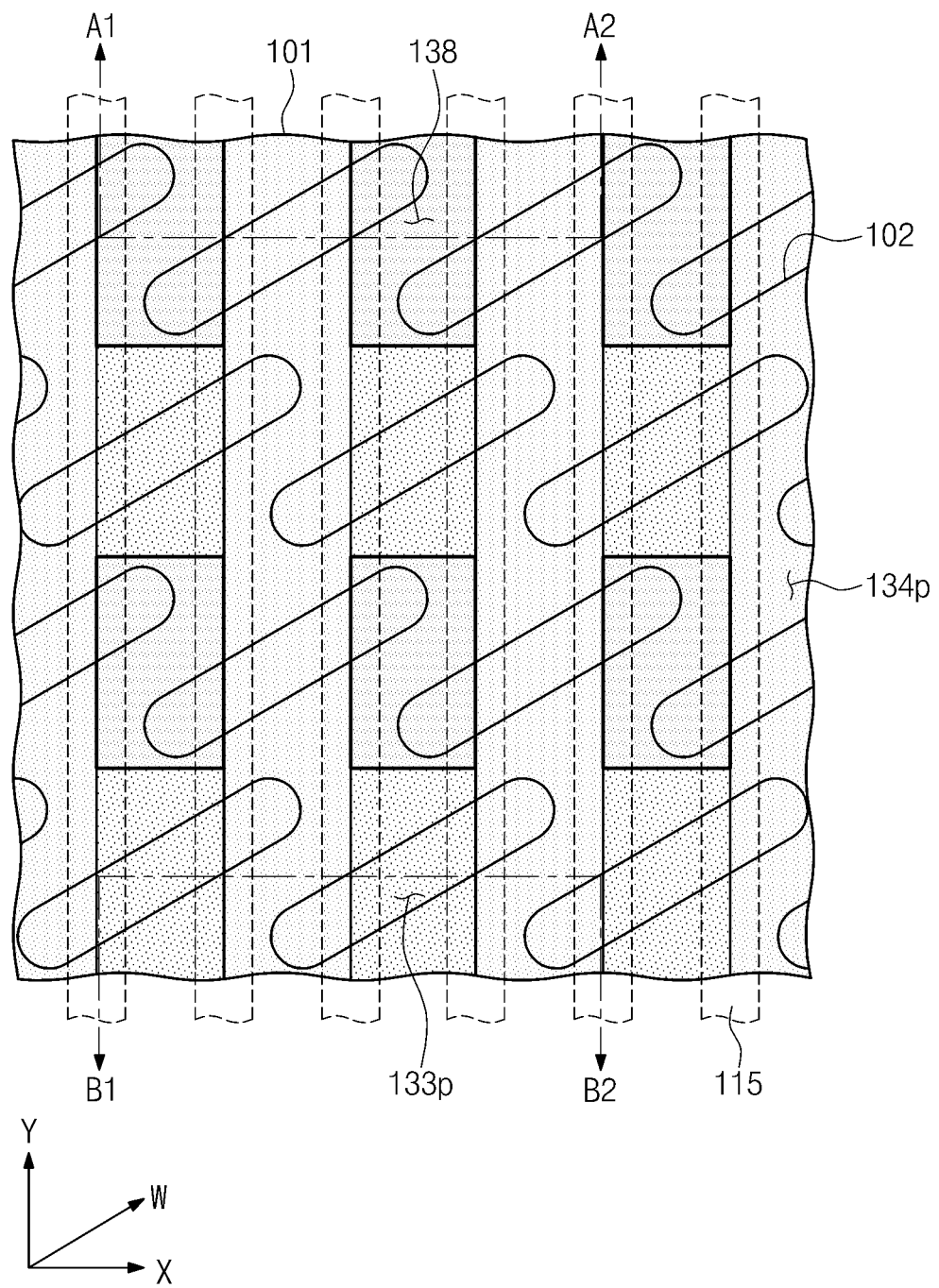
Figure 7B:
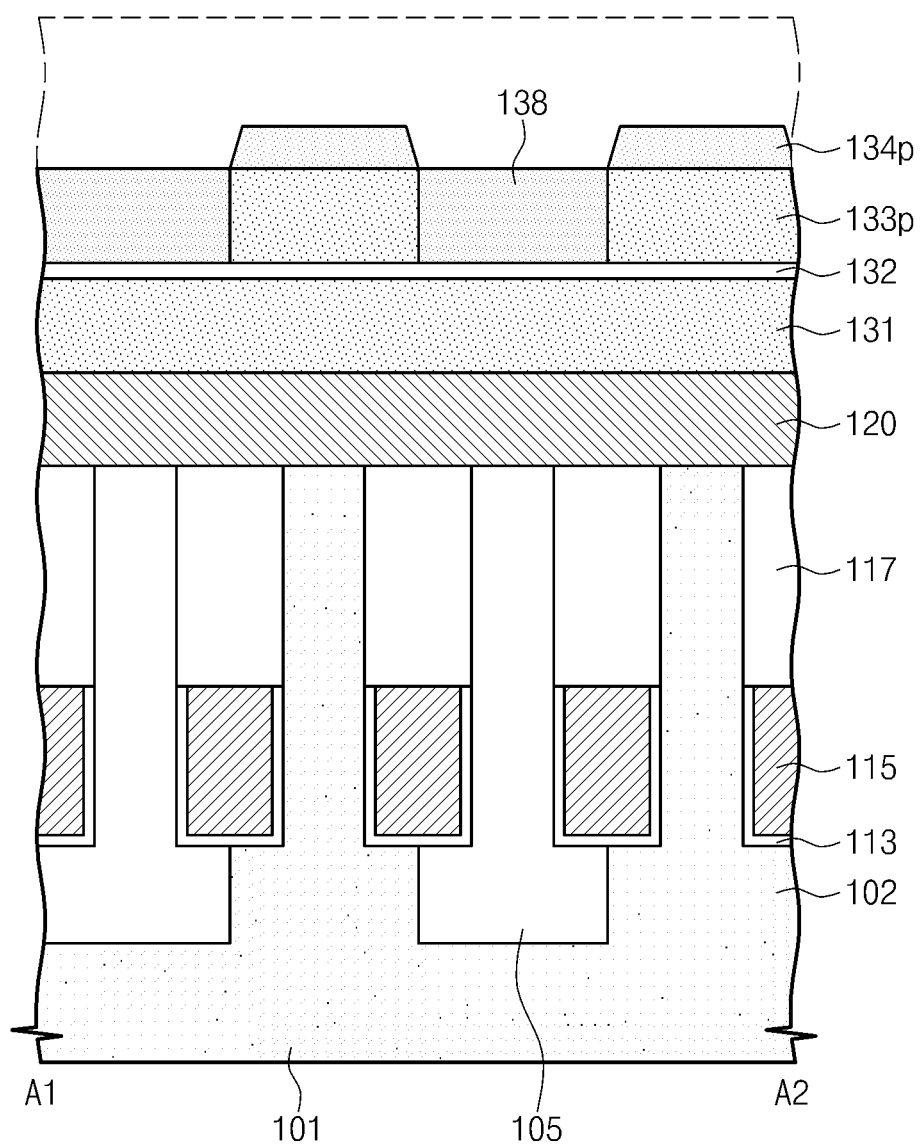
Figure 7C:
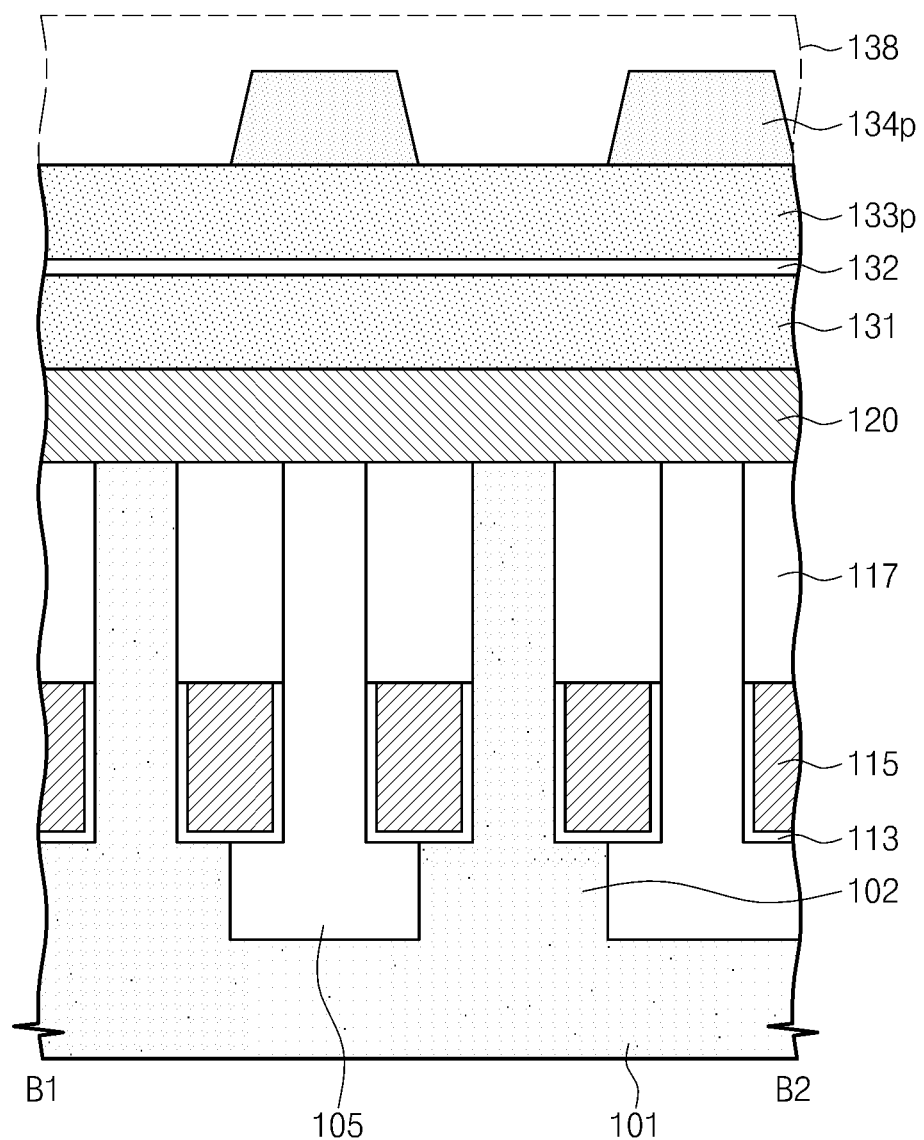

Referring to FIGS. 7A, 7B and 7C, a second hardmask layer 138 may be formed on the substrate 101. For example, the second hardmask layer 138 may be coated on the substrate 101 to have a thickness sufficient enough to cover the fourth mask pattern 134p, and then an etch-back process may be performed to the second hardmask layer 138 until the fourth mask pattern 134p is completely exposed.

The second hardmask layer 138 may have an island shape spaced apart from each other by the third mask pattern 133p in the first direction Y and by the fourth mask pattern 134p in the second direction X. The second hardmask layer 138 may include a material whose etch selectivity is different from that of the fourth mask pattern 134p. For example, the second hardmask layer 138 may include a material substantially identical or similar to that of the first hardmask layer 136.

Figure 8A:
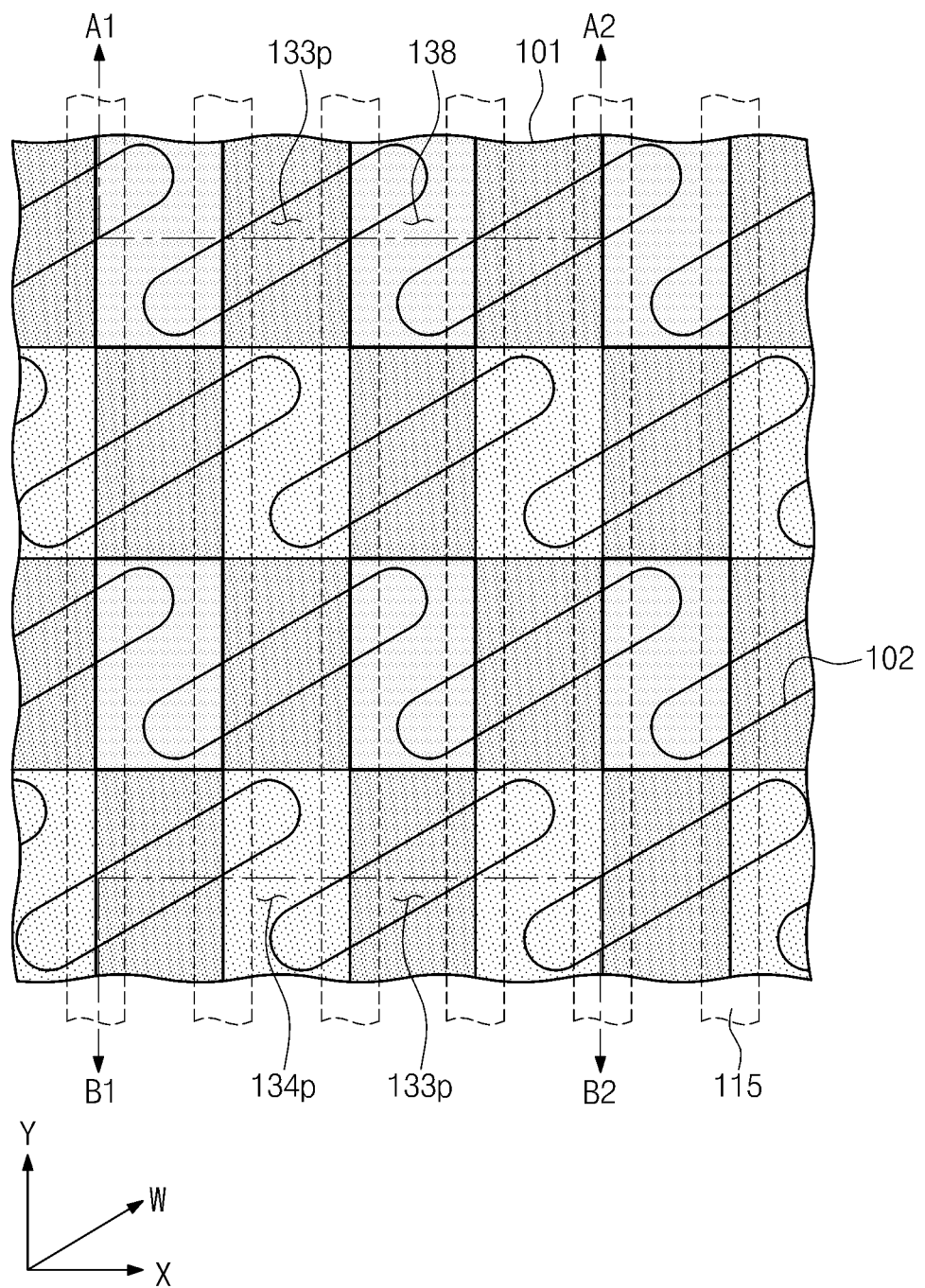
Figure 8B:
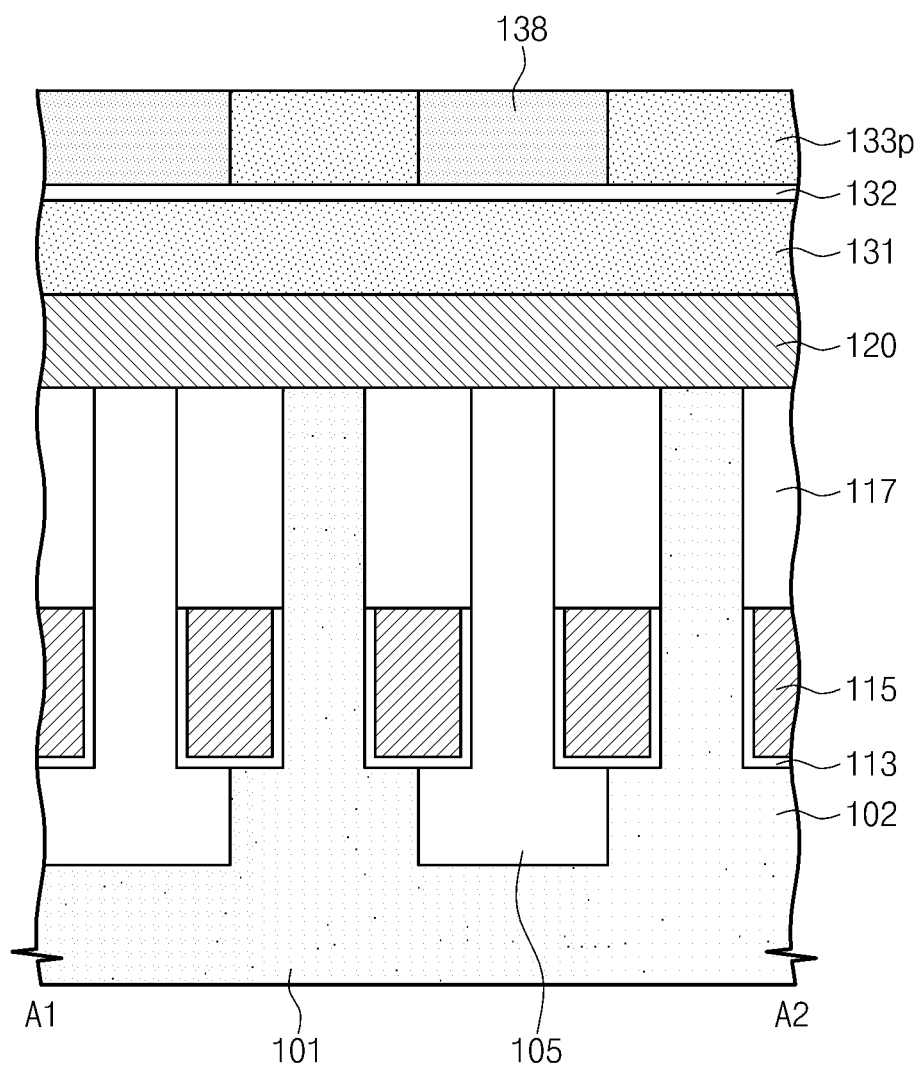
Figure 8C:
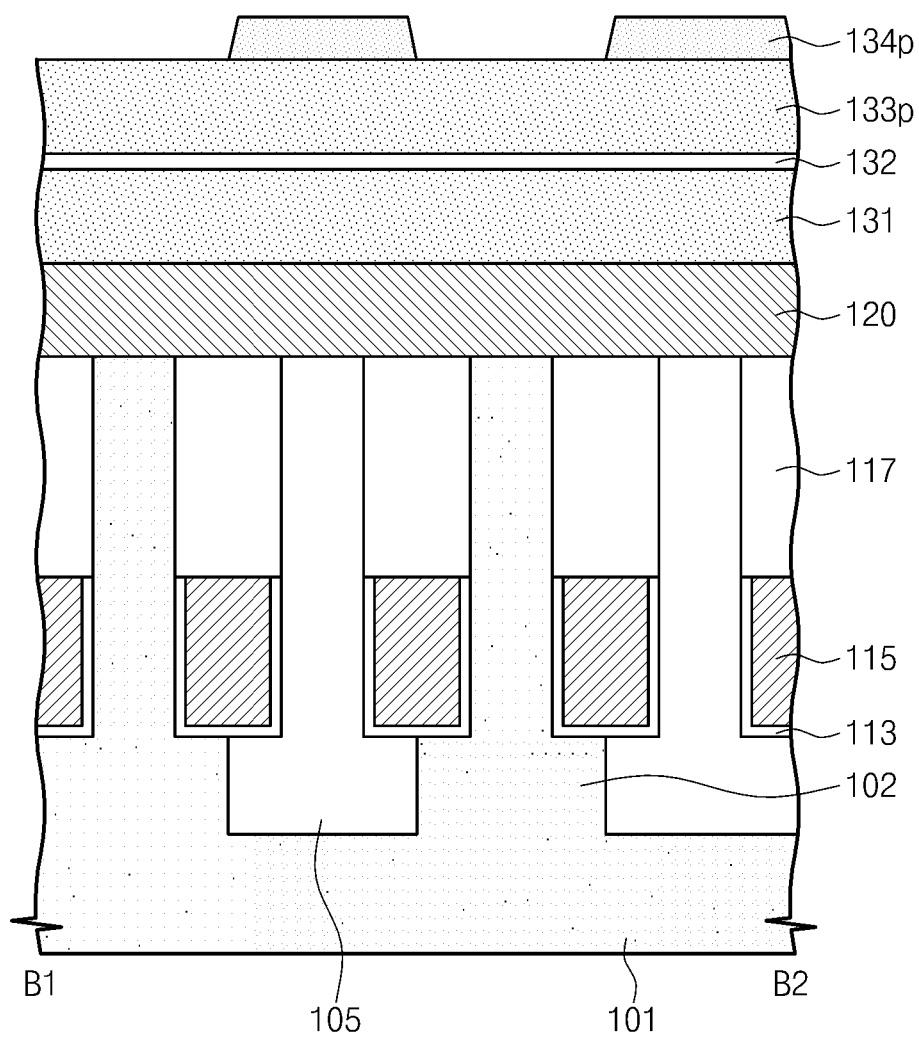

Referring to FIGS. 8A, 8B and 8C, an etching process may be performed to partially remove the fourth mask patterns 134p. As described formerly with reference to FIGS. 6A, 6B and 6C, the fourth mask patterns 134p may have different thicknesses or heights depending on positions thereof. Owing to the etching process, the fourth mask pattern 134p having a smaller height or thickness formed on the line A1-A2 may be removed and the fourth mask pattern 134p having a greater height or thickness formed on the line B1-B2 may remain.

Figure 9A:
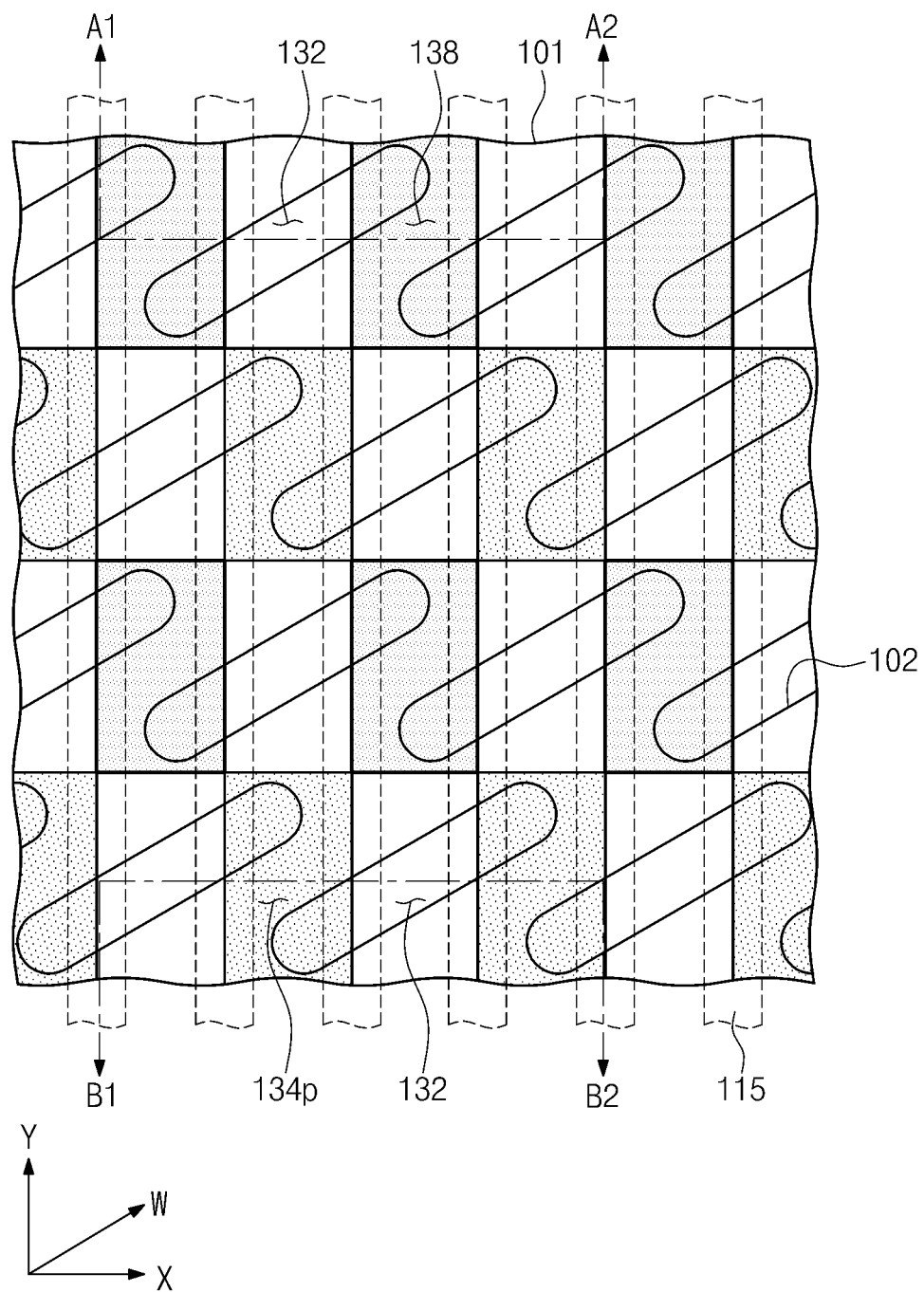
Figure 9B:
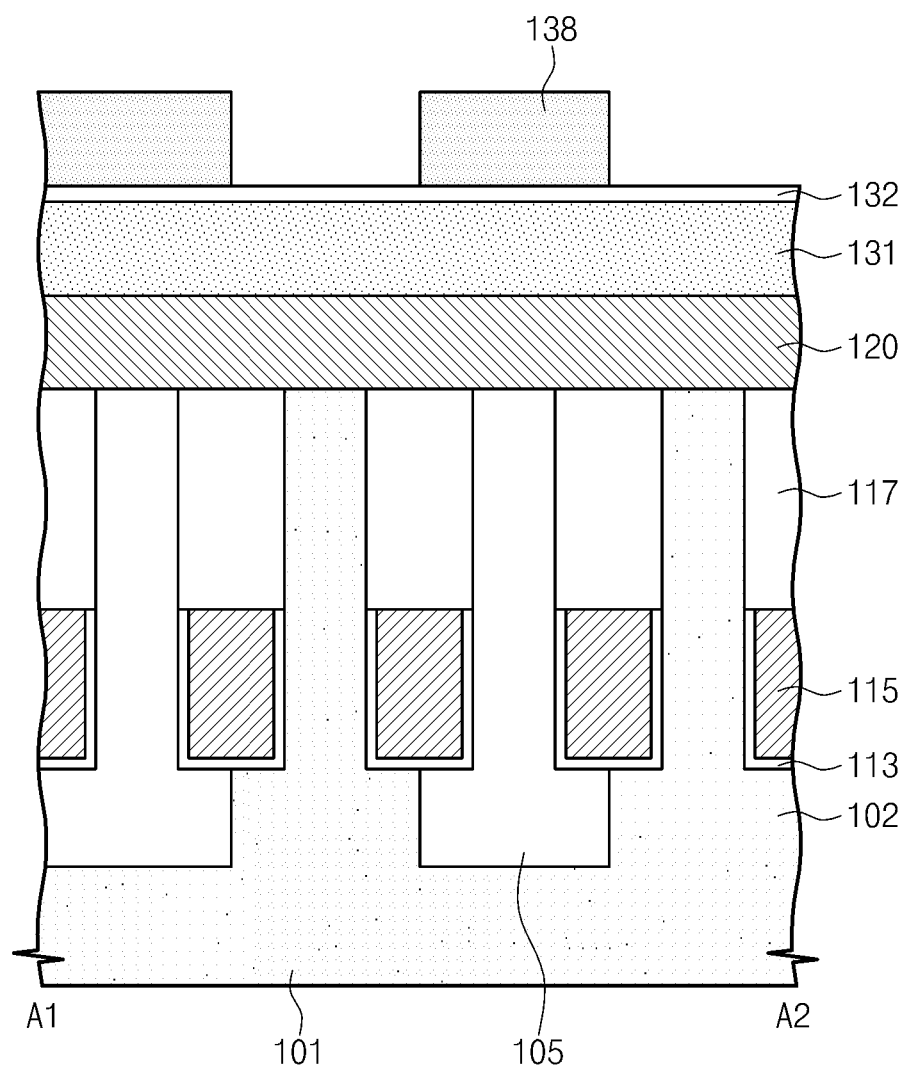
Figure 9C:
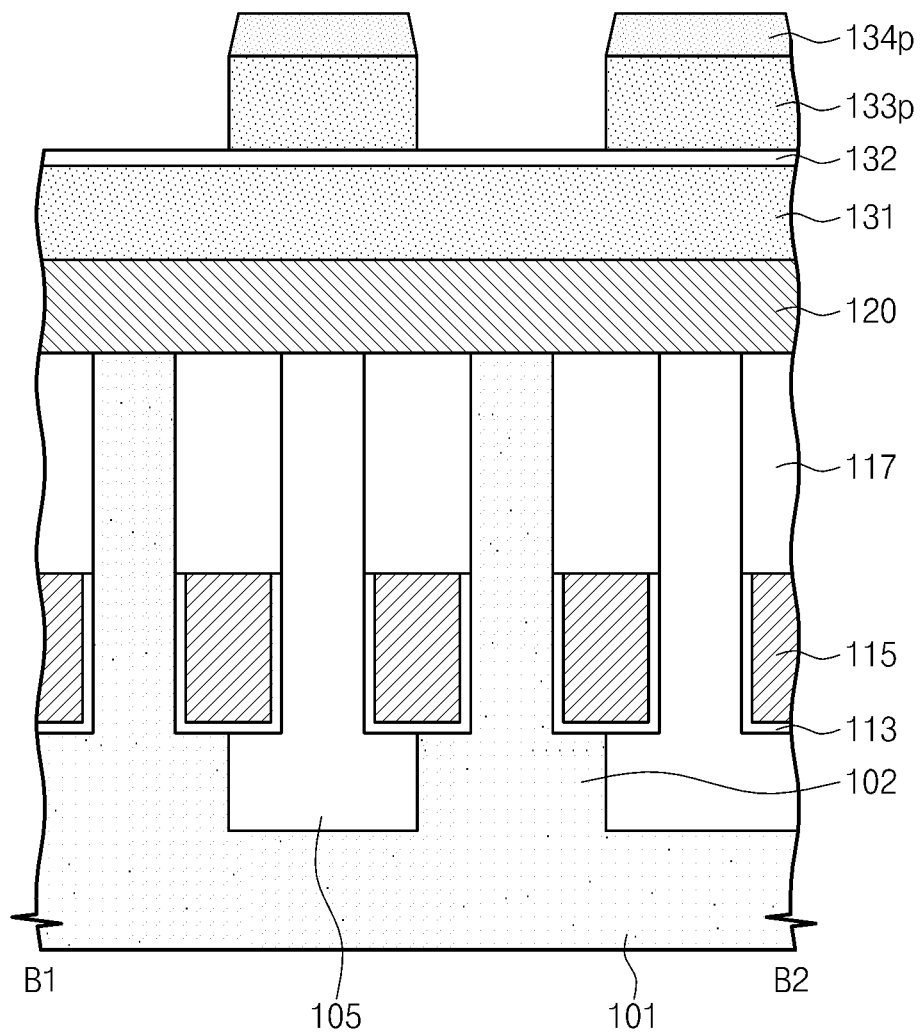

Referring to FIGS. 9A, 9B and 9C, an etching process may be performed to partially remove the third mask patterns 133p. For example, when the third mask patterns 133p is etched, the second hardmask layer 138 on the line A1-A2 may act as an etch mask and the fourth mask pattern 134p on the line B1-B2 may serve as an etch mask. The second mask layer 132 may act as an etch stop layer when the third mask patterns 133p is etched.

Figure 10A:
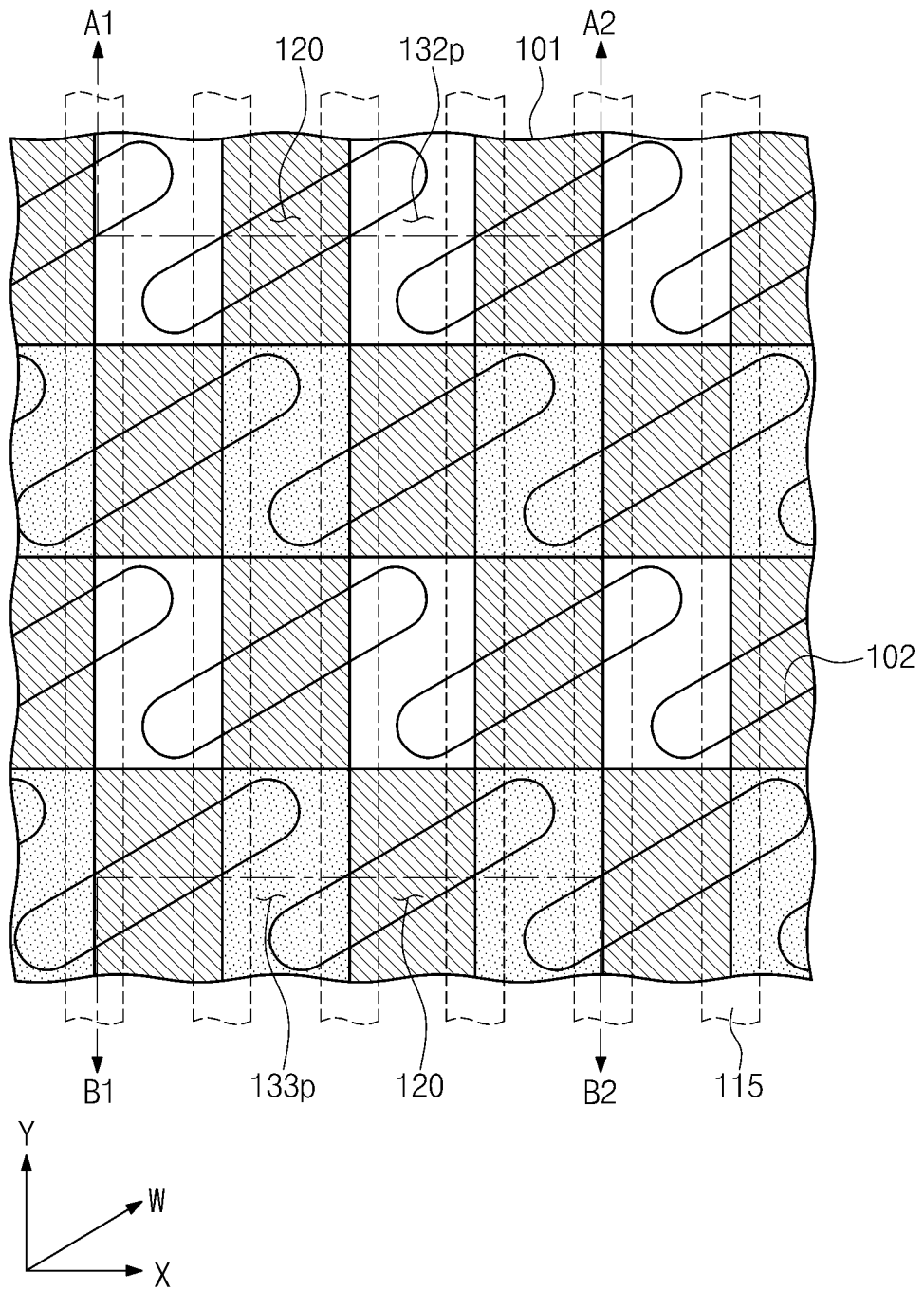
Figure 10B:
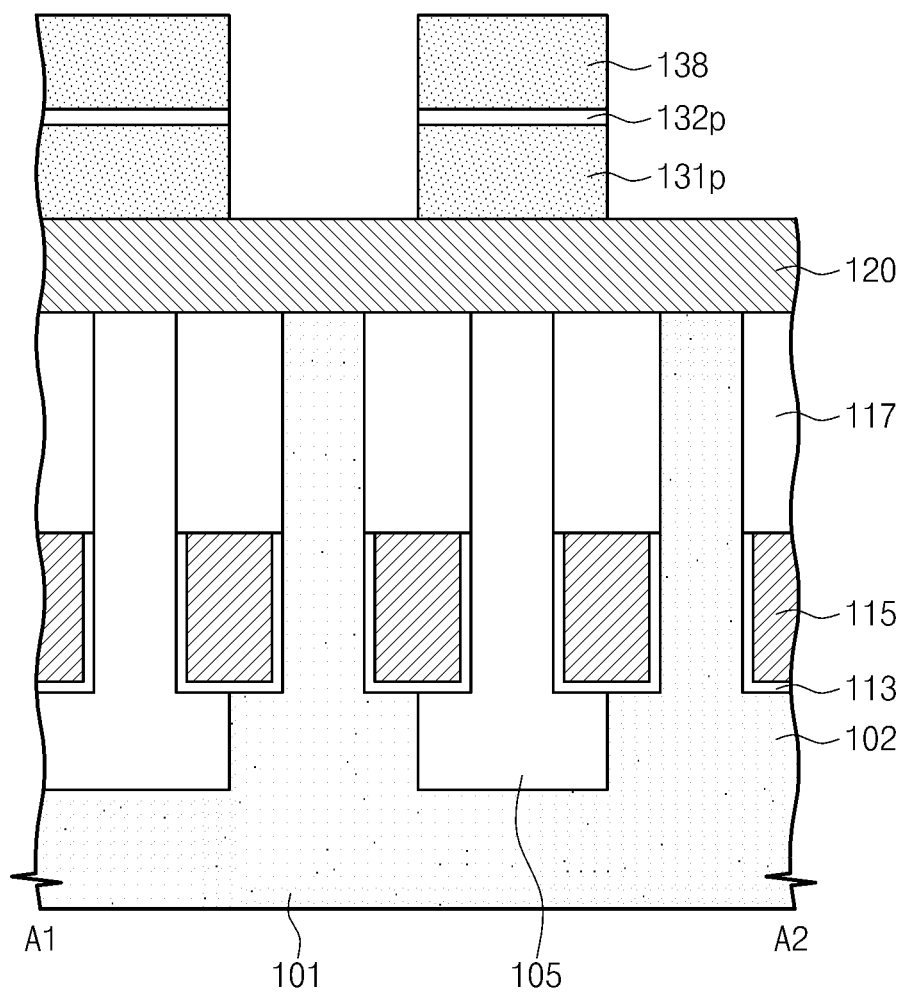
Figure 10C:
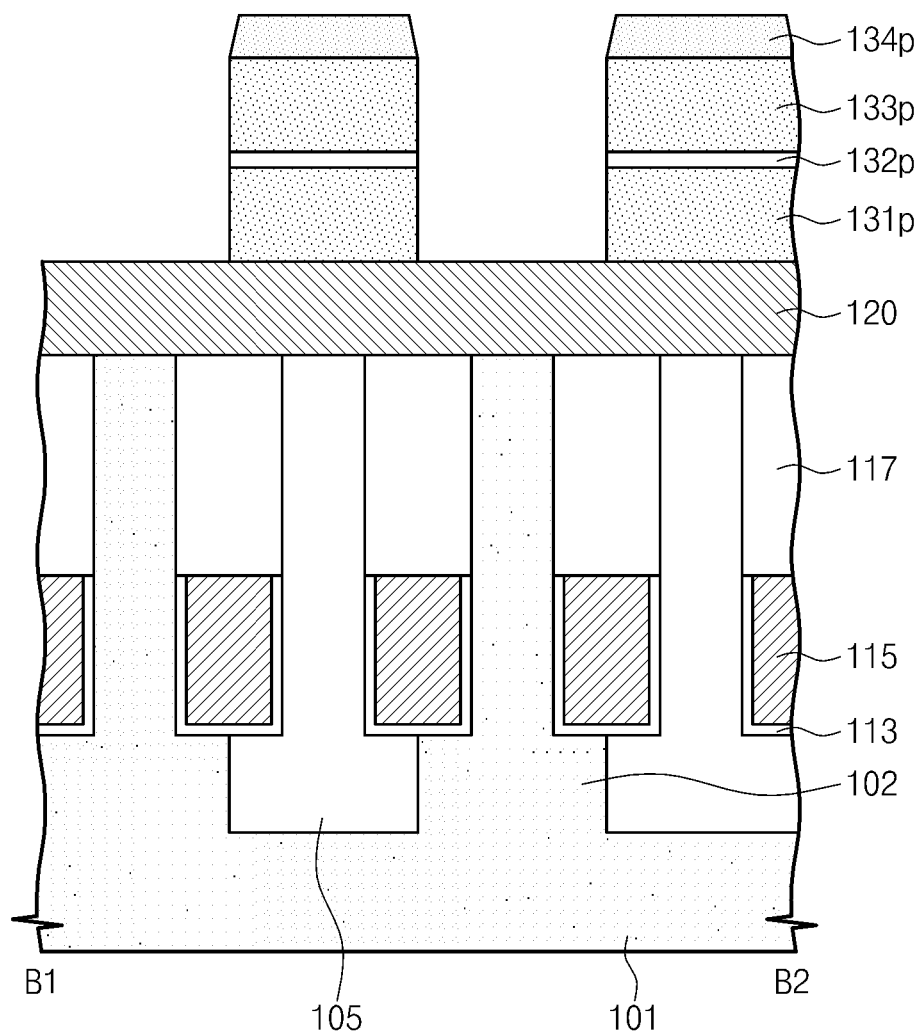

Referring to FIGS. 10A, 10B and 10C, the second mask layer 132 and the first mask layer 131 may be selectively etched to form a second mask pattern 132p and a first mask pattern 131p, respectively. During the etching process to the second mask layer 132 and the first mask layer 131, the second hardmask layer 138 on the line A1-A2 may act as an etch mask and the fourth mask pattern 134p on the line B1-B2 may serve as an etch mask. As a result of the etching process, the conductive layer 120 may be partially exposed to have an island shape.

After the etching process, the second hardmask layer 138 and the fourth mask pattern 134p may be removed by a single process or separate processes. Alternatively, if the fourth mask pattern 134p is formed of a material substantially identical or similar to that of the conductive layer 120, the fourth mask pattern 134p may be removed together with the conductive layer 120 when a succeeding etching process (which is described with reference to FIGS. 11A to 11C) to the conductive layer 120 is performed.

Figure 11A:
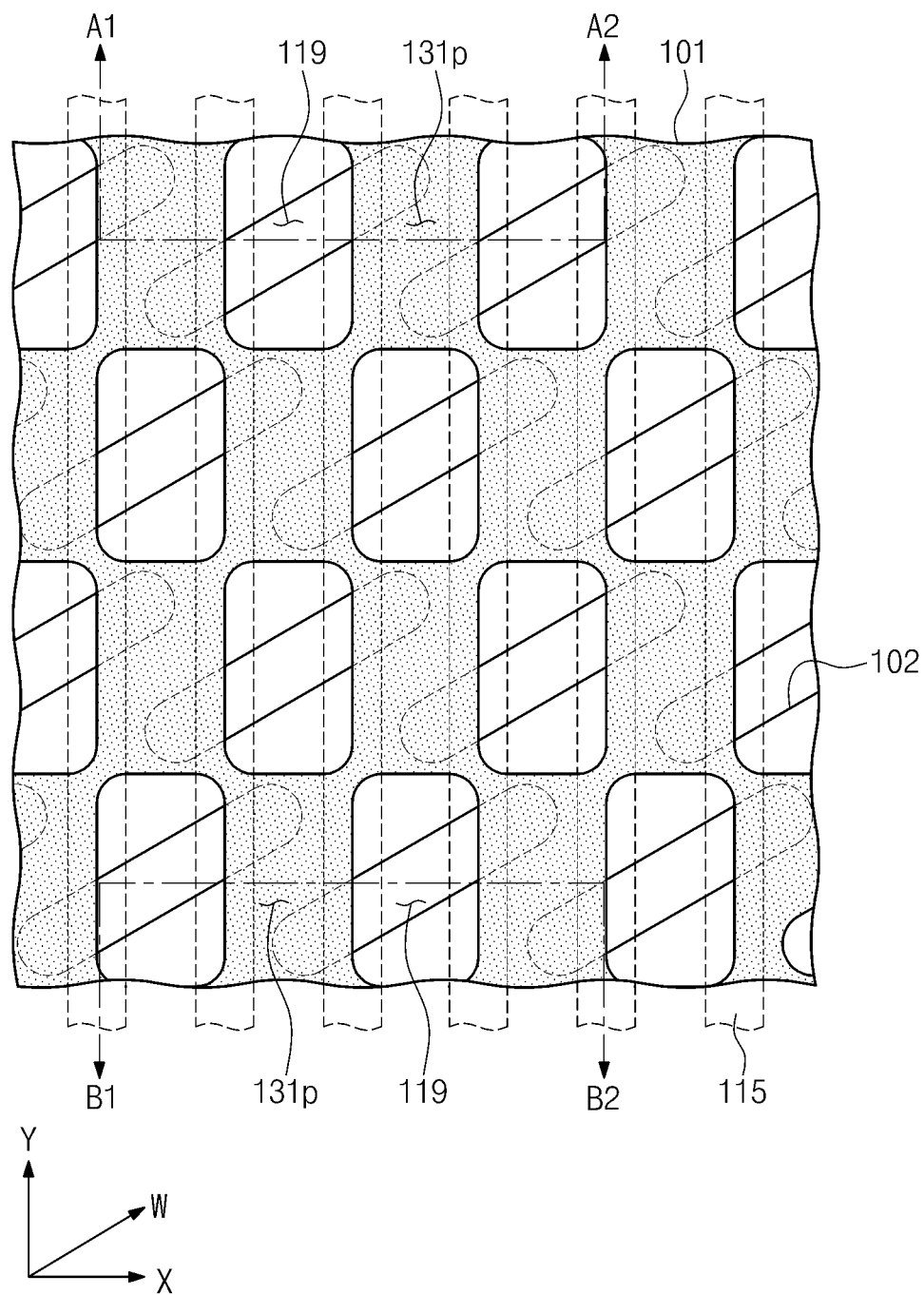
Figure 11B:
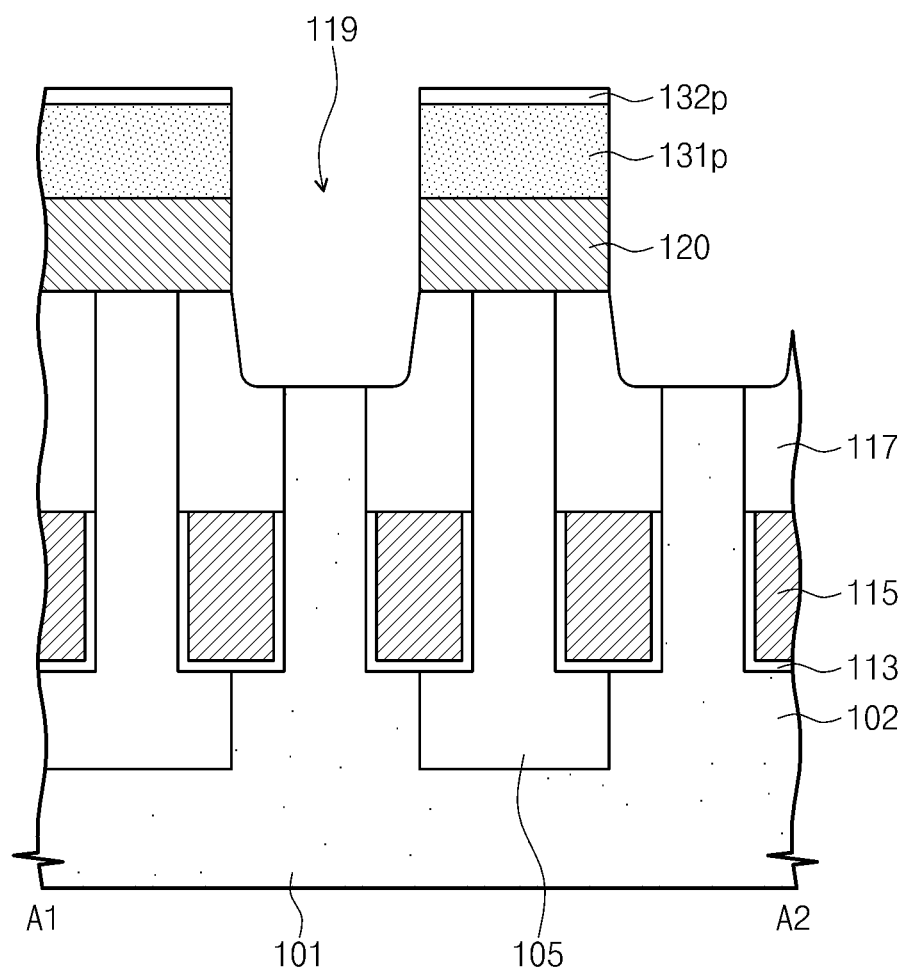
Figure 11C:
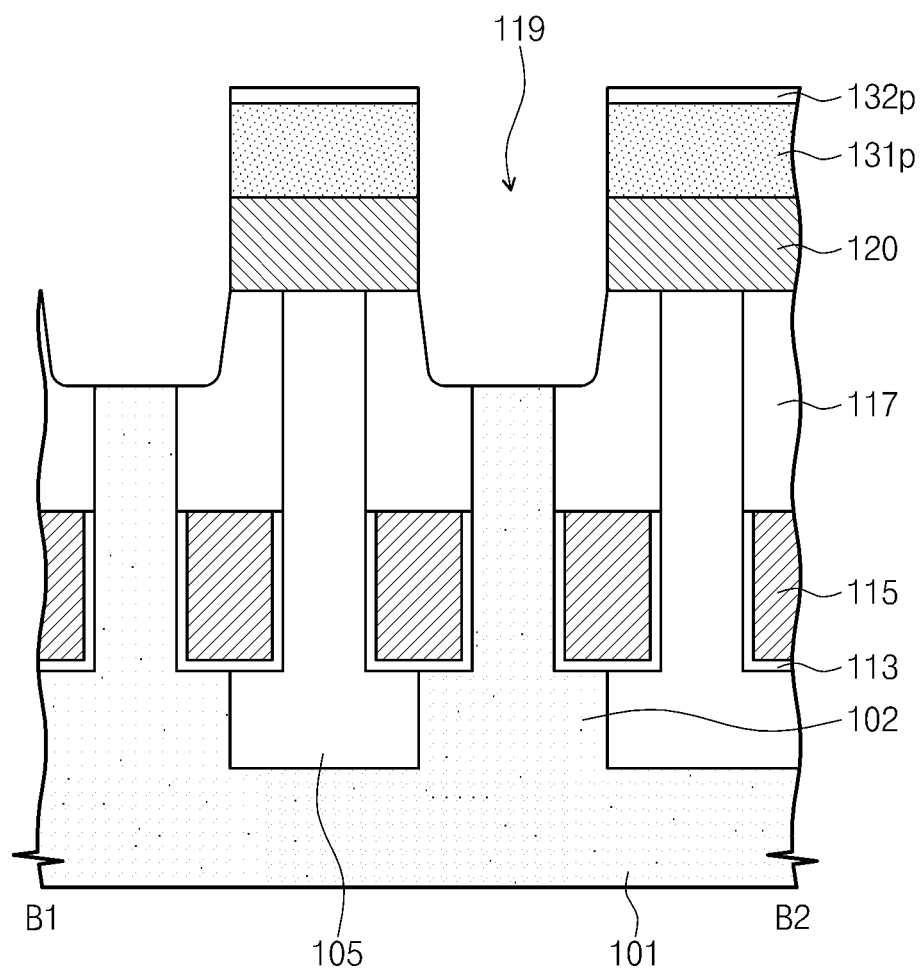

Referring to FIGS. 11A, 11B and 11C, the conductive layer 120 may be etched to form contact holes 119 exposing the active regions 102 by an etching process using the second mask pattern 132p and the first mask pattern 131p as an etch mask. The active region 102 and the capping layer 117 may be partially etched simultaneously with the conductive layer 120. The contact hole 119 may have a floor lower than a bottom surface of the conductive layer 120. After forming the contact hole 119, the first and second mask patterns 131p and 132p may be removed.

In some embodiments, the first mask patterns 131p may be formed to have closely packed island shapes even the line patterning process which was described with reference to FIGS. 10A, 10B and 10C is performed. The first mask pattern 131p may be used as an etch mask in the etching process for the contact hole 119. As a result, the contact holes 119 may be formed to have closely packed island shapes. For example, the contact holes 119 may have rectangular shapes that are regularly spaced apart from each other in the first direction Y and the second direction X. The contact hole 119 may expose a central part of the active region 102 and vertically overlap with portions of the adjacent word lines 115.

Figure 12A:
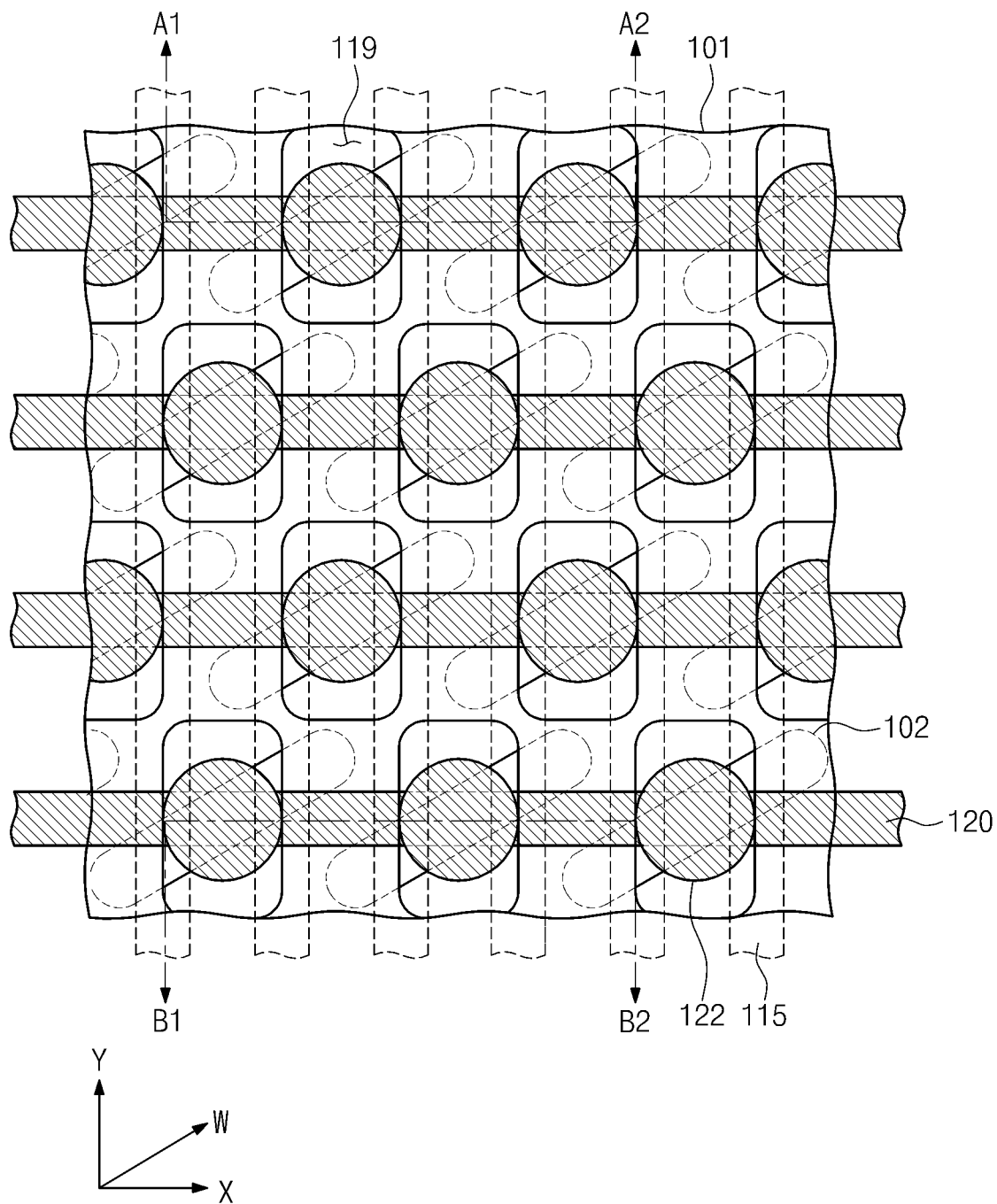
Figure 12B:
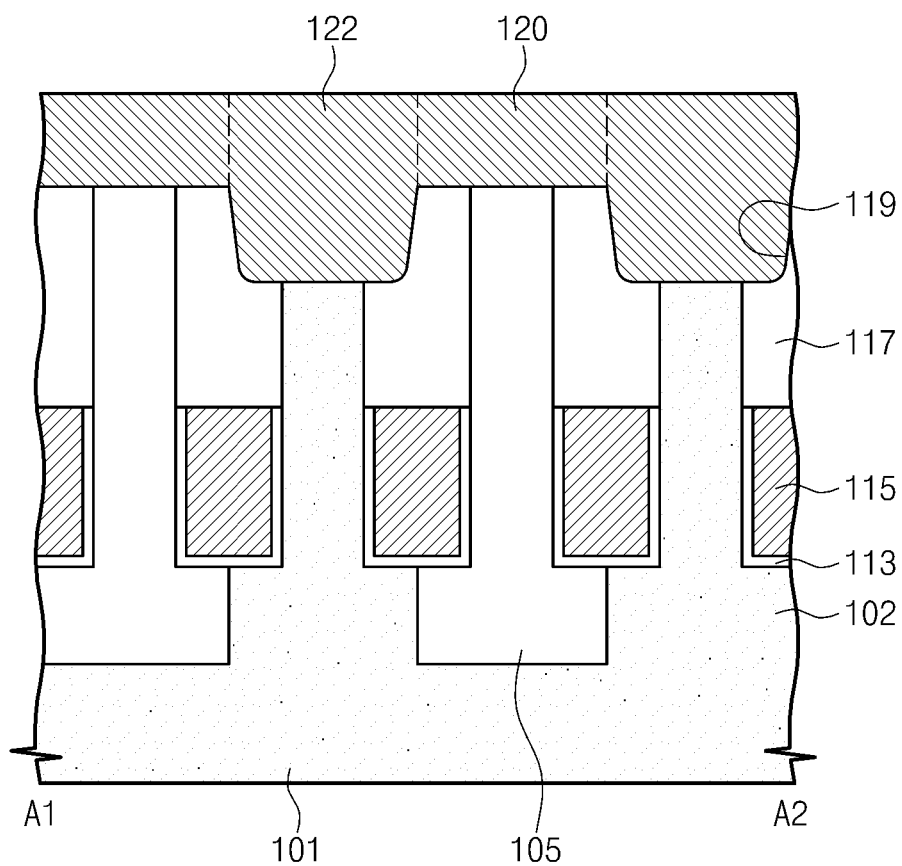
Figure 12C:
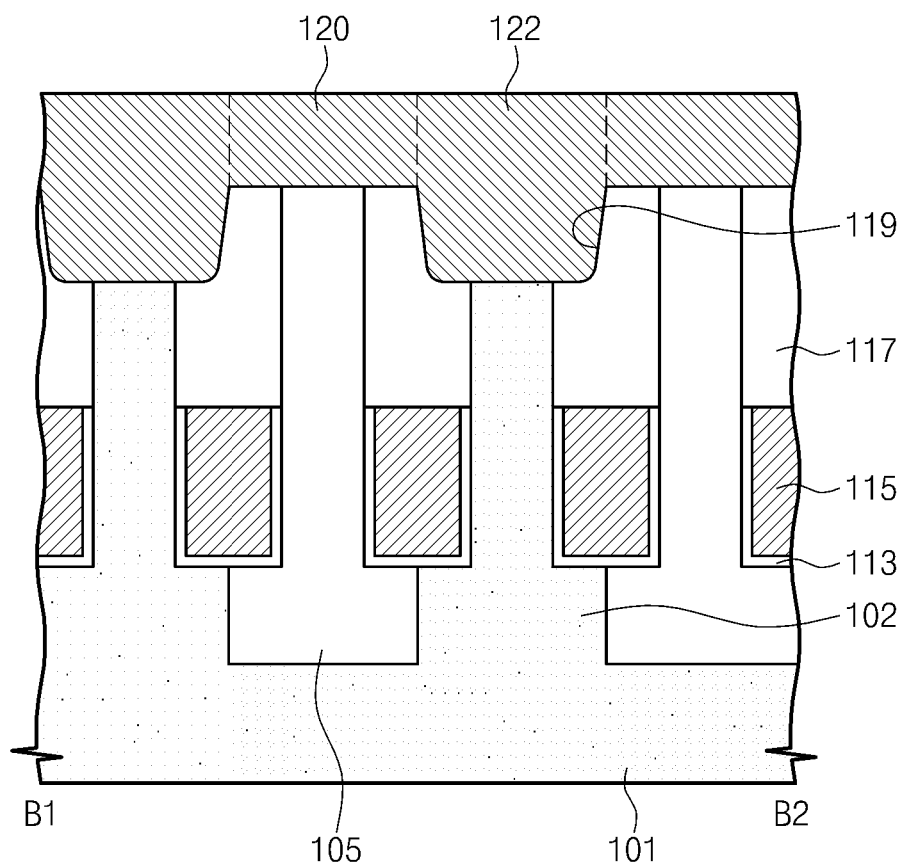
Figure 13A:
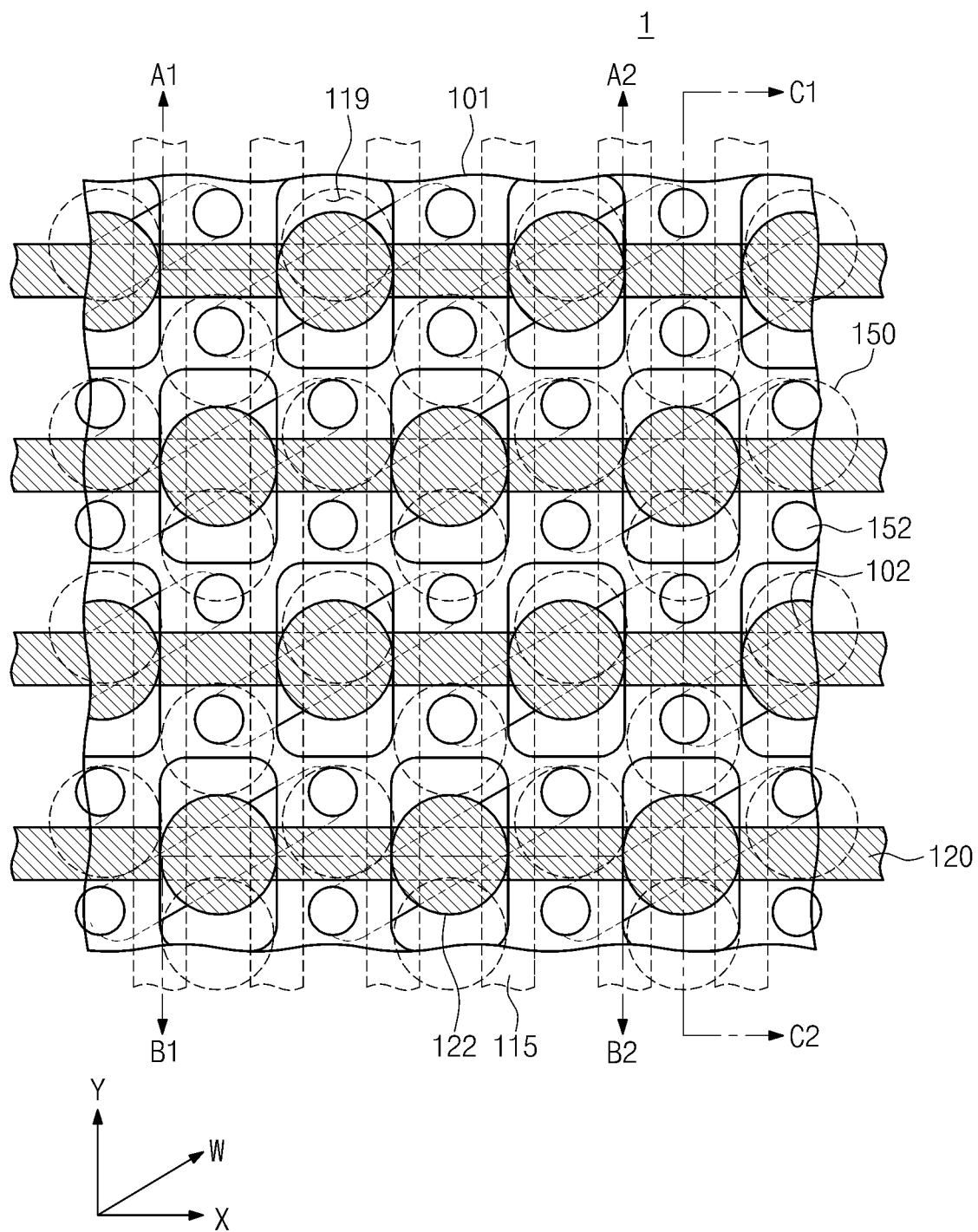
Figure 13B:
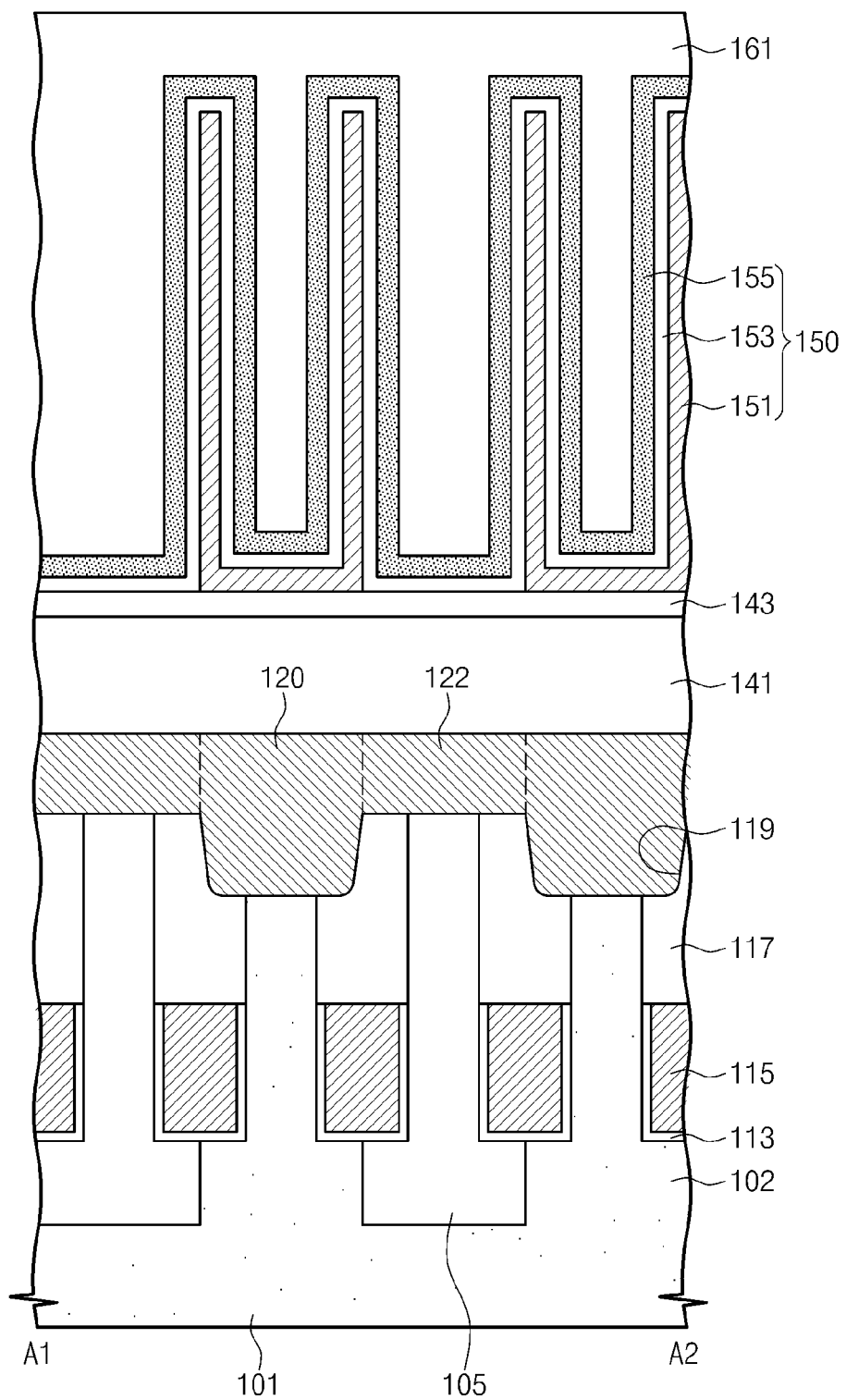
Figure 13C:
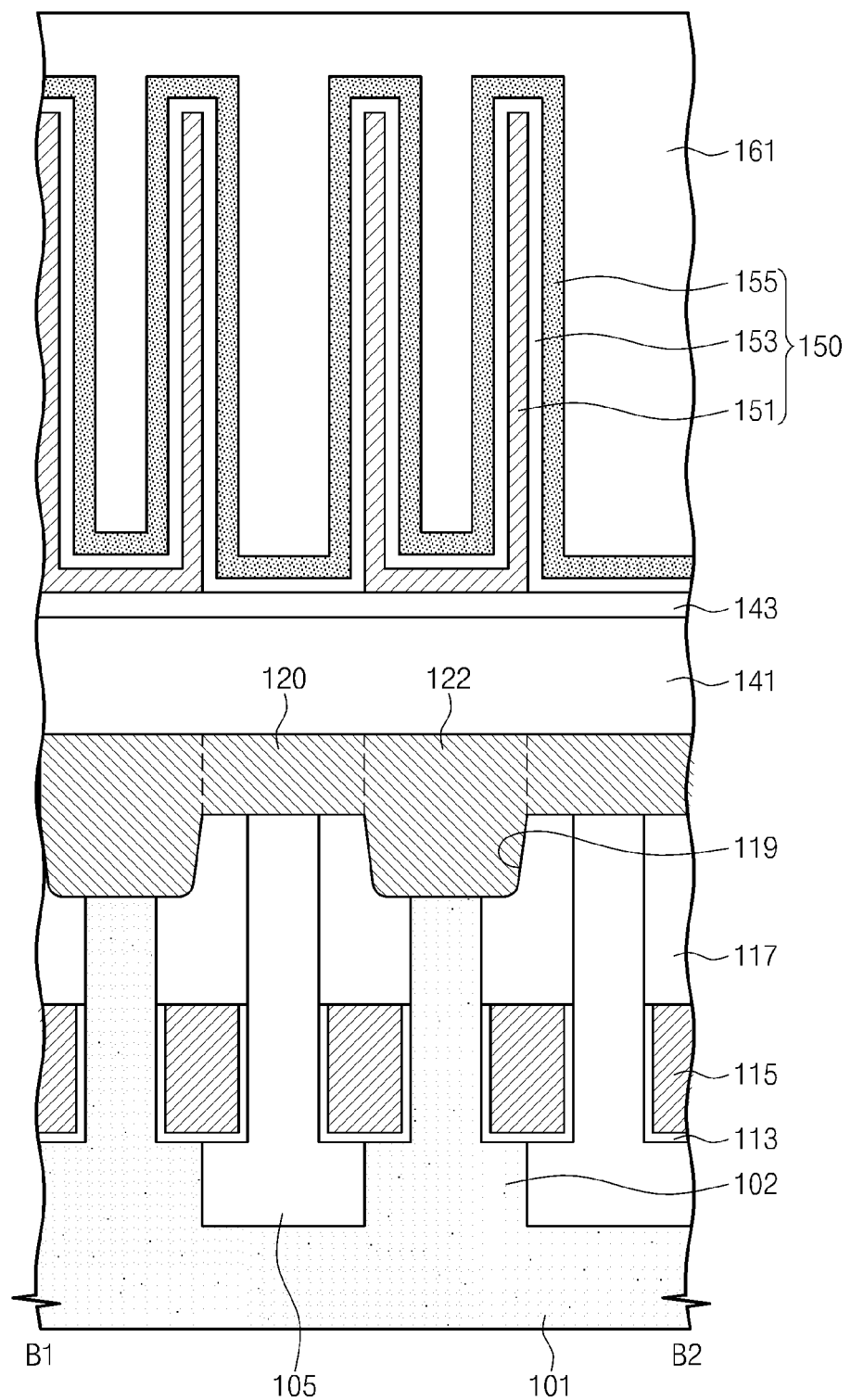
Figure 13D:
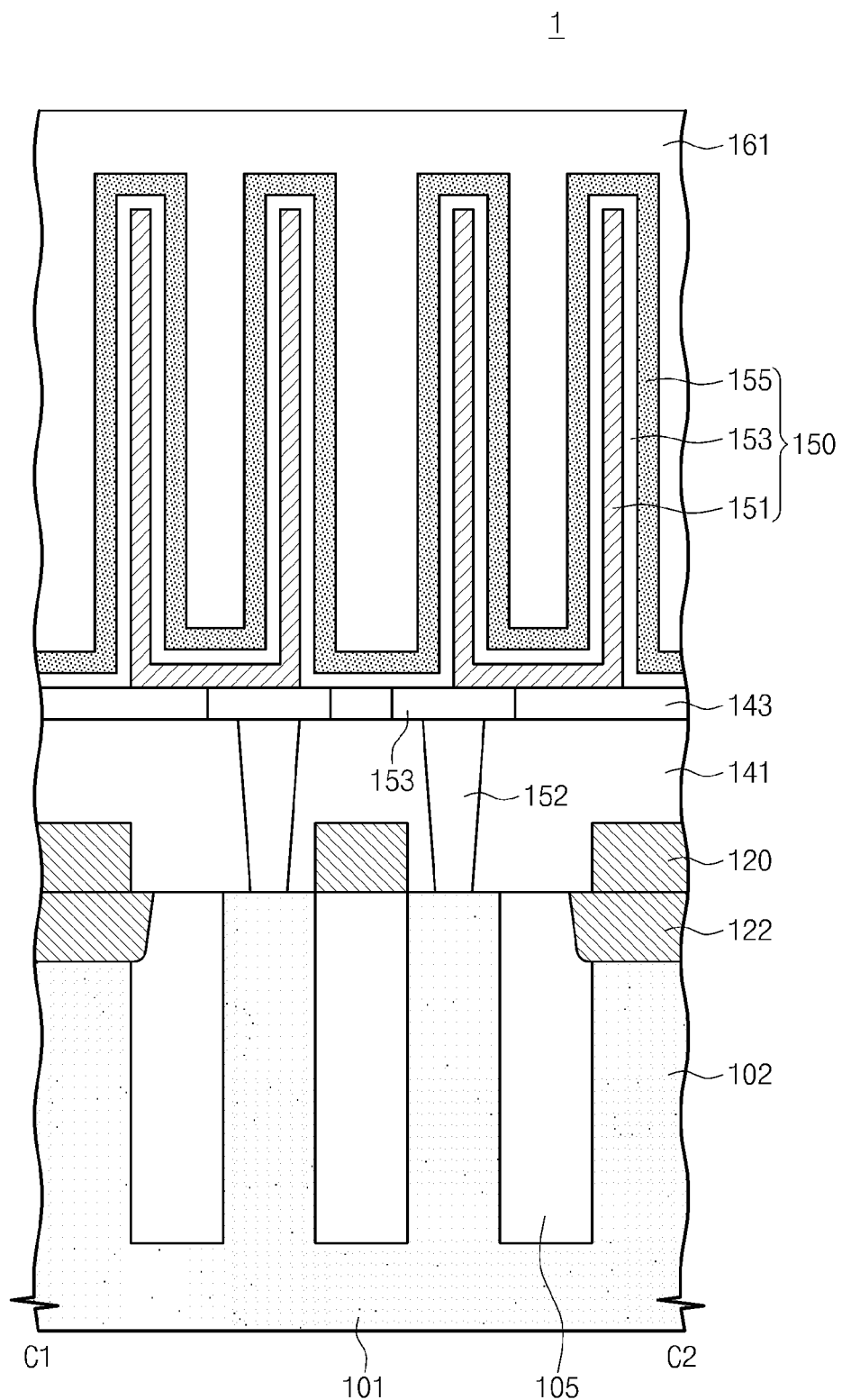
FIG. 13D is a cross-sectional view taken along the line C1-C2 of FIG. 1A.

Referring to FIGS. 12A, 12B and 12C, the contact hole 119 may be filed with a conductive material to form a contact 122 electrically connected to the active region 102. For example, the conductive material may be deposited to fill the contact hole 119 and then the deposited conductive material may be planarized to form the contact 122. The contact 122 may electrically connect the conductive layer 120 to the active region 102. The conductive layer 120 may constitute a bit line electrically connected to the substrate 101 through the contact 122. The conductive layer 120 may be hereinafter referred to as a bit line.

Referring to FIGS. 13A, 13B, 13C and 13D, a second contact 152 may be further formed to be electrically connected to the active region 102 and a capacitor 150 may be further formed to be electrically connected to the second contact 152, thereby fabricating a semiconductor device 1. For example, a first inter-dielectric layer 141 may be formed on the substrate 101 to cover the bit line 120, and the second contact 152 passing through the first inter-dielectric layer 141 may be formed to be coupled to the active region 102. A pad 153 may be further formed on the first inter-dielectric layer 141 to be electrically connected to the second contact 152, and a second inter-dielectric layer 143 may be further formed on the first inter-dielectric layer 141. A lower electrode 151, a dielectric layer 153, and an upper electrode 155 may be sequentially deposited on the second inter-dielectric layer 143 to form the capacitor 150. A third inter-dielectric layer 161 may be further formed to cover the capacitor 150.

Figure 14A:
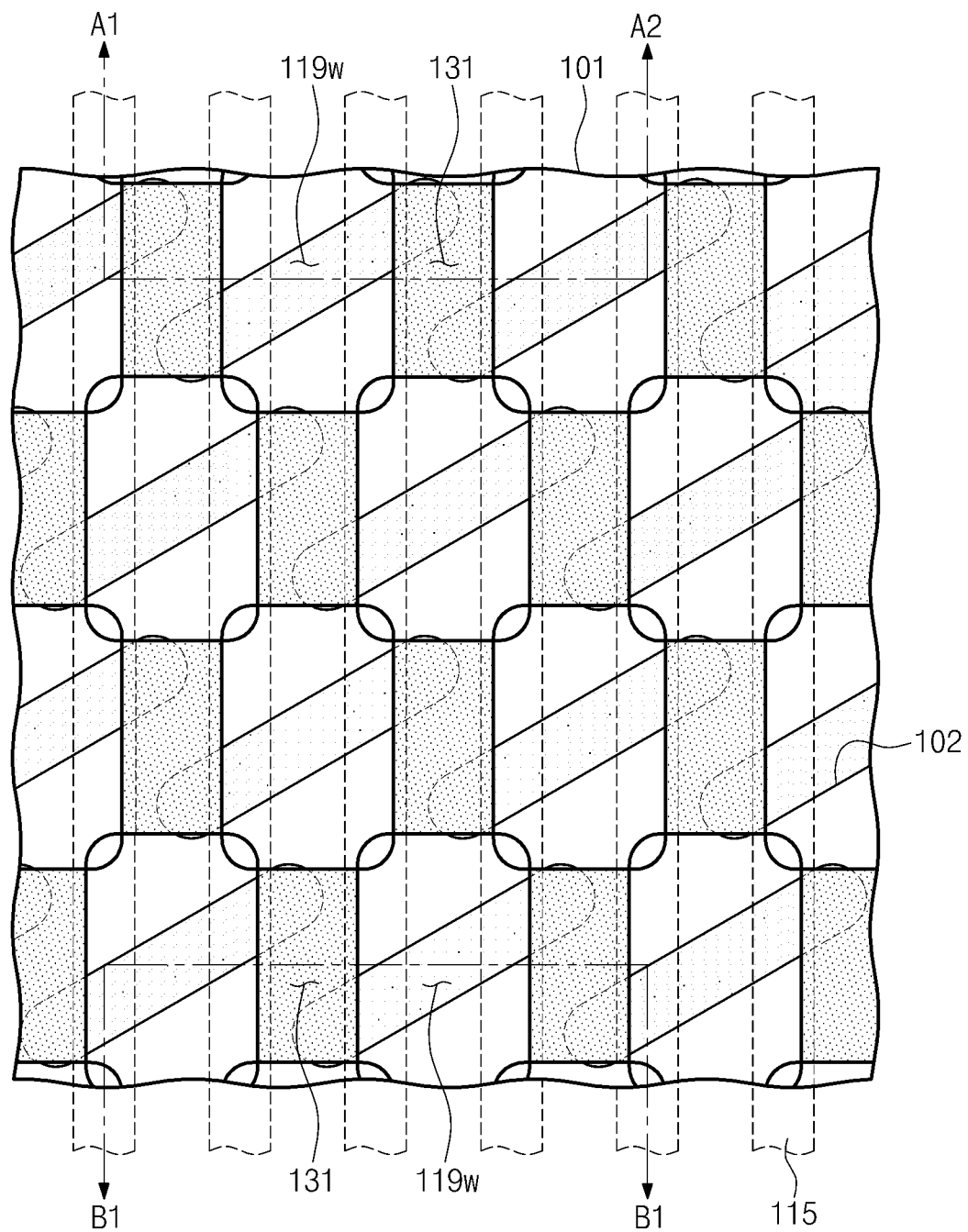
FIG. 14A is a plan view illustrating a method for forming a contact hole according to another example embodiment of the present inventive concepts.
Figure 14B:
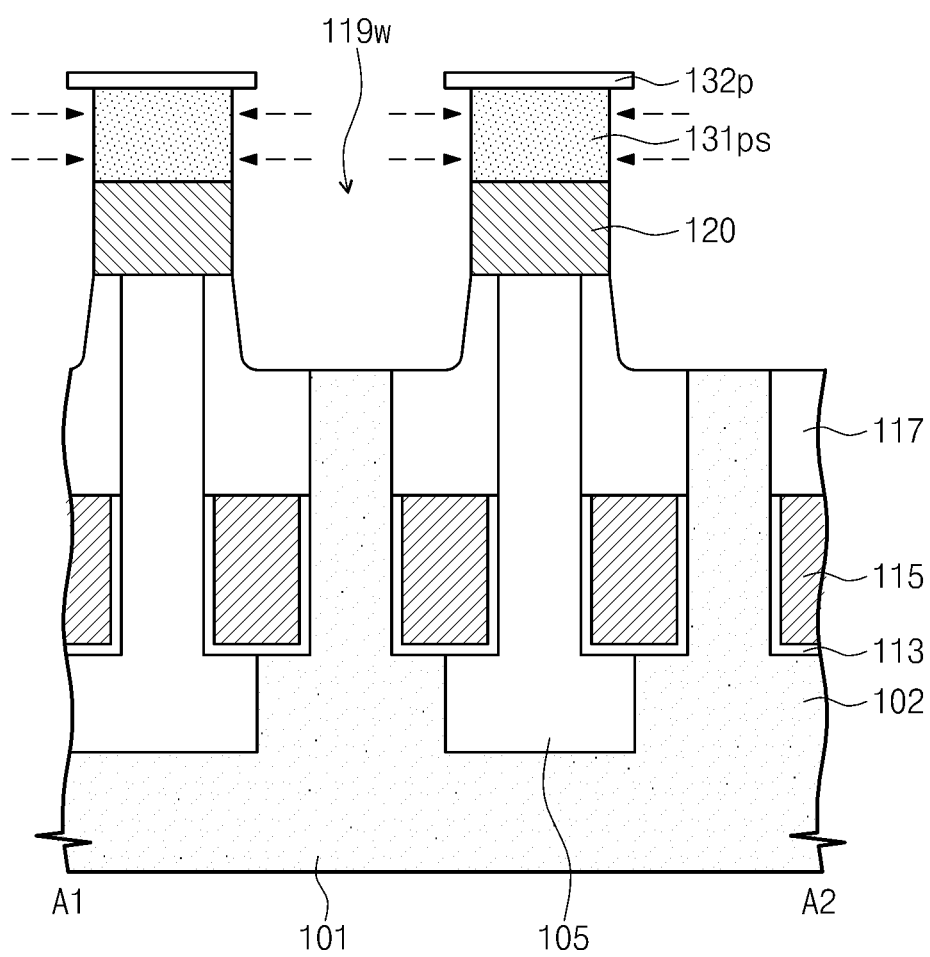
FIG. 14B is a cross-sectional view taken along the line A1-A2 of FIG. 14A.
Figure 14C:
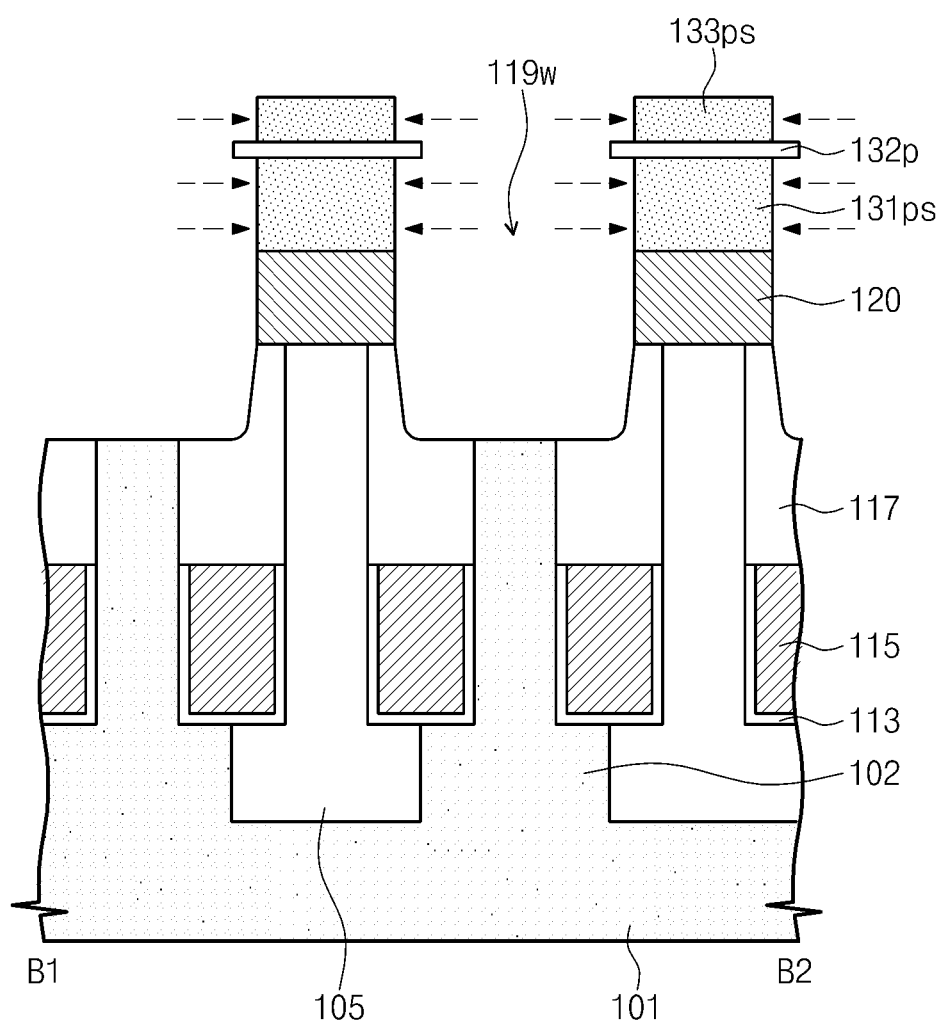
FIG. 14C is a cross-sectional view taken along the line B1-B2 of FIG. 14A.

FIG. 14A is a plan view illustrating a method for forming a contact hole according to another example embodiment of the present inventive concepts. FIG. 14B is a cross-sectional view taken along a line A1-A2 of FIG. 14A. FIG. 14C is a cross-sectional view taken along a line B1-B2 of FIG. 14A.

Referring to FIGS. 14A, 14B and 14C, before forming the contact hole 119 described with reference to FIGS. 11A, 11B and 11C, the first mask pattern 131p and the third mask pattern 133p may be scaled down. For example, a wet etching process may be performed to recess sidewalls of the first and third mask patterns 131p and 133p to form a first mask reduced pattern 131ps and a third mask reduced pattern 133ps. An etching process using the first and third mask reduced patterns 131ps and 133ps as an etch mask may be performed to the conductive layer 120 to form a wide contact hole 119w having a relatively enlarged volume and/or wide width compared to the contact hole 120 of FIGS. 11A, 11B and 11C.

Figure 15A:
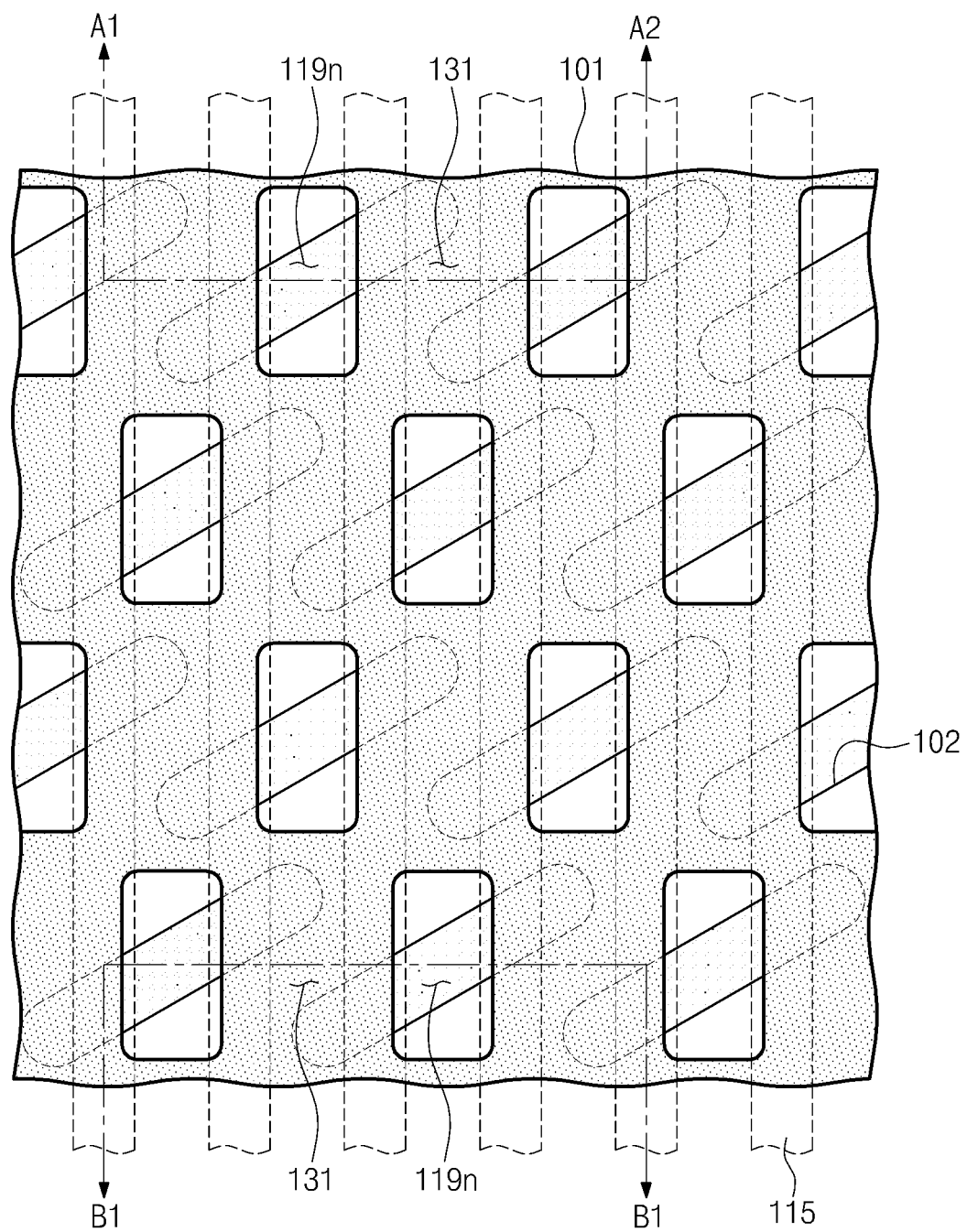
FIG. 15A is a plan view illustrating a method for forming a contact hole according to other example embodiment of the present inventive concepts.
Figure 15B:
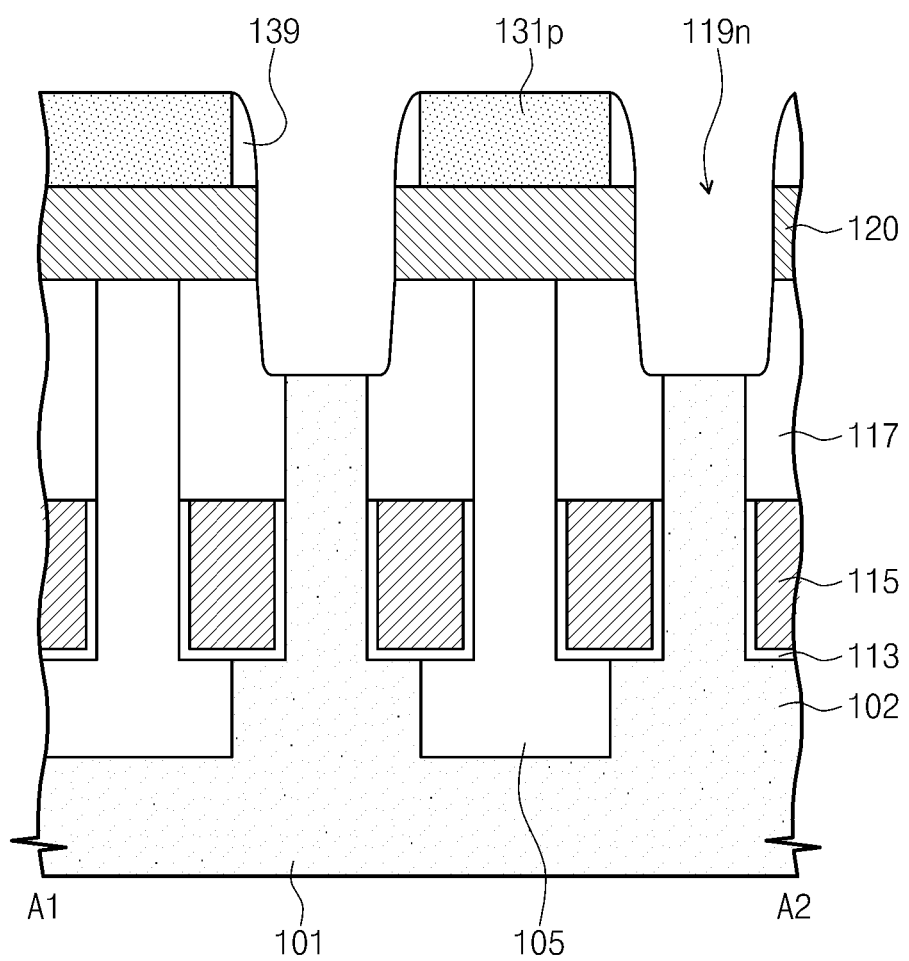
FIG. 15B is a cross-sectional view taken along the line A1-A2 of FIG. 15A.
Figure 15C:
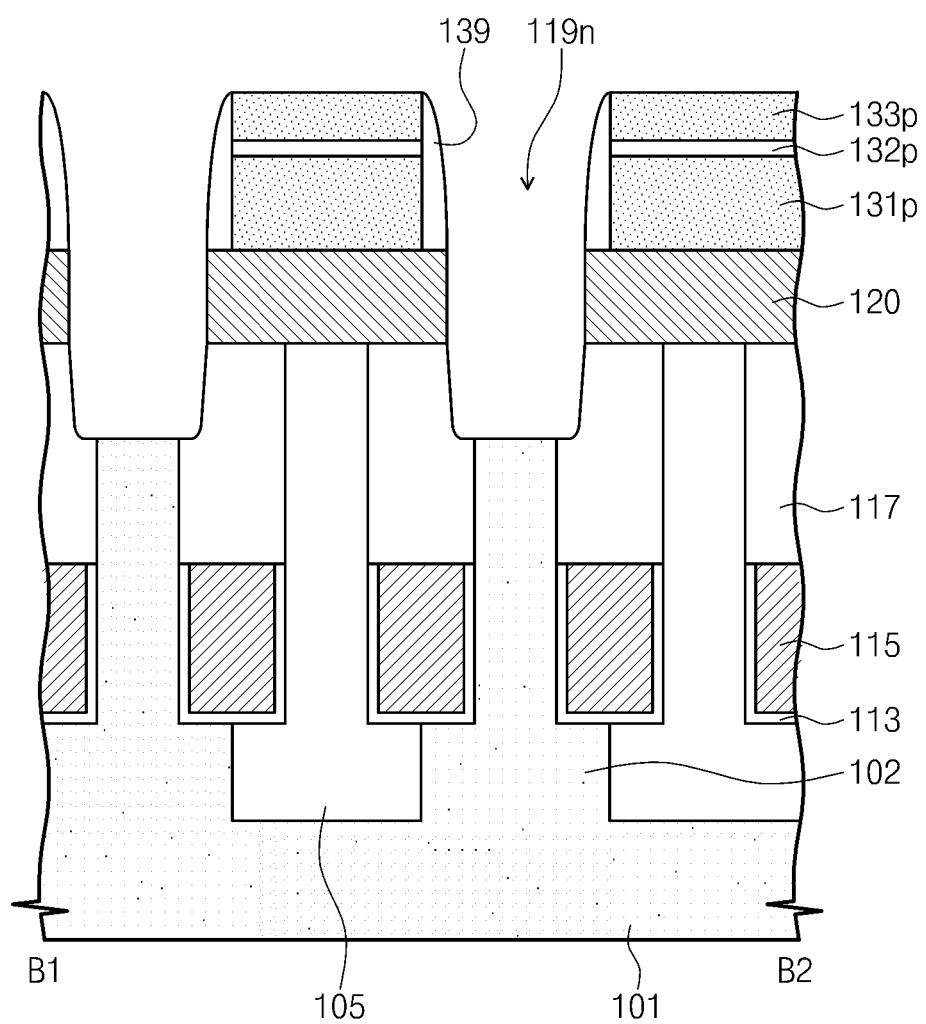
FIG. 15C is a cross-sectional view taken along the line B1-B2 of FIG. 15A.

FIG. 15A is a plan view illustrating a method for forming a contact hole according to other example embodiment of the present inventive concepts. FIG. 15B is a cross-sectional view taken along the line A1-A2 of FIG. 15A. FIG. 15C is a cross-sectional view taken along a line B1-B2 of FIG. 15A.

Referring to FIGS. 15A, 15B and 15C, before forming the contact hole 119 described with reference to FIGS. 11A, 11B and 11C, the first mask pattern 131p and the third mask pattern 133p may be enlarged. For example, an oxide layer may be deposited and patterned to form spacers 139 on sidewalls of the first and third mask patterns 131p and 133p. An etching process using the first and third mask patterns 131ps and 133ps having the spacers 139 as an etch mask may be performed to the conductive layer 120 to form a narrow contact hole 119n having a relatively reduced area and/or narrow width compared to the contact hole 120 of FIGS. 11A, 11B and 11C.

FIGS. 16A to 28A are plan views illustrating a method for forming an active region according to an example embodiment of the present inventive concepts. FIGS. 16B to 28B are cross-sectional views taken along lines D1-D2 in cell regions of FIGS. 16A to 28A. FIGS. 16C to 28C are cross-sectional views taken along lines E1-E2 in cell regions of FIGS. 16A to 28A. FIGS. 16D to 28D are cross-sectional view of peripheral regions of FIGS. 16A to 28A. FIG. 29 is a plan view illustrating a semiconductor device according to another example embodiment of the present inventive concepts.

Referring to FIGS. 16A, 16B, 16C and 16D, a lower mask layer 201 and an upper mask layer 203 may be sequentially stacked on a substrate 101. The lower mask layer 201 may have a material having an etch selectivity with respect to that of the upper mask layer 203. For example, the lower mask layer 201 may be formed of an insulating layer such as a silicon oxide layer and the upper mask layer 203 may be formed of a semiconductor layer or a conductive layer such as a polysilicon layer.

Figure 16A:
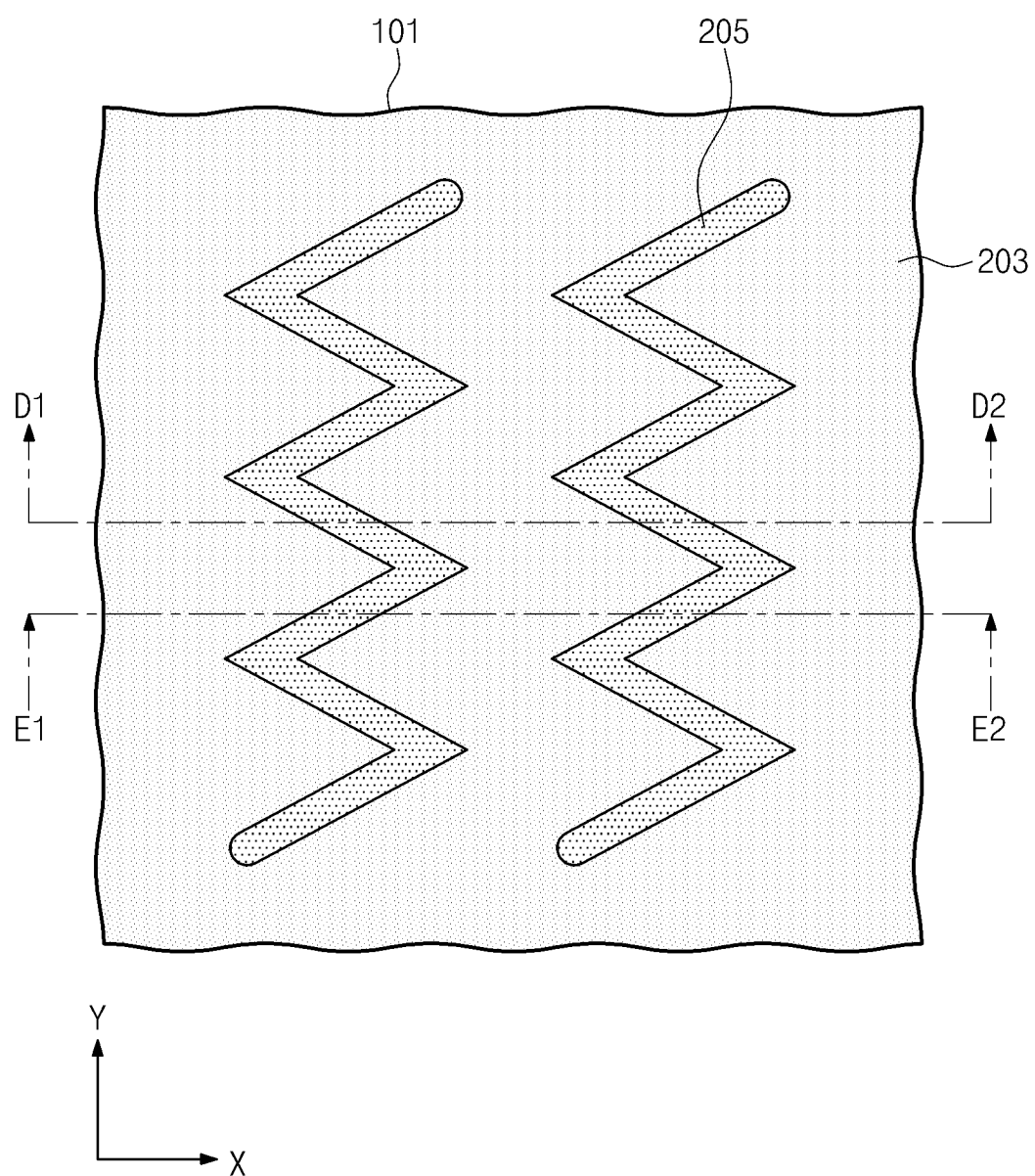
Figure 16B:
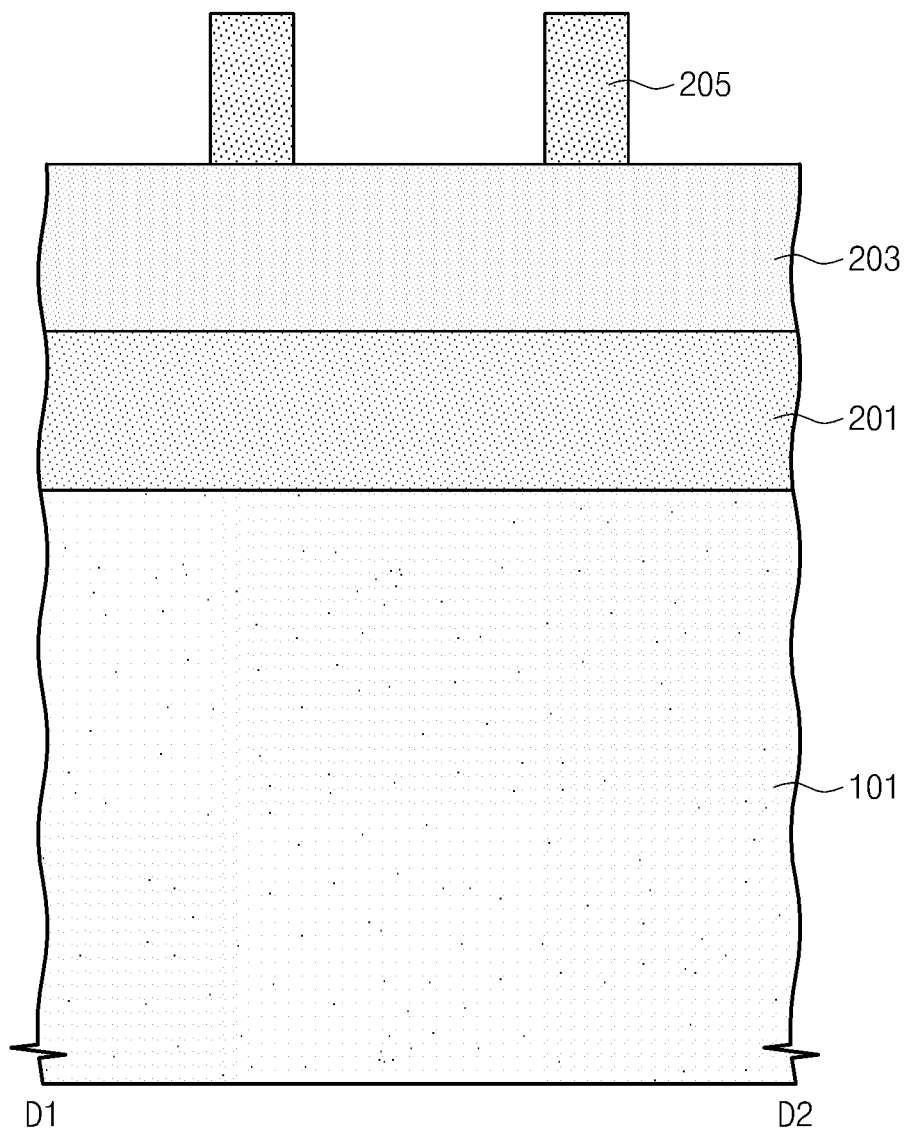
Figure 16C:
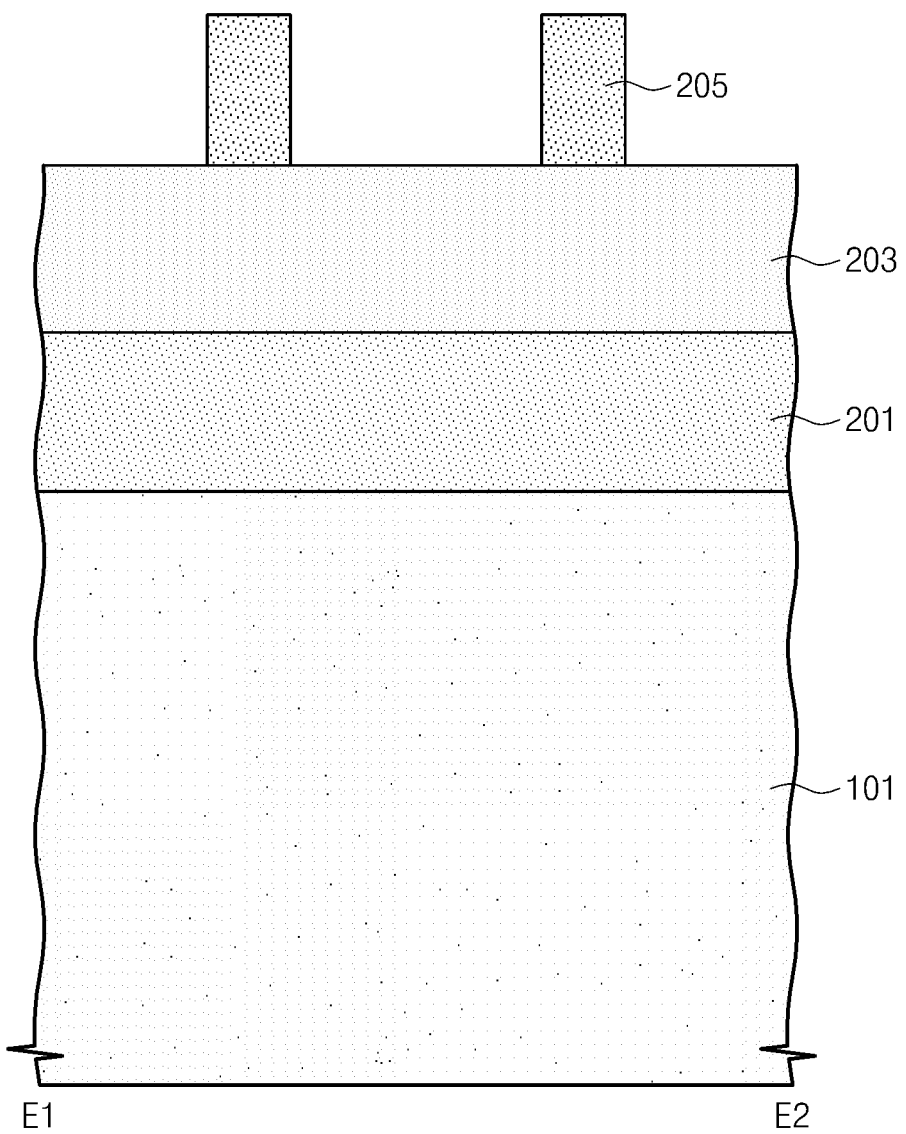
Figure 16D:
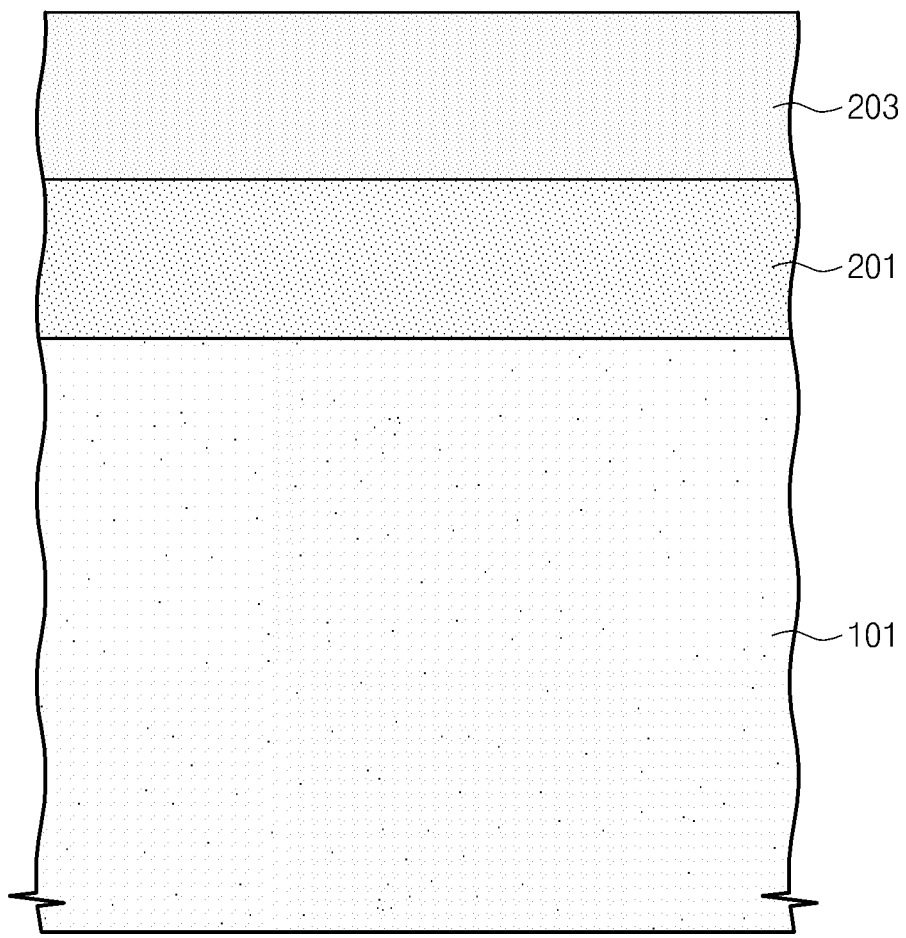

A plurality of first hardmask layers 205 may be formed on the upper mask layer 203. The first hardmask layers 205 may extend in a first direction Y and be spaced apart from each other in a second direction X. Each of the first hardmask layers 205 may have a wavy or herringbone shape extending in the first direction Y. The first hardmask layers 205 may be formed of a material (e.g., SiON, SiC, SiN, SiCN, etc.) having an etch selectivity with respect to the lower and upper mask layers 201 and 203. The first hardmask layers 205 may be formed in a cell region as illustrated in FIGS. 16B and 16C, but may not be formed in a peripheral region as illustrated in FIG. 16D.

Figure 17A:
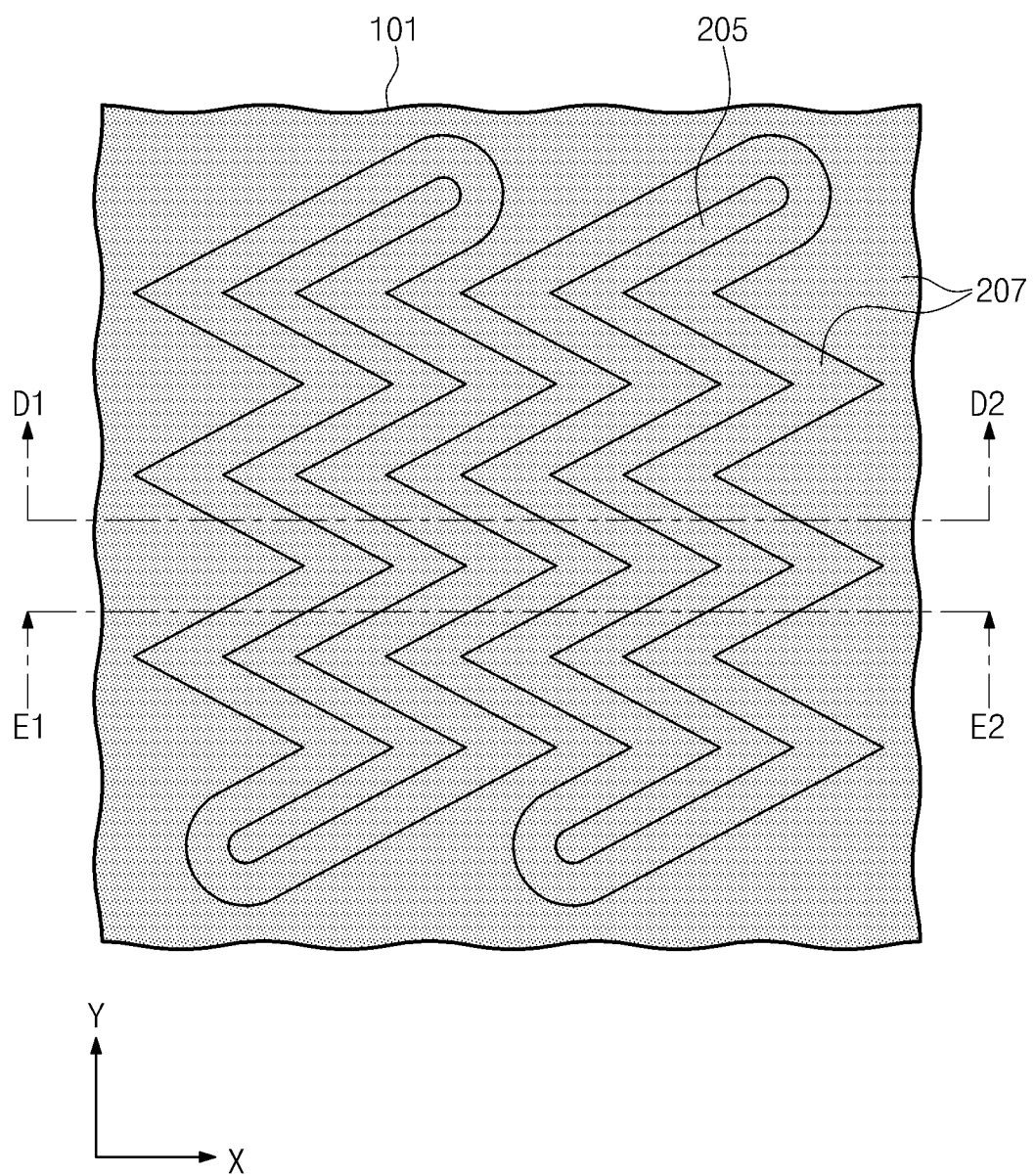
Figure 17B:
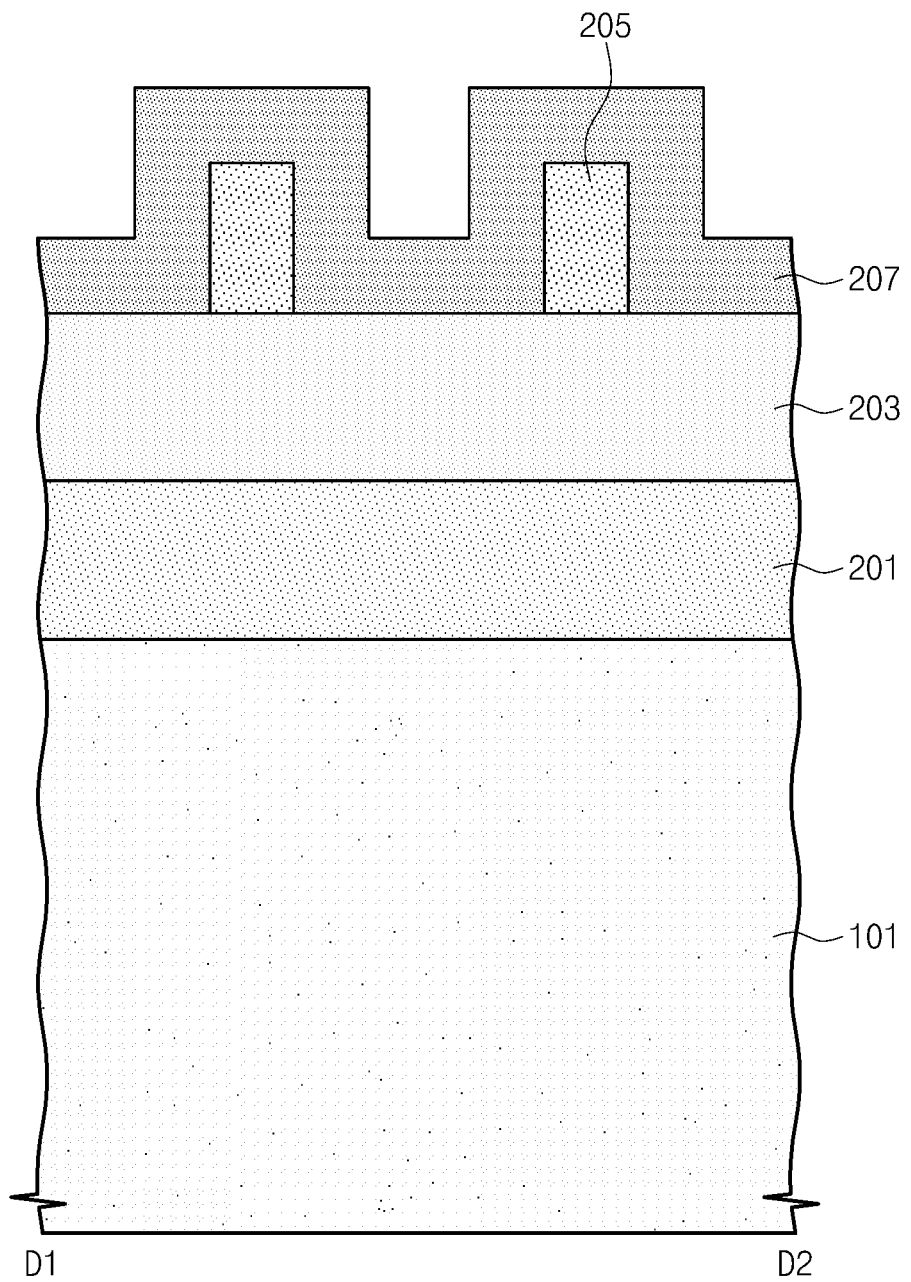
Figure 17C:
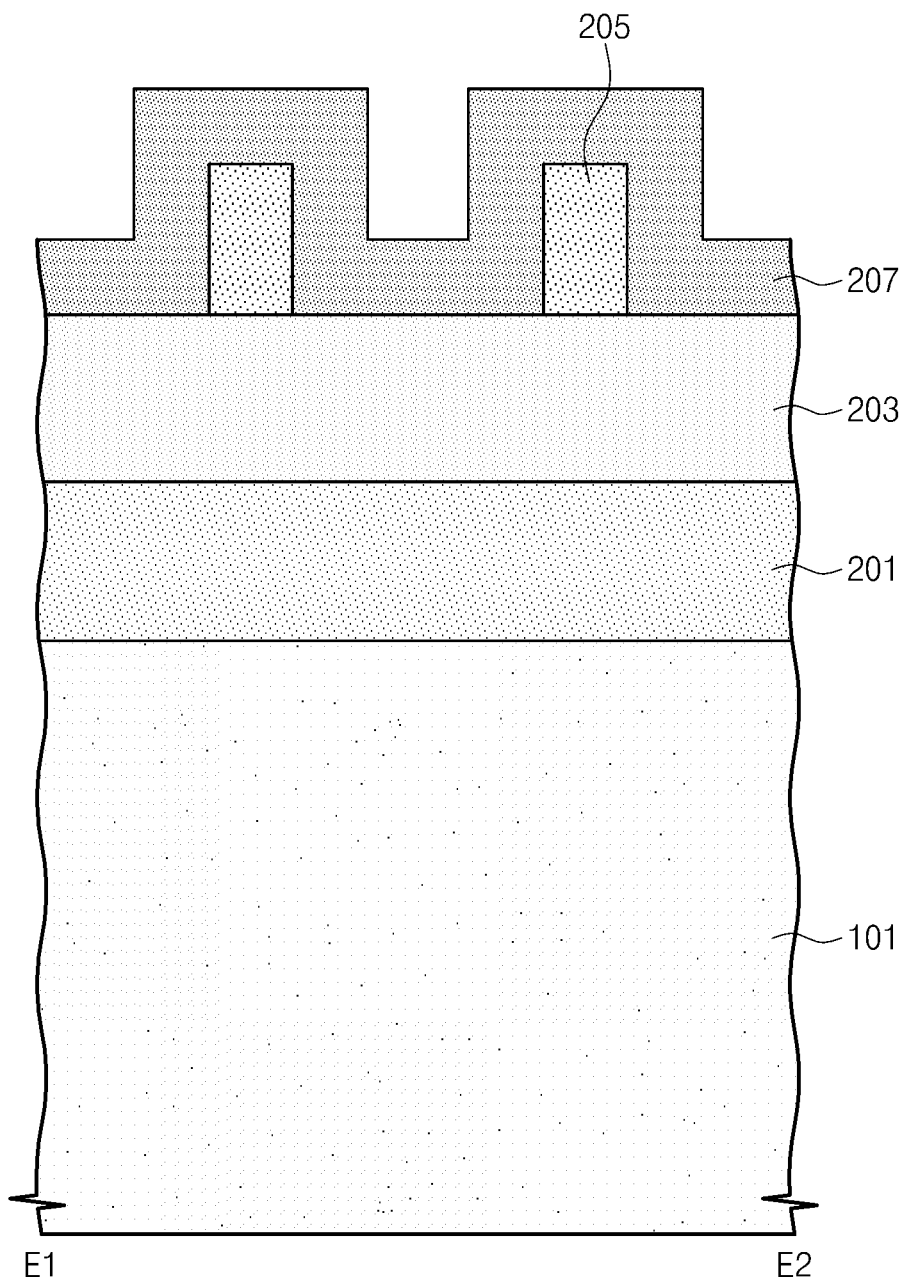
Figure 17D:
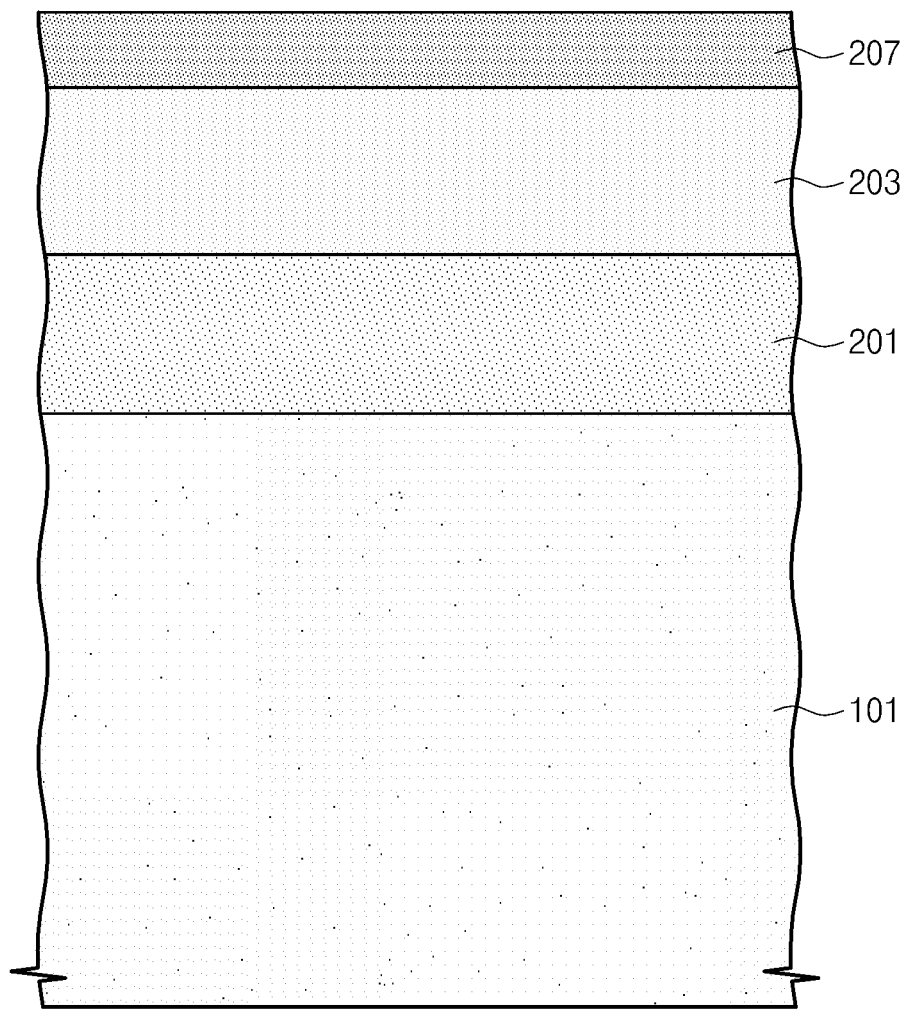
Figure 18A:
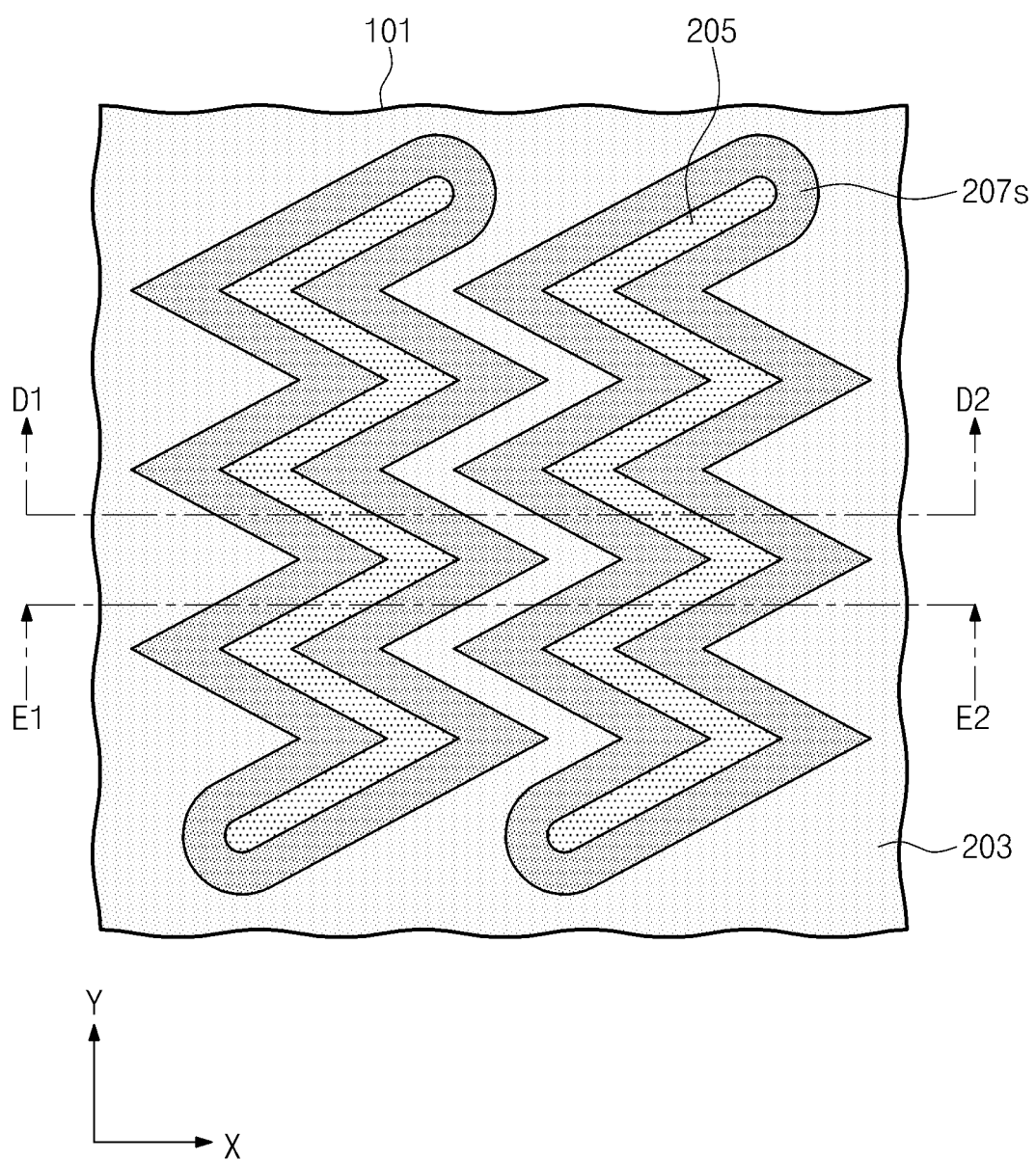
Figure 18B:
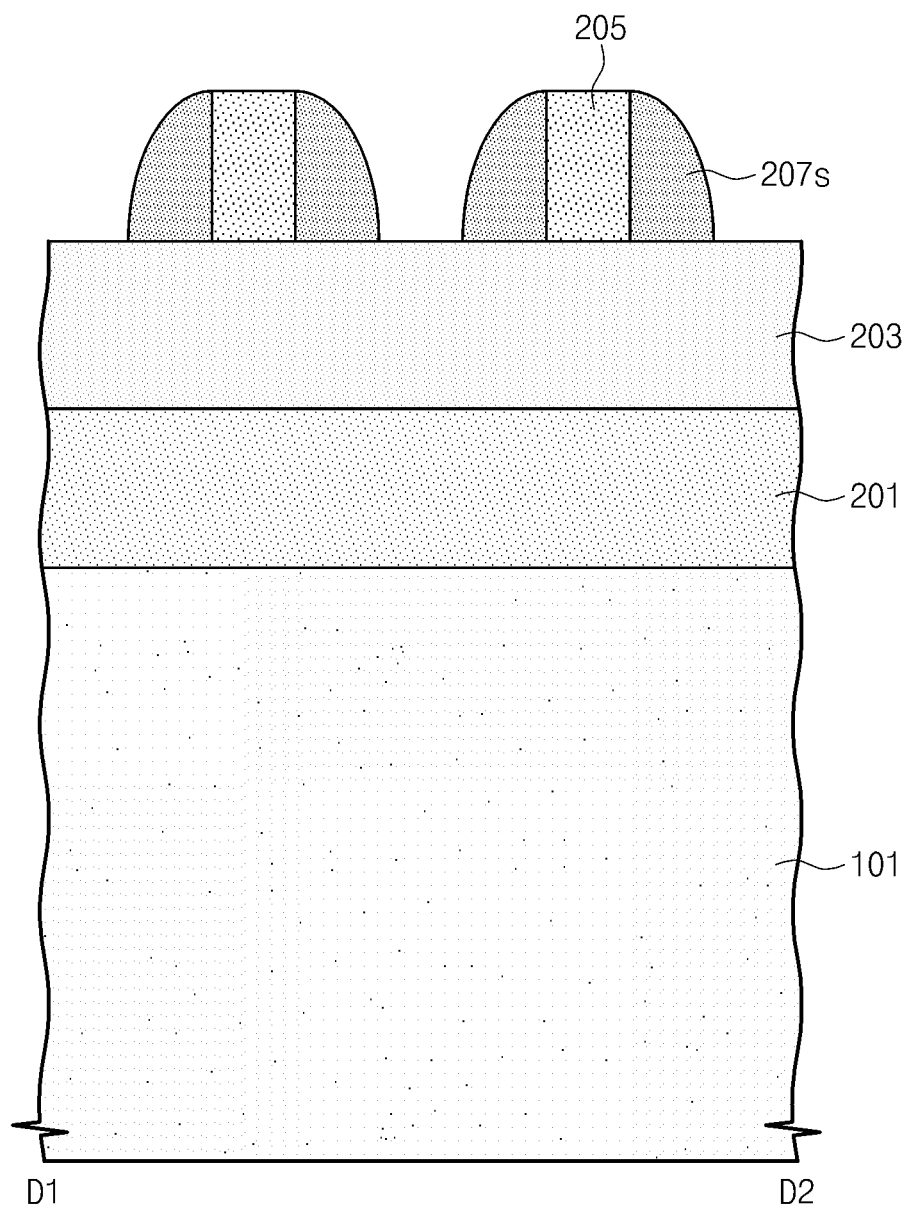
Figure 18C:
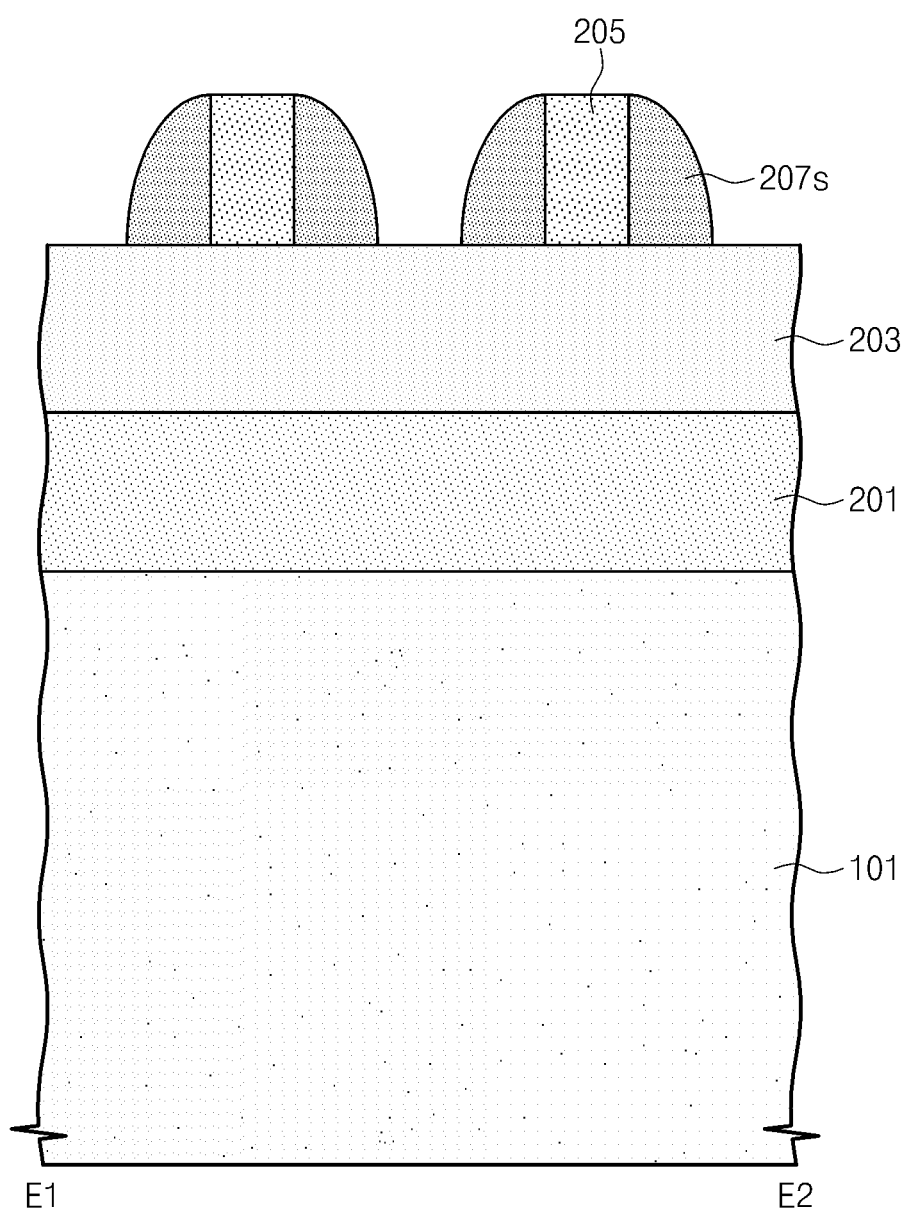
Figure 18D:
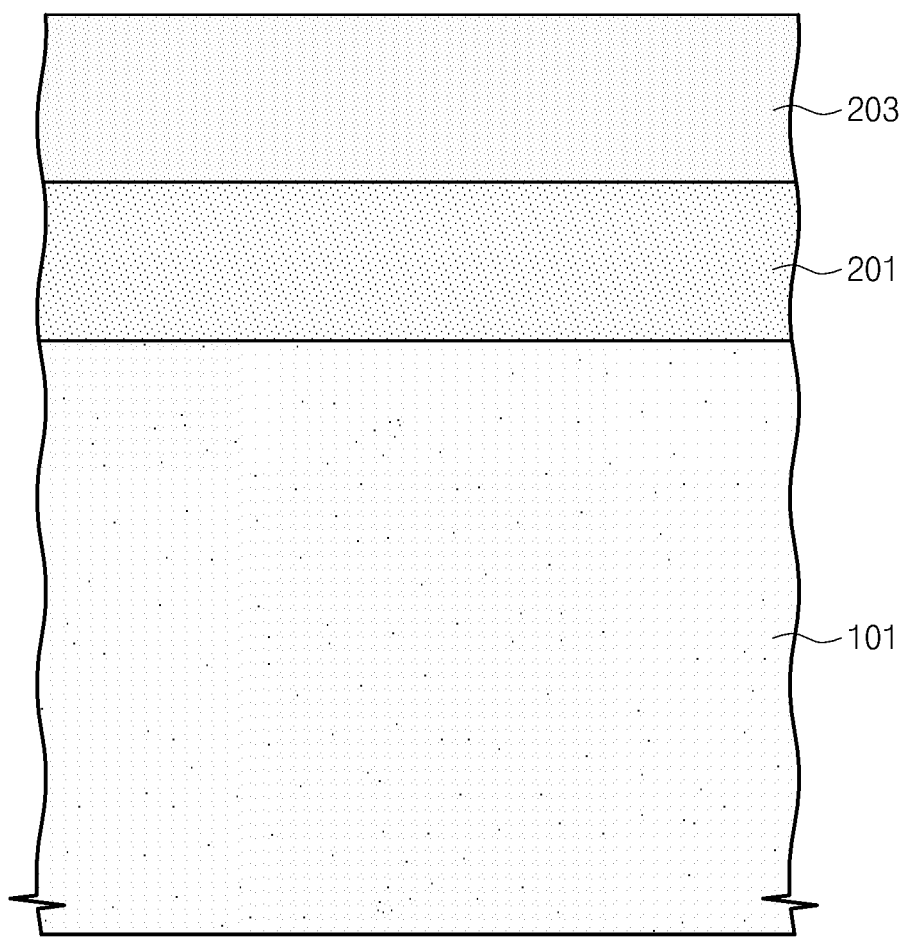
Figure 19A:
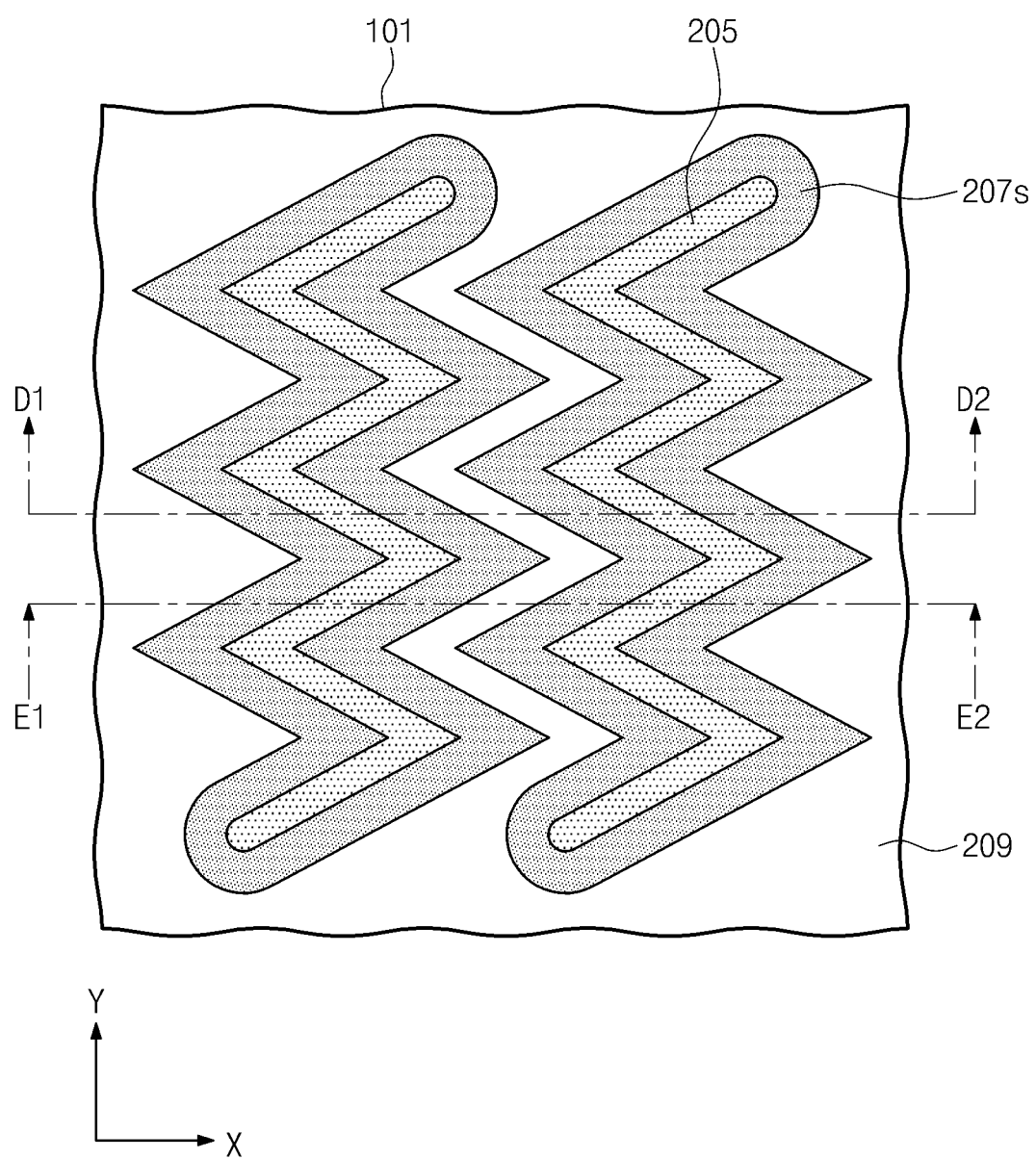
Figure 19B:
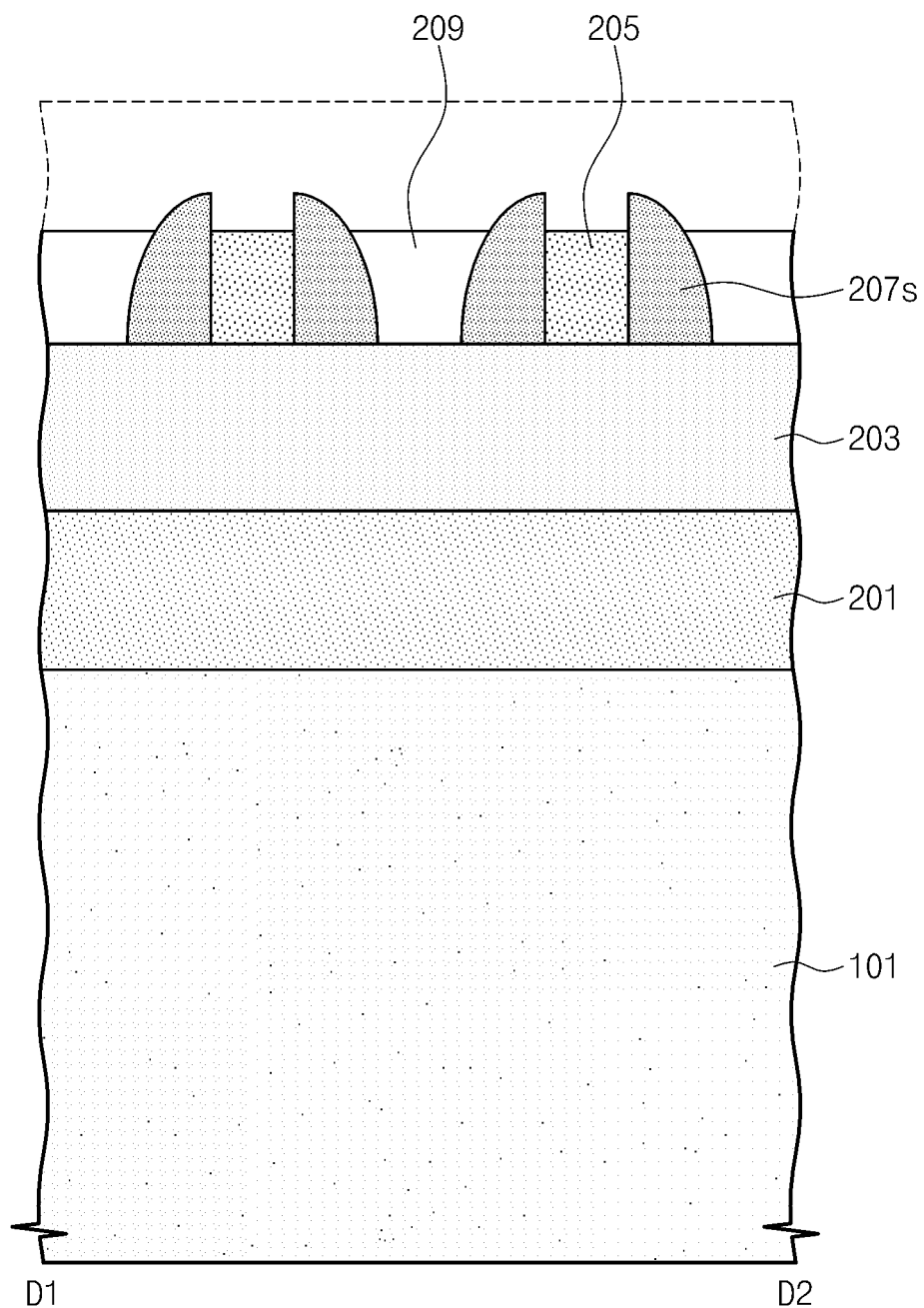
Figure 19C:
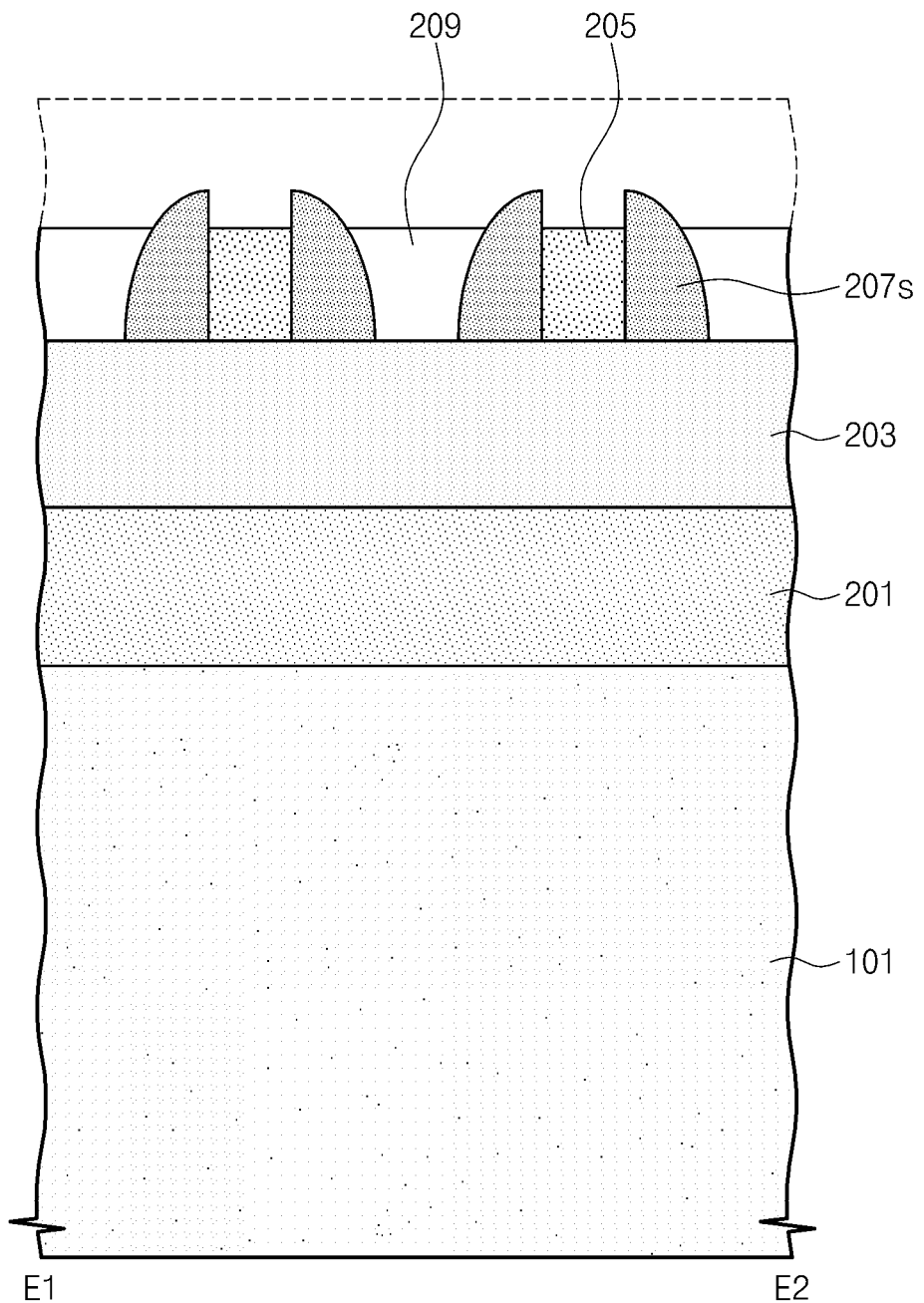
Figure 19D:
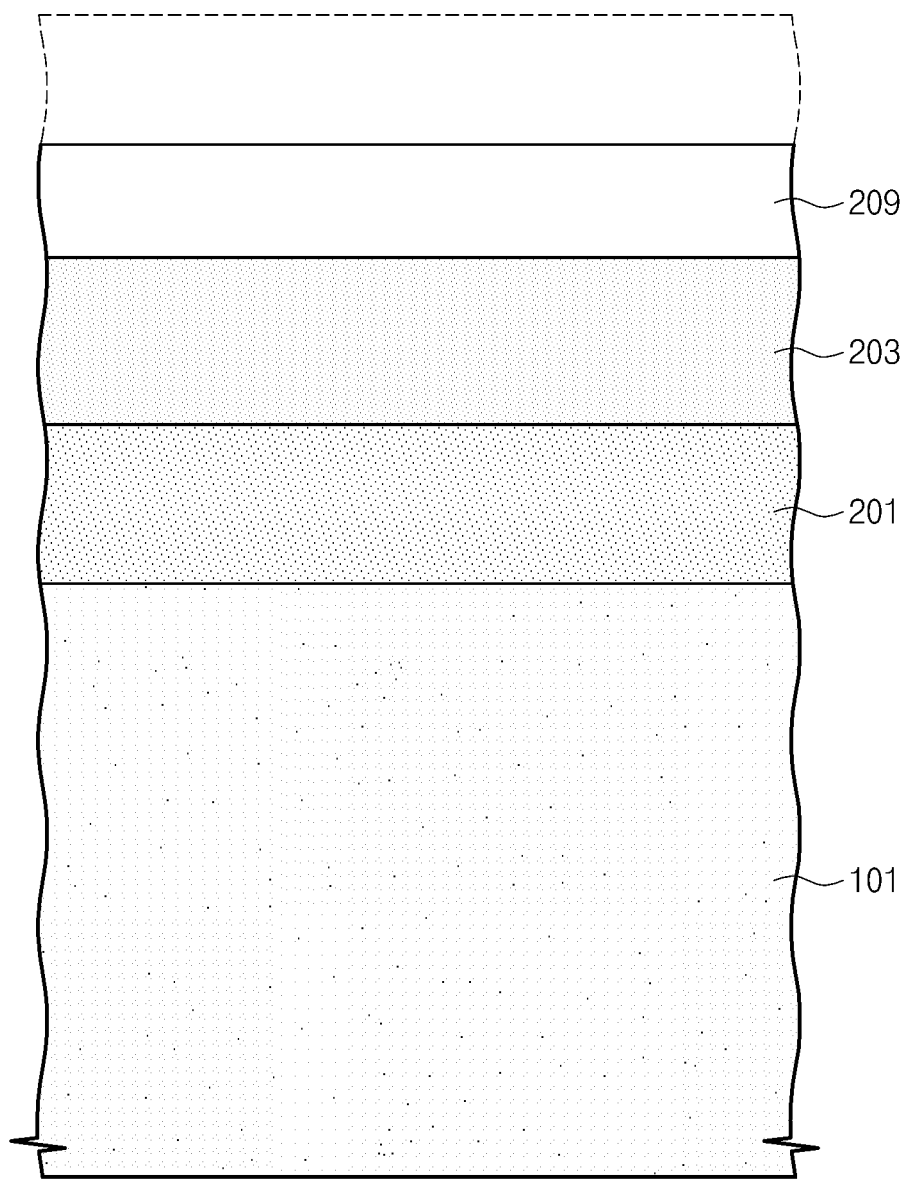

Referring to FIGS. 17A, 17B, 17C and 17D, a spacer layer 207 may be formed on the upper mask layer 203. The spacer layer 207 may include an insulating material (e.g., a silicon oxide layer) deposited by an atomic layer deposition (ALD). The spacer layer 207 may have a bent shape curved along a profile on the upper mask layer 203 in the cell region as illustrated in FIGS. 17B and 18C and a planar shape in the peripheral region as illustrated in FIG. 17D.

Referring to FIGS. 18A, 18B, 18C and 18D, the spacer layer 207 may be etched to form a spacer 207s on a sidewall of the first hardmask layer 205. The spacer 207s may have a closed type herringbone shape extending along the sidewall of the first hardmask layer 205 having the herringbone shape.

Referring to FIGS. 19A, 19B, 19C and 19D, a second hardmask layer 209 may be formed on the upper mask layer 203. For example, the second hardmask layer 209 may be deposited to have a thickness sufficient enough to cover the first hardmask layer 205 and then an etch-back process may be performed to planarize the deposited second hardmask layer 209 such that the spacer 207s may be partially exposed. The second hardmask layer 209 may be formed of a material substantially identical or similar to that of the first hardmask layer 205. In an embodiment, the first hardmask layer 205 may be partially etched together with the second hardmask layer 209. In an embodiment, the planarization process can be omitted when the second hardmask layer 209 is formed to have a thickness whose variation is improved enough to expose the spacer 207s.

Figure 20A:
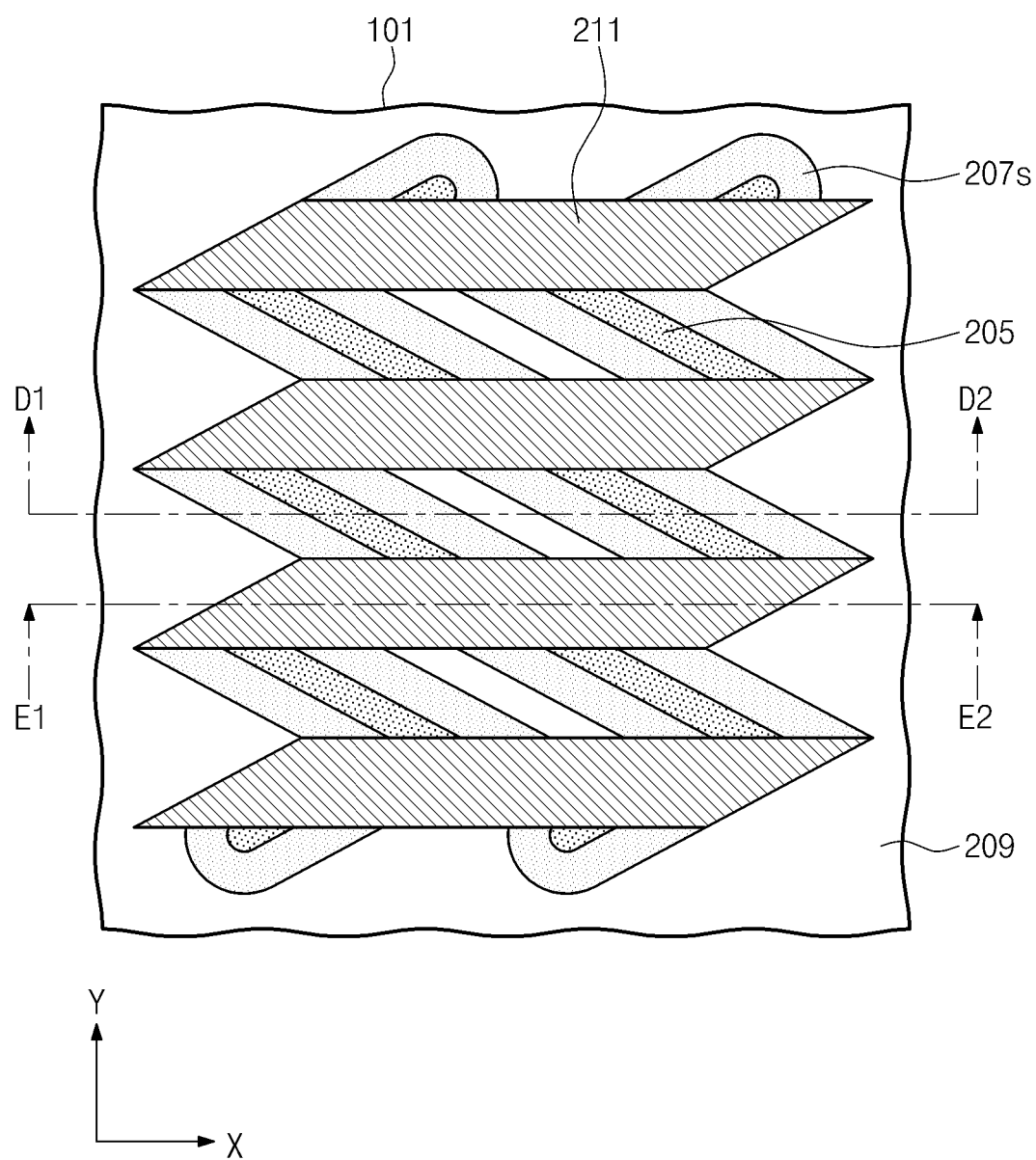
Figure 20B:
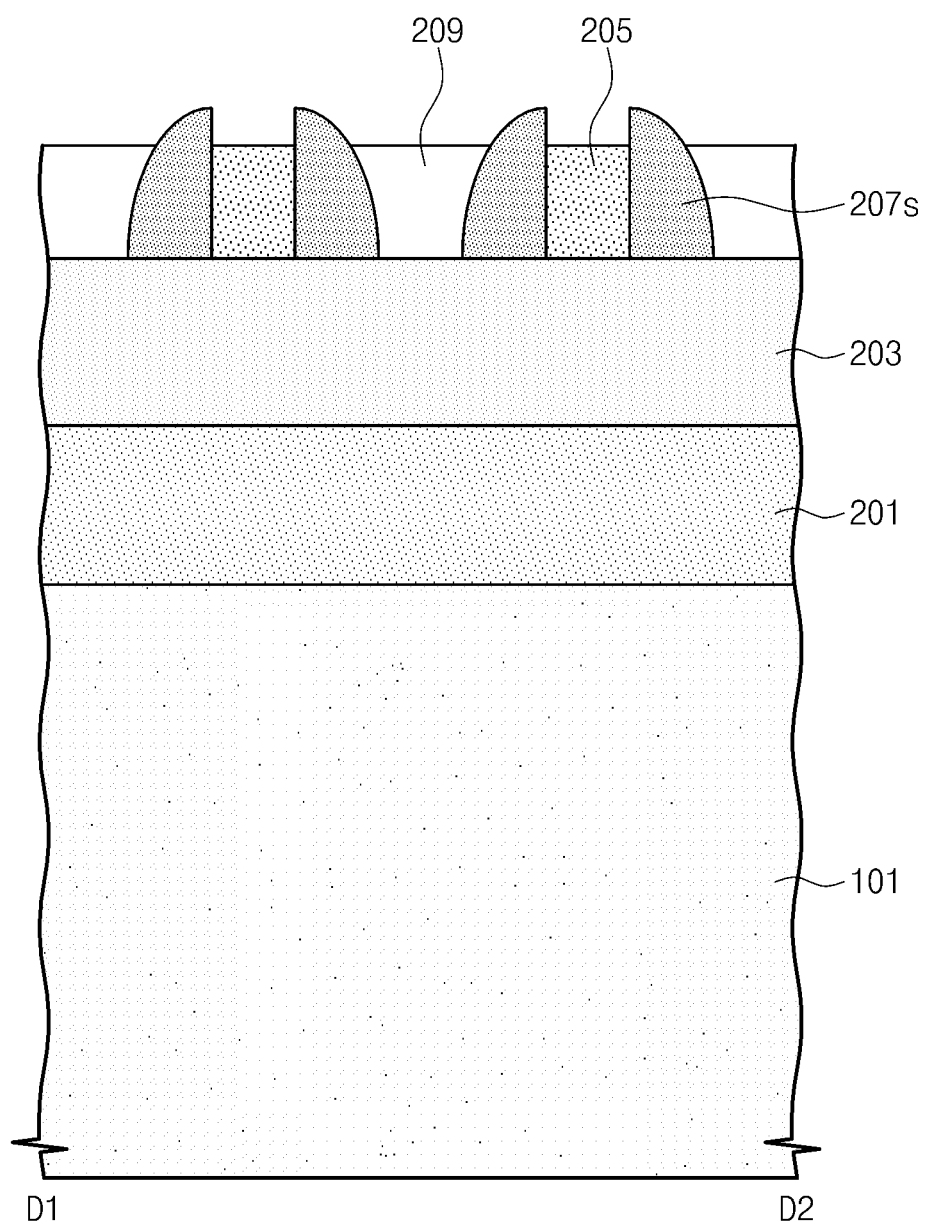
Figure 20C:
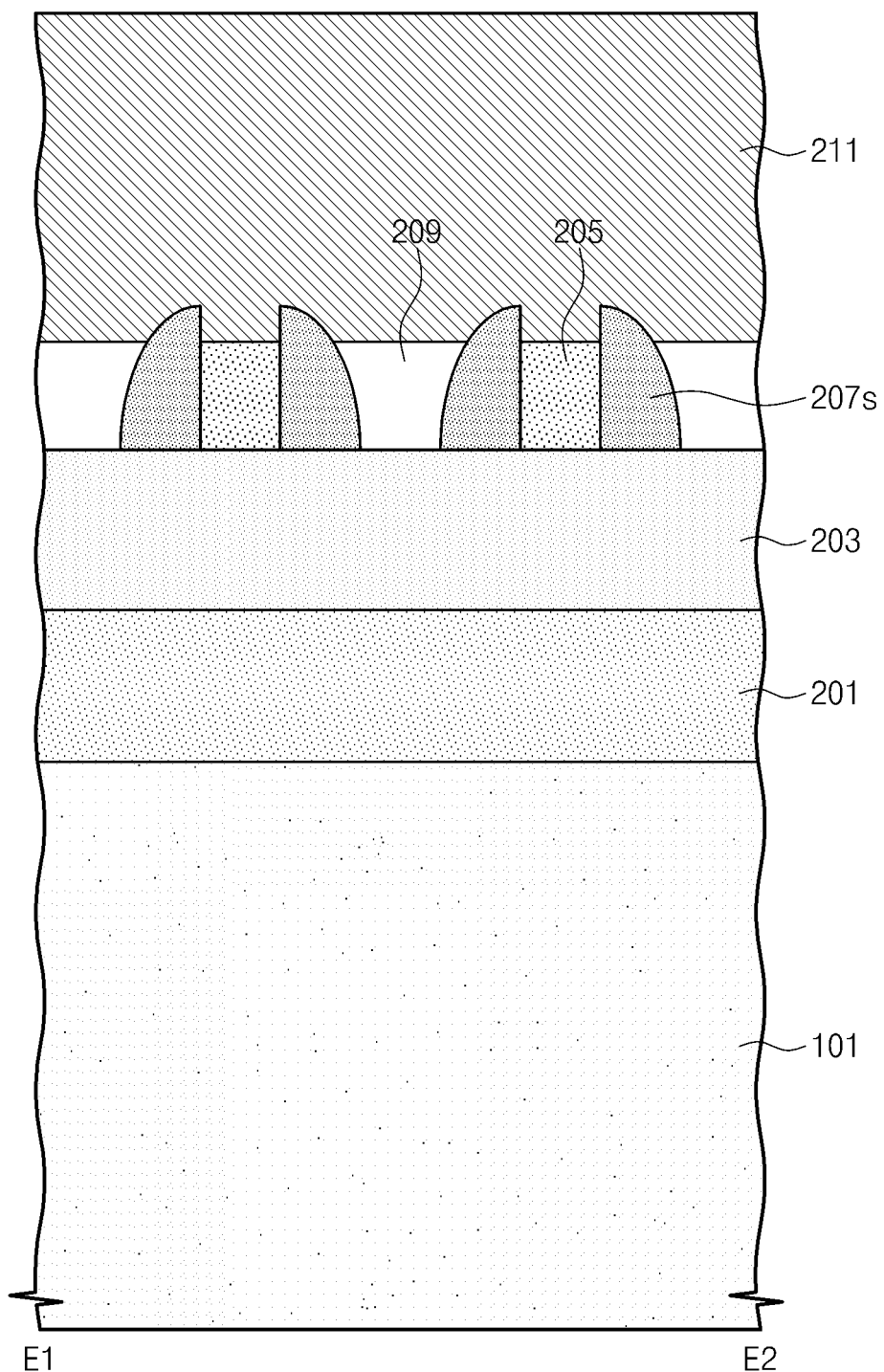
Figure 20D:
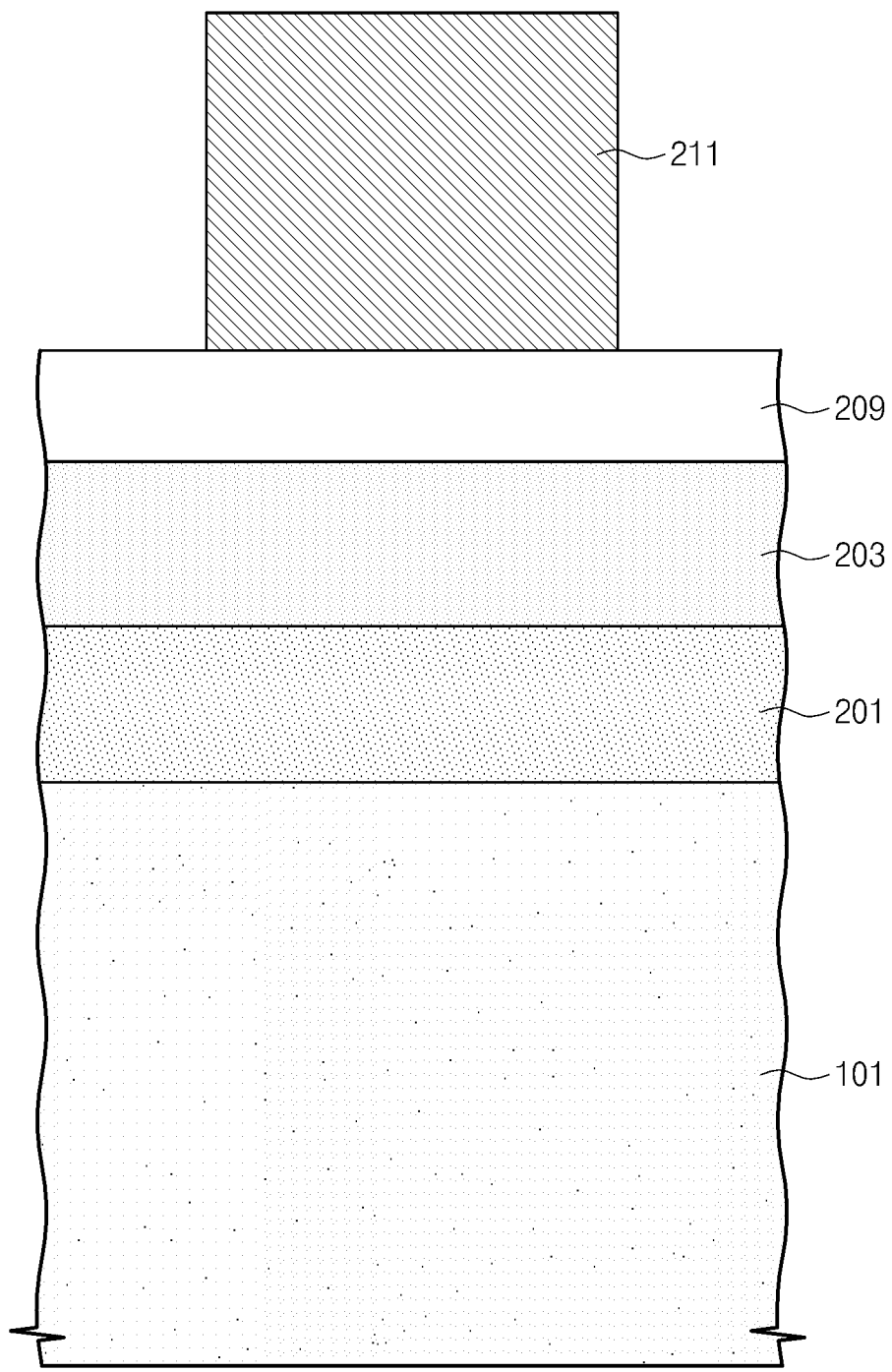

Referring to FIGS. 20A, 20B, 20C and 20D, a plurality of first photomask layers 211 may be formed to have line shapes extending in the second direction X and spaced apart from each other in the first direction Y. For example, as shown in FIG. 20A, a photoresist may be coated and patterned to form the first photomask layer 211 that exposes the first hardmask layer 205 and the spacer 207s on the line D1-D2 and covers the first hardmask layer 205 and the spacer 207s on the line E1-E2. As illustrated in FIG. 20D, the first photomask layer 211 on the peripheral region may partially cover the upper mask layer 203.

Figure 21A:
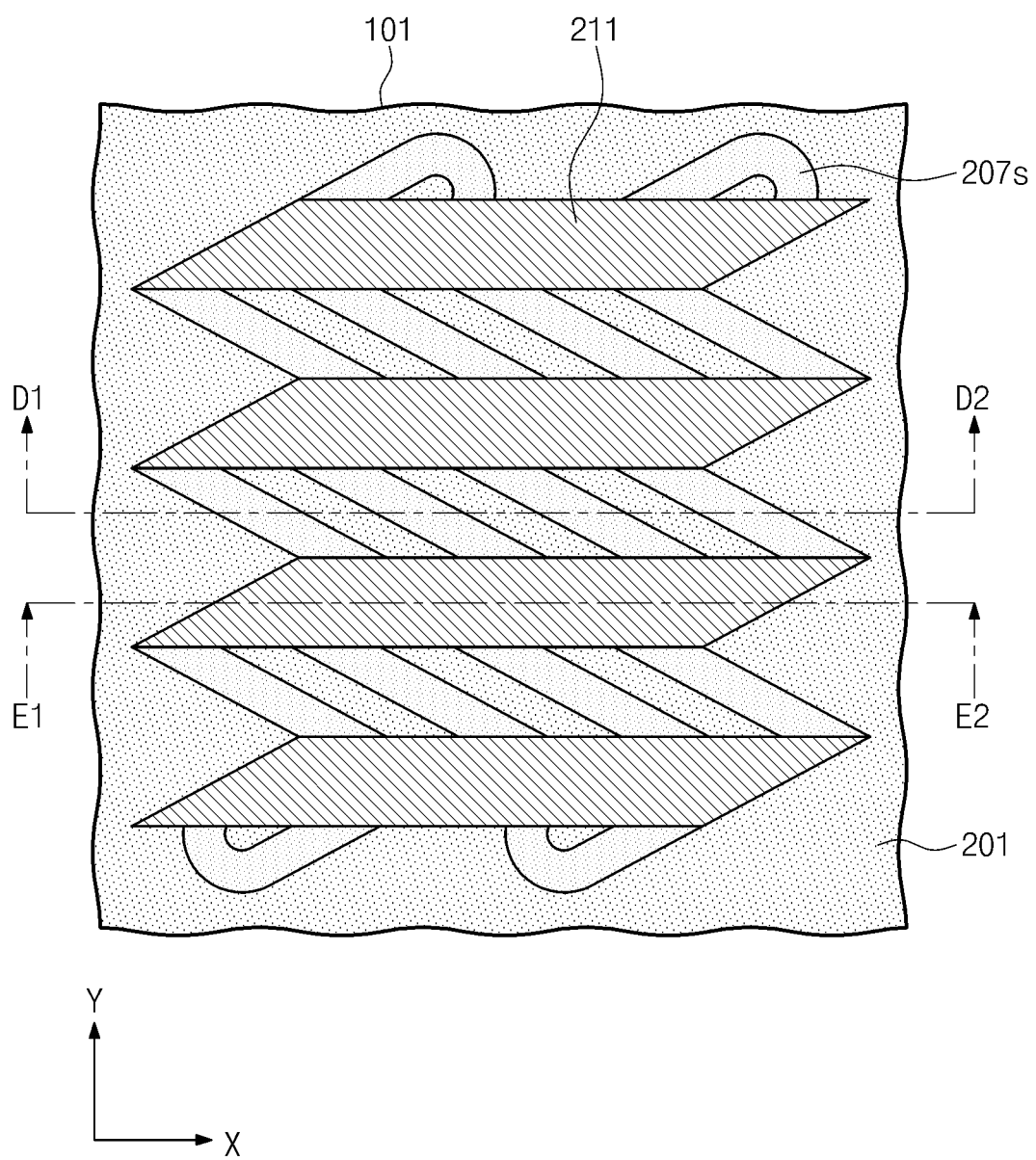
Figure 21B:
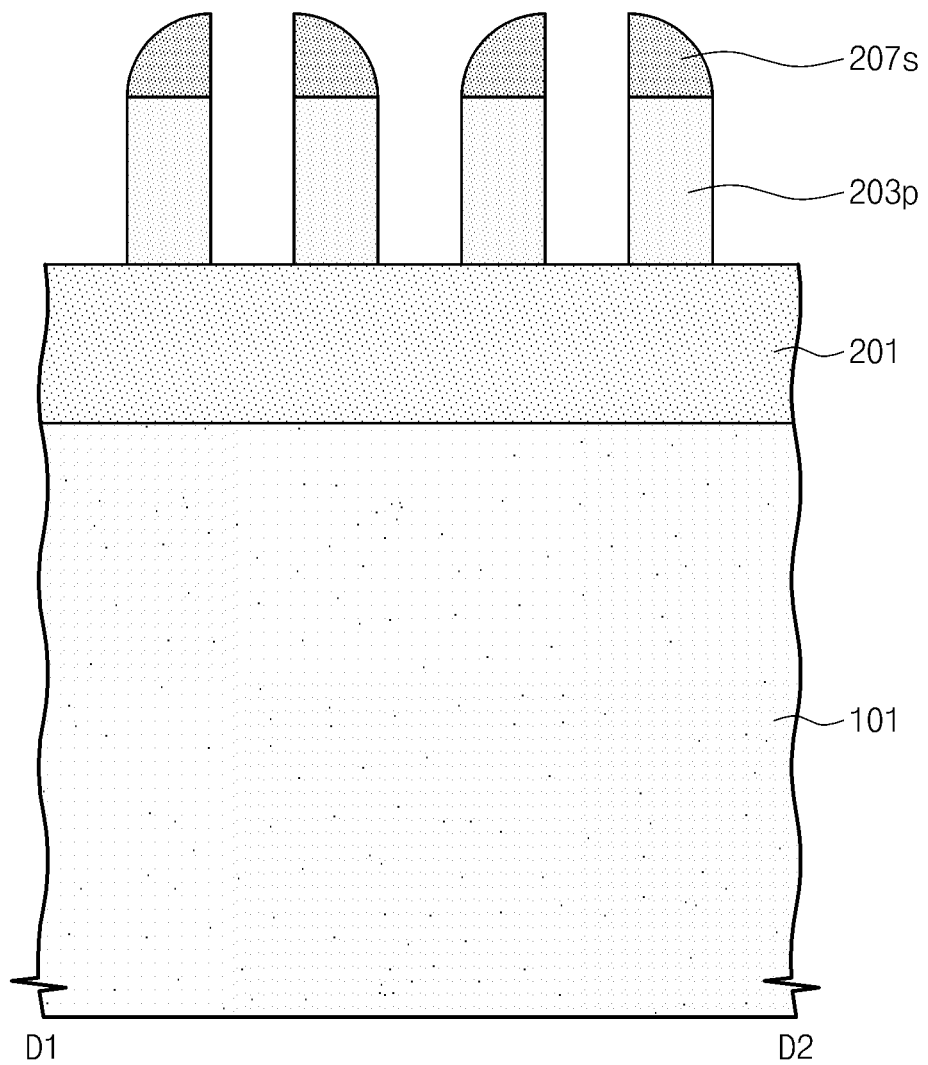
Figure 21C:
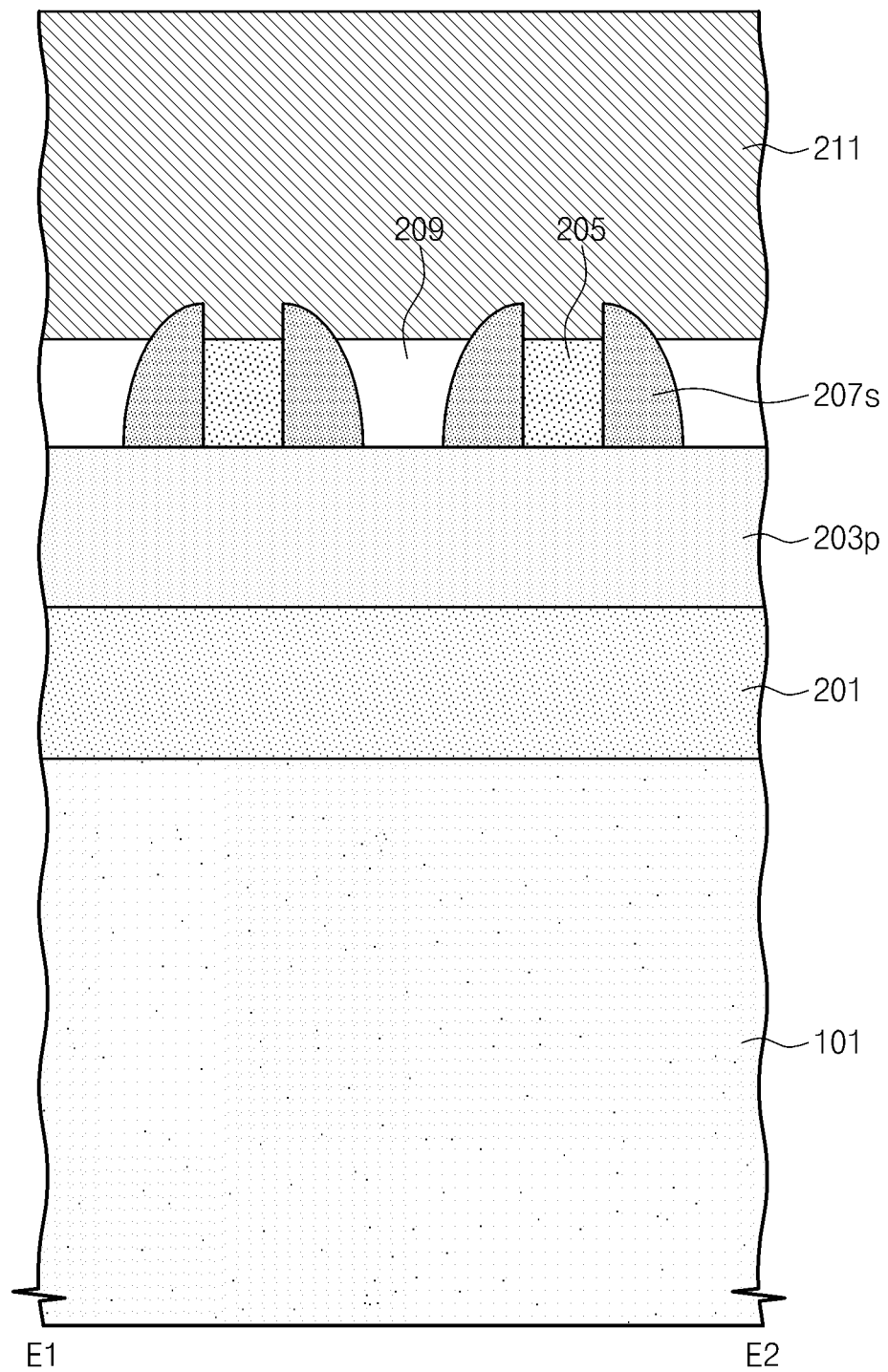
Figure 21D:
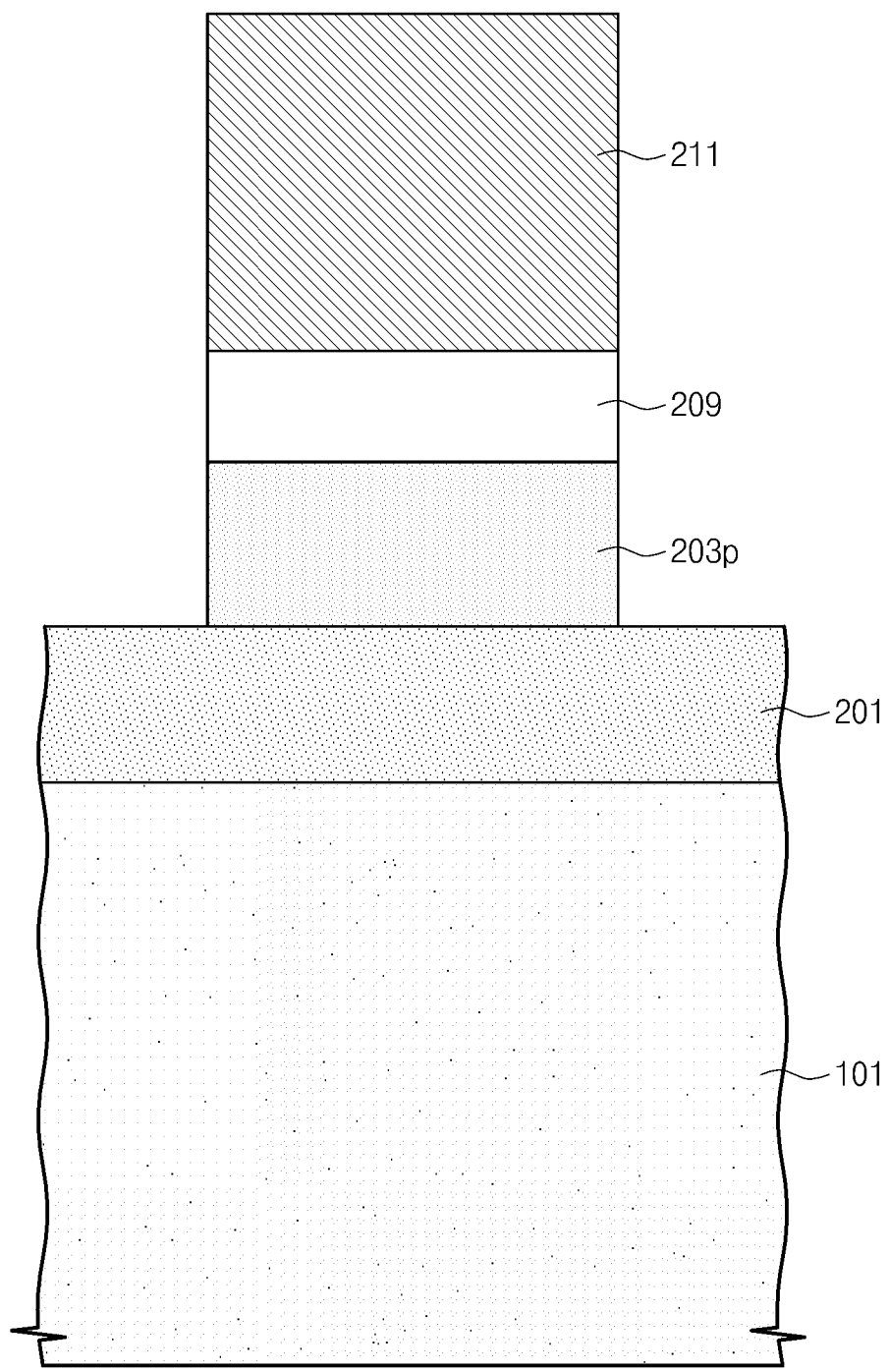

Referring to FIGS. 21A, 21B, 21C and 21D, the first hardmask layer 205 may be etched by an etching process using the first photomask layer 211 as an etch mask. The second hardmask layer 209 may be etched together with the first hardmask layer 205. As shown in FIG. 21B, the etch process may selectively remove the first and second hardmask layers 205 and 209 not covered with the photomask layer 211. The upper mask layer 203 may be etched by an etch process using the spacer 207s as an etch mask to form an upper mask pattern 203p partially exposing the lower mask layer 201. In the peripheral region, as shown in FIG. 21D, the second hardmask layer 209 and the upper mask layer 203 may be etched to partially expose the lower hardmask layer 201.

Figure 22A:
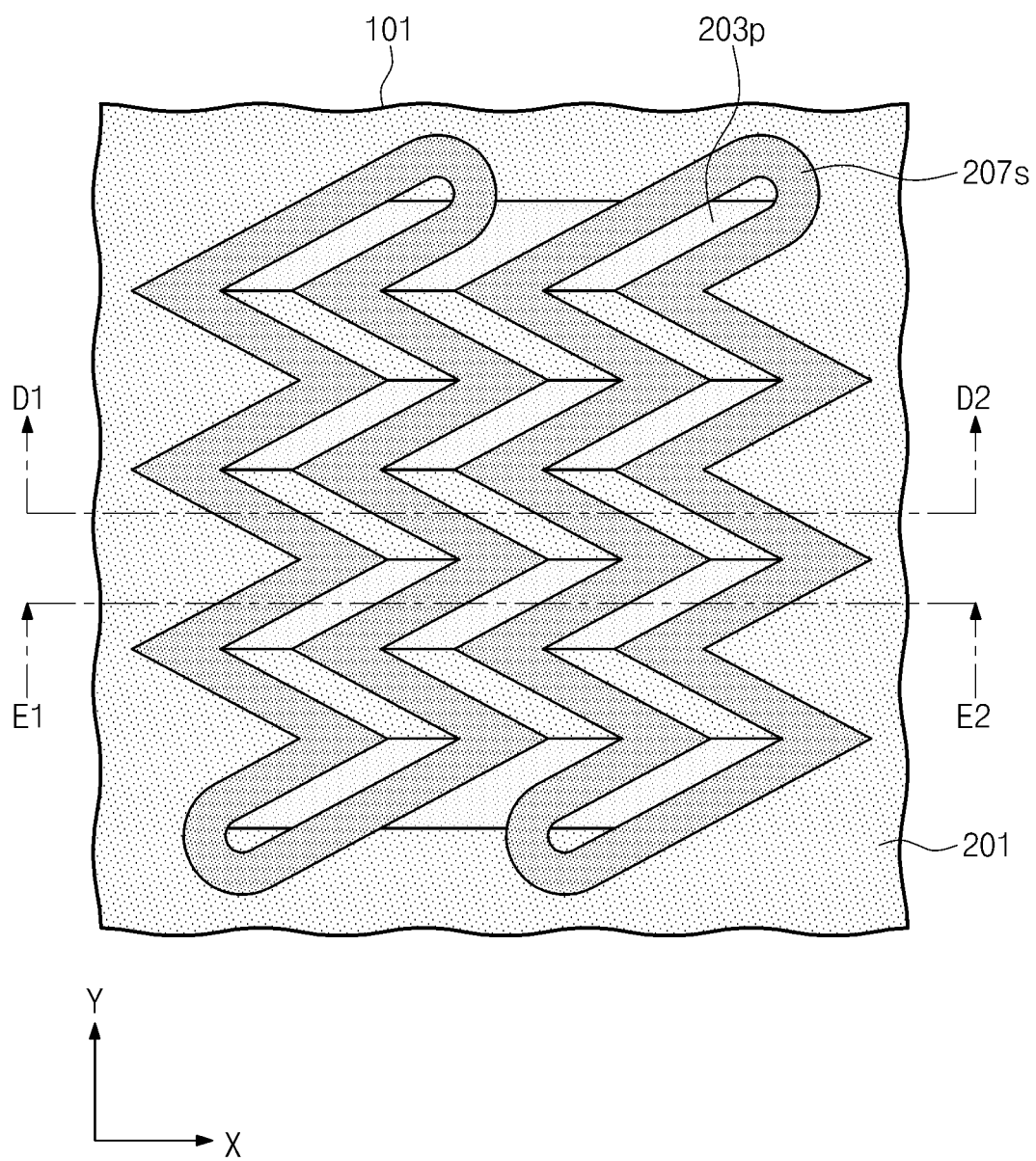
Figure 22B:
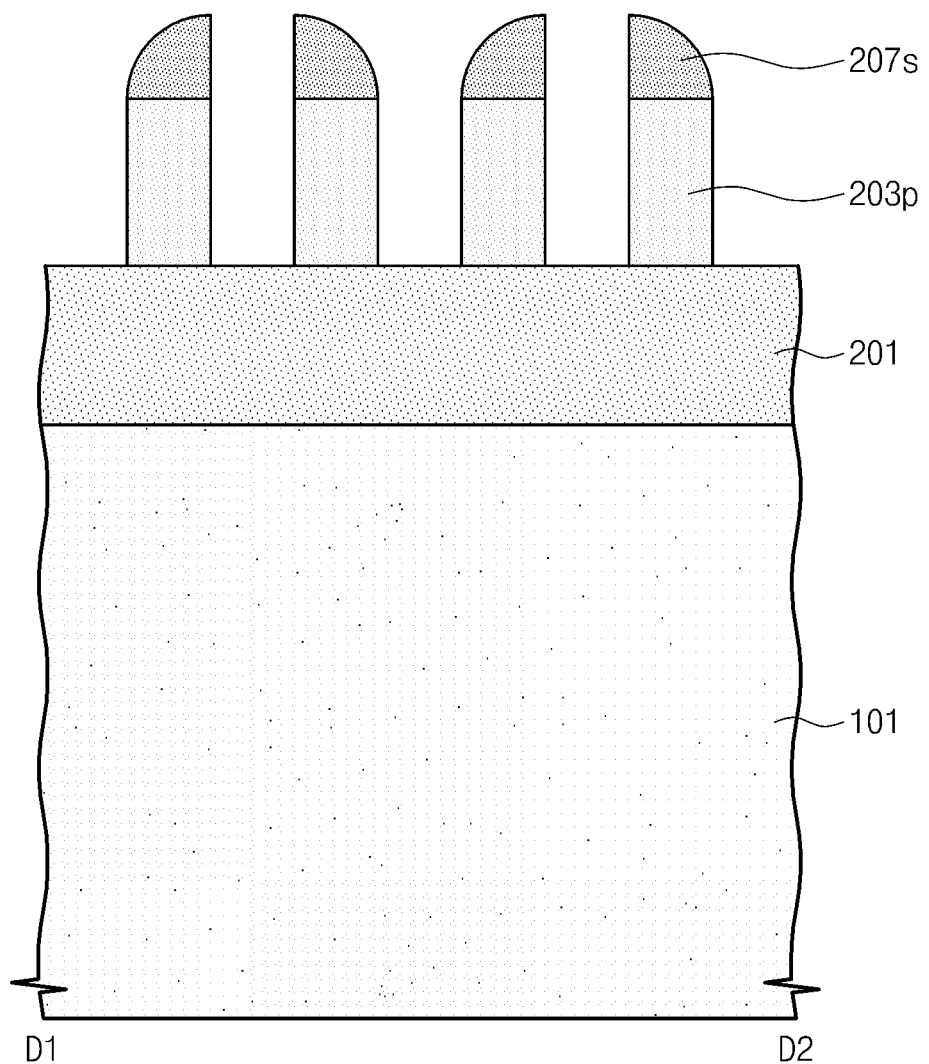
Figure 22C:
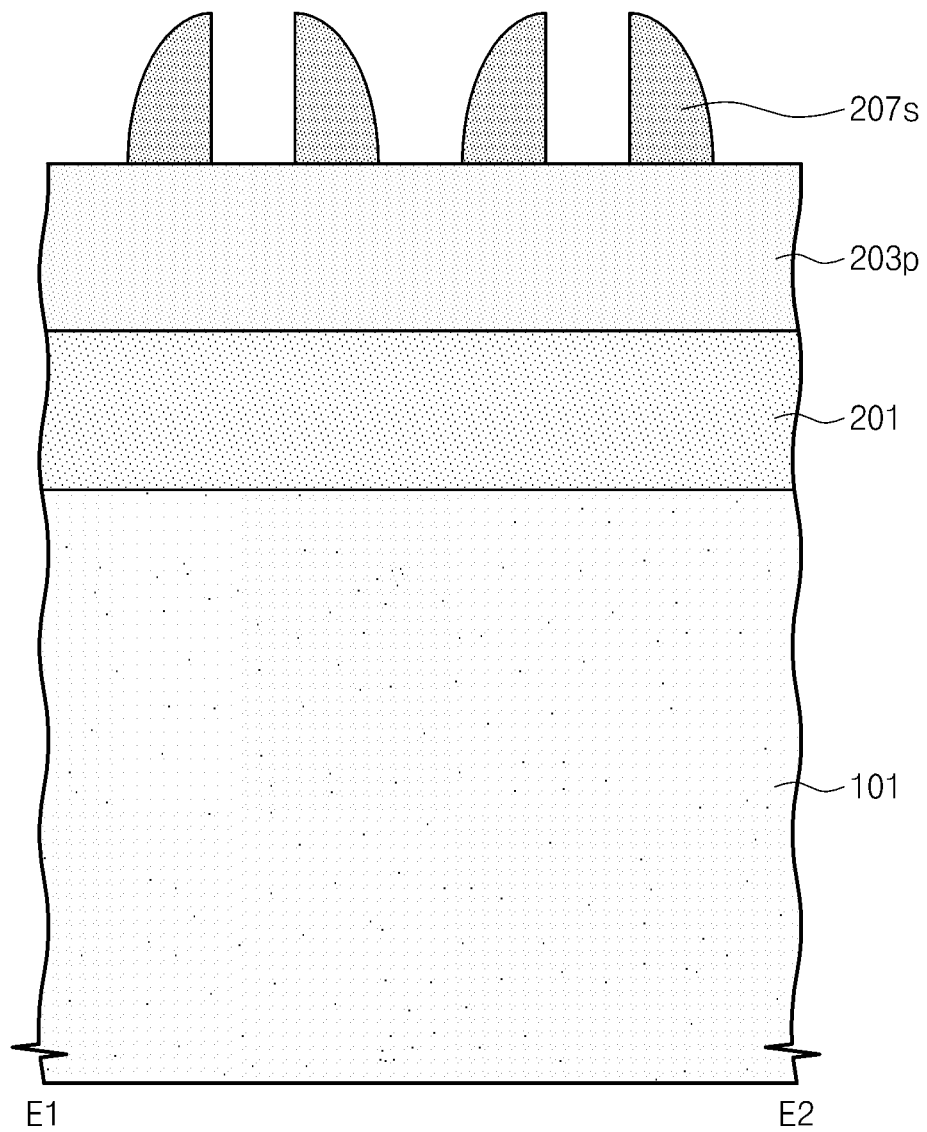
Figure 22D:
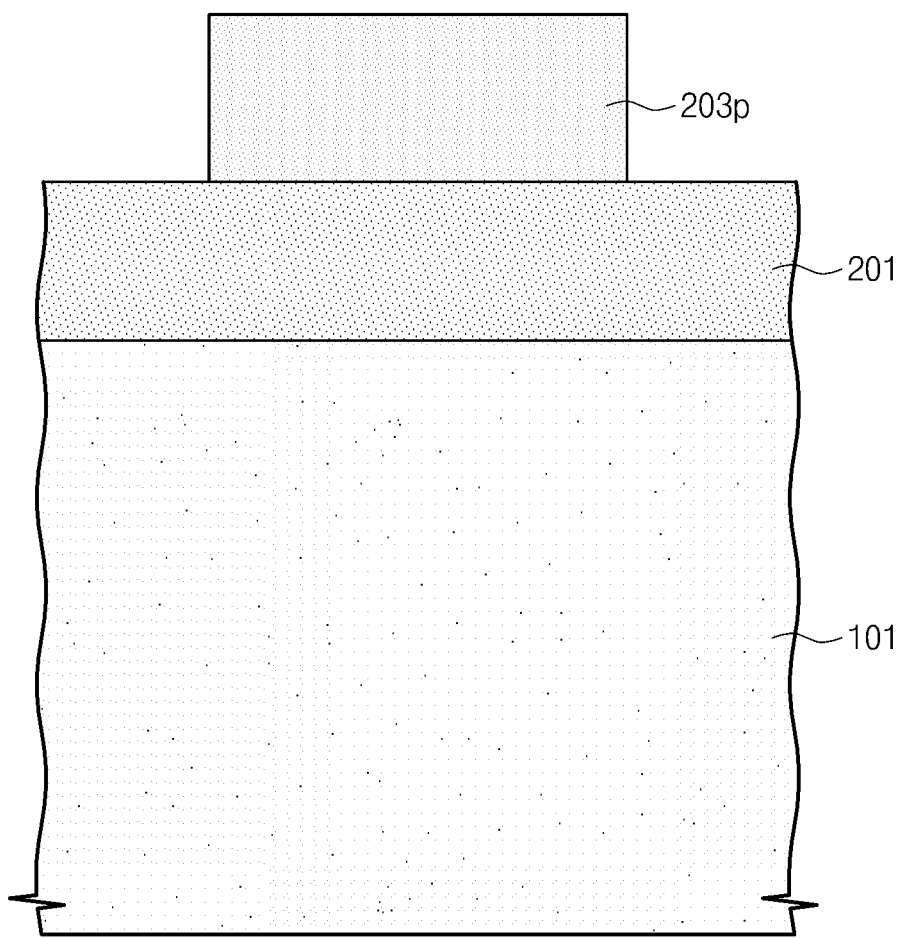
Figure 23A:
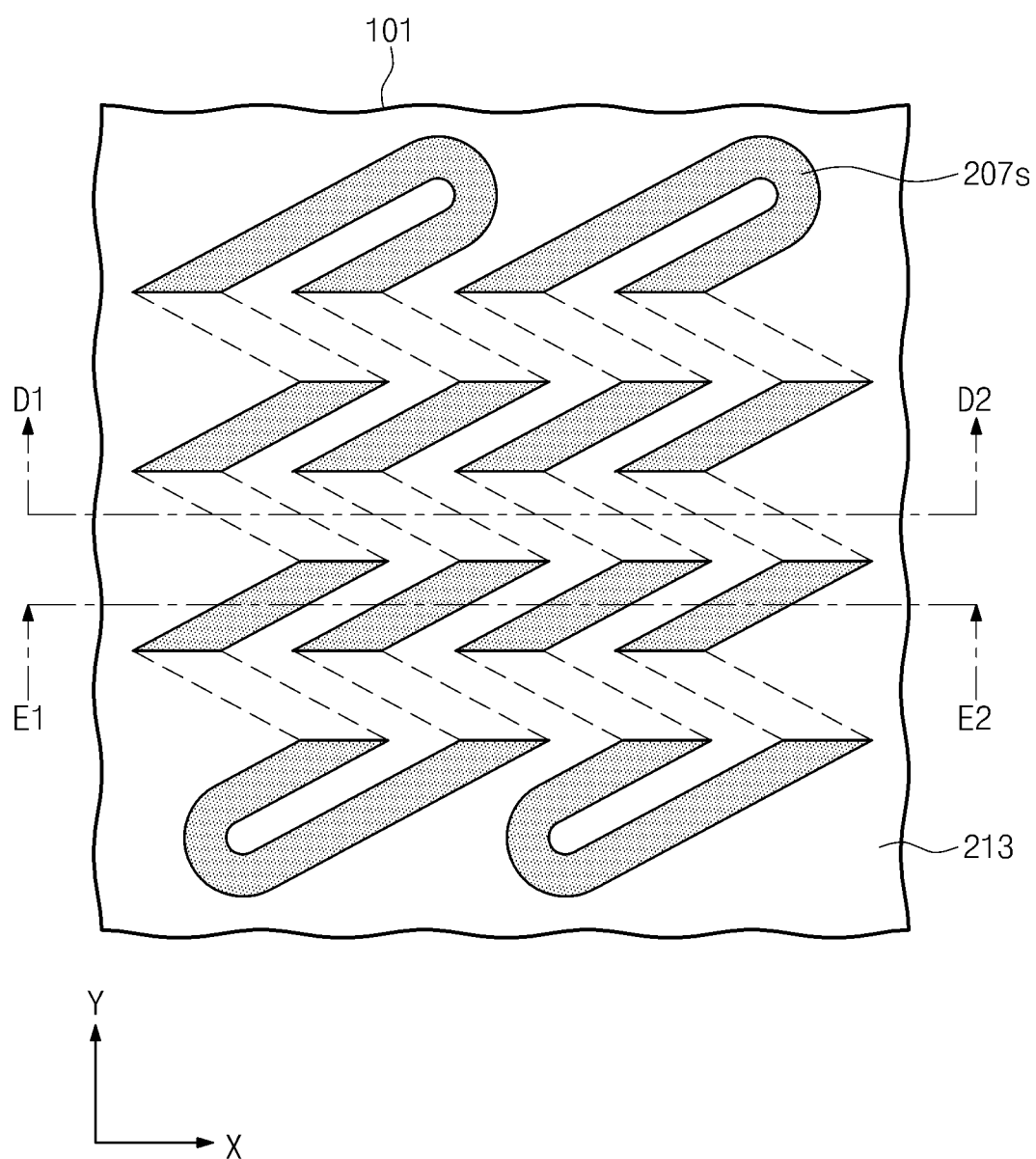
Figure 23B:
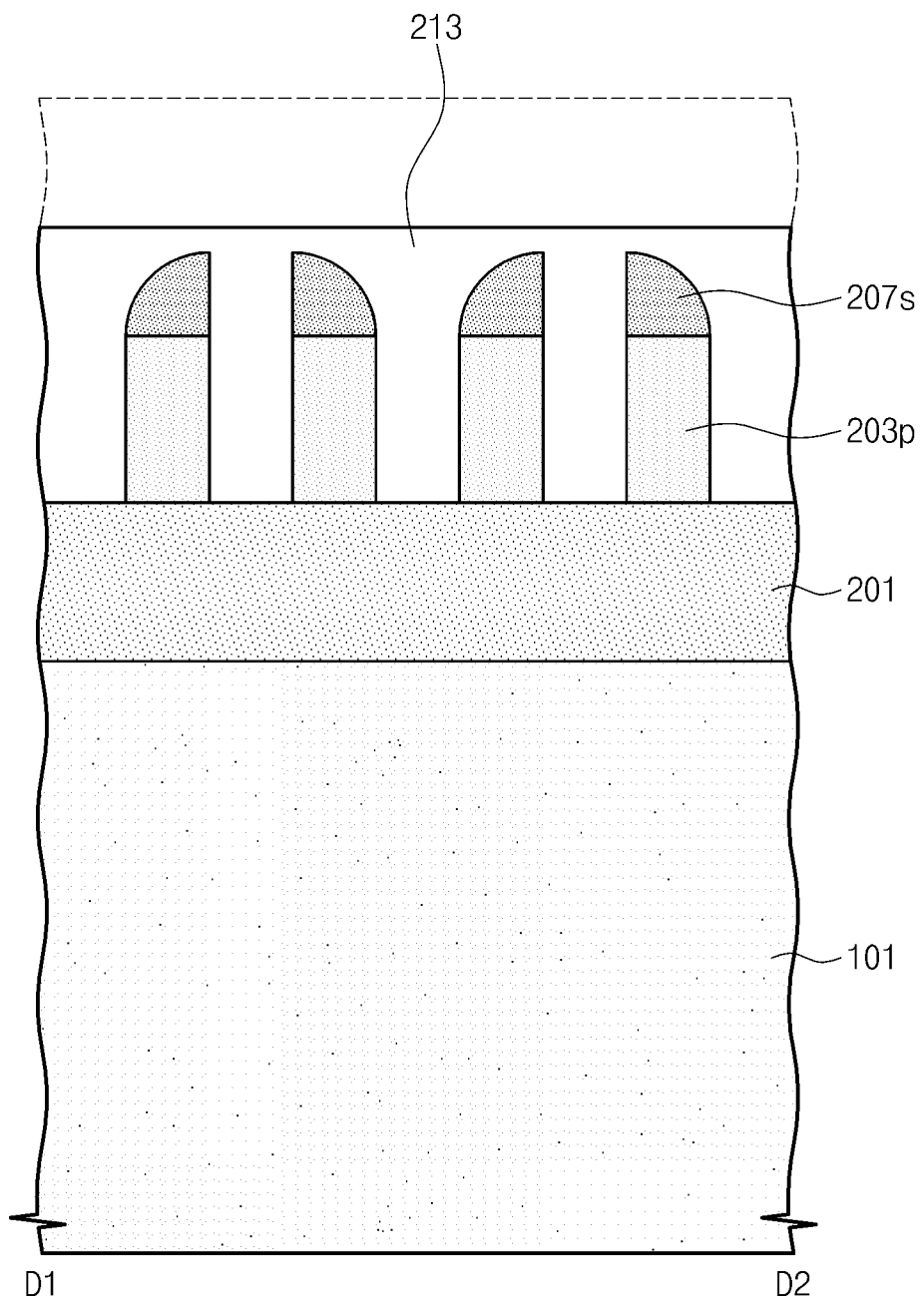
Figure 23C:
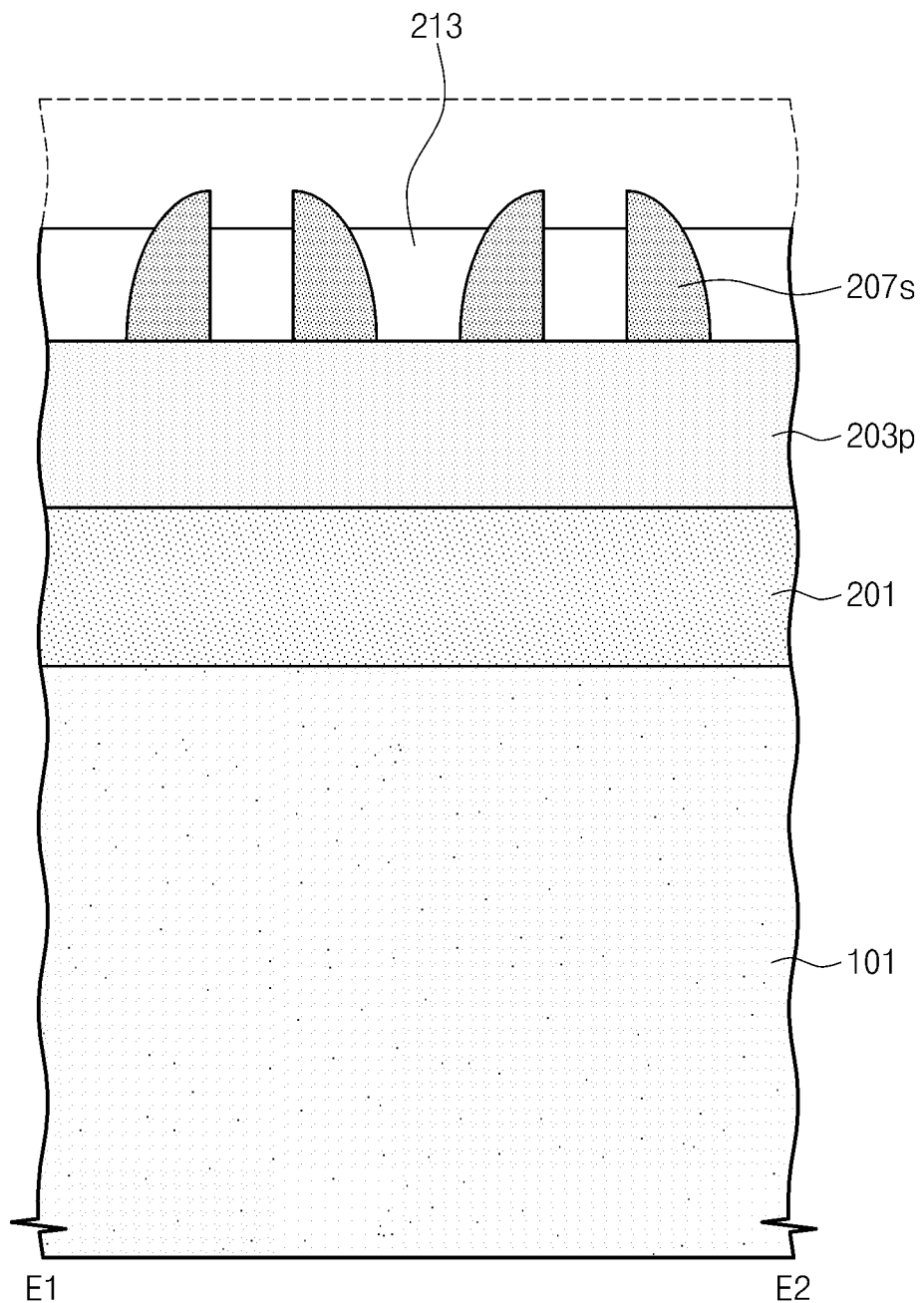
Figure 23D:
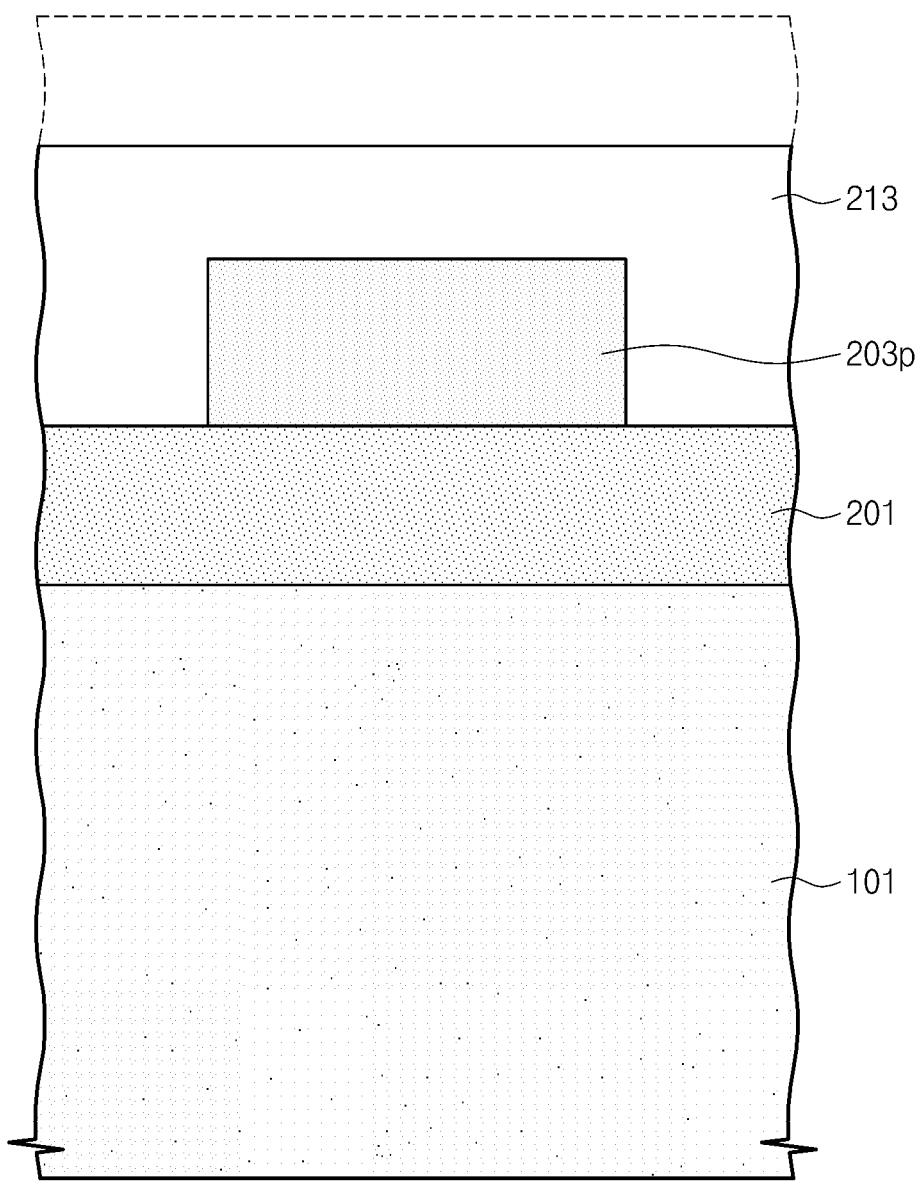

Referring to FIGS. 22A, 22B, 22C and 22D, the first photomask layer 211 may be removed by an ashing process, and the first and second hardmask layers 205 and 209 may be removed by an etching process. As a result, the spacer 207s having the herringbone shape may be completely exposed. In the peripheral region, as shown in FIG. 22D, the first photomask layer 211 and the second hardmask layer 209 may be removed such that the upper mask pattern 203p may remain and the lower hardmask layer 201 may be partially exposed.

Referring to FIGS. 23A, 23B, 23C and 23D, a third mask layer 213 may be formed on the lower mask layer 201. For example, the third mask layer 213 may be deposited to have a thickness sufficient enough to cover the spacer 207s and then an etch-back process may be performed to the third hardmask layer 213 so as to partially expose the spacer 207s. The spacer 207s on the line E1-E2 may protrude over the third hardmask layer 213. The third hardmask layer 211 may be formed of a material substantially identical or similar to that of the first hardmask layer 205 or the second hardmask layer 209.

Figure 24A:
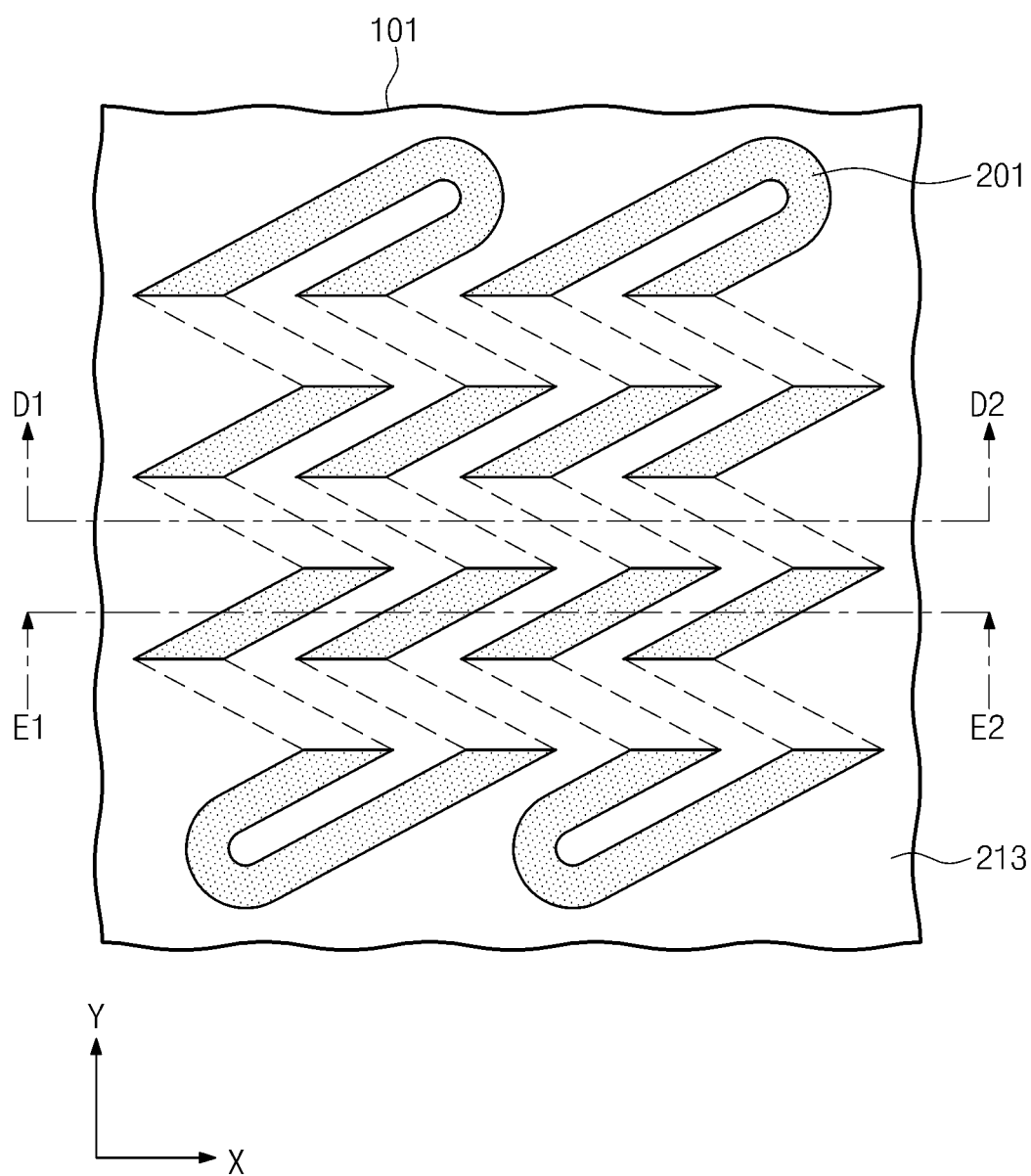
Figure 24B:
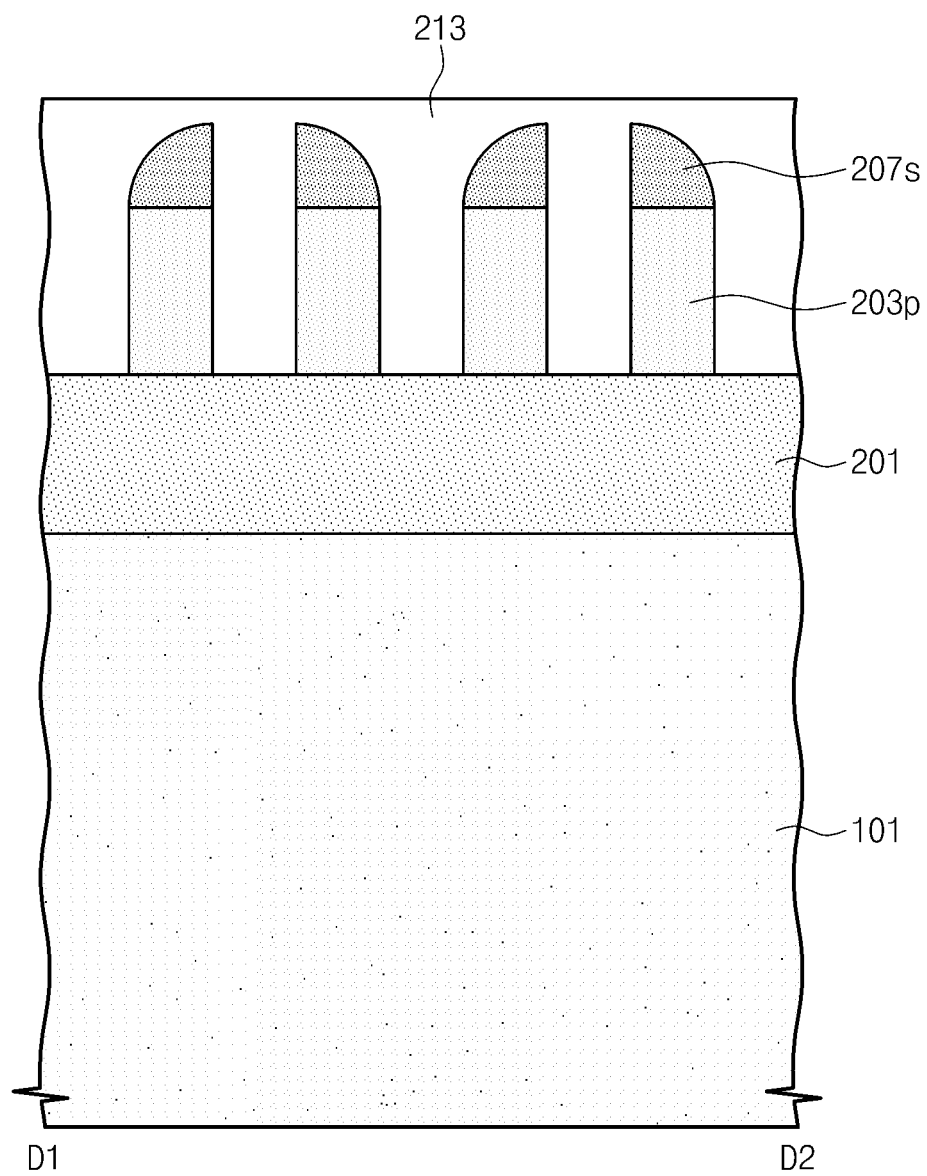
Figure 24C:
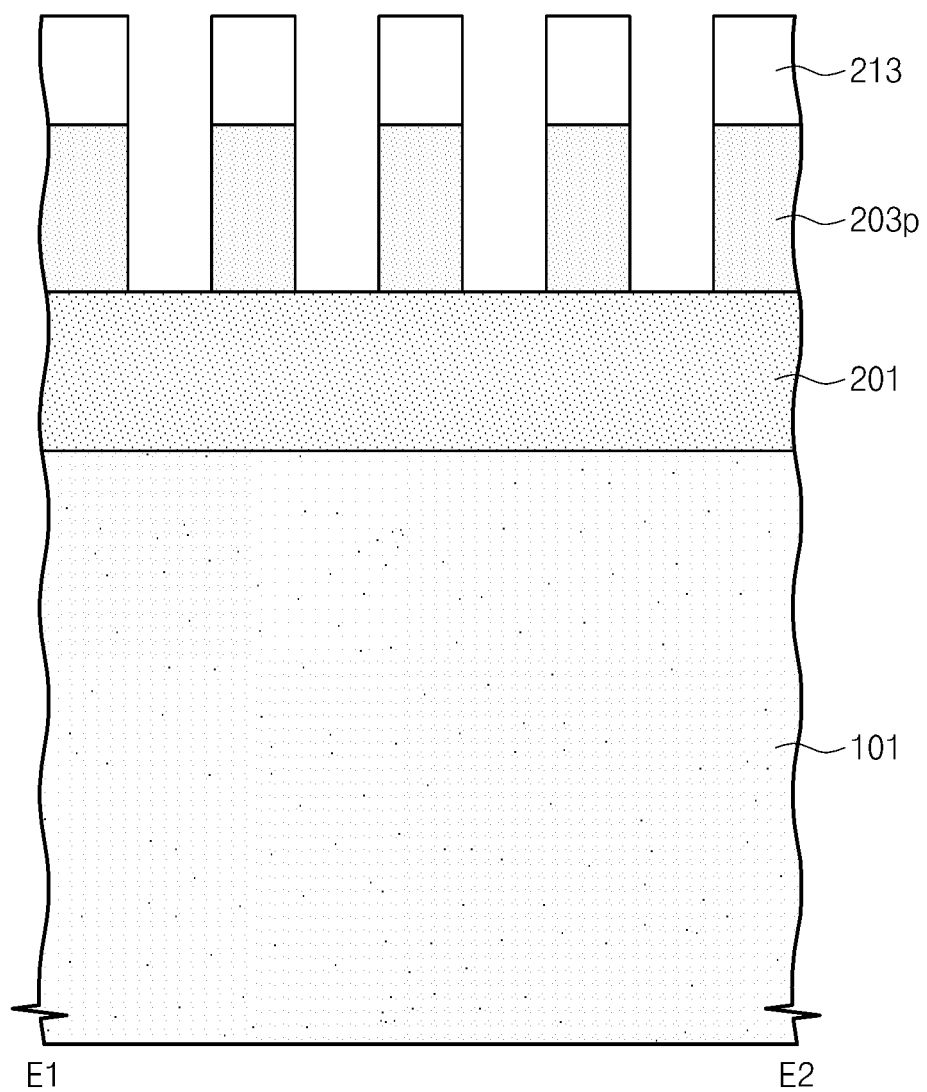
Figure 24D:
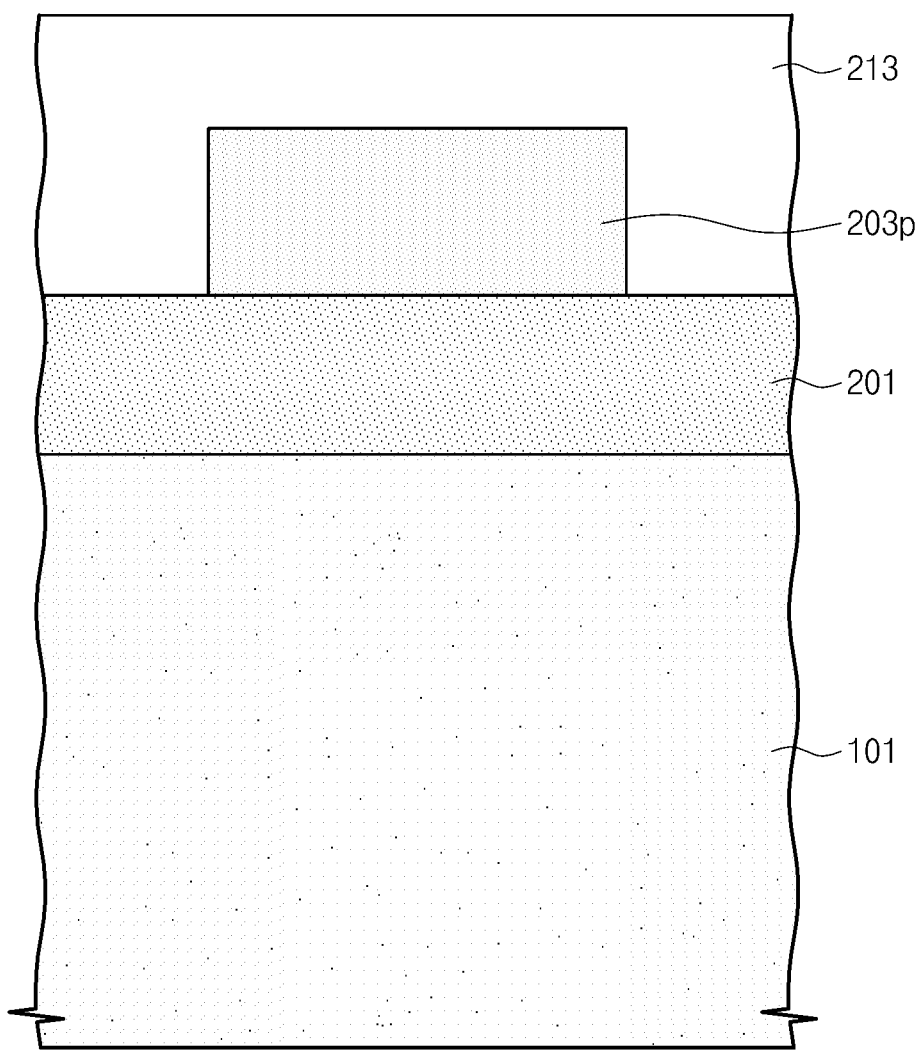
Figure 25A:
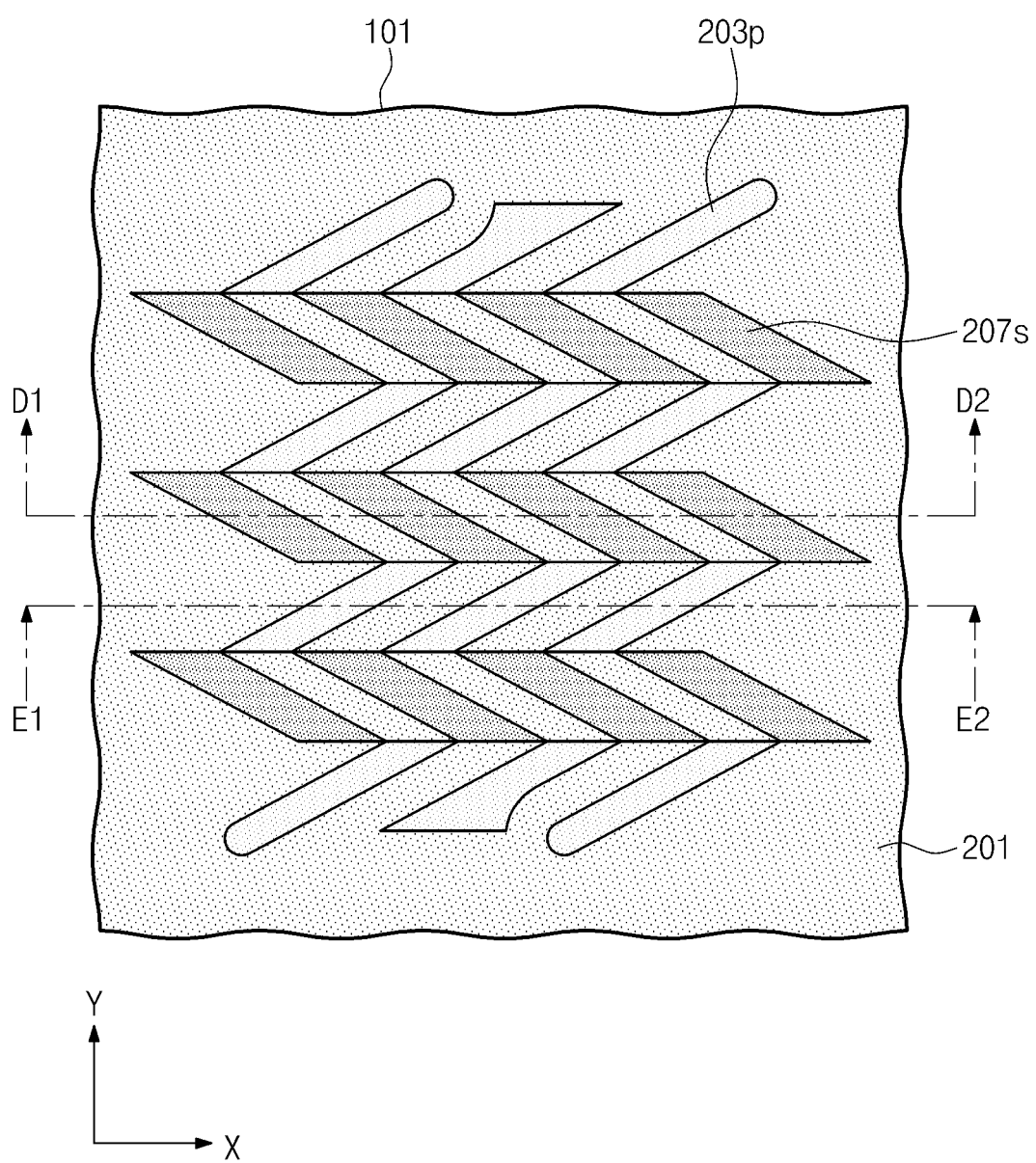
Figure 25B:
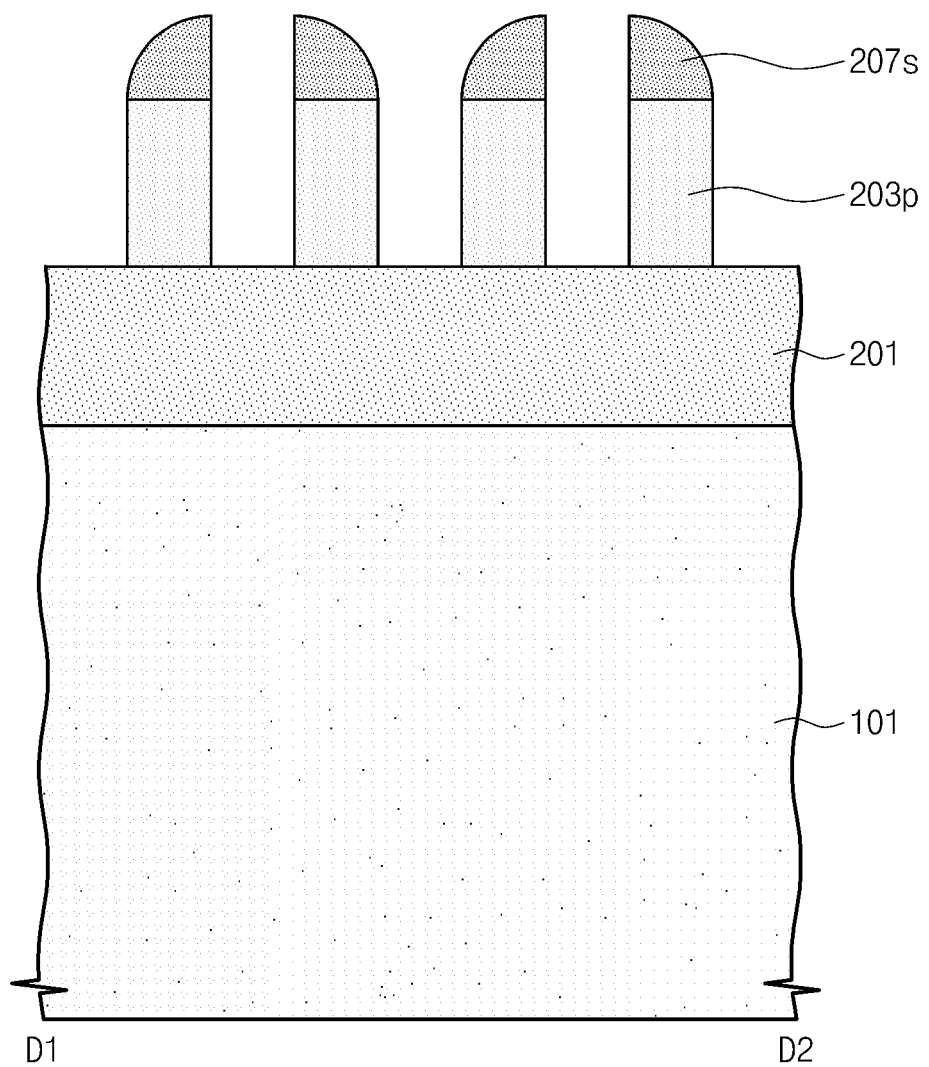
Figure 25C:
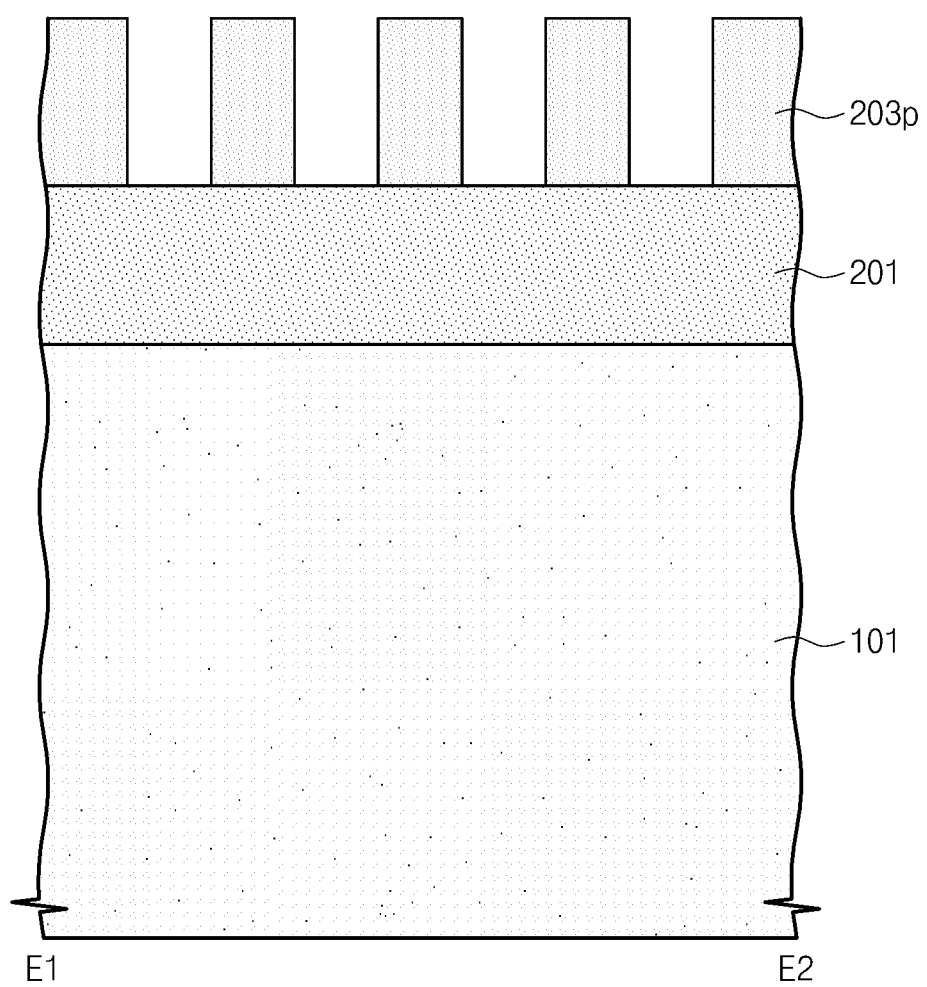
Figure 25D:
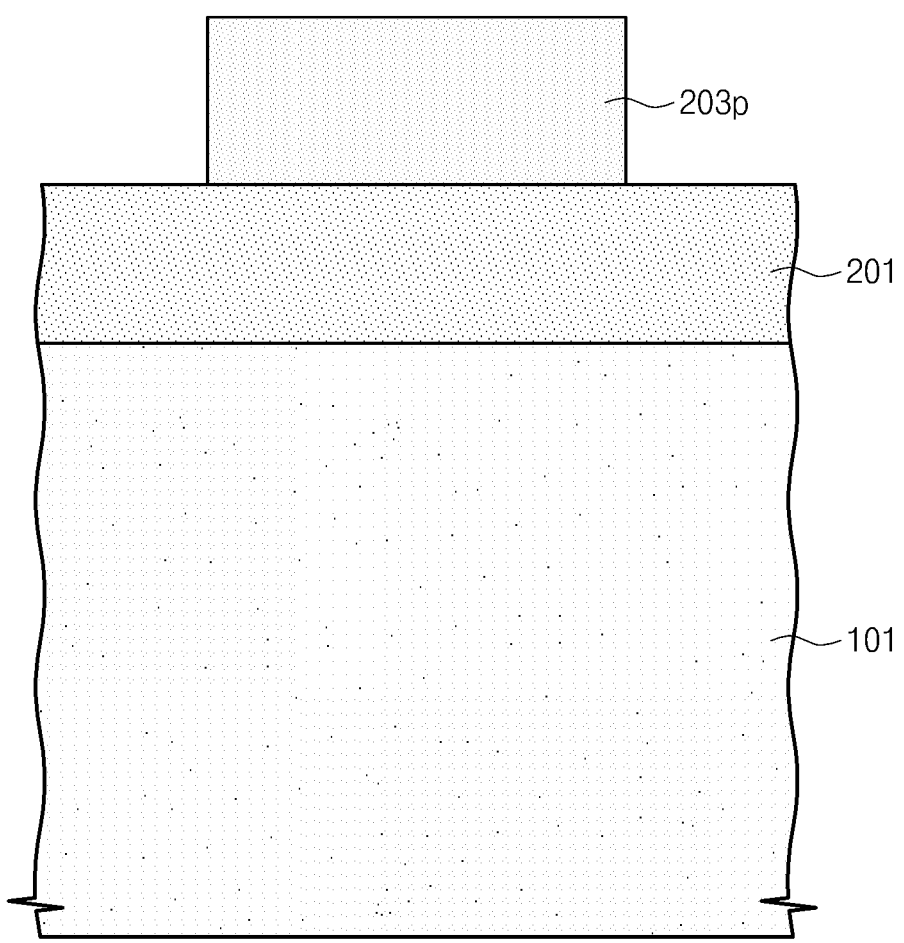
Figure 26A:
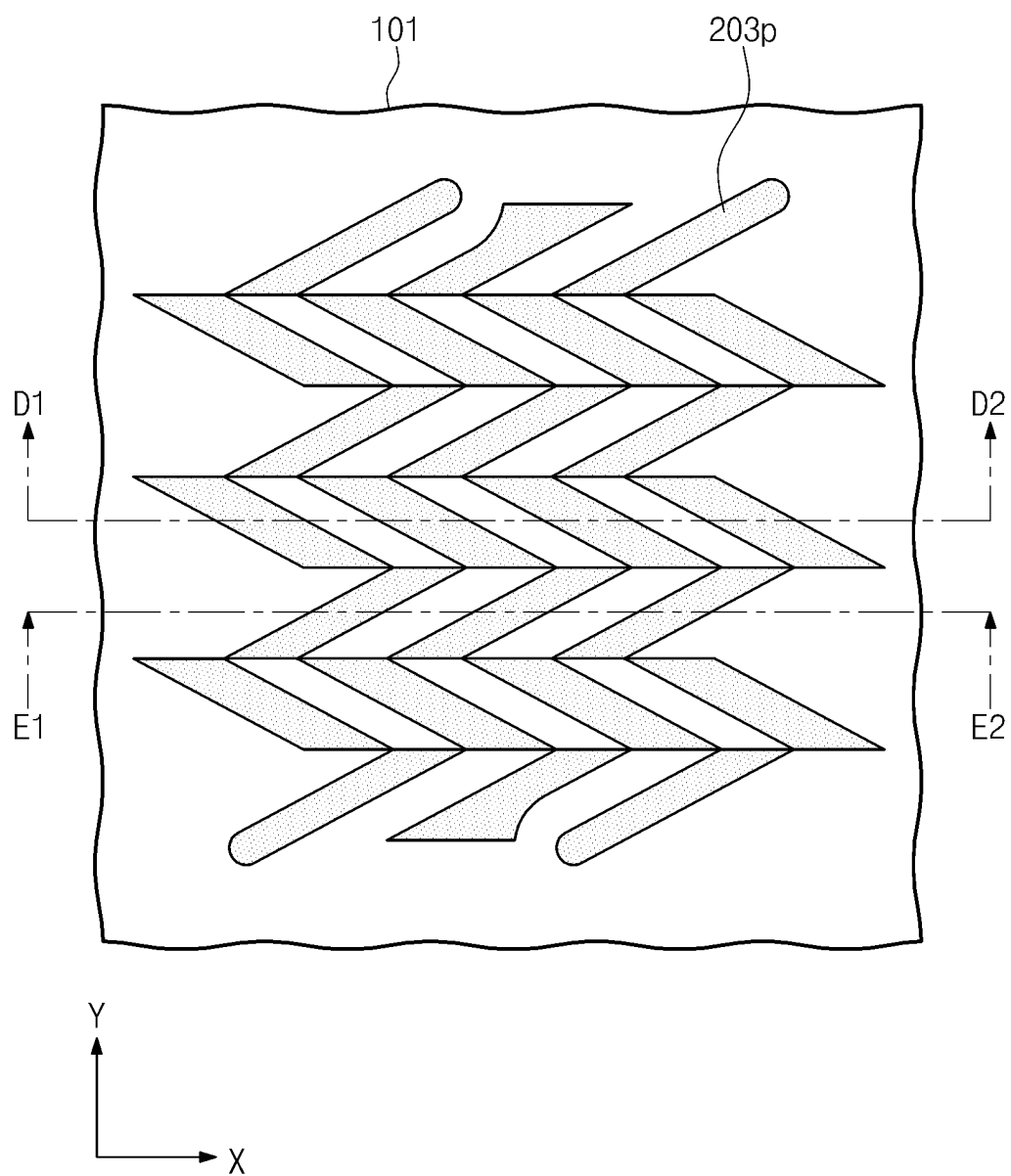
Figure 26B:
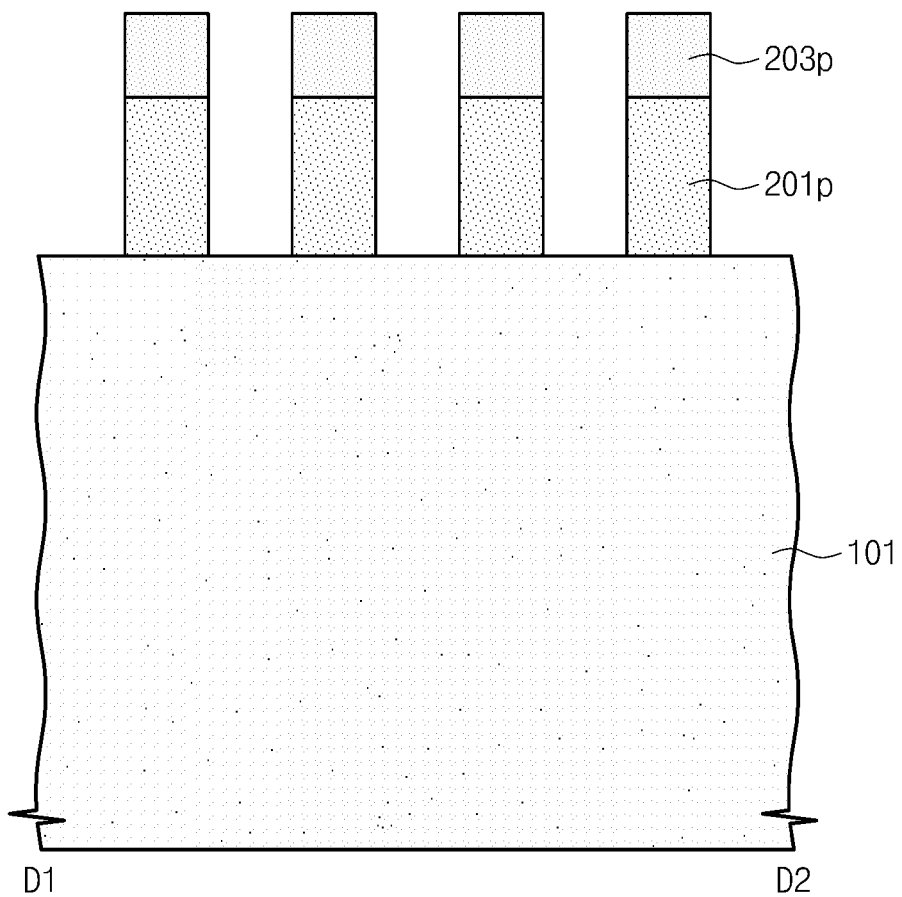
Figure 26C:
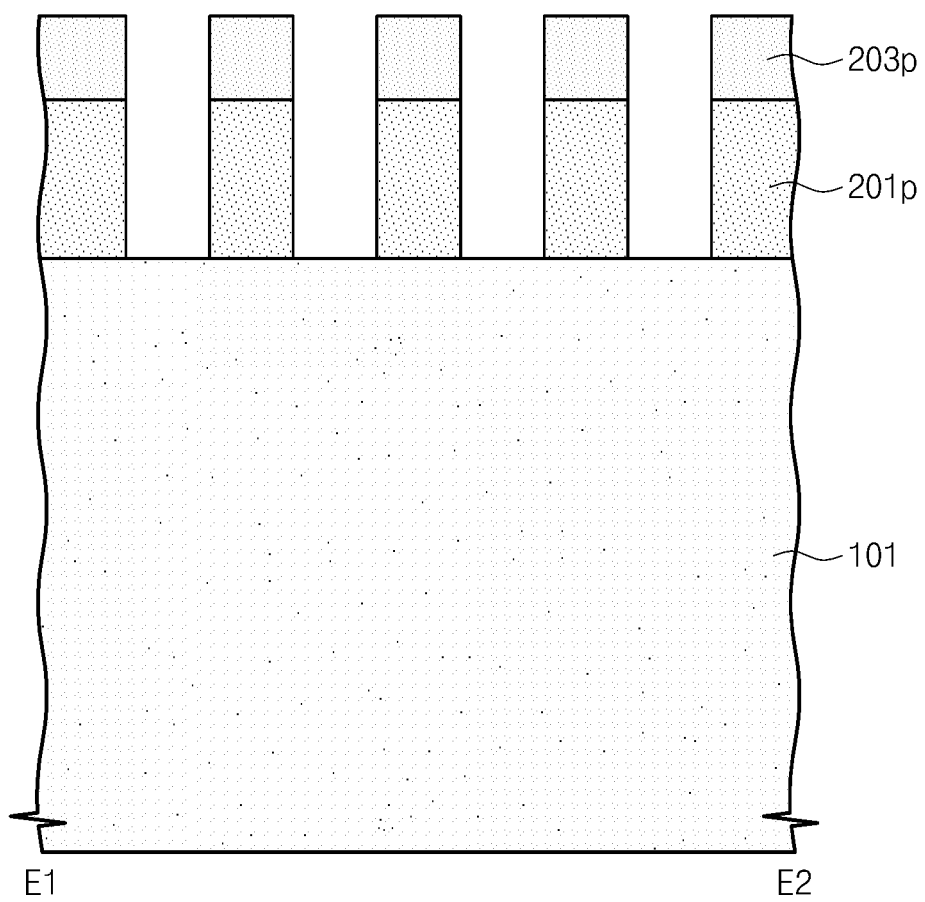
Figure 26D:
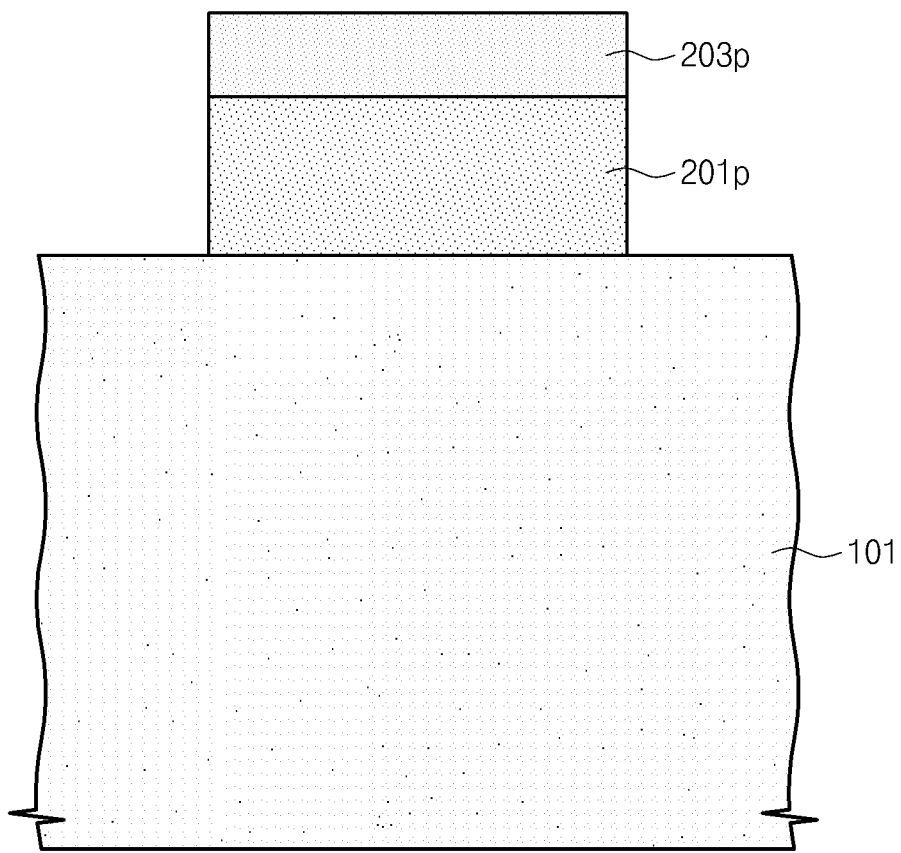

Referring to FIGS. 24A, 24B, 24C and 24D, the spacer 207s protruding over the third hardmask layer 213 may be selectively removed by an etching process using the third hardmask layer 213 as an etch mask. The selective removal of the spacer 207s may partially expose the upper mask pattern 203p. Thereafter, the exposed upper mask pattern 203p may be etched. The selective removal of the spacer 207s and the etching of the upper mask pattern 203p may partially expose the lower mask layer 201 along the line E1-E2 as illustrated in FIG. 24A. Owing to the selective removal of the spacer 207s protruding over the third hardmask layer 213, the spacer 207s may be changed to have a discontinuous shape from a continuous shape.

Referring to FIGS. 25A, 25B, 25C and 25D, the third hardmask layer 213 may be removed to partially expose the lower mask layer 201. The discontinuous shaped spacer 207s may remain on the line D1-D2.

Referring to FIGS. 26A, 26B, 26C and 26D, the lower mask layer 201 may be etched by an etching process using the upper mask pattern 203p as an etch mask to form a lower mask pattern 201p. The spacer 207s may be used as an etch mask during the etching process or removed before or after the etching process. In case the spacer 207s is formed of a material (e.g., silicon oxide) substantially identical or similar to that of the lower mask layer 201, the spacer 207s may be removed when the lower mask layer 201 is etched. The upper mask pattern 203p may have a herringbone shape extending in a zigzag fashion along the first direction Y. Similarly, the lower mask pattern 201p may be shaped like the upper mask pattern 203p.

Referring to FIGS. 27A, 27B, 27C and 27D, the substrate 101 may be etched by an etching process using the lower mask pattern 201p as an etch mask to form a trench 103. Therefore, a portion of the substrate 101 may be defined as an active region 102. The upper mask pattern 203p may be used as an etch mask during the etching process or removed before or after the etching process. In case the upper mask pattern 203p is formed of a material (e.g., polysilicon) substantially identical or similar to that of the substrate 101, the upper mask pattern 203p may be removed when the substrate 101 is etched.

Figure 27A:
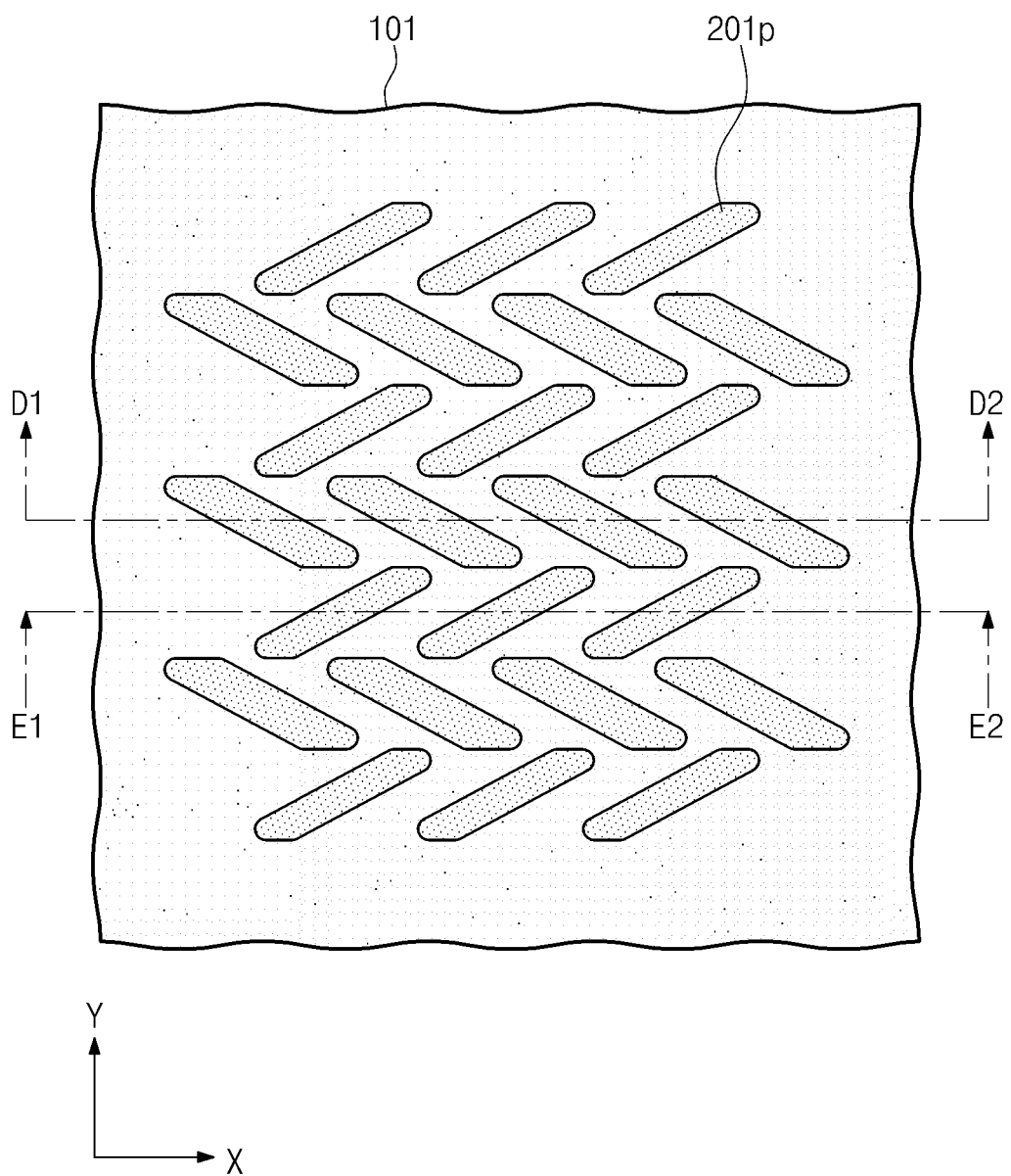
Figure 27B:
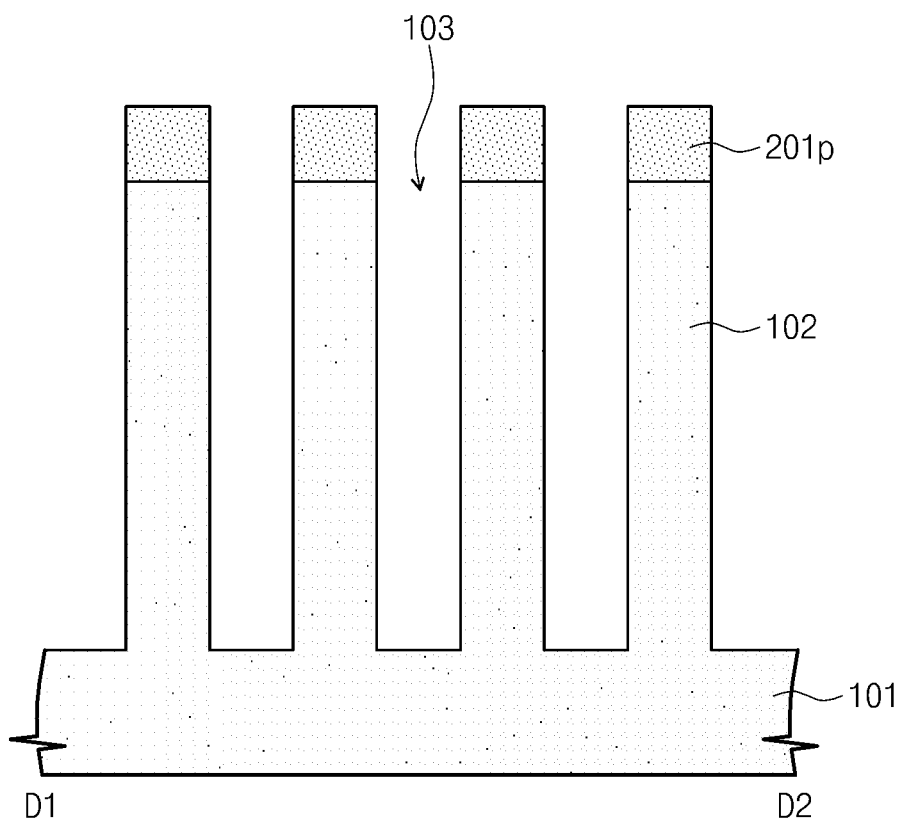
Figure 27C:
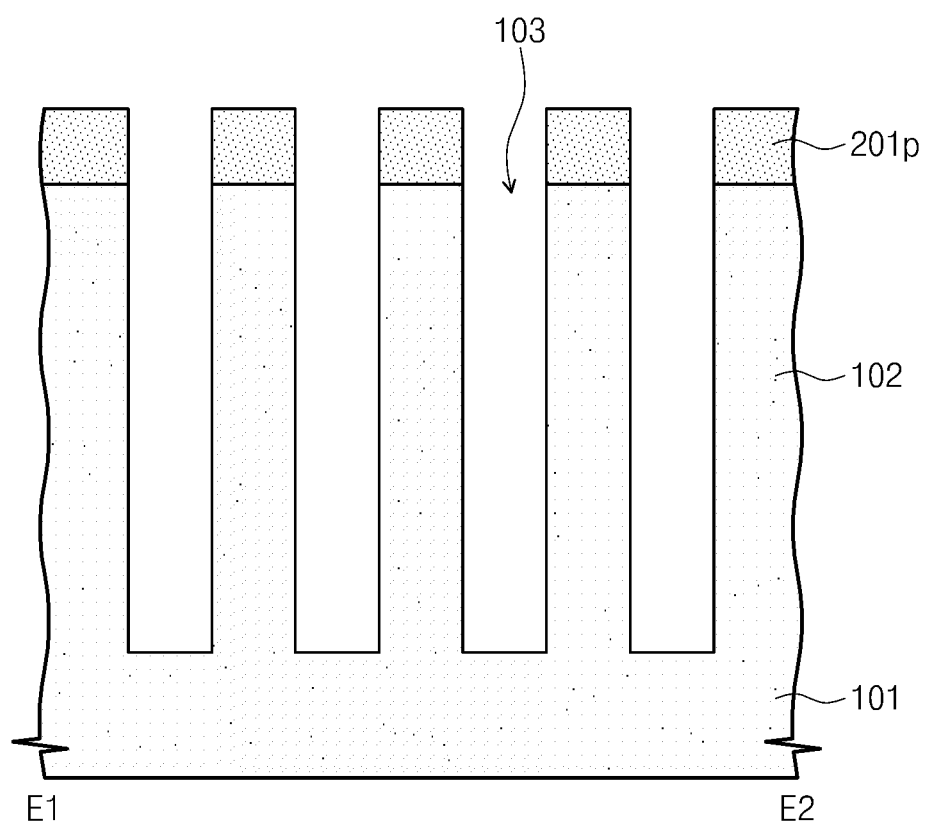
Figure 27D:
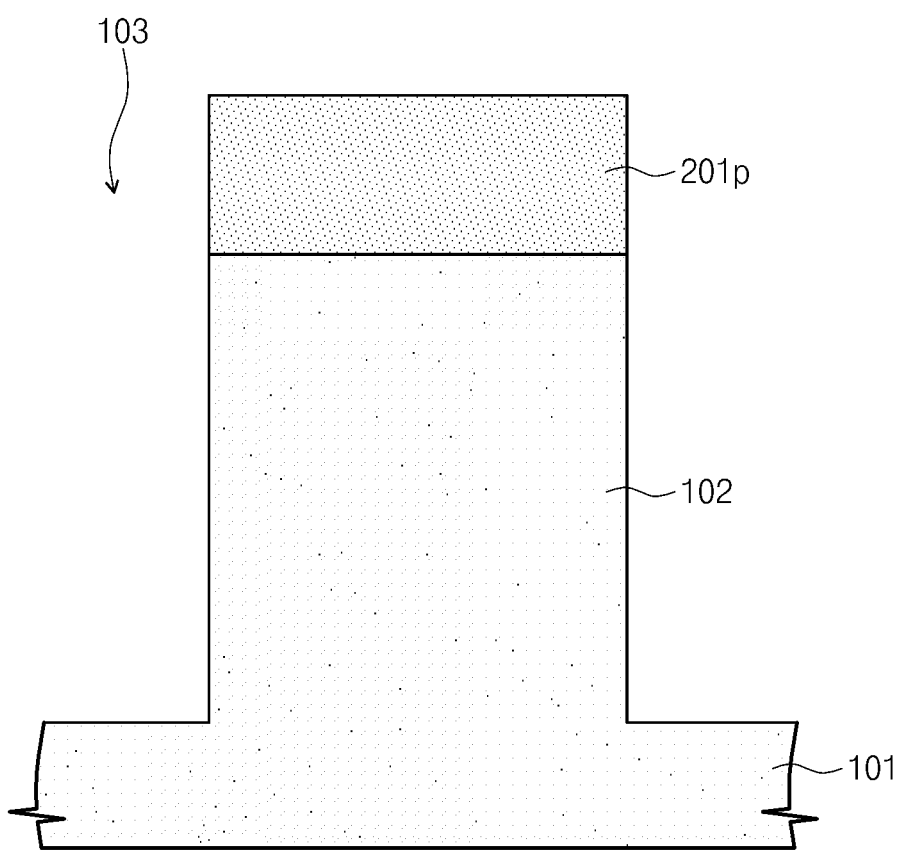

In some embodiments, when the lower mask layer 201 is etched as formerly described with reference to FIGS. 26A, 26B, 26C and 26D, the lower mask pattern 201p may be partially etched to have a round shape as illustrated in FIG. 27A. Alternatively, a separate process may be performed to form the round-shaped lower mask pattern 201p.

Figure 28A:
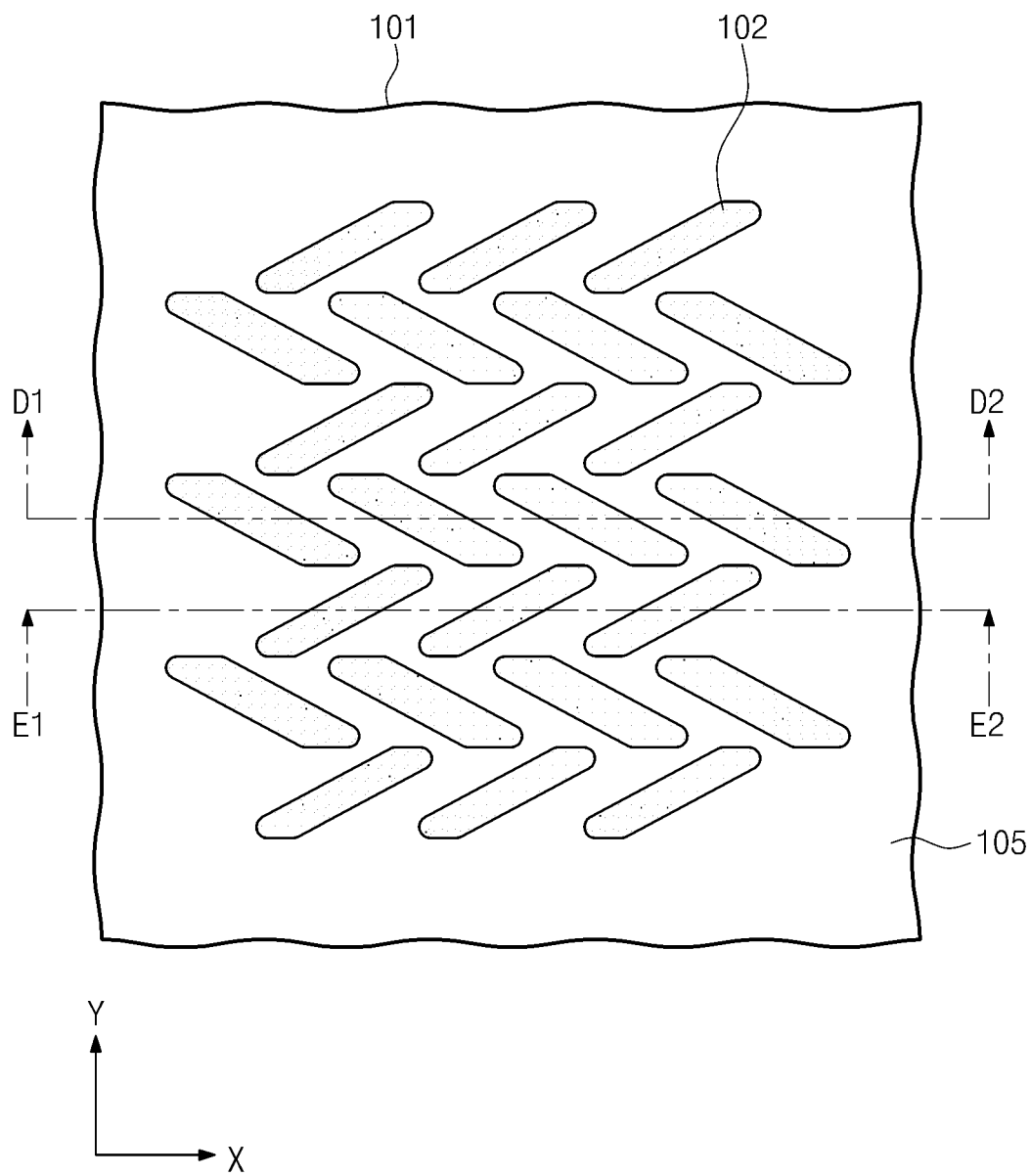
Figure 28B:
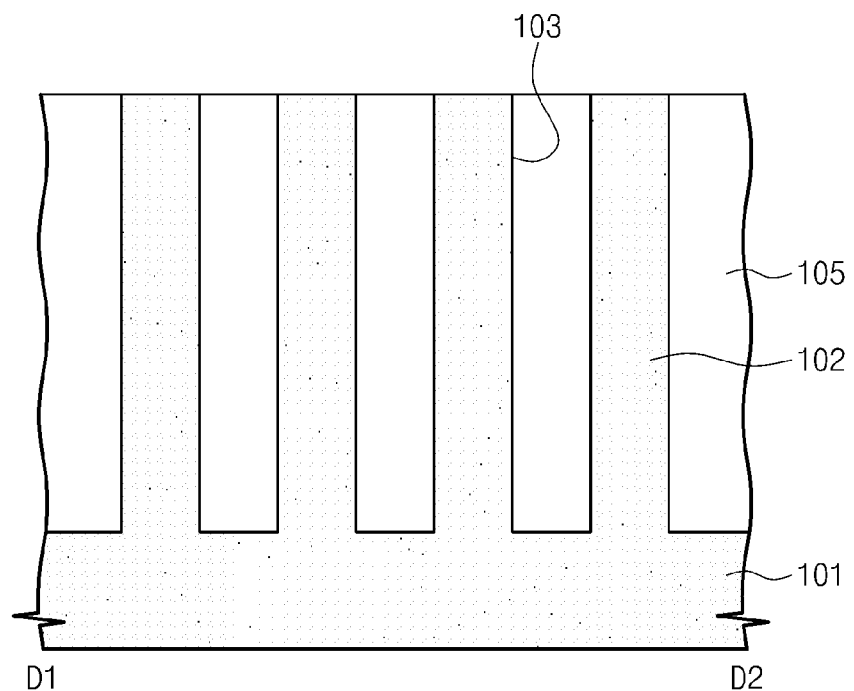
Figure 28C:
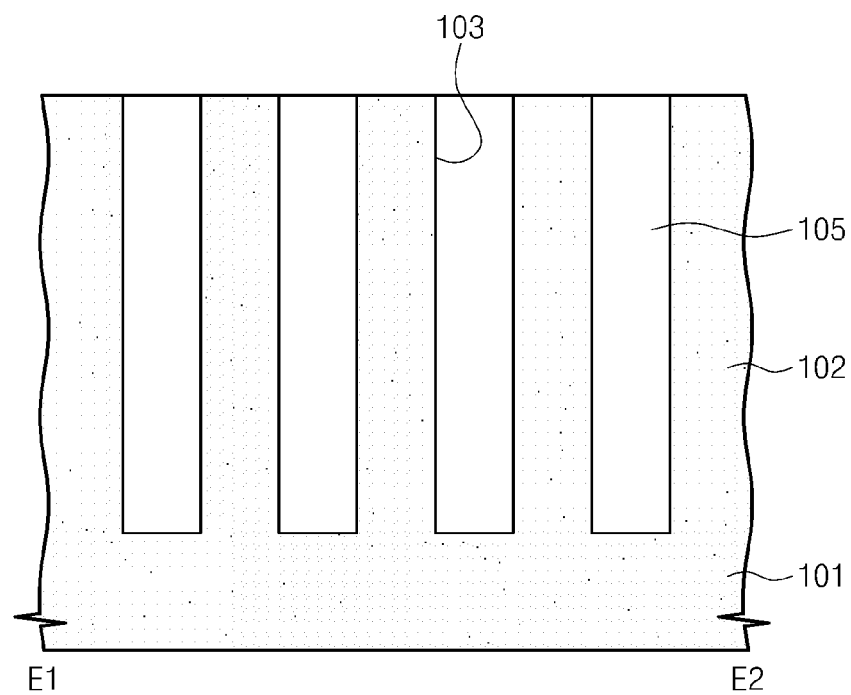
Figure 28D:
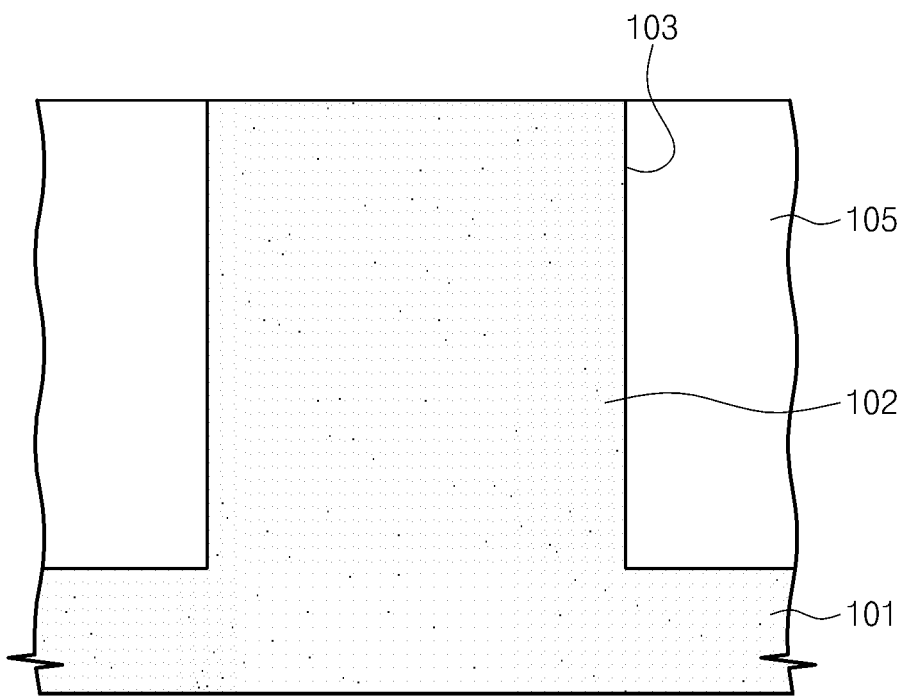
Figure 29:
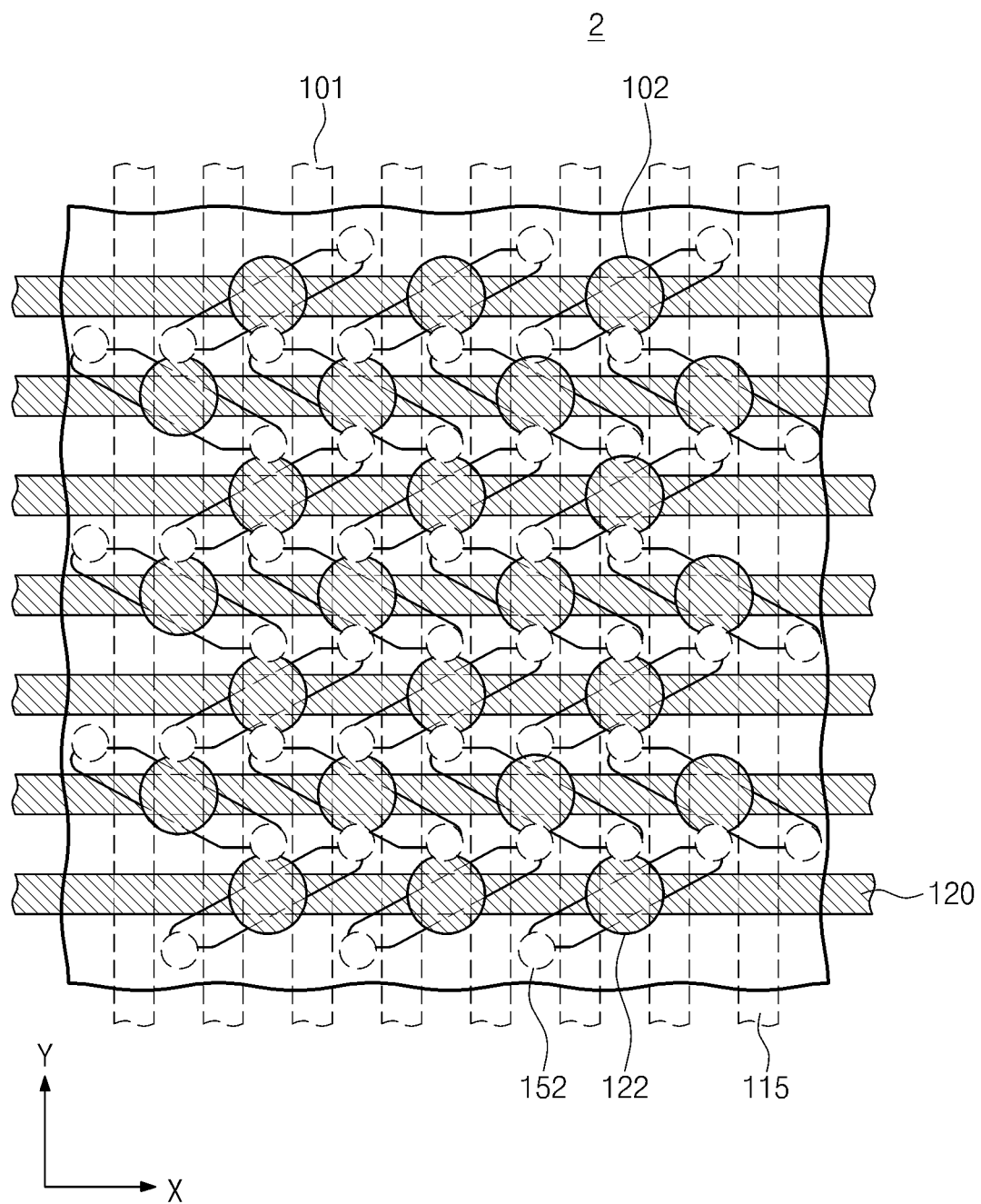
FIG. 29 is a plan view illustrating a semiconductor device according to another example embodiment of the present inventive concepts.

Referring to FIGS. 28A, 28B, 28C and 28D, the trench 103 may be filled with an insulating material to form a device isolation layer 105. Consequently, the substrate 101 may have the active region 102 defined by the device isolation layer 105 and vertically extending from the substrate 101. The active region 102 in the cell region as shown in FIGS. 28B and 28C may have a herringbone shape discontinuously extending in the first direction Y. The active region 102 in the peripheral region as illustrated in FIG. 28D may have an island shape. In an embodiment, the active region 102 in the peripheral region may be formed to have a herringbone shape substantially identical or similar to the active region 102 in the cell region.

Referring to FIG. 29, a word line 115 extending in the first direction Y, a contact 122 electrically connected to the active region 102, and a bit line 120 extending in the second direction X may be formed on the substrate 101 having the herringbone-shaped active region 102, thereby fabricating a semiconductor device 2. The contact 122 may electrically connect the bit line 120 to the substrate 101. The semiconductor device 2 may further include a second contact 152 electrically connected to the active region 102 and a capacitor electrically connected to the substrate 101 by the second contact 152.

FIGS. 30A to 42A are plan views illustrating a method for forming an active region according to another example embodiment of the present inventive concepts. FIGS. 30B to 42B are cross-sectional views taken along lines G1-G2 in cell regions of FIGS. 30A to 42A. FIGS. 30C to 42C are cross-sectional views taken along lines H1-H2 in cell regions of FIGS. 30A to 42A. FIGS. 30D to 42D are cross-sectional view of peripheral regions of FIGS. 30A to 42A. FIG. 43 is a plan view illustrating a semiconductor device according to other example embodiment of the present inventive concepts.

Referring to FIGS. 30A, 30B, 30C and 30D, a lower mask layer 301 and an upper mask layer 303 may be sequentially stacked on a substrate 101. The lower mask layer 301 may have an etch selectivity different from that of the upper mask layer 303. For example, the lower mask layer 301 may be formed of an insulating layer (e.g., a silicon oxide layer) and the upper mask layer 303 may be formed of a semiconductor layer or a conductive layer (e.g., a polysilicon layer).

Figure 30A:
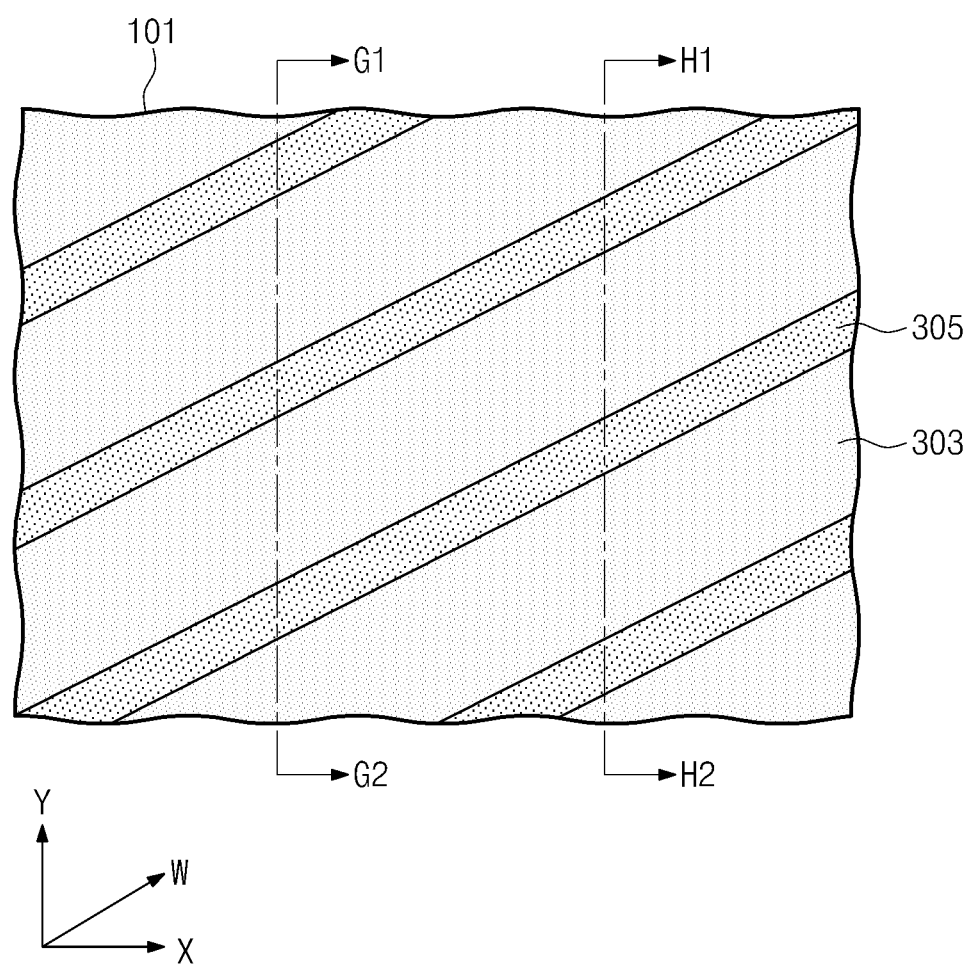
Figure 30B:
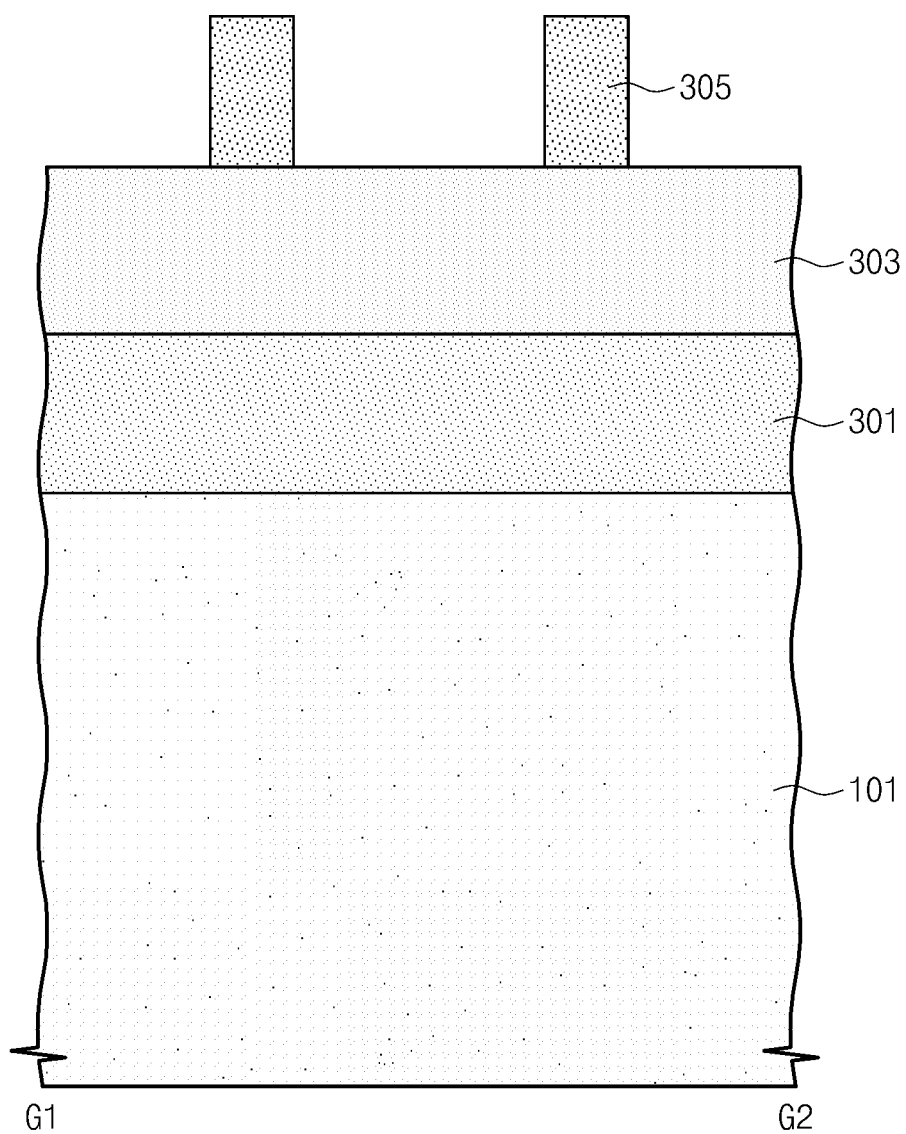
Figure 30C:
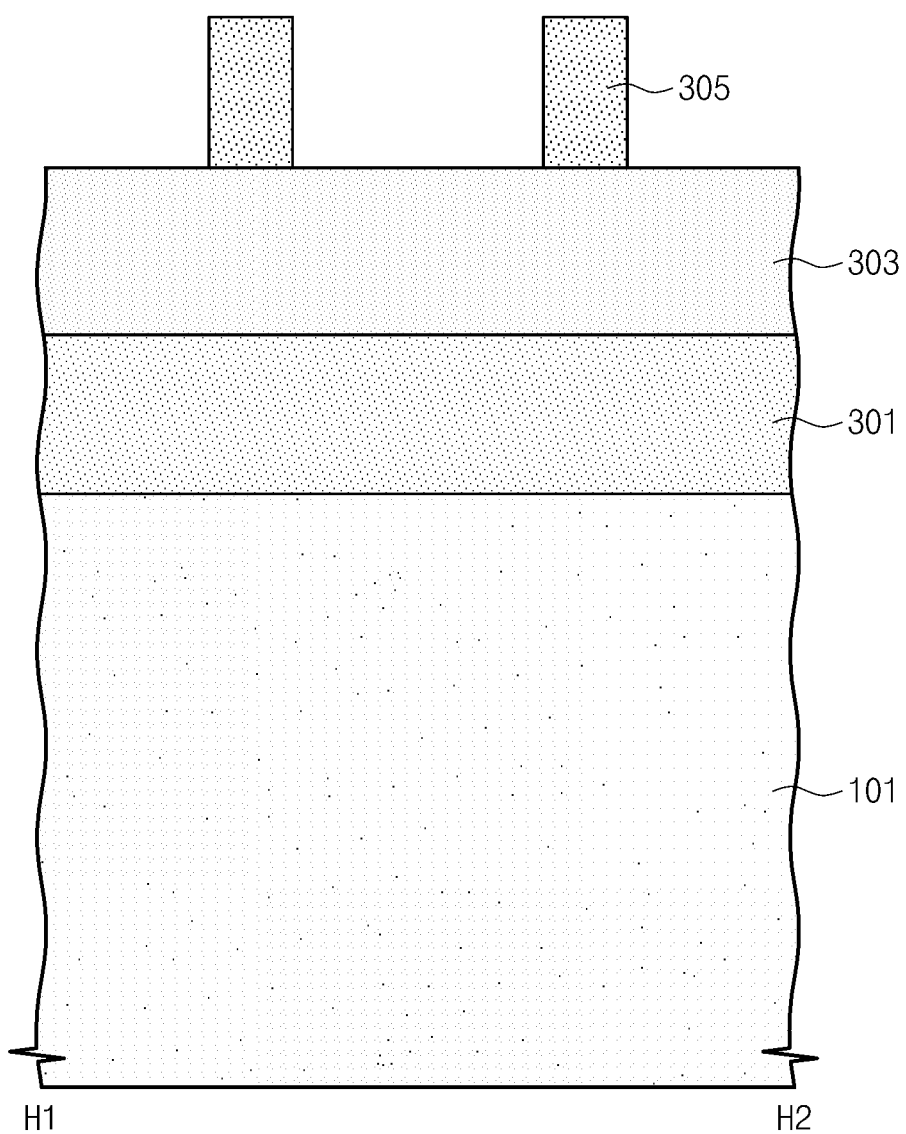
Figure 30D:
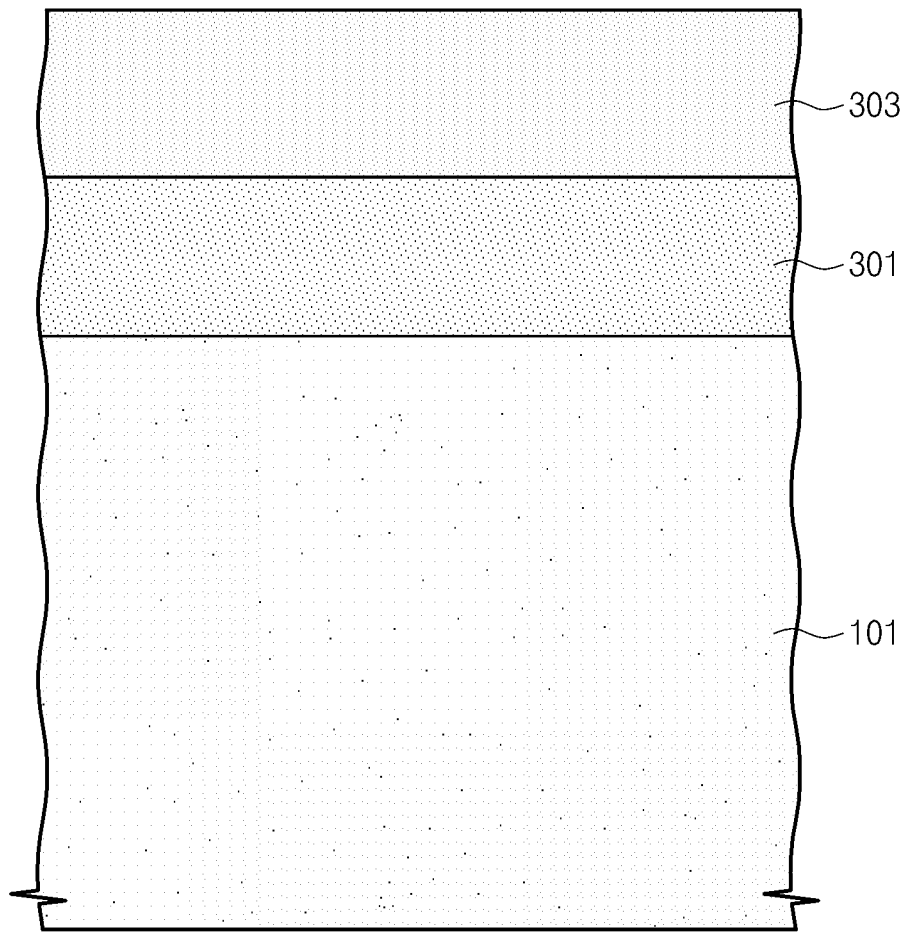
Figure 31A:
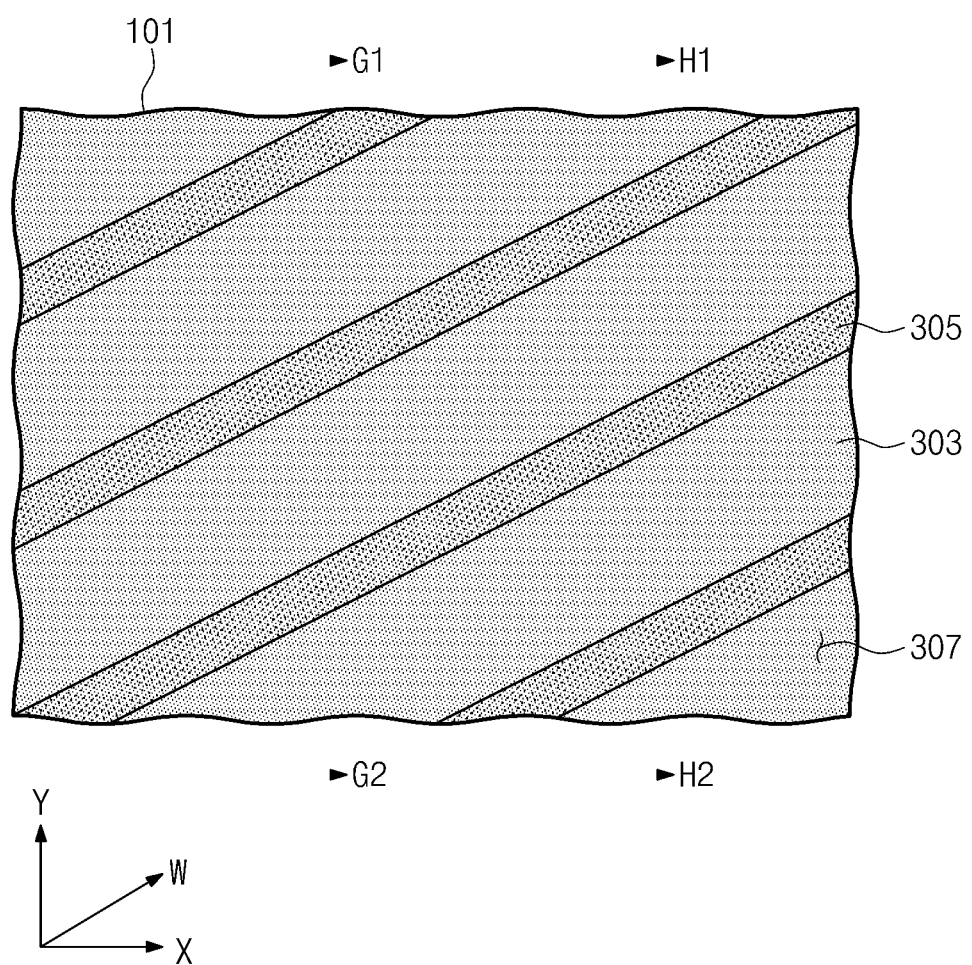
Figure 31B:
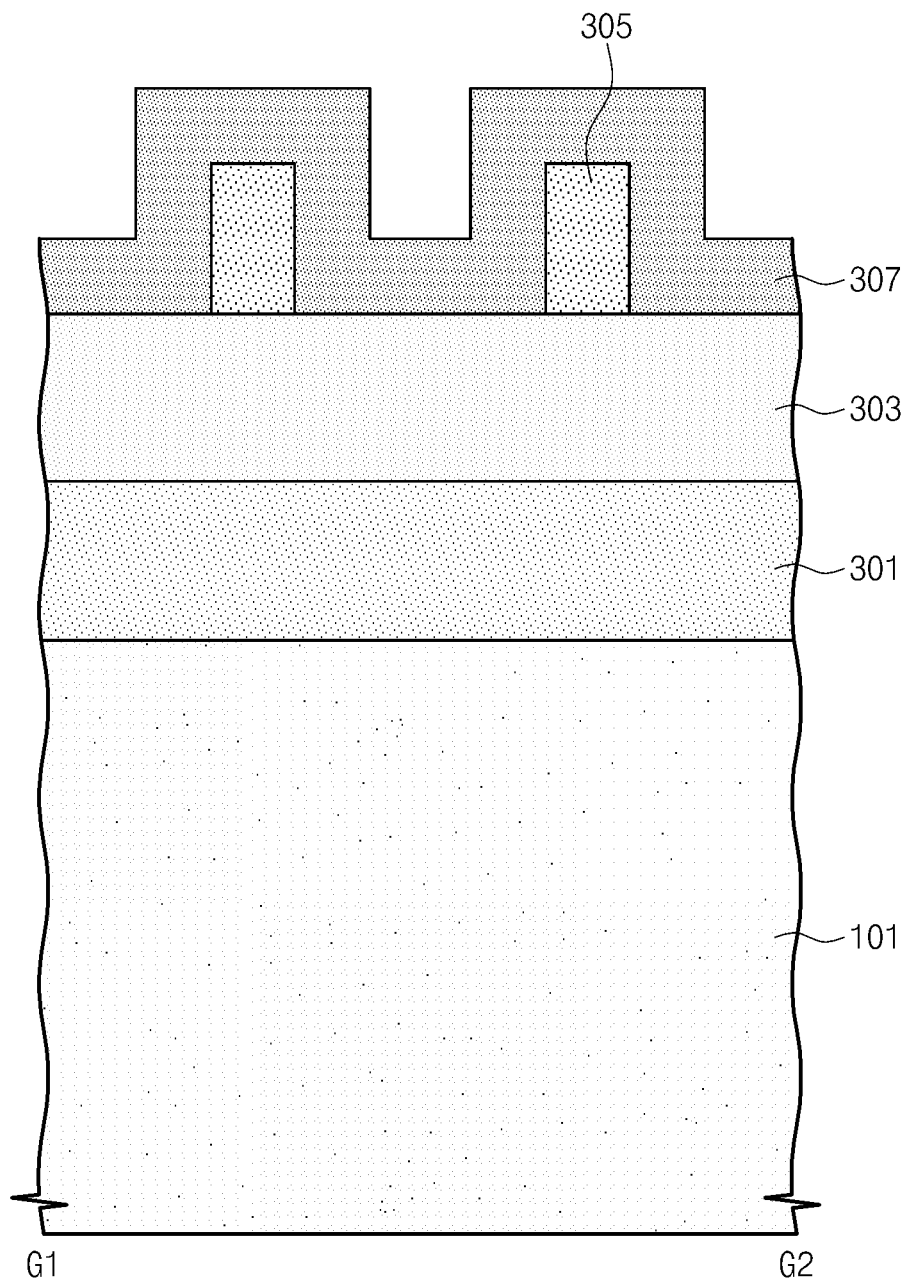
Figure 31C:
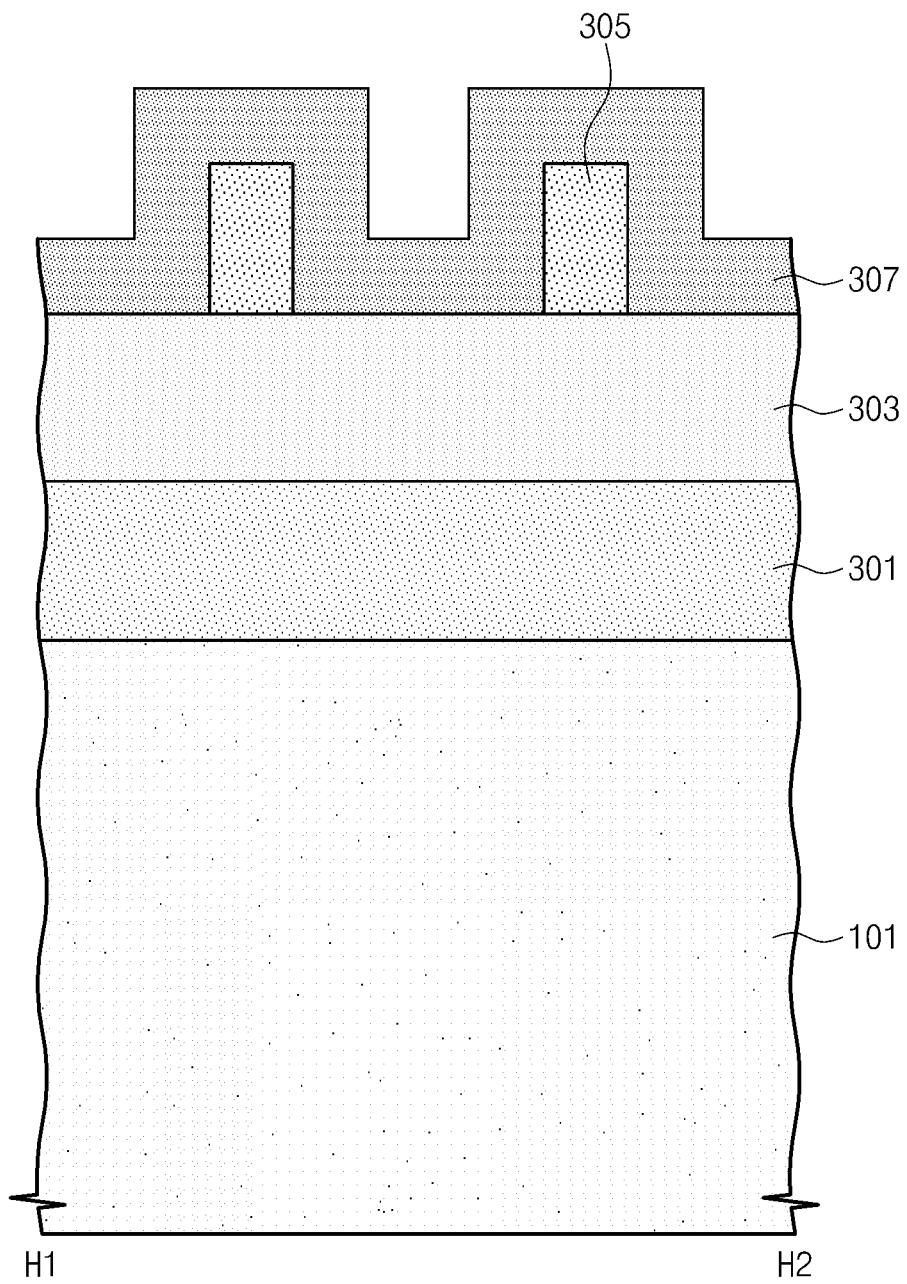
Figure 31D:
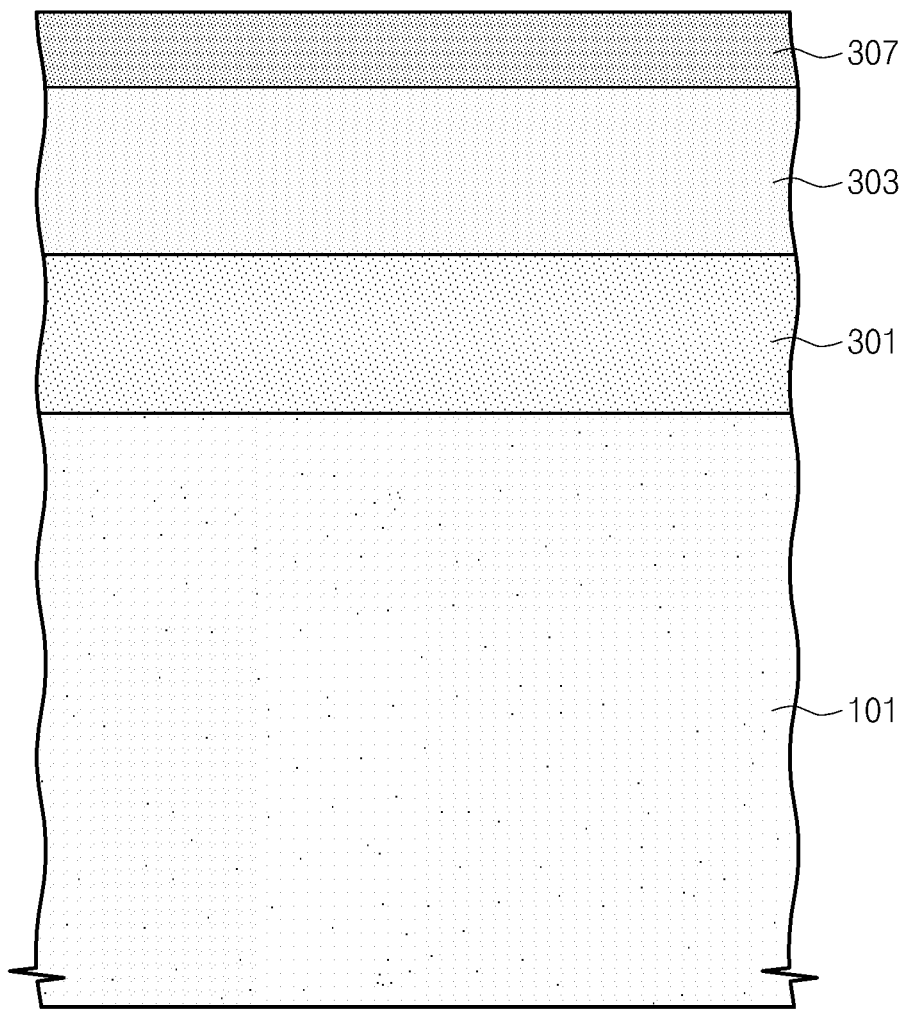

A plurality of first hardmask layers 305 may be formed on the upper mask layer 303. The first hardmask layers 305 may have line shapes extending parallel with one another in a diagonal direction W. The first hardmask layers 305 may be formed of a material (e.g., SiON, SiC, SiN, SiCN, etc.) having an etch selectivity with respect to the lower and upper mask layers 301 and 303. As shown in FIG. 30D, the first hardmask layers 205 may not be formed in a peripheral region.

Referring to FIGS. 31A, 31B, 31C and 31D, a spacer layer 307 may be formed on the upper mask layer 303. The spacer layer 307 may include an insulating material (e.g., a silicon oxide layer) deposited by an atomic layer deposition (ALD). The spacer layer 307 may have a bent shape in a cell region and a planar shape in the peripheral region.

Figure 32A:
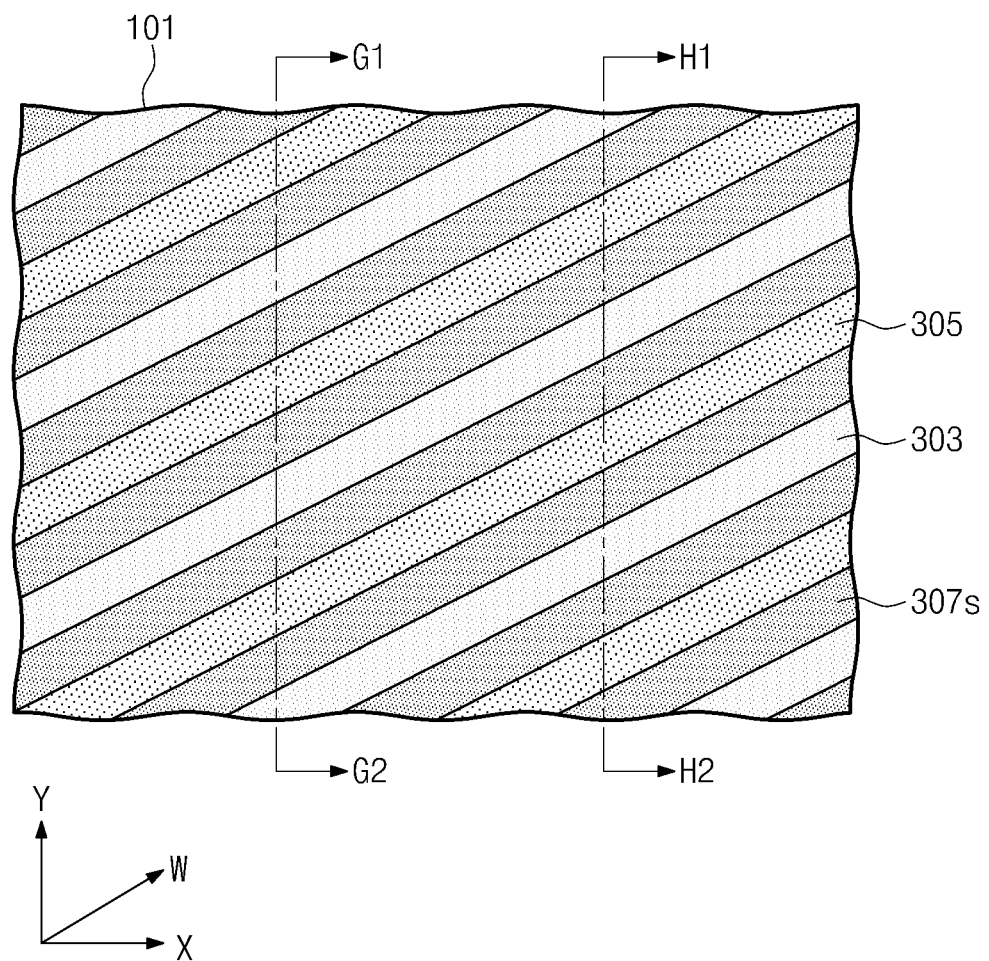
Figure 32B:
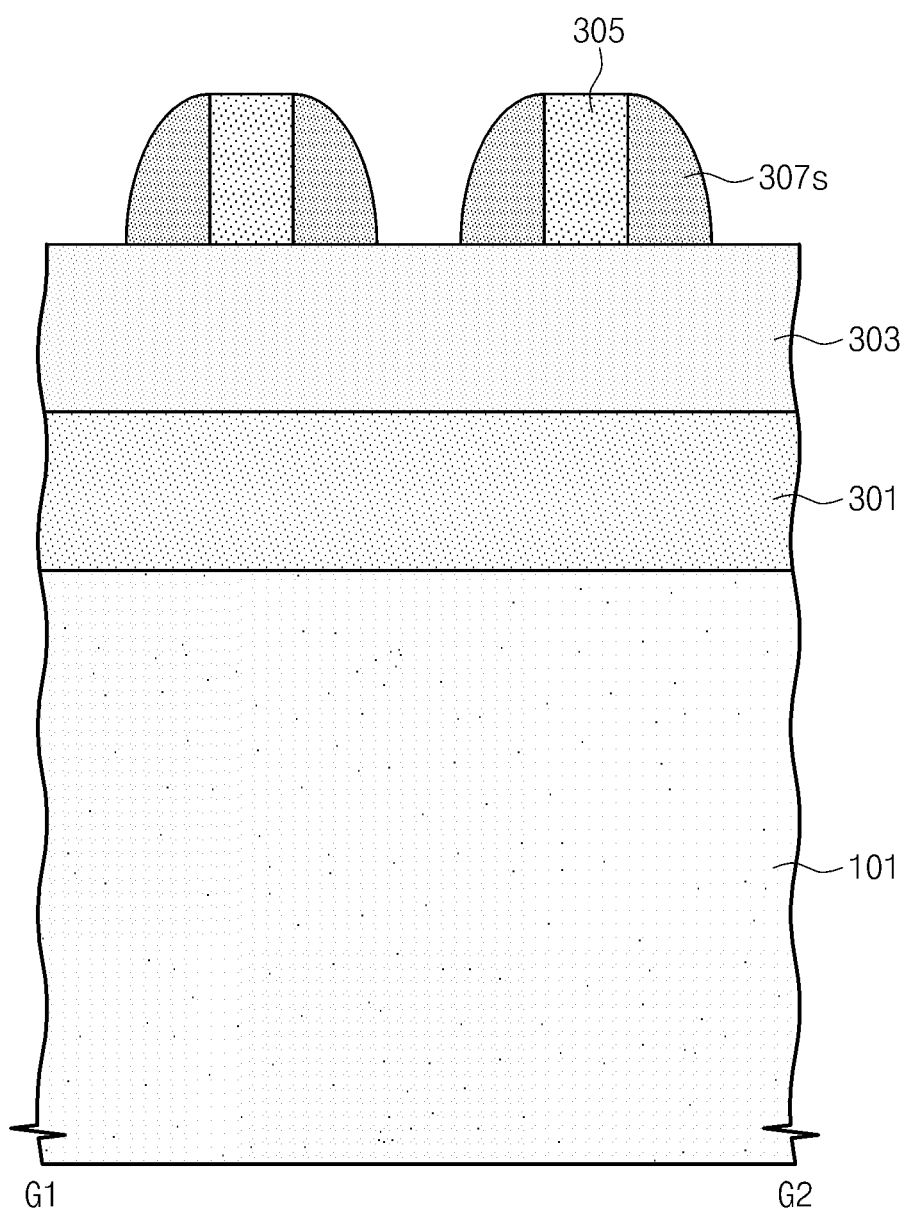
Figure 32C:
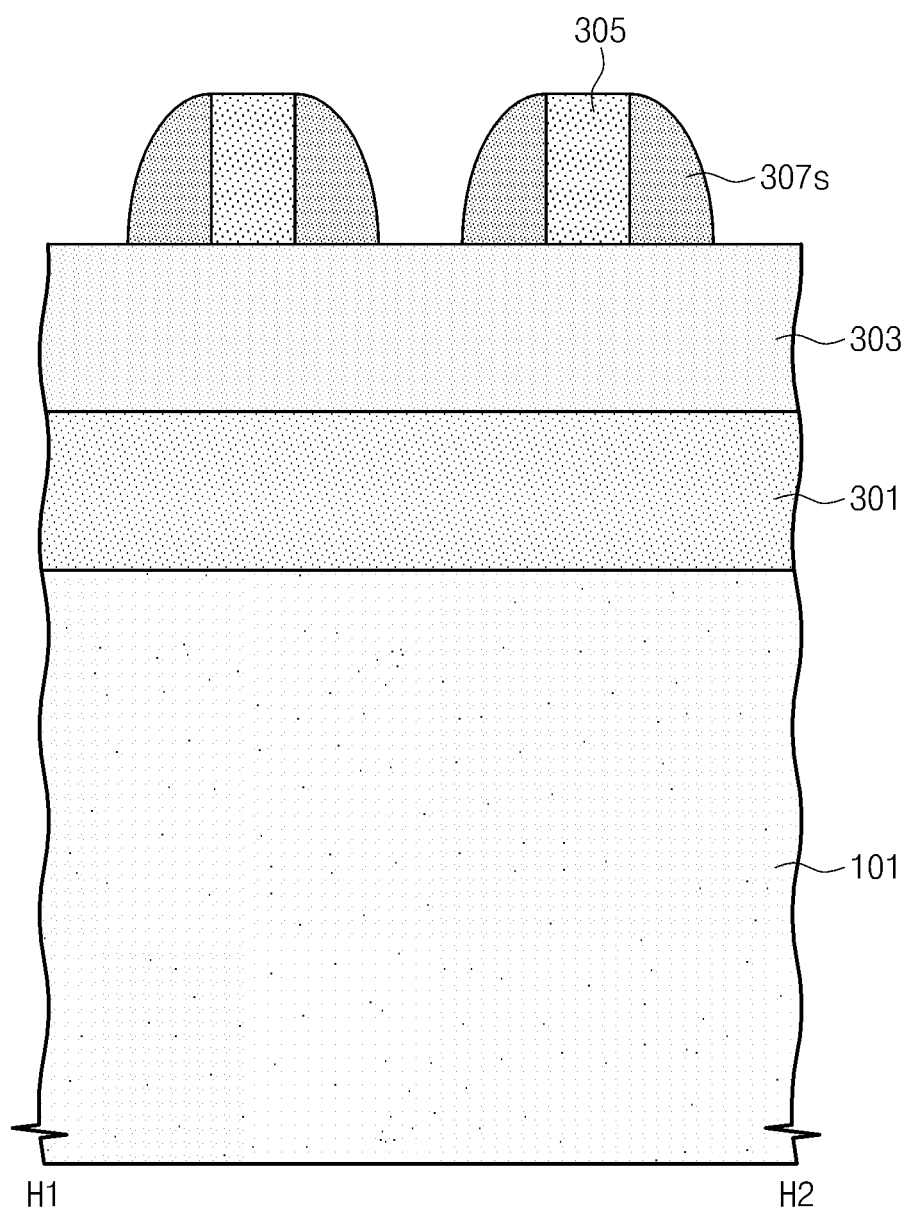
Figure 32D:
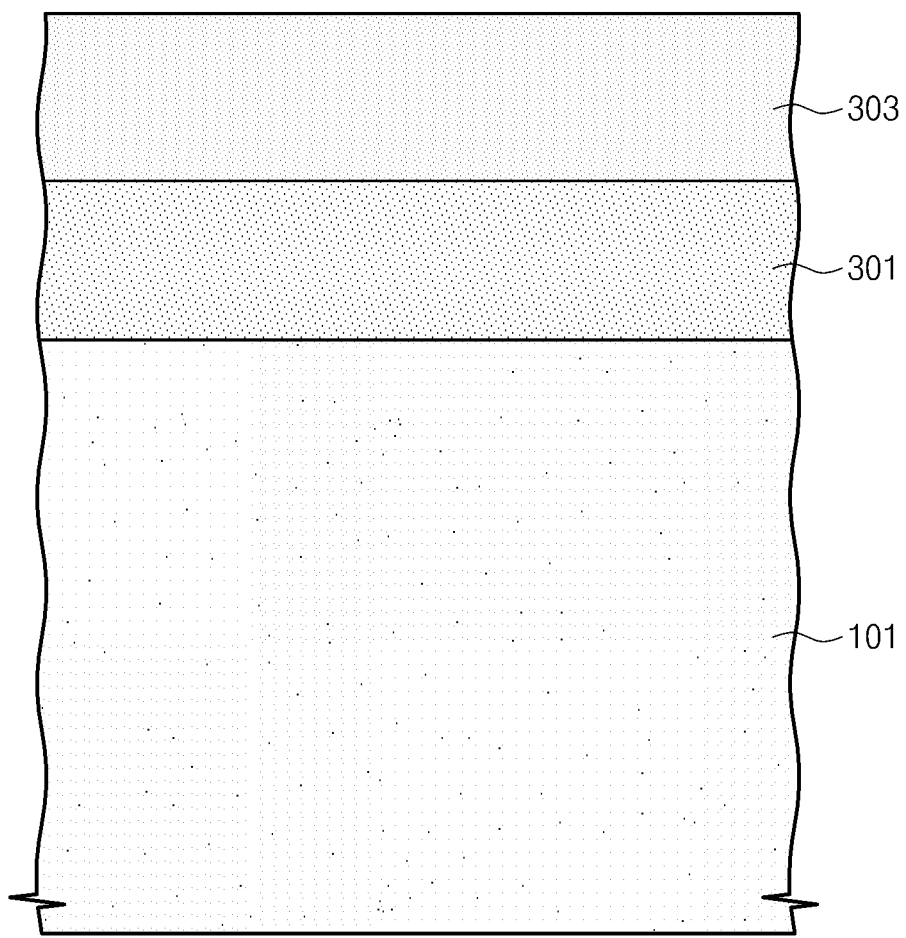
Figure 33A:
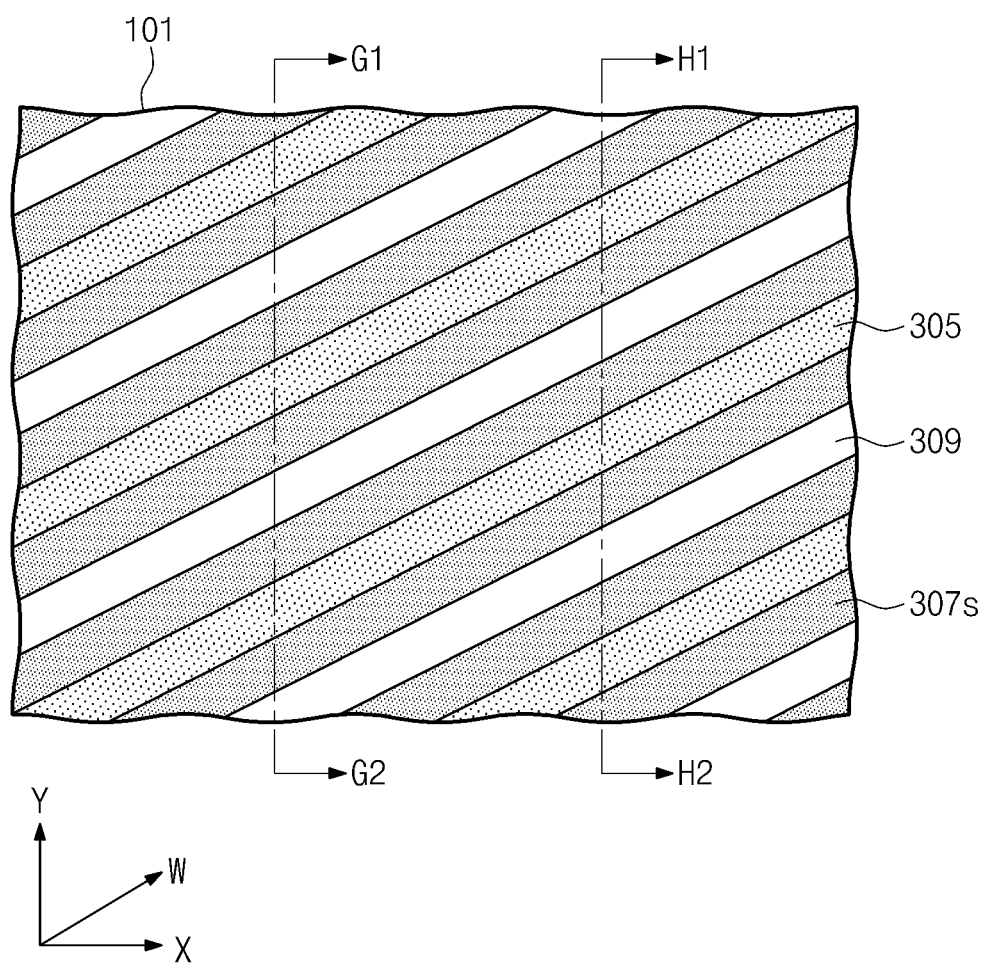
Figure 33B:
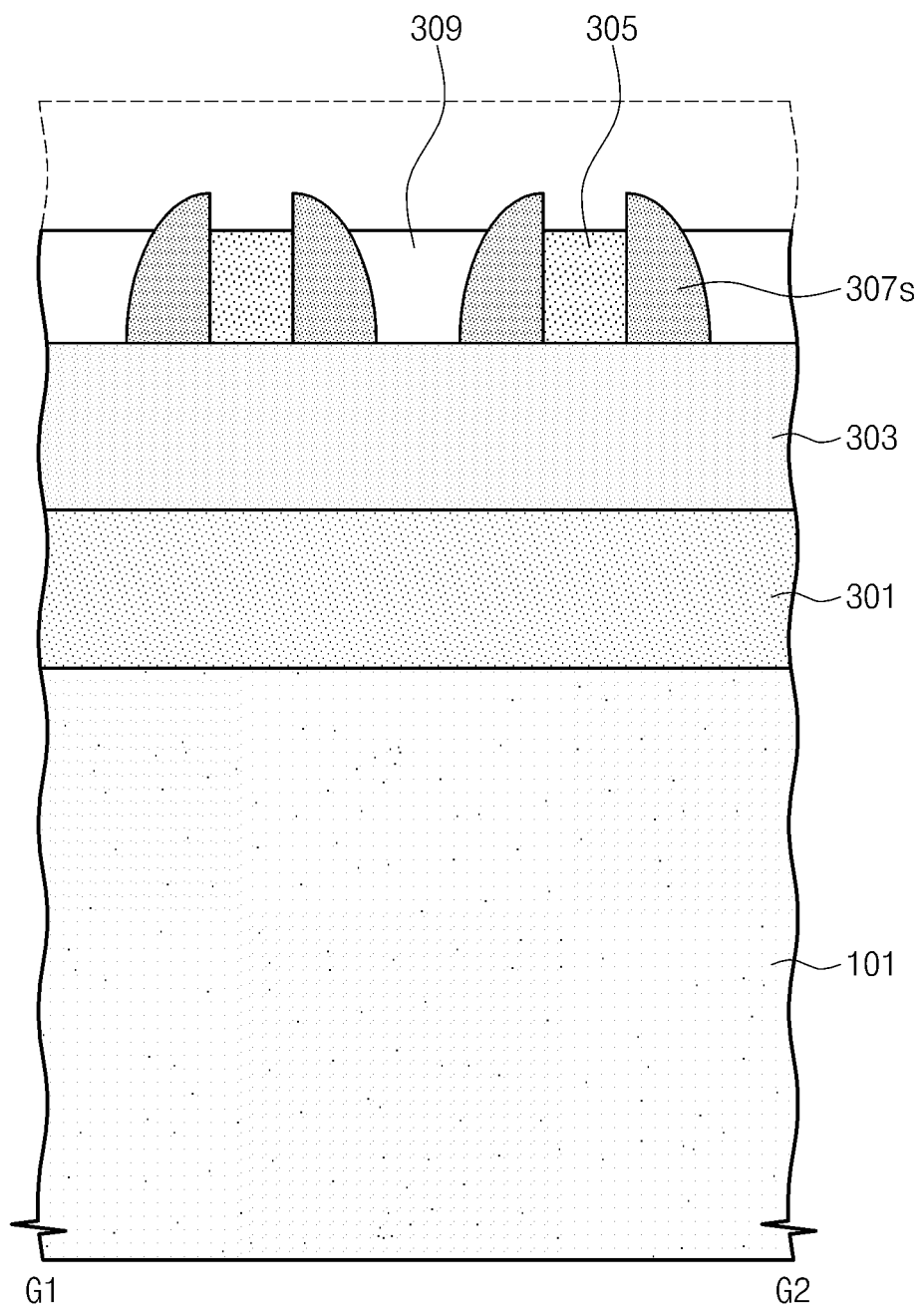
Figure 33C:
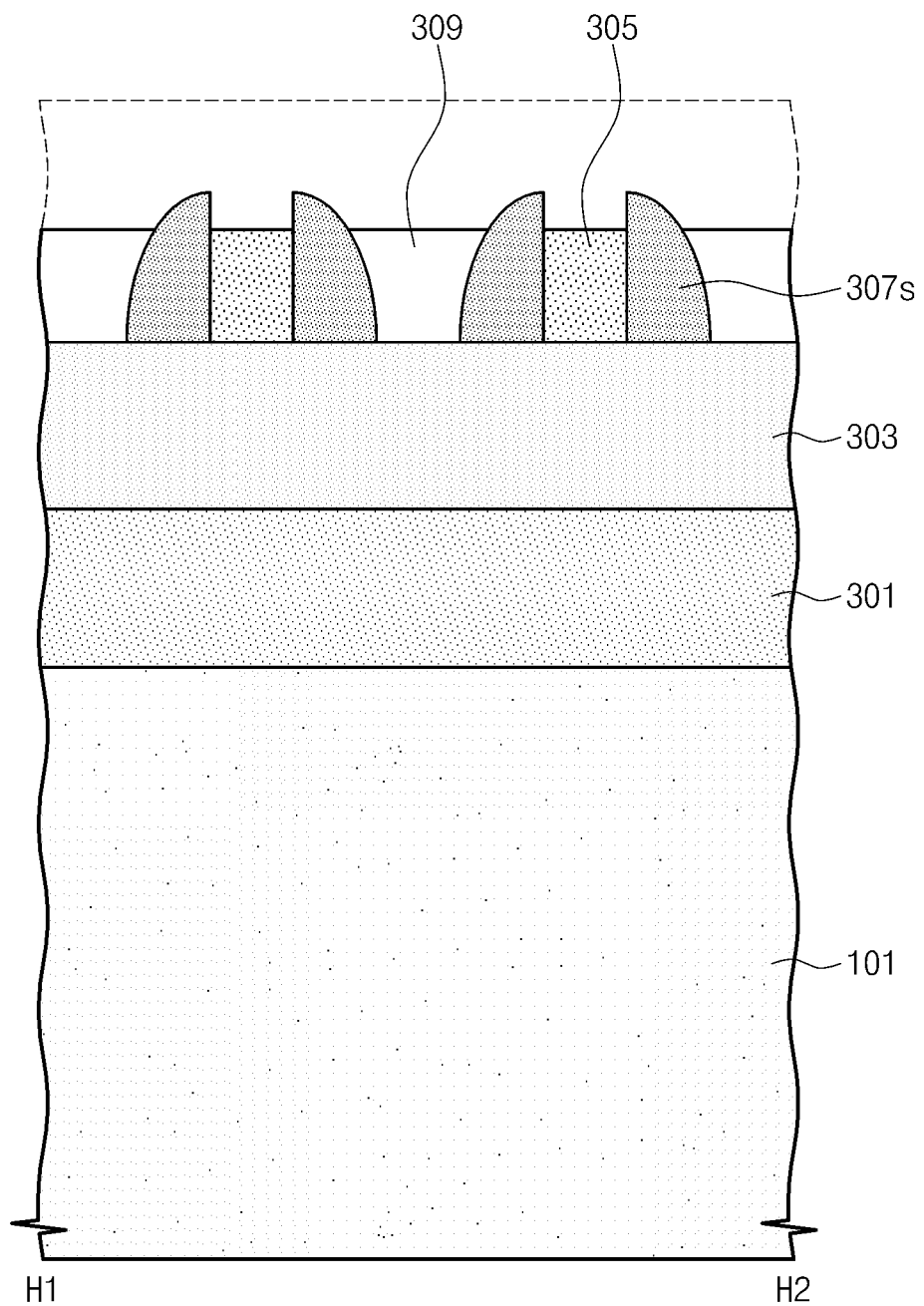
Figure 33D:
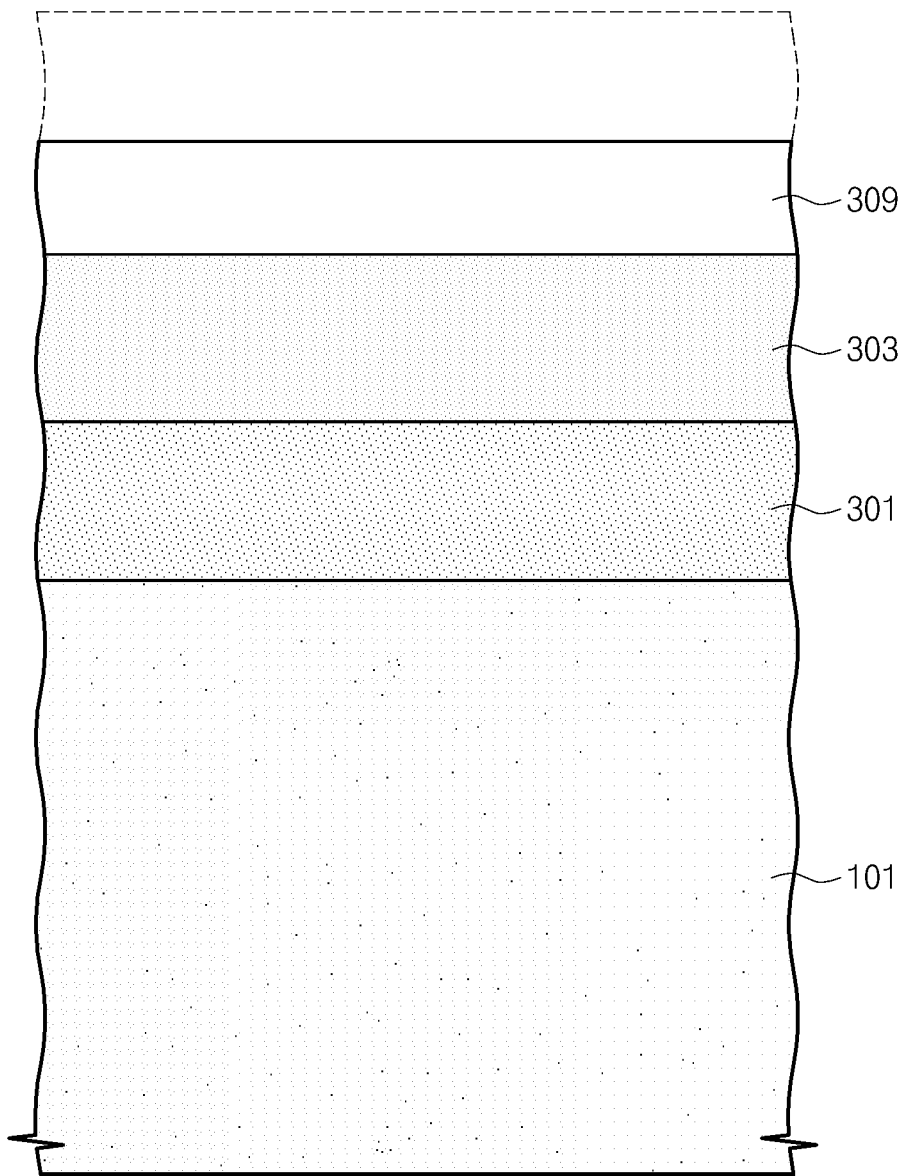

Referring to FIGS. 32A, 32A, 32C and 32D, the spacer layer 307 may be etched to form a spacer 307s on a sidewall of the first hardmask layer 305. The spacer 307s may have a line shape extending along the first hardmask layer 305 shaped like a line as illustrated in FIG. 32A.

Referring to FIGS. 33A, 33B, 33C and 33D, a second hardmask layer 309 may be formed on the upper mask layer 303. The spacer 307s may protrude over the second hardmask layer 309. The second hardmask layer 309 may be formed by deposition and etch-back processes. Alternatively, it is possible to skip the etch-back process in case the second hardmask layer 309 is formed to have a thickness whose variation is improved enough to expose the spacer 307s.

Figure 34A:
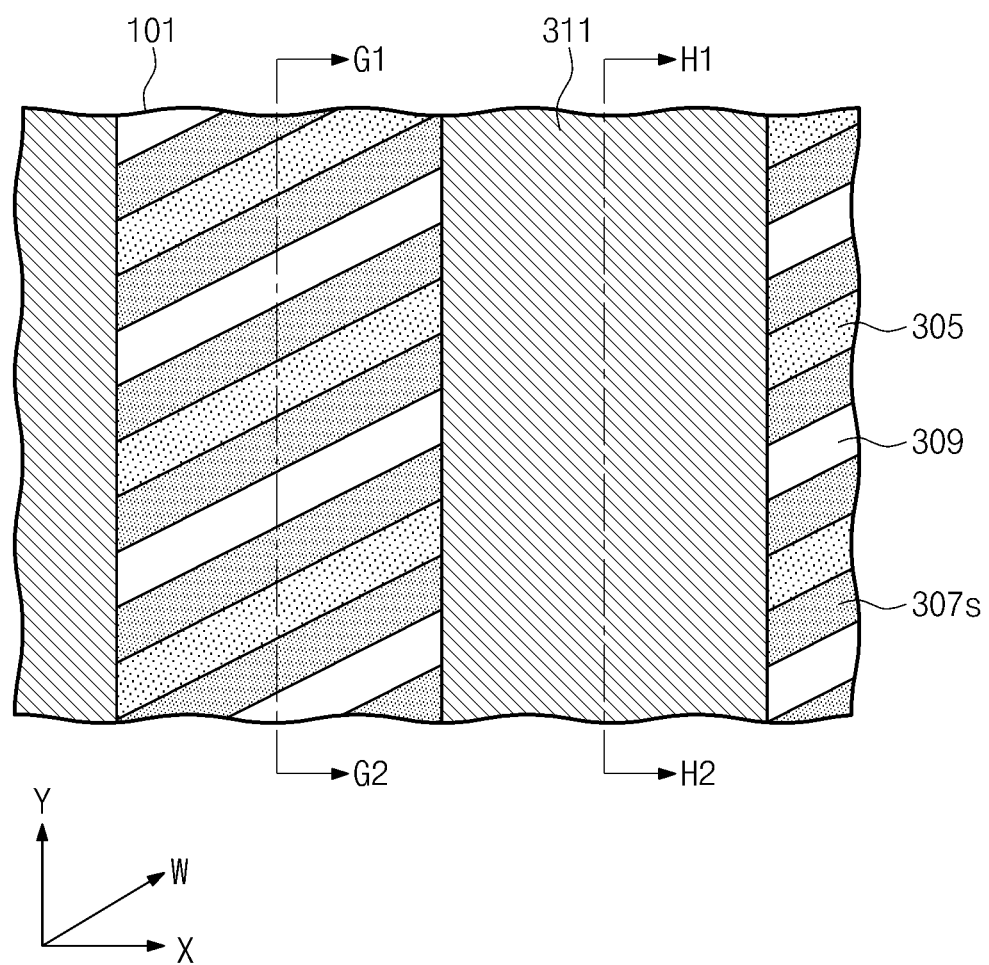
Figure 34B:
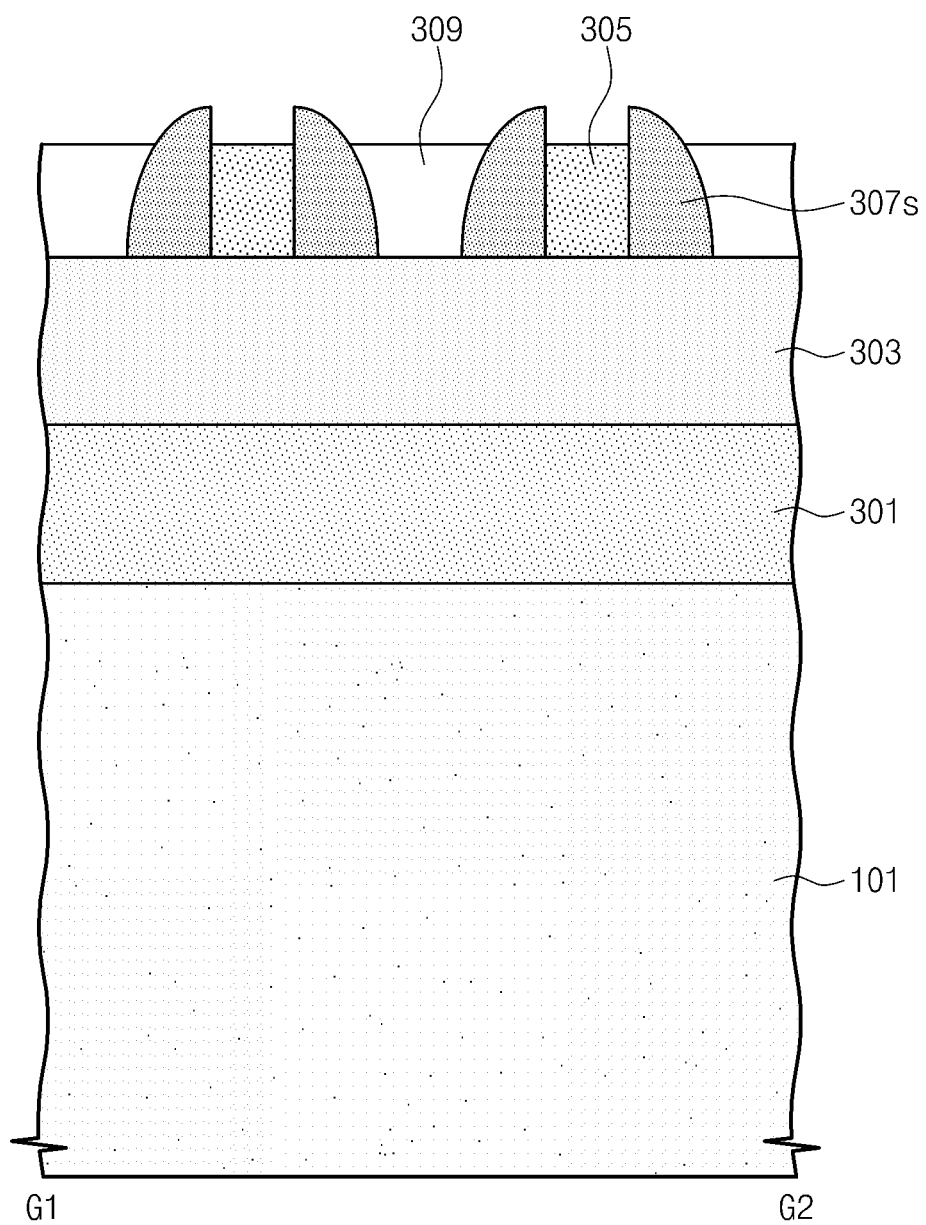
Figure 34C:
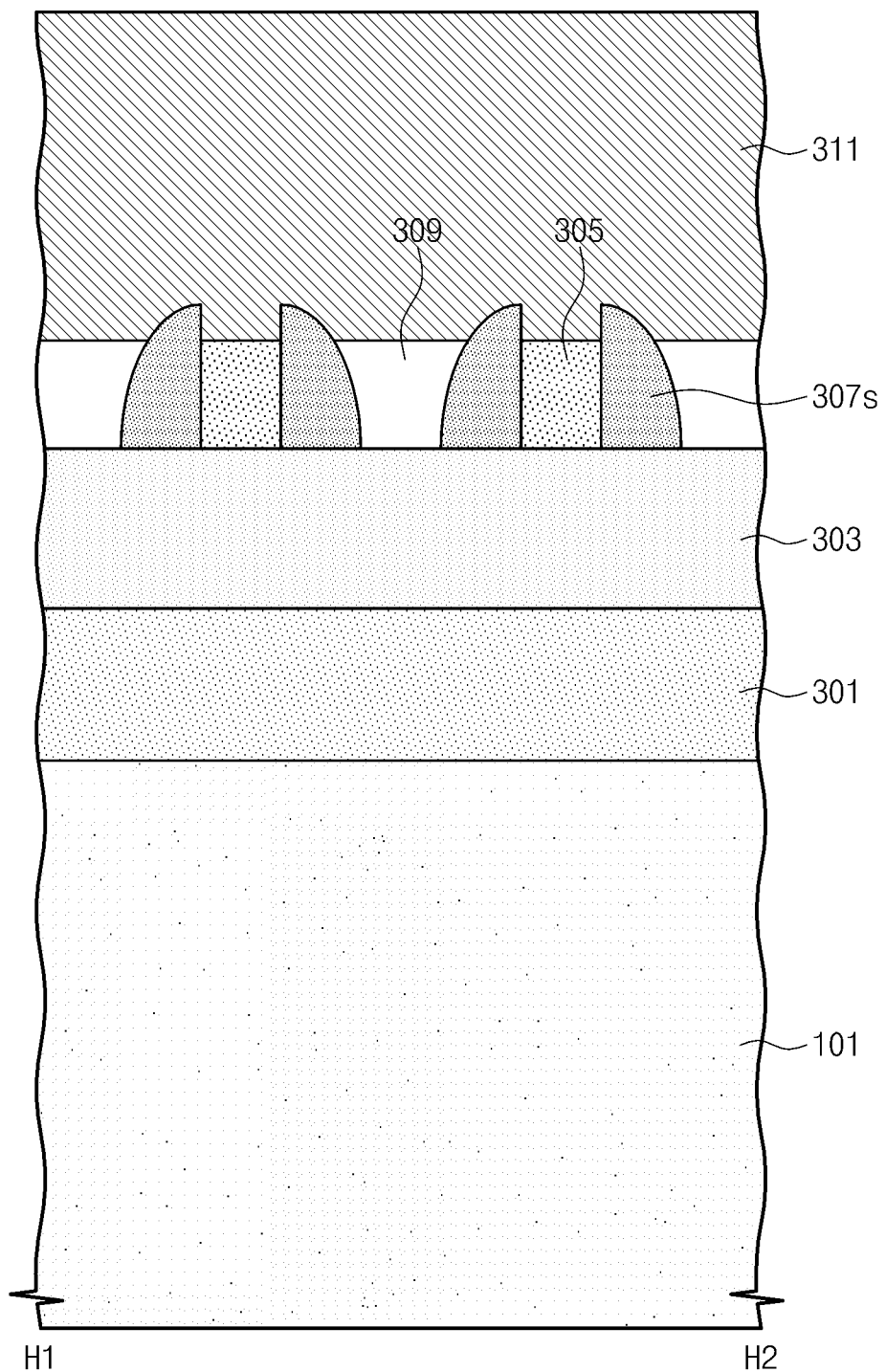
Figure 34D:
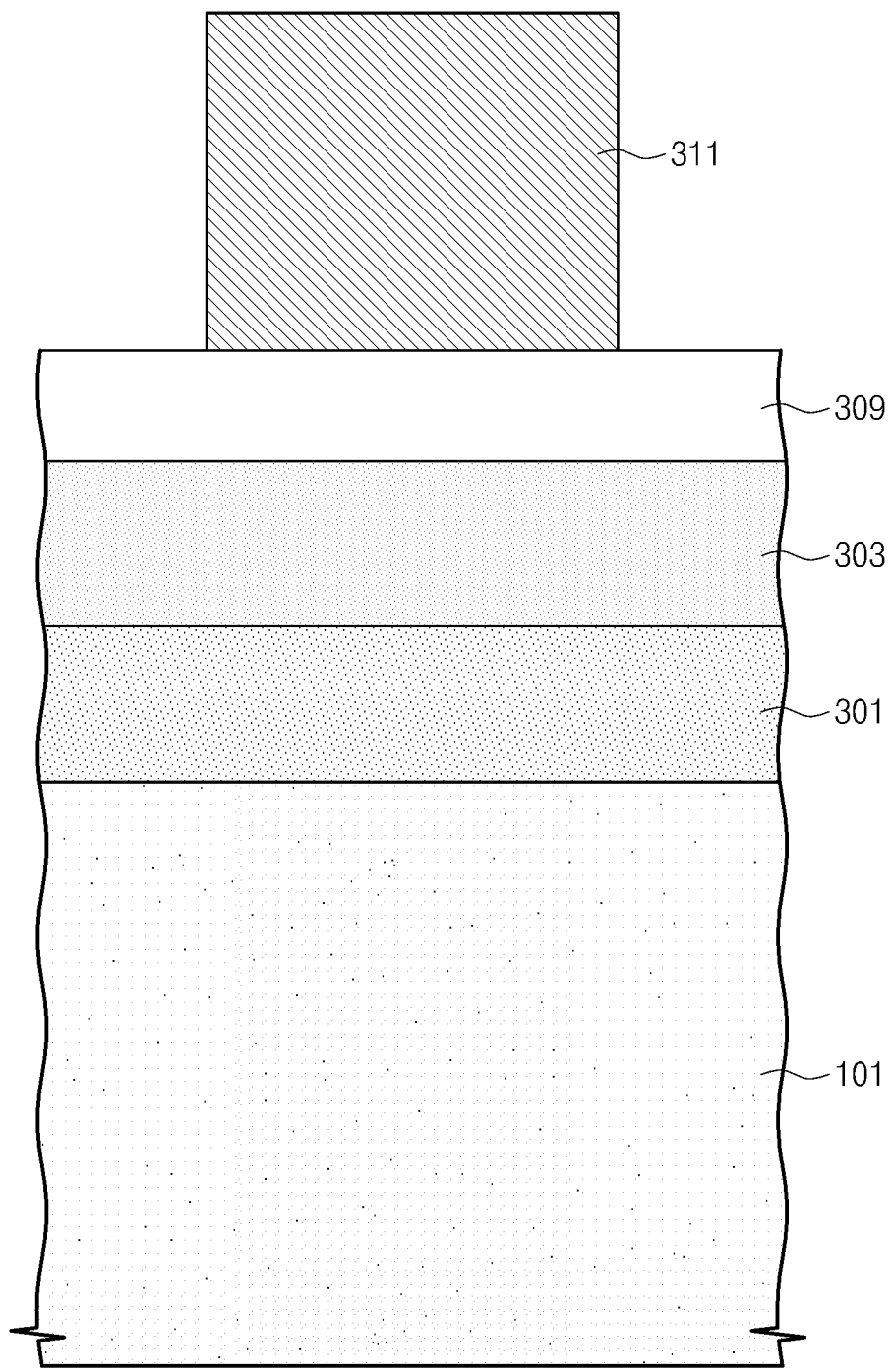

Referring to FIGS. 34A, 34B, 34C and 34D, a plurality of first photomask layers 311 may be formed to have line shapes extending in the first direction Y and spaced apart from each other in the second direction X. For example, as shown in FIG. 34A, a photoresist may be coated and patterned to form the first photomask layer 311 that exposes the first hardmask layer 305, the spacer 307s and the second hardmask layer 309 on the line G1-G2 and covers the first hardmask layer 305, the spacer 307s and the second hardmask layer 309 on the line H1-H2. As illustrated in FIG. 34D, the first photomask layer 311 on the peripheral region may partially cover the upper mask layer 303.

Figure 35A:
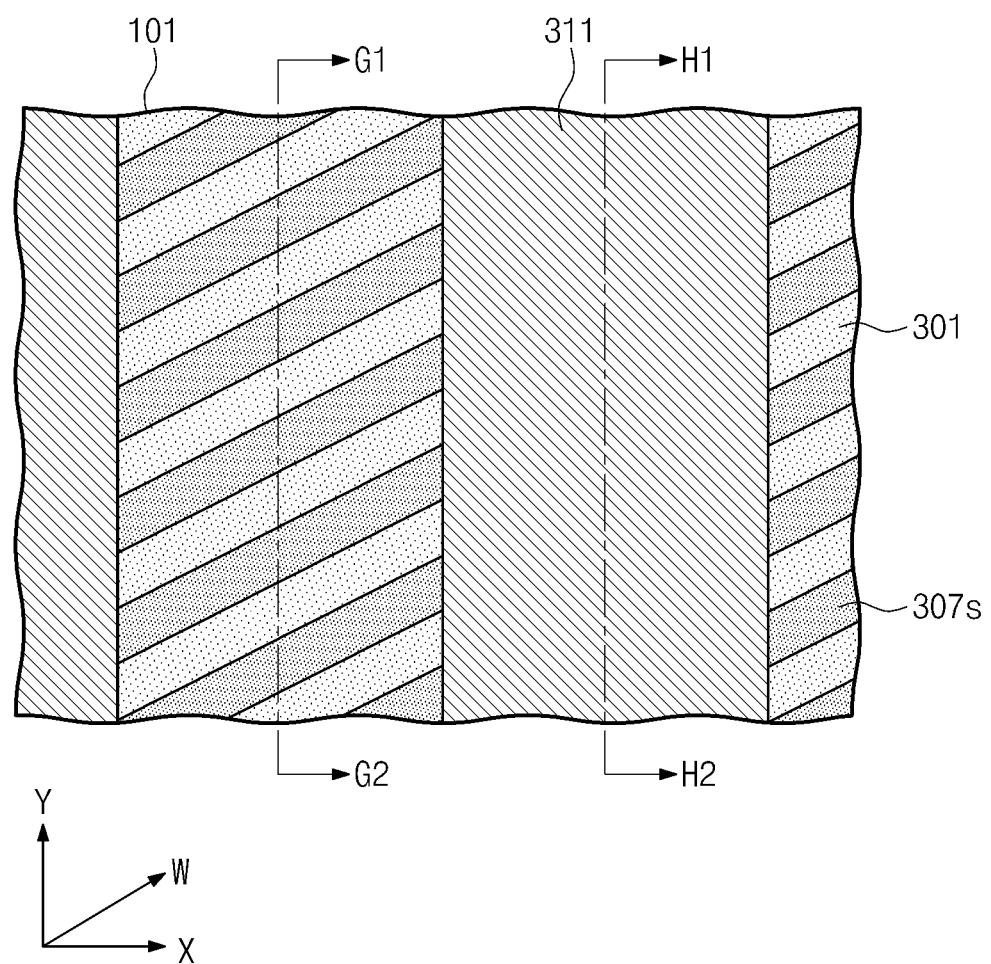
Figure 35B:
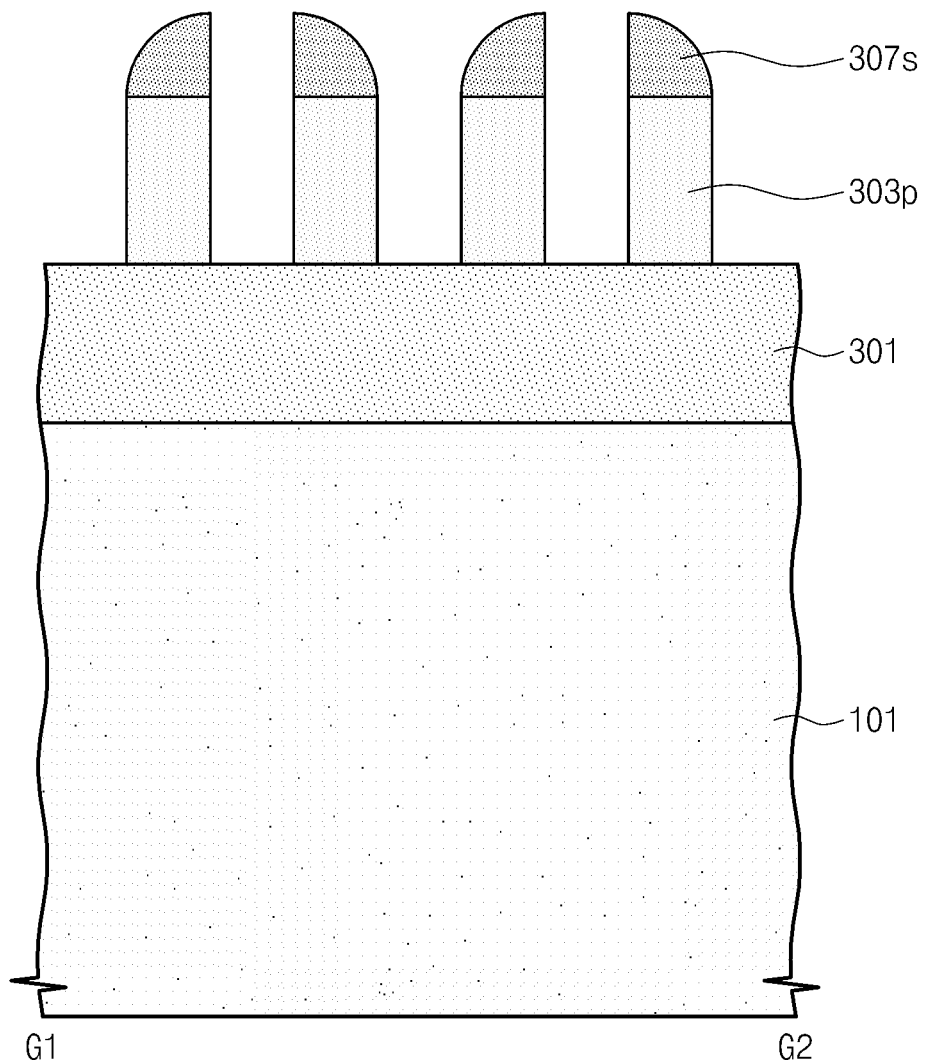
Figure 35C:
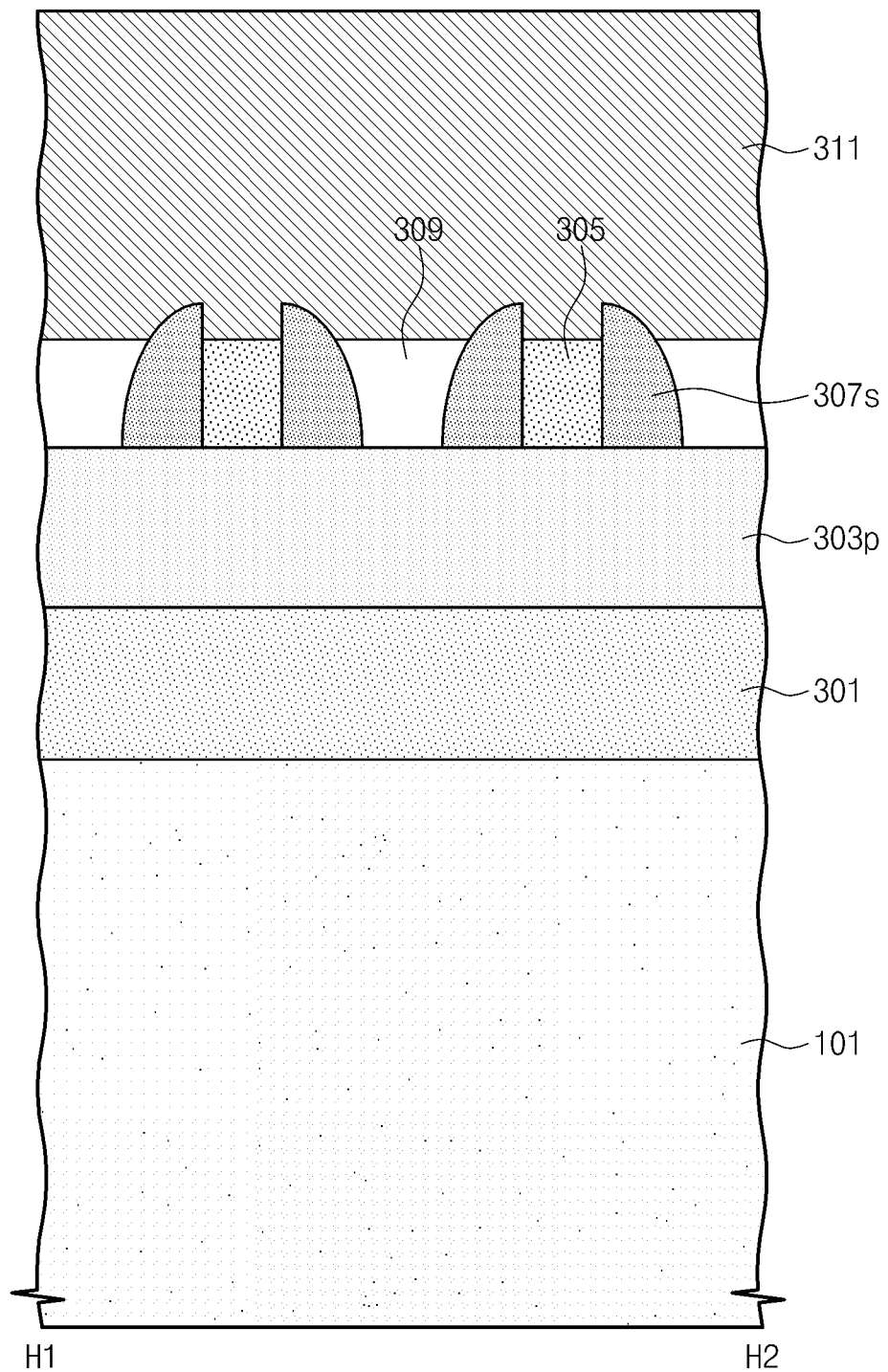
Figure 35D:
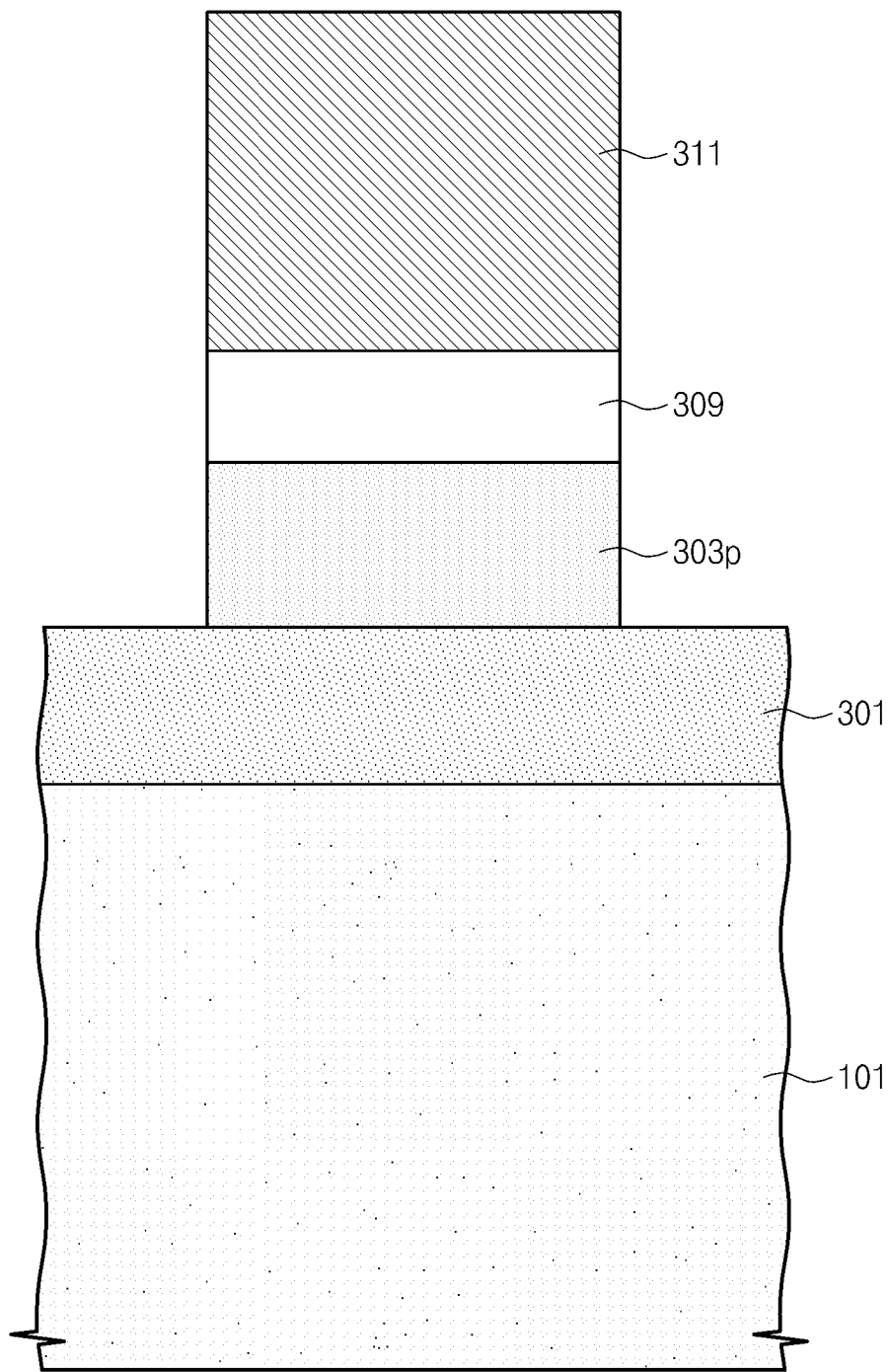

Referring to FIGS. 35A, 35B, 35C and 35D, the exposed first hardmask layer 305 may be etched by an etching process using the first photomask layer 311 as an etch mask. The exposed second hardmask layer 309 may be etched together with the exposed first hardmask layer 305. The upper mask layer 303 may be etched by an etching process using the spacer 307s as an etch mask to form an upper mask pattern 303s partially exposing the lower mask layer 301. In the peripheral region, as shown in FIG. 35D, the second hardmask layer 309 and the upper mask layer 303 may be etched to partially expose the lower mask layer 301.

Figure 36A:
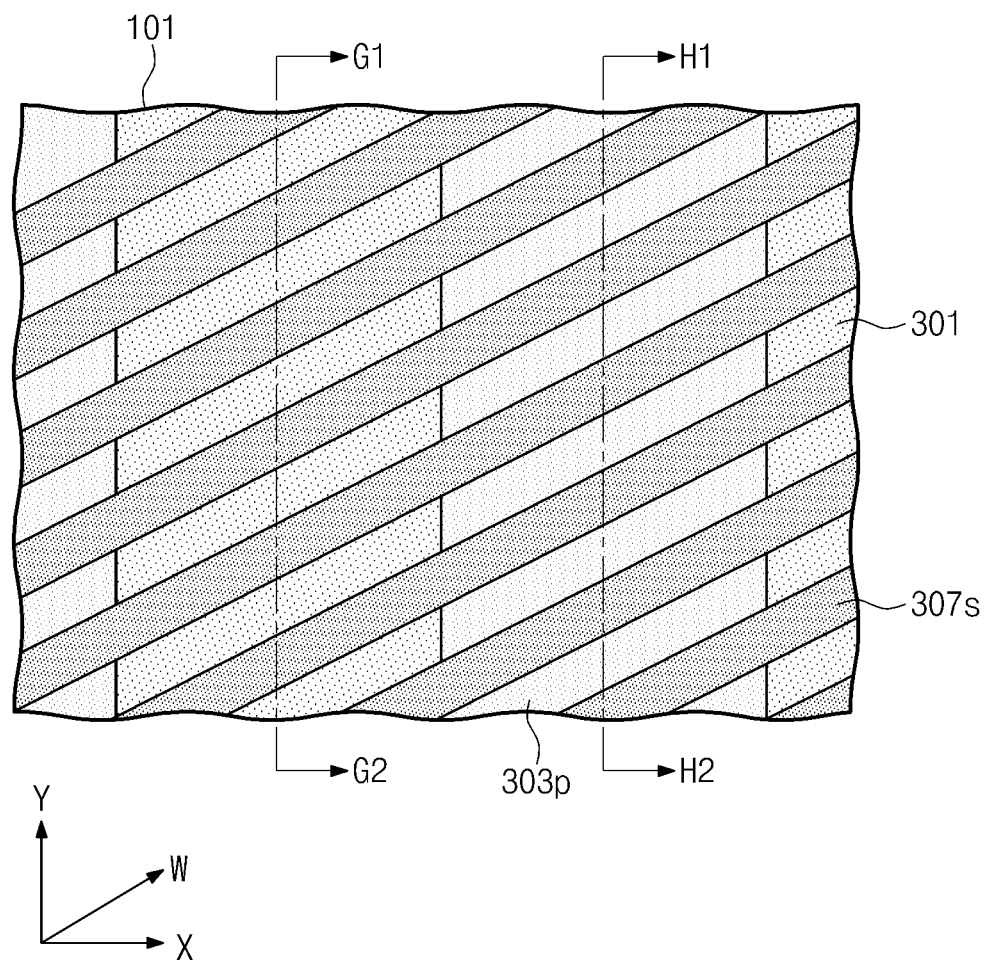
Figure 36B:
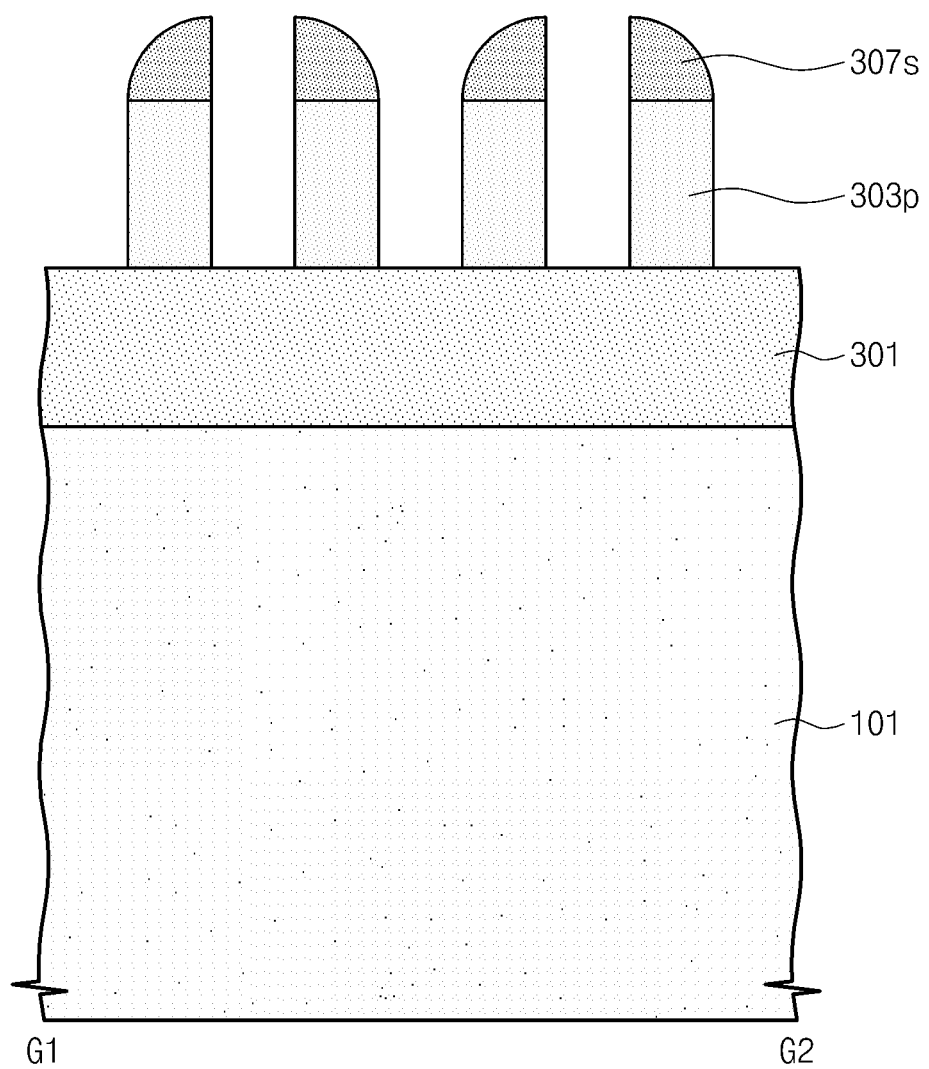
Figure 36C:
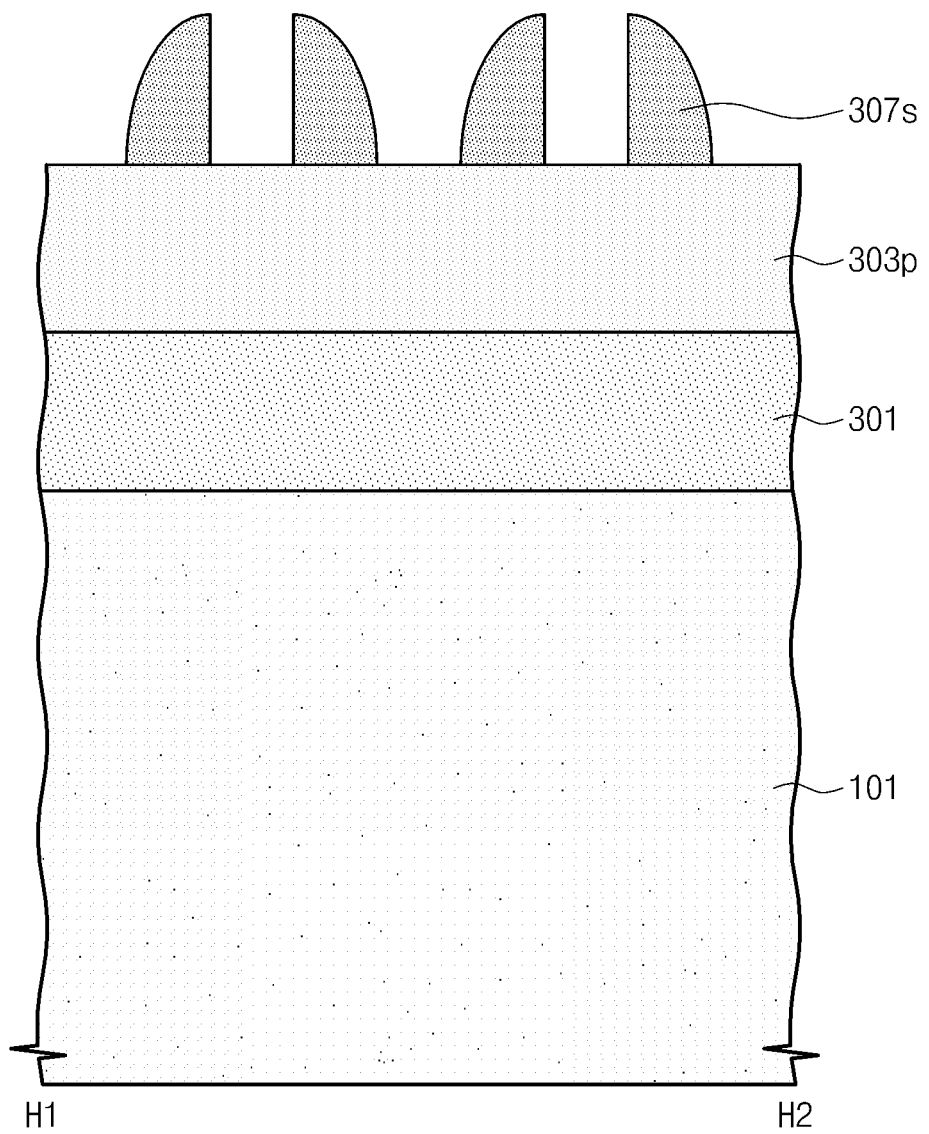
Figure 36D:
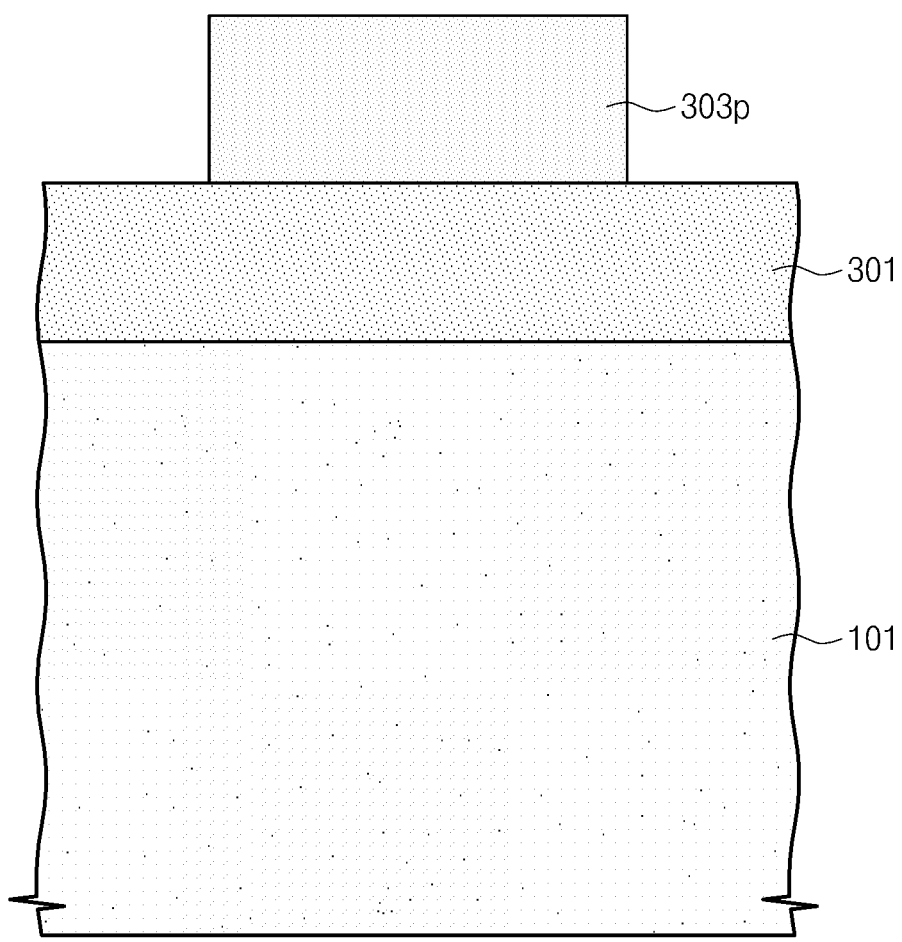

Referring to FIGS. 36A, 36B, 36C and 36D, the first photomask layer 311 may be removed by an ashing process, and the first hardmask layer 305 and the second hardmask layer 309 may be removed by an etching process. As a result, the spacer 307s may be exposed. In the peripheral region, as shown in FIG. 36D, the upper mask pattern 303p may remain and the lower mask layer 301 may be partially exposed.

Figure 37A:
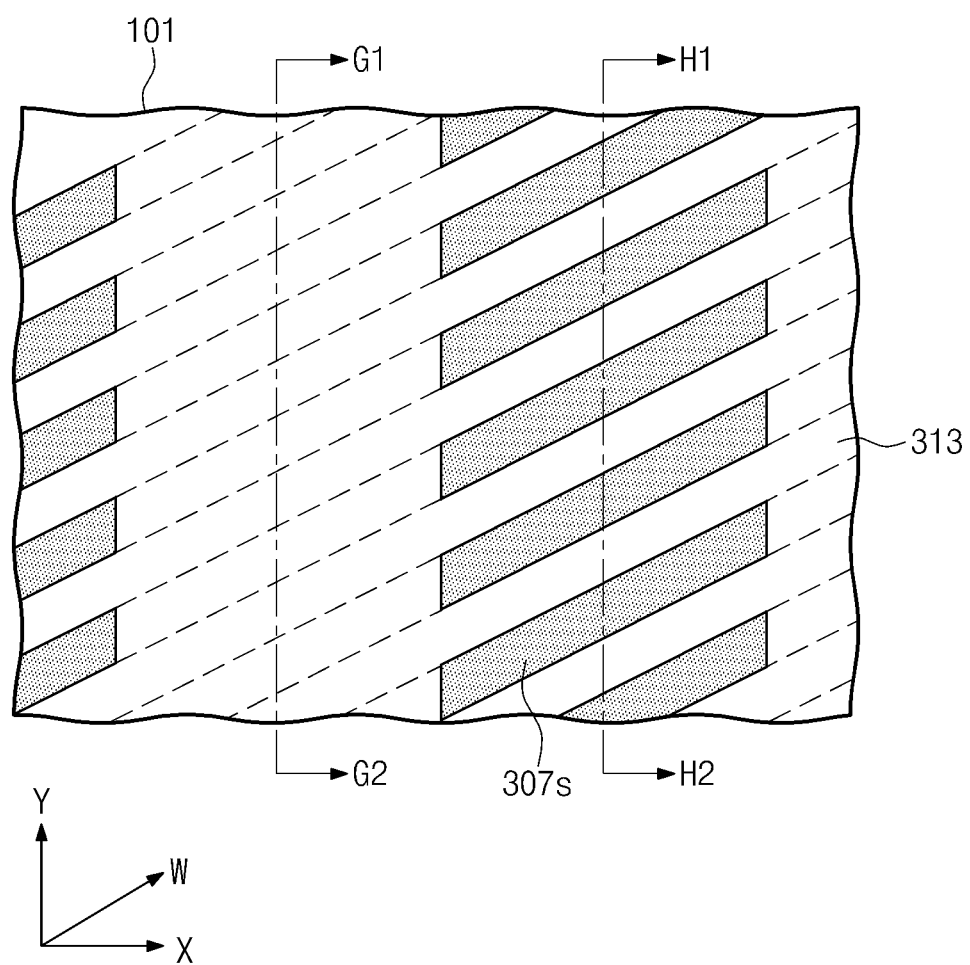
Figure 37B:
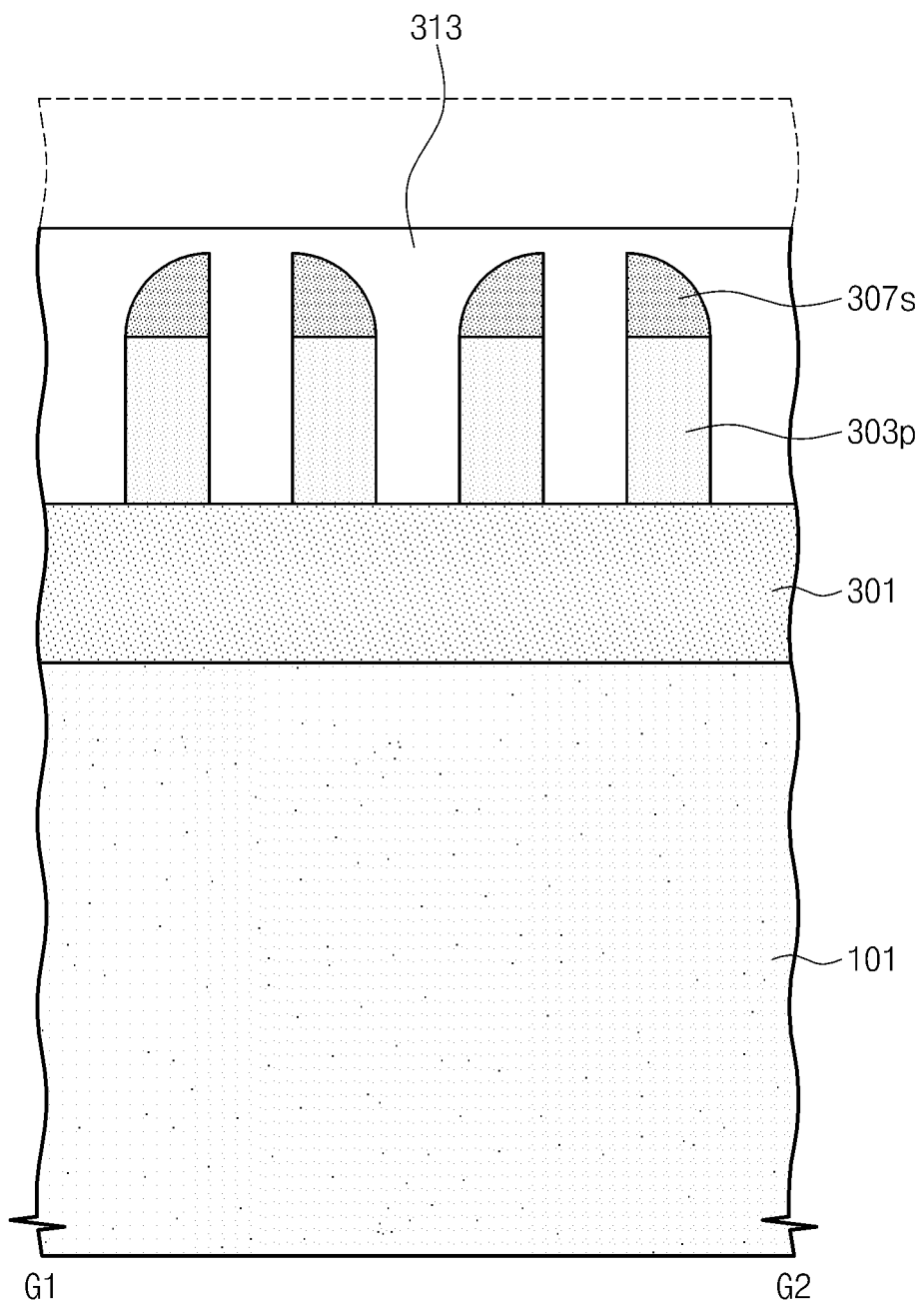
Figure 37C:
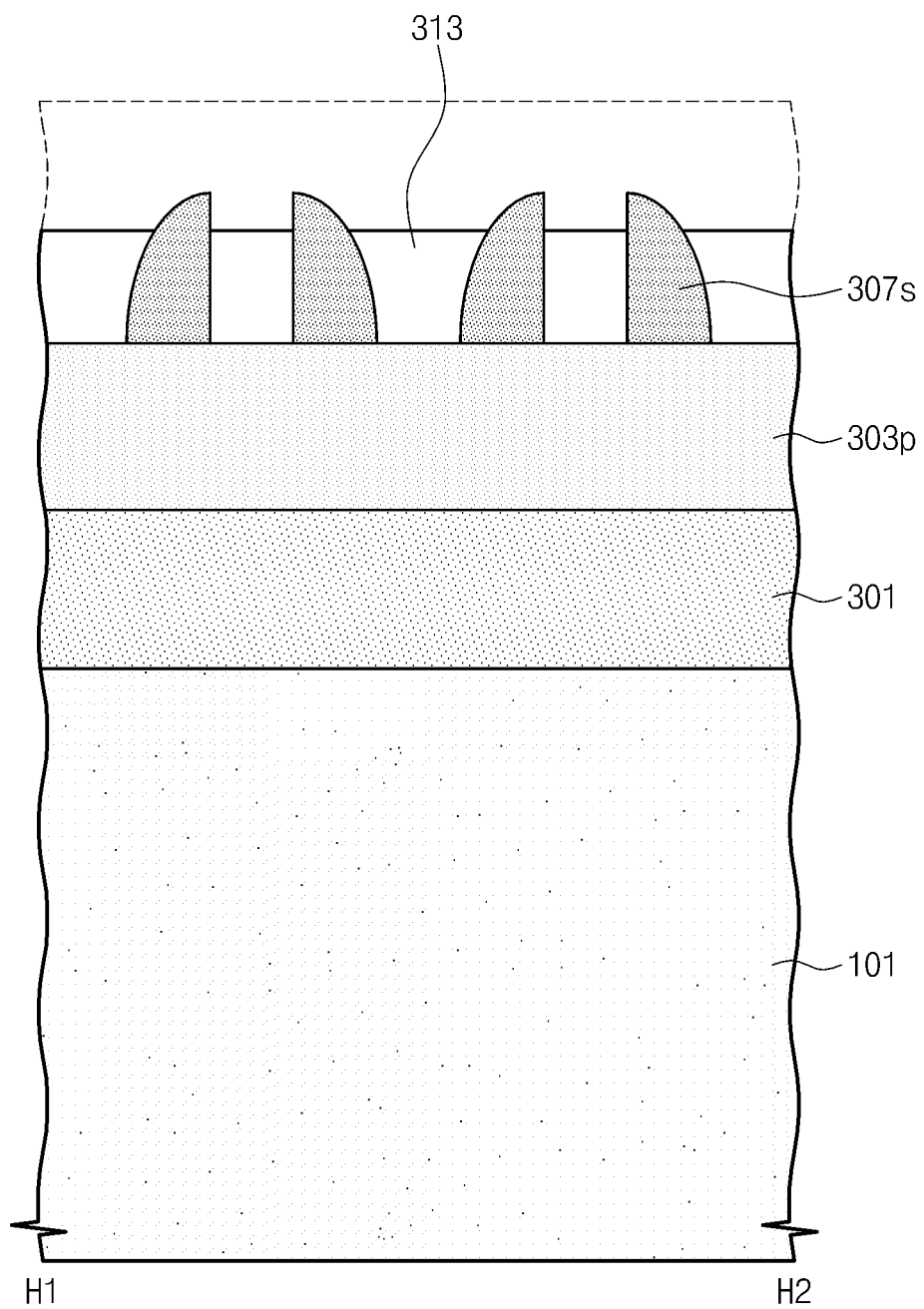
Figure 37D:
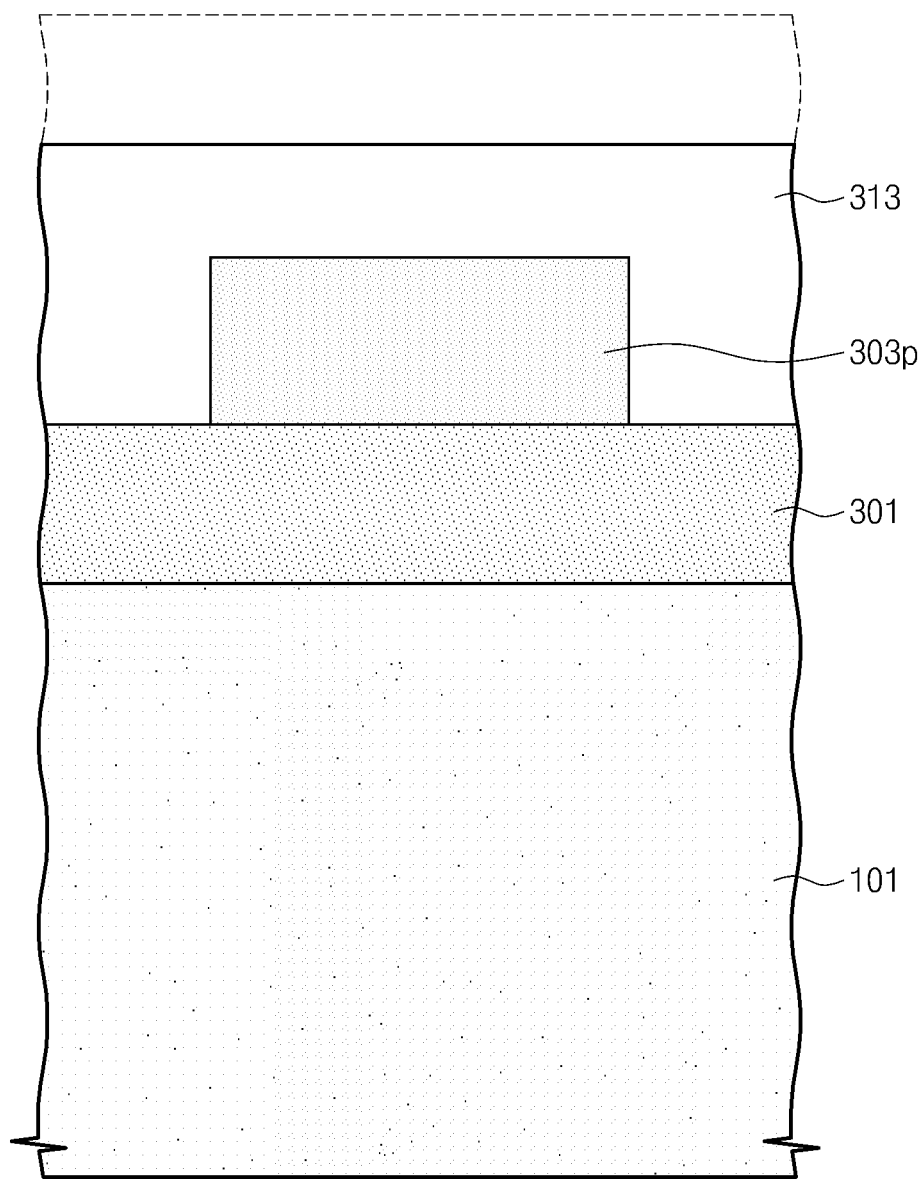

Referring to FIGS. 37A, 37B, 37C and 37D, a third hardmask layer 313 may be formed on the lower mask layer 301. Deposition and etch-back processes may be performed to form the third hardmask layer 313 partially exposing the spacer 307s. As shown in FIG. 37C, the spacer 307s on the line H1-H2 may protrude over the third hardmask layer 313. The third hardmask layer 311 may be formed of a material substantially identical or similar to that of the first hardmask layer 305 or the second hardmask layer 309.

Figure 38A:
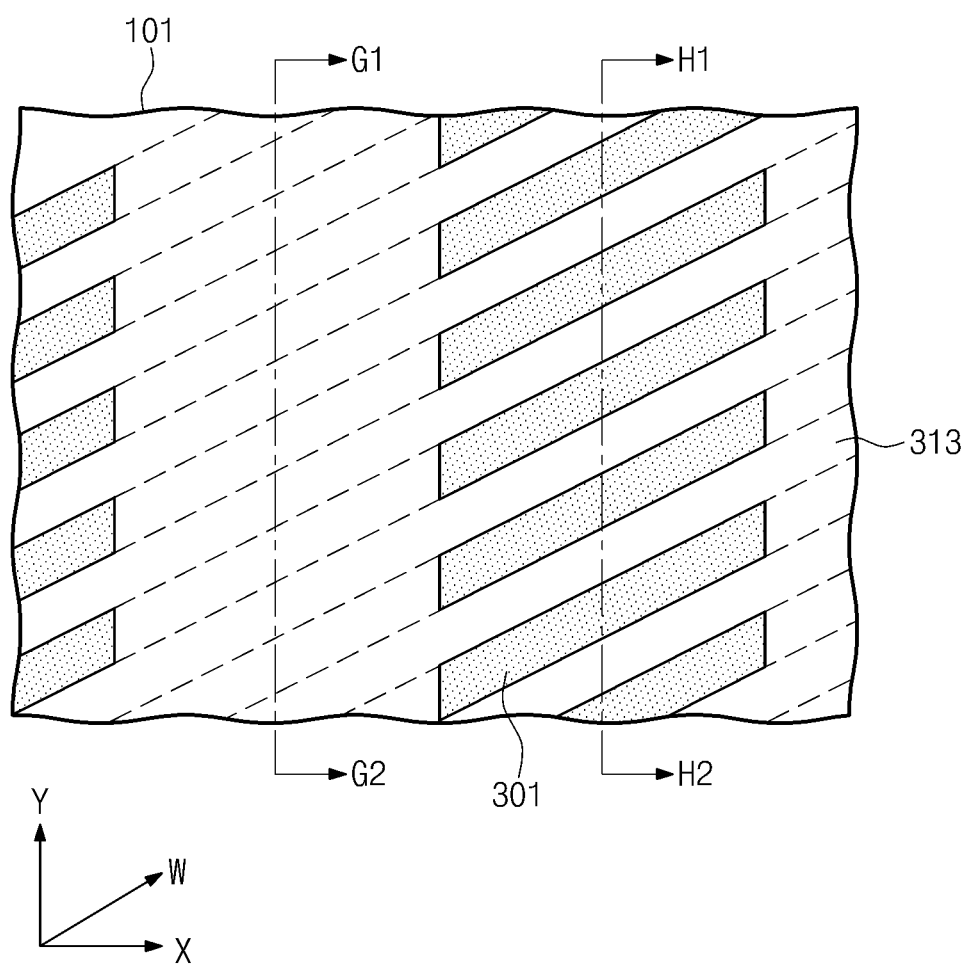
Figure 38B:
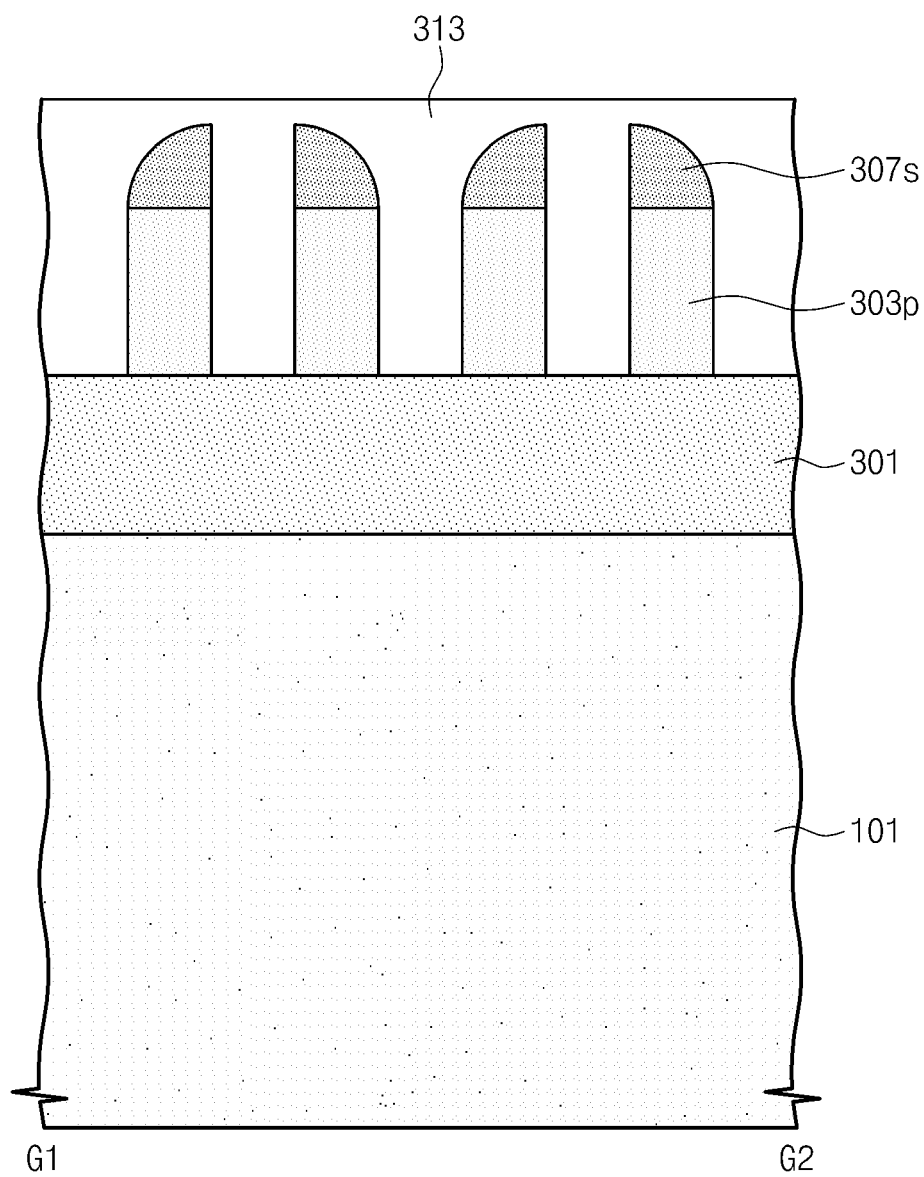
Figure 38C:
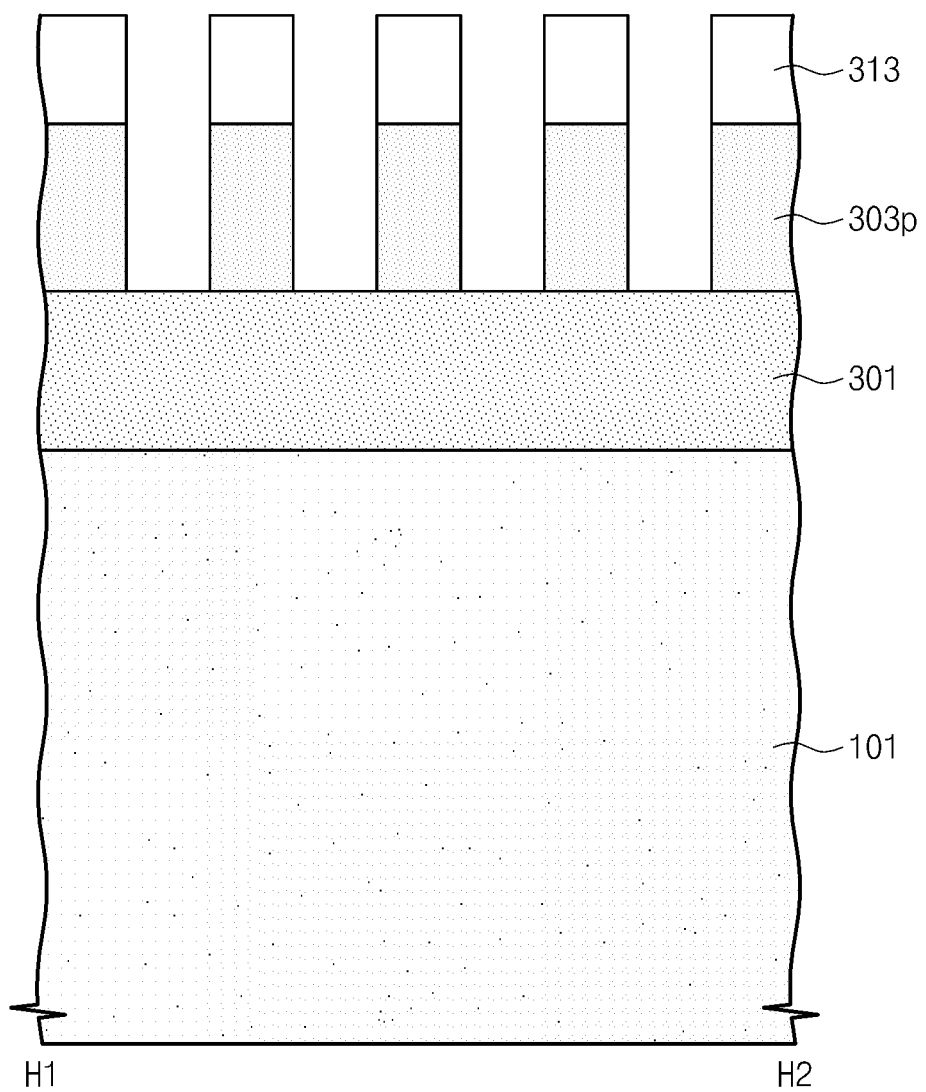
Figure 38D:
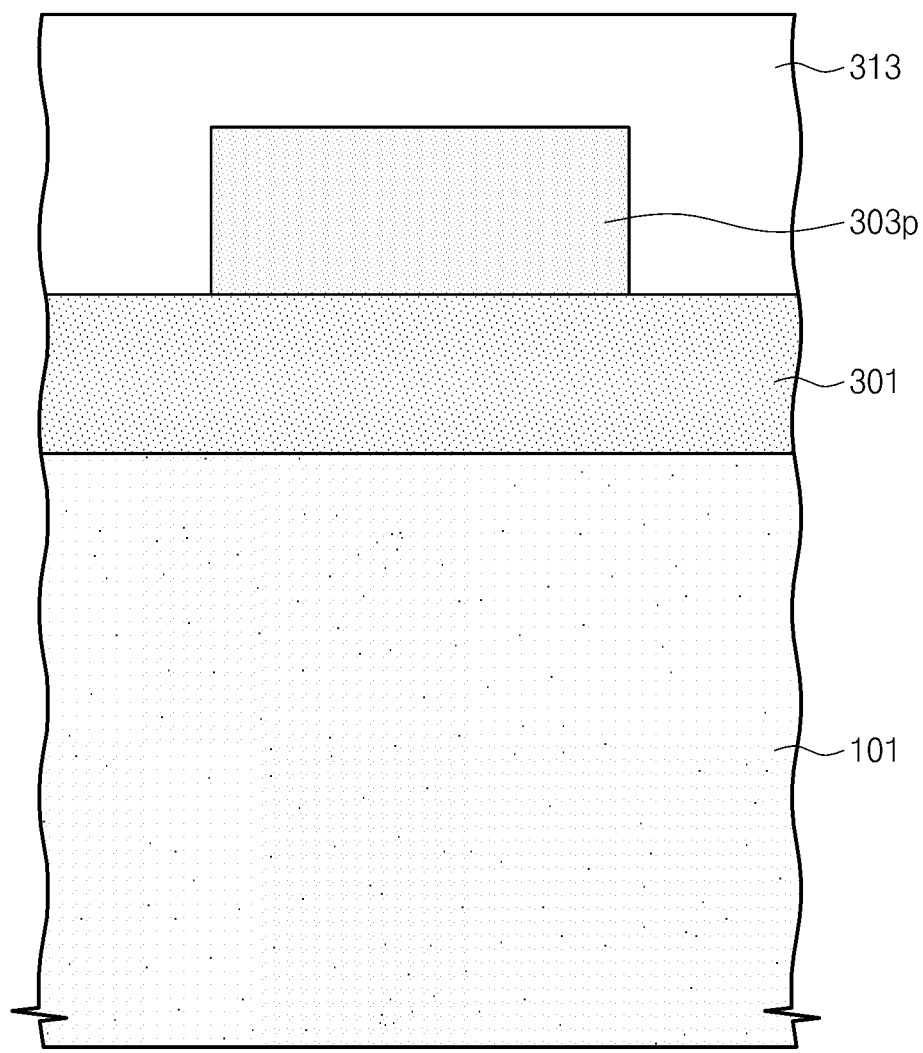
Figure 39A:
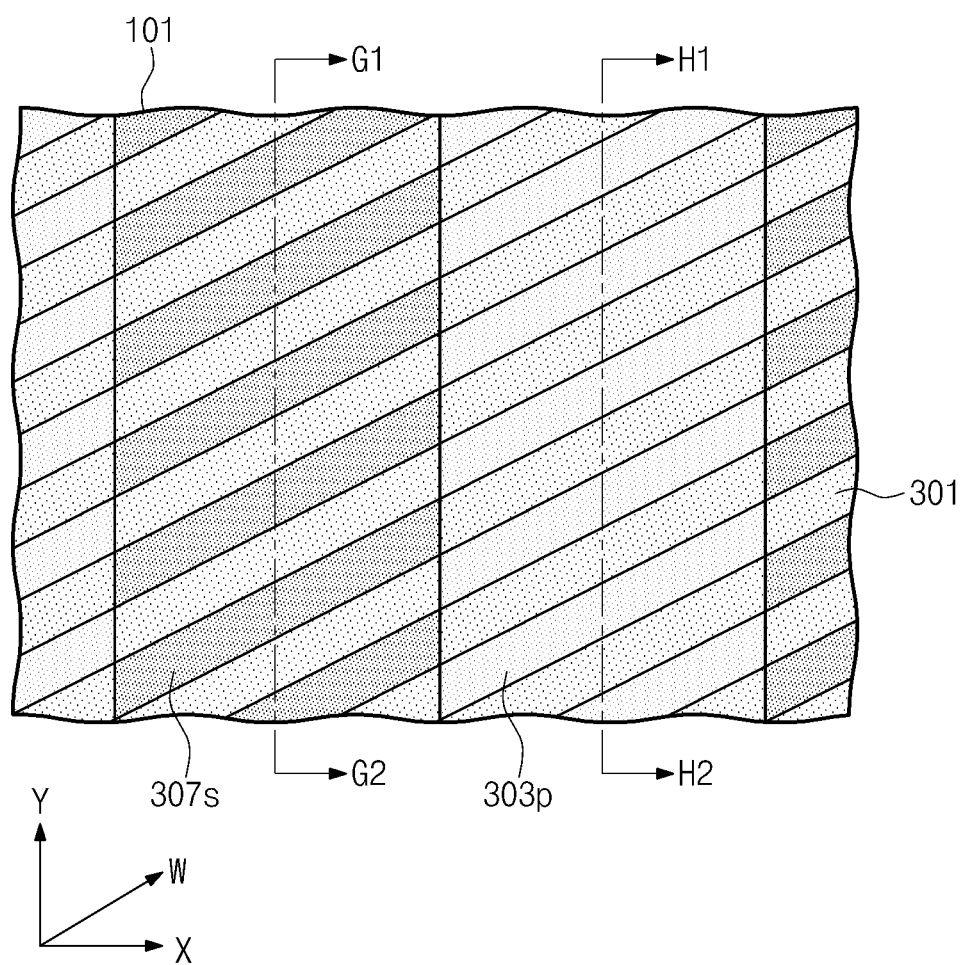
Figure 39B:
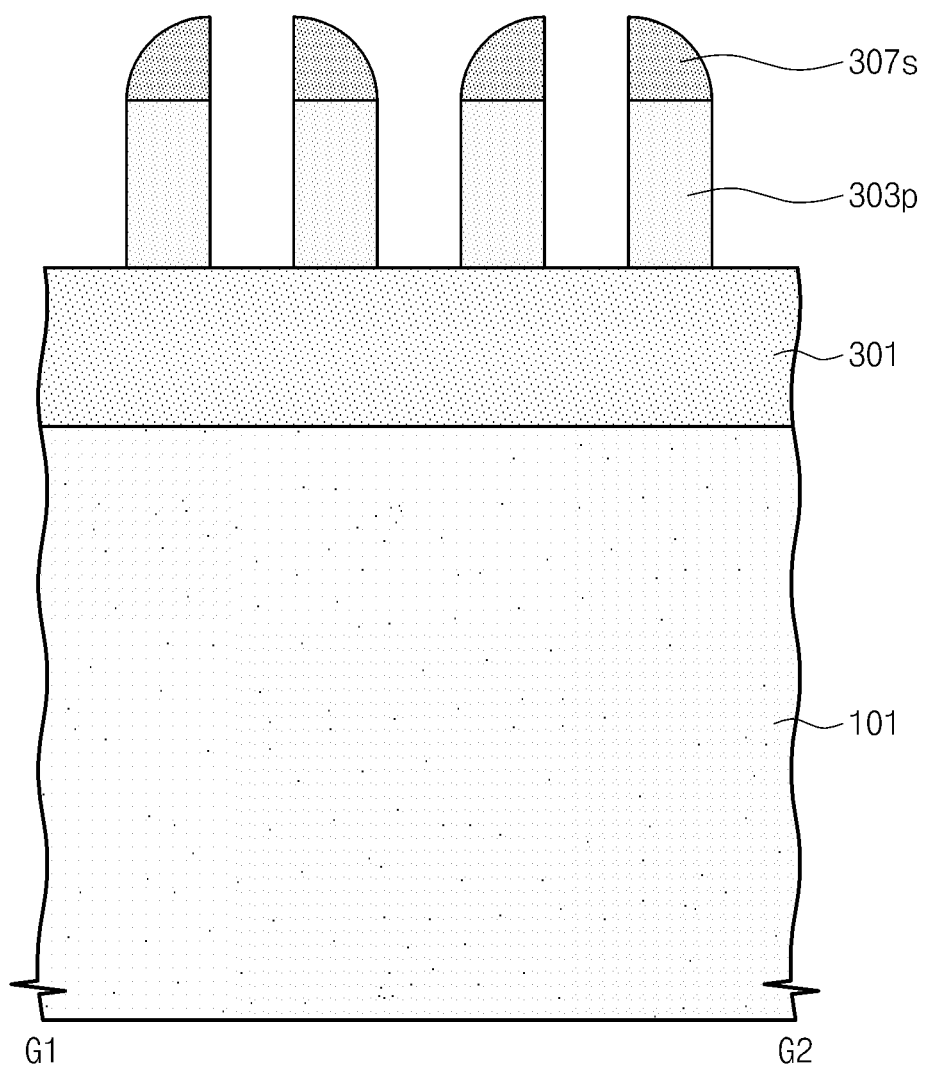
Figure 39C:
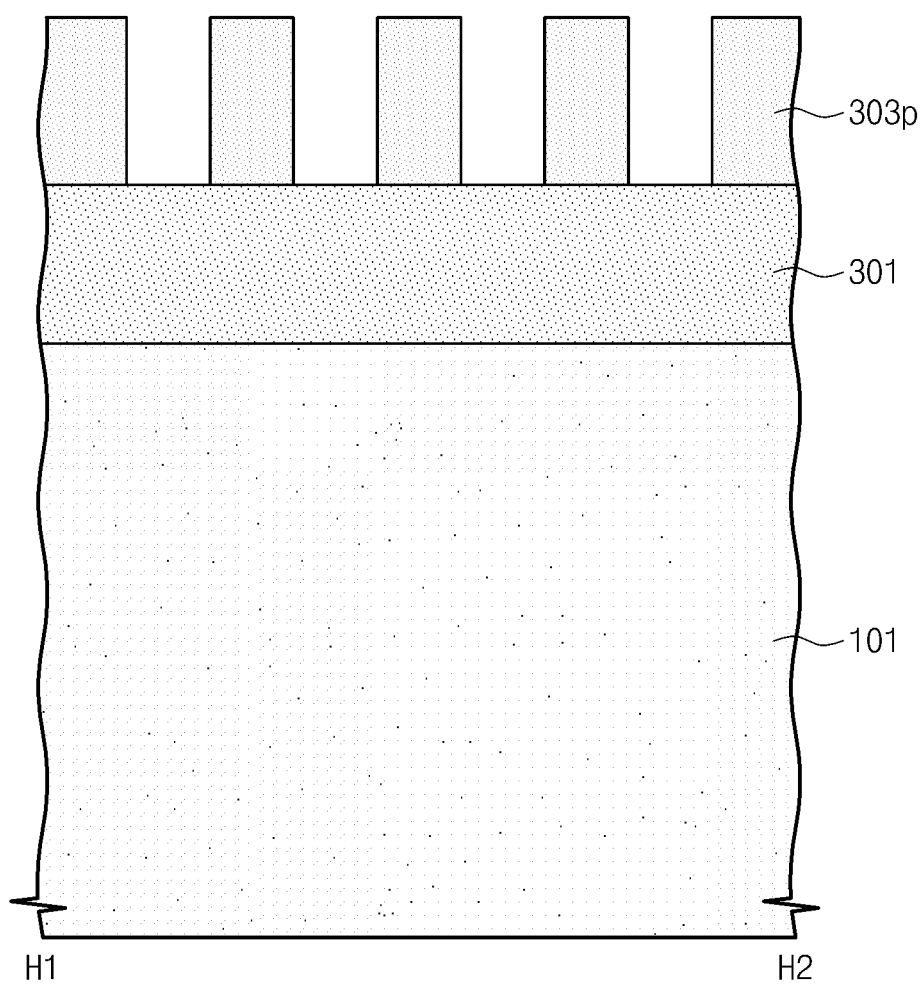
Figure 39D:
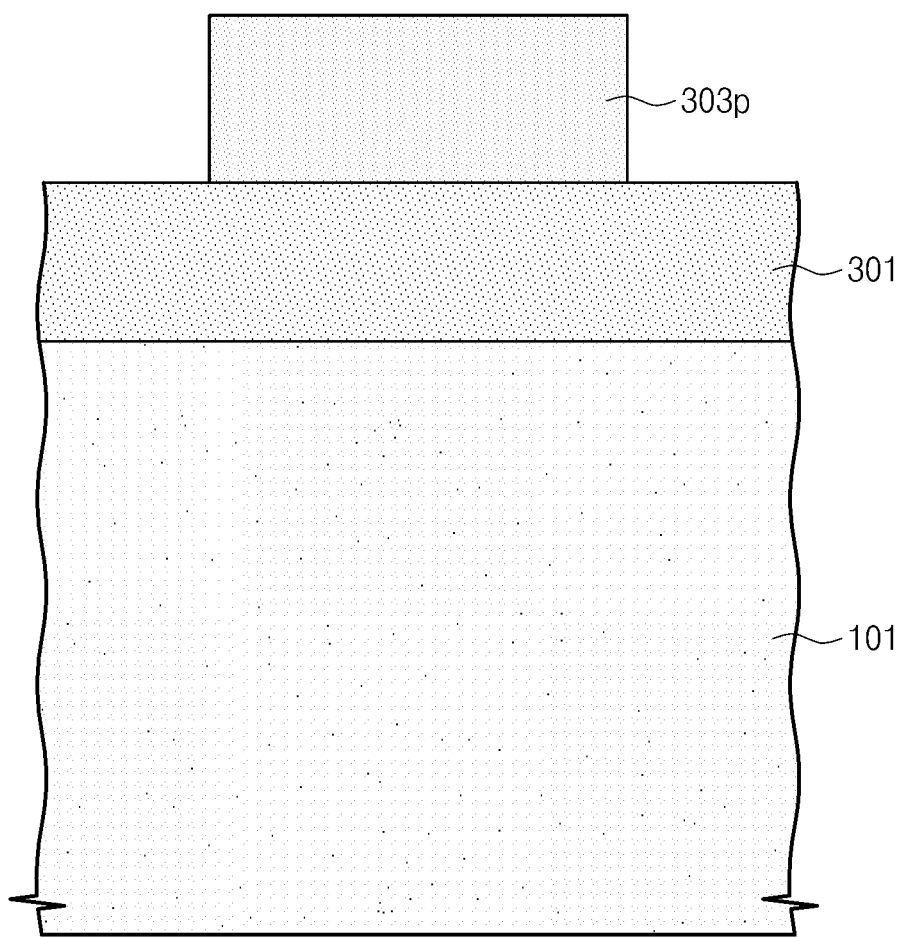
Figure 40A:
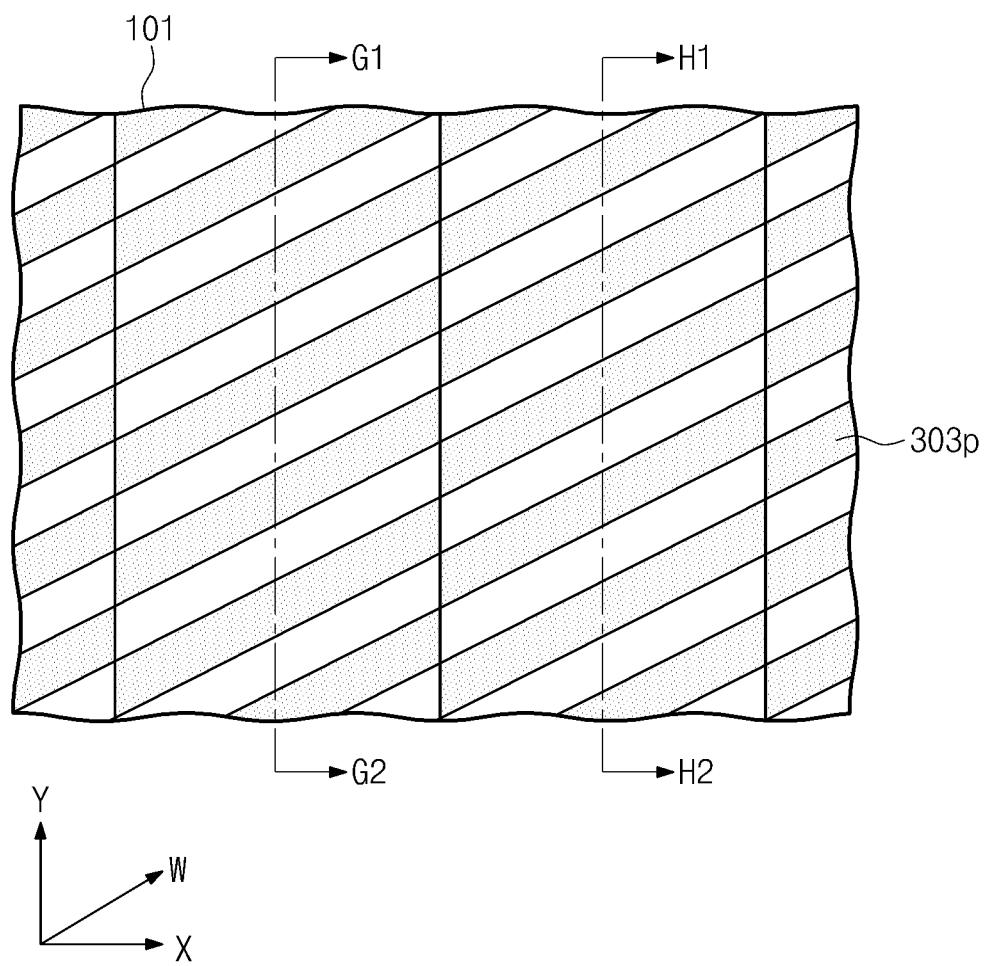
Figure 40B:
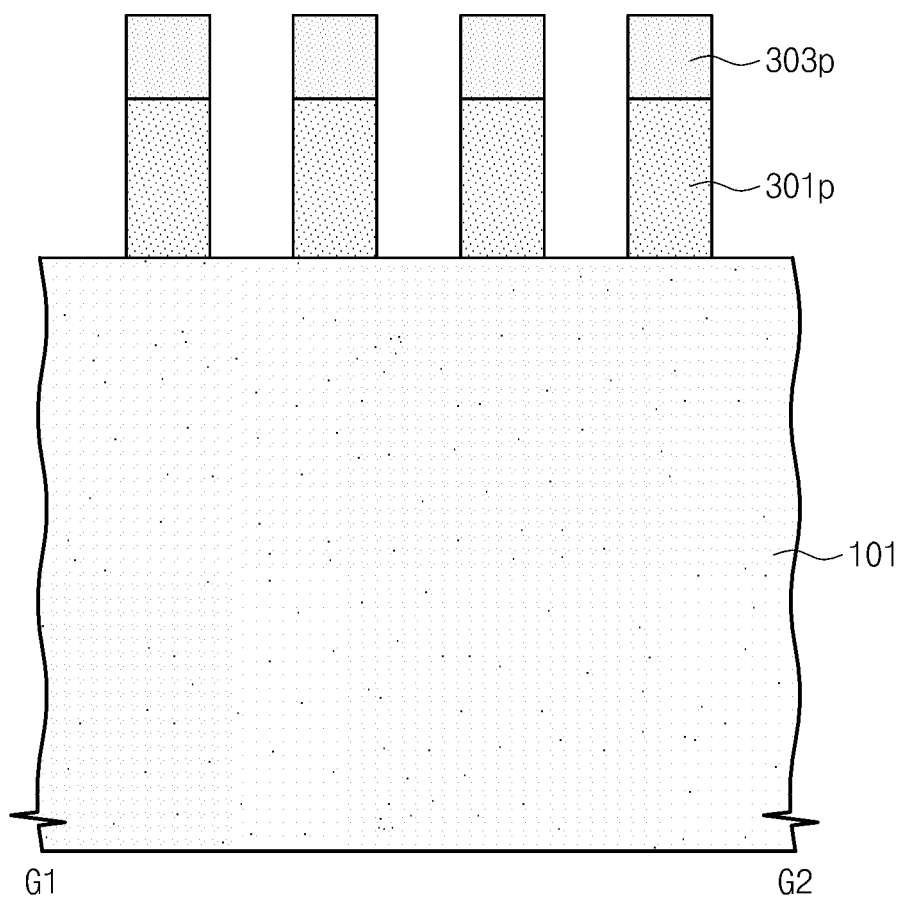
Figure 40C:
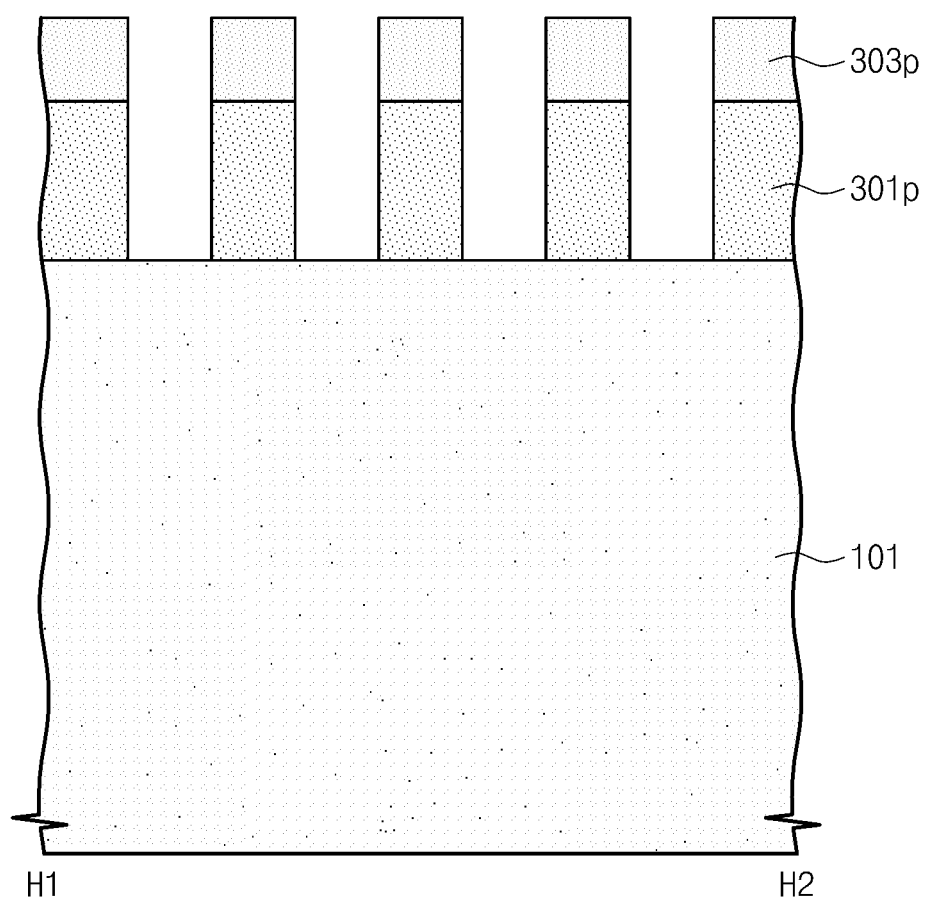
Figure 40D:
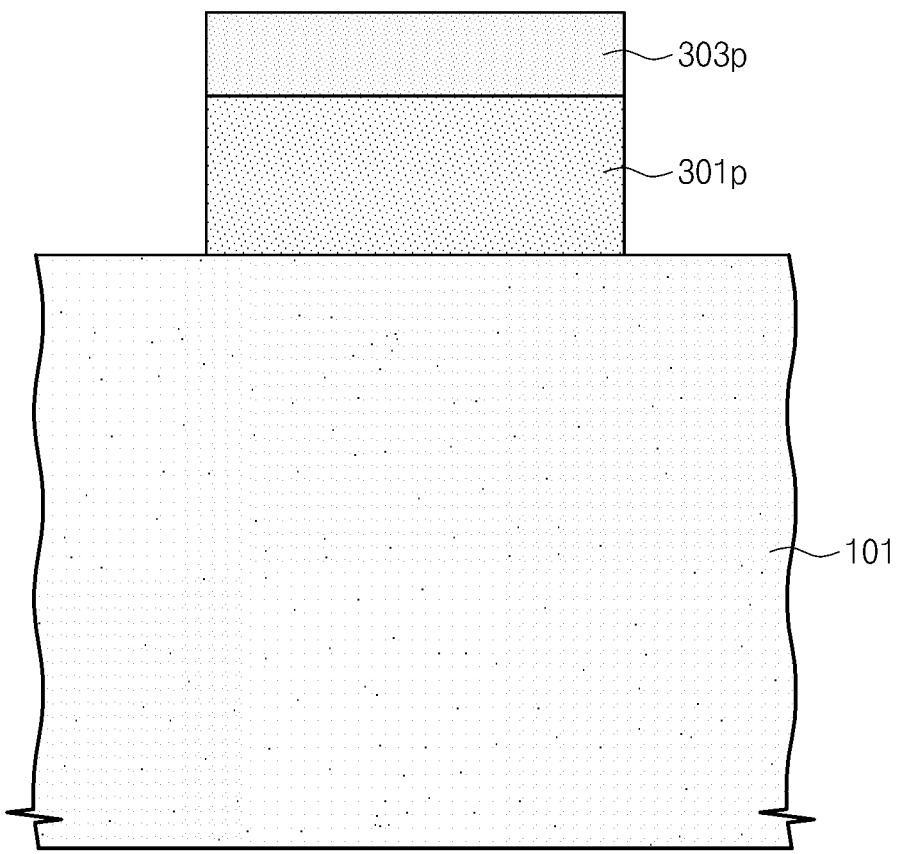
Figure 41A:
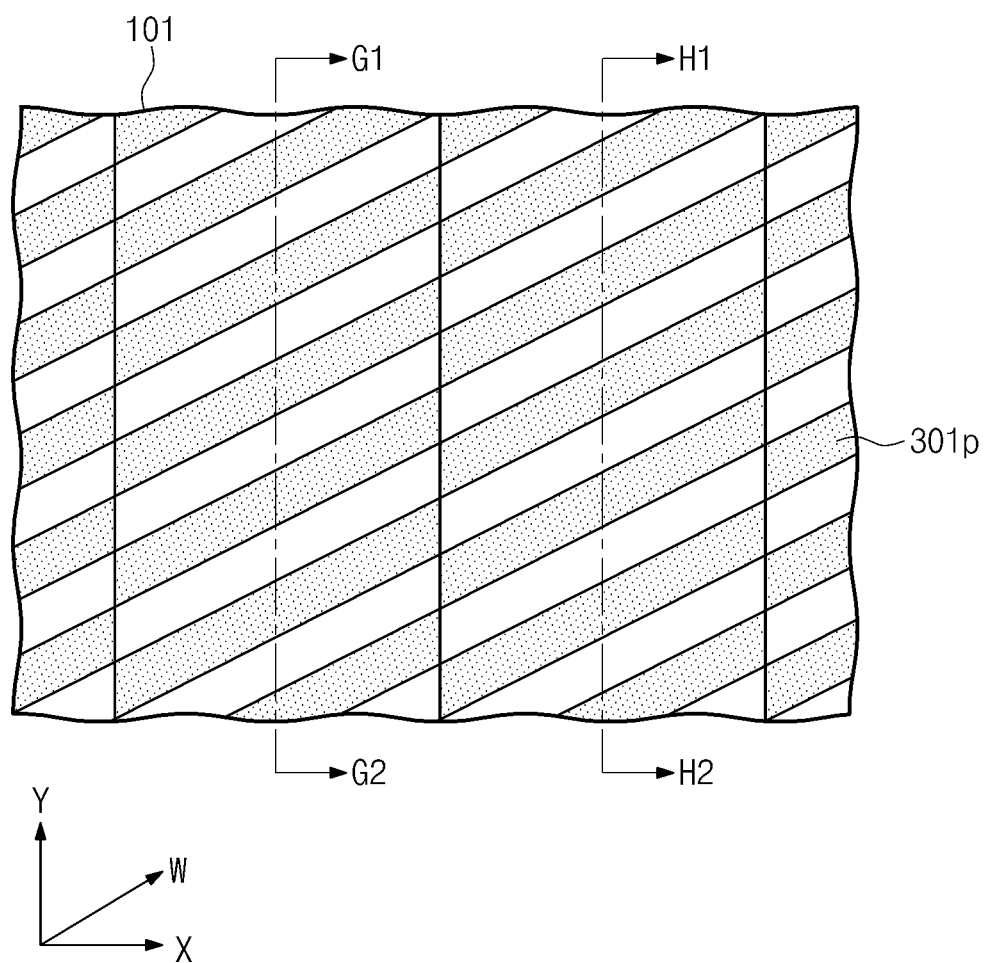
Figure 41B:
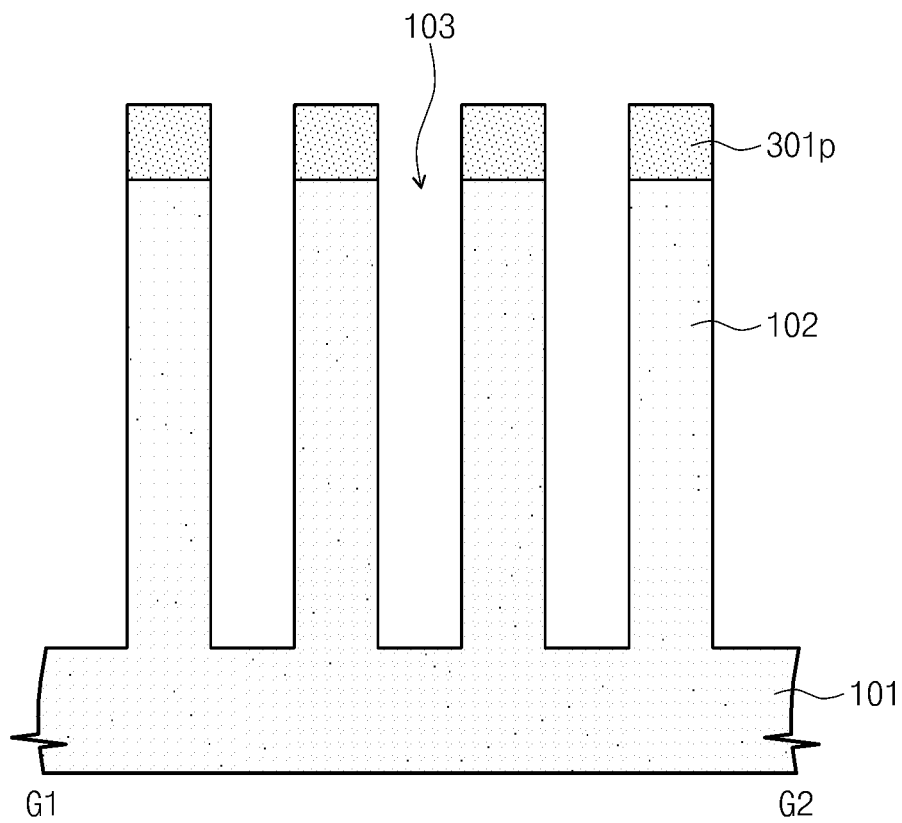
Figure 41C:
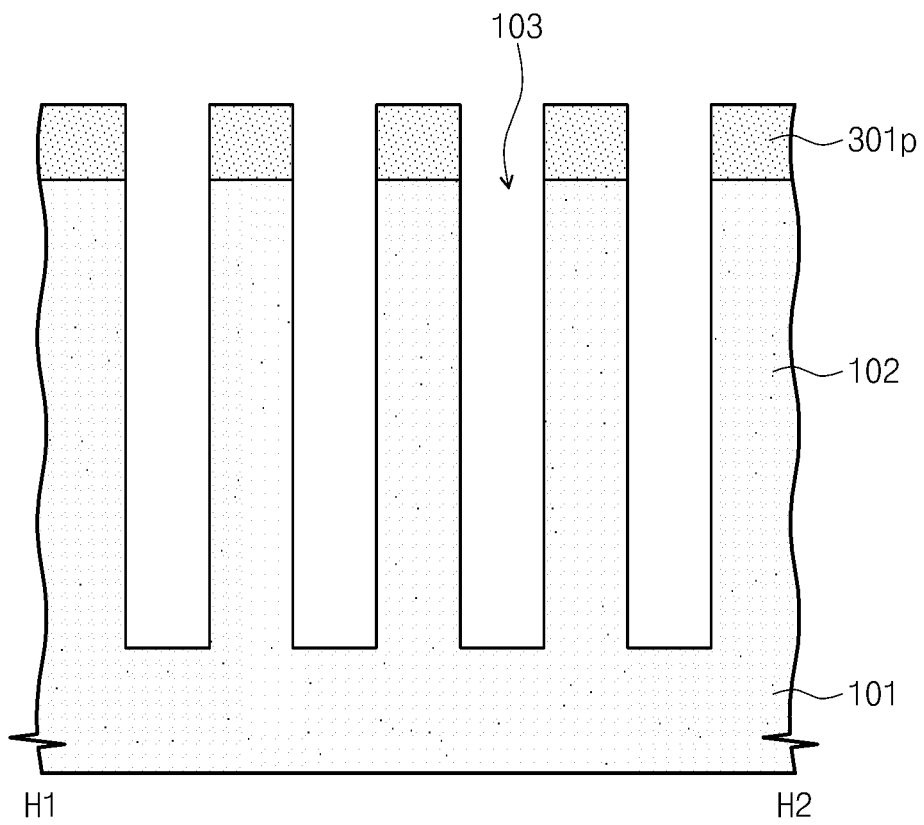
Figure 41D:
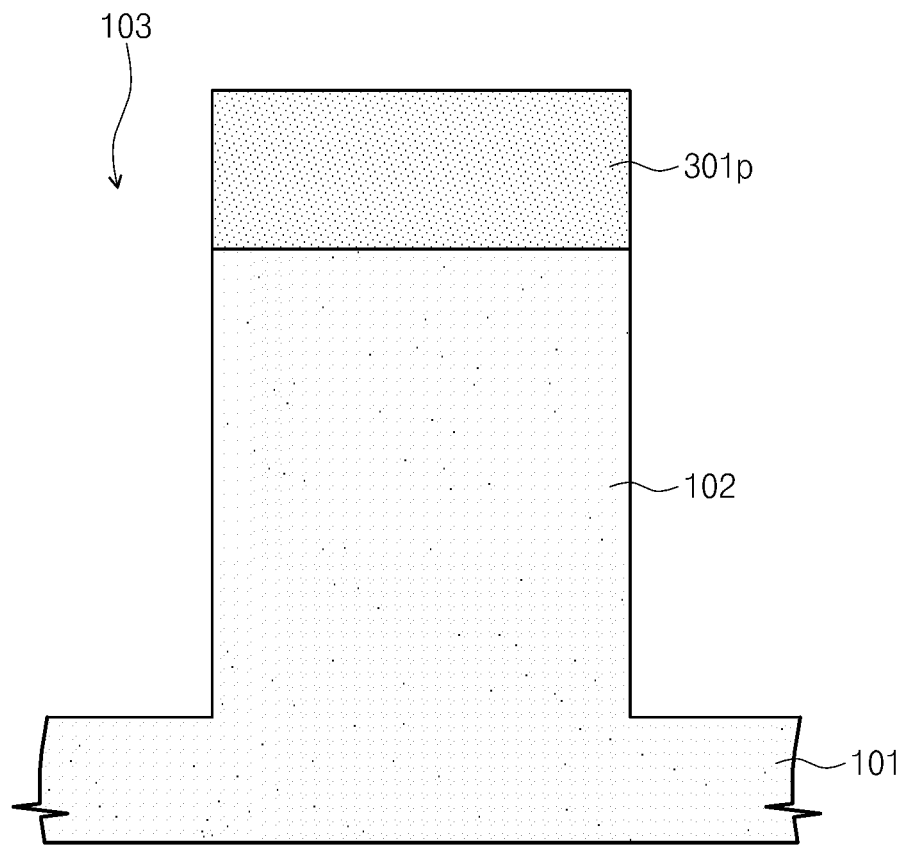

Referring to FIGS. 38A, 38B, 38C and 38D, the spacer 307s protruding over the third hardmask layer 313 may be selectively removed by an etching process using the third hardmask layer 313 as an etch mask. The selective removal of the spacer 307s may partially expose the upper mask pattern 303p. The exposed upper mask pattern 303p may be etched. The selective removal of the spacer 307s and the etching of the upper mask pattern 303p may partially expose the lower mask layer 301 on the line H1-H2. Owing to the selective removal of the spacer 307s protruding over the third hardmask layer 313, the spacer 307s may have a shorter length. In other words, the spacer 307s shaped like a continuous line of FIG. 37A may be divided into a plurality of line-shaped segments as shown in FIG. 38A.

Referring to FIGS. 39A, 39B, 39C and 39D, the third hardmask layer 313 may be removed to partially expose the lower mask layer 301. The spacer 307s may remain on the line G1-G2.

Referring to FIGS. 40A, 40B, 40C and 40D, the lower mask layer 301 may be etched by an etching process using the upper mask pattern 303p as an etch mask to form a lower mask pattern 301p. The spacer 307s may be used as an etch mask during the etching process or removed before or after the etching process. In case the spacer 307s is formed of a material (e.g., silicon oxide) substantially identical or similar to that of the lower mask layer 301, the spacer 307s may be removed when the lower mask layer 301 is etched. The upper mask pattern 303p may have a line shape extending in a zigzag fashion along the diagonal direction W. Similarly, the lower mask pattern 301p may be shaped like the upper mask pattern 303p.

Referring to FIGS. 41A, 41B, 41C and 41D, the substrate 101 may be etched by an etching process using the lower mask pattern 301p as an etch mask to form a trench 103. Therefore, a portion of the substrate 101 may be defined as an active region 102. The upper mask pattern 303p may be used as an etch mask during the etching process or removed before or after the etching process. In case the upper mask pattern 303p may be formed of a material (e.g., polysilicon) substantially identical or similar to that of the substrate 101, the upper mask pattern 303p may be removed when the substrate 101 is etched.

Figure 42A:
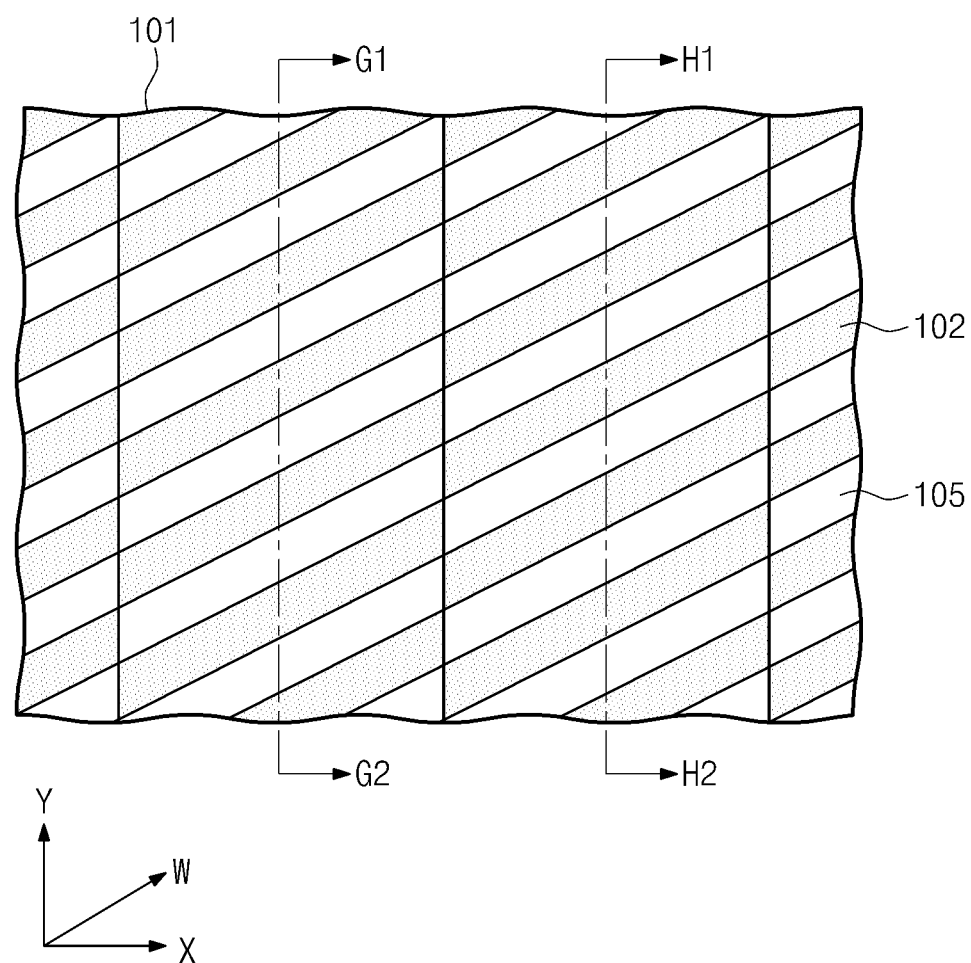
Figure 42B:
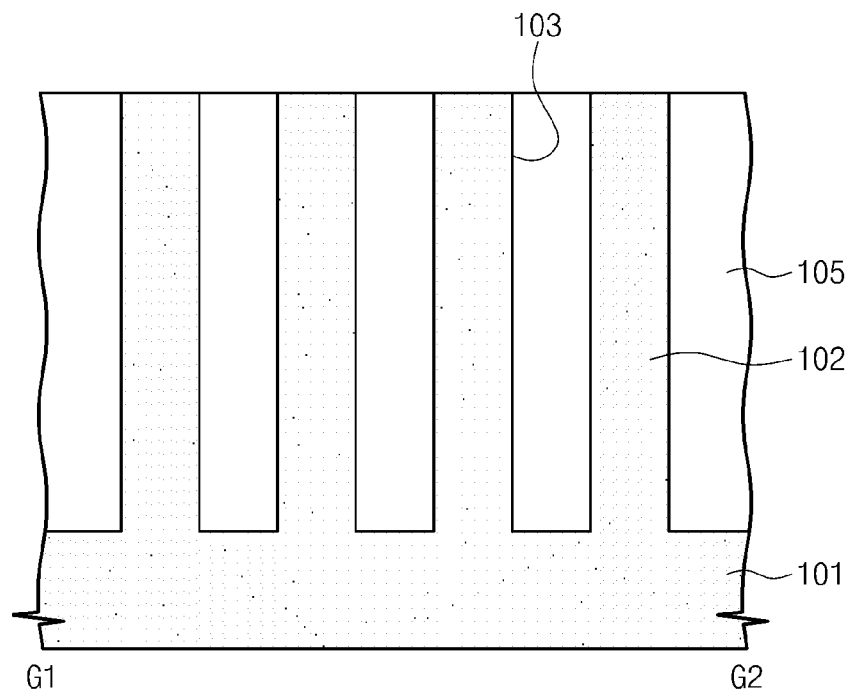
Figure 42C:
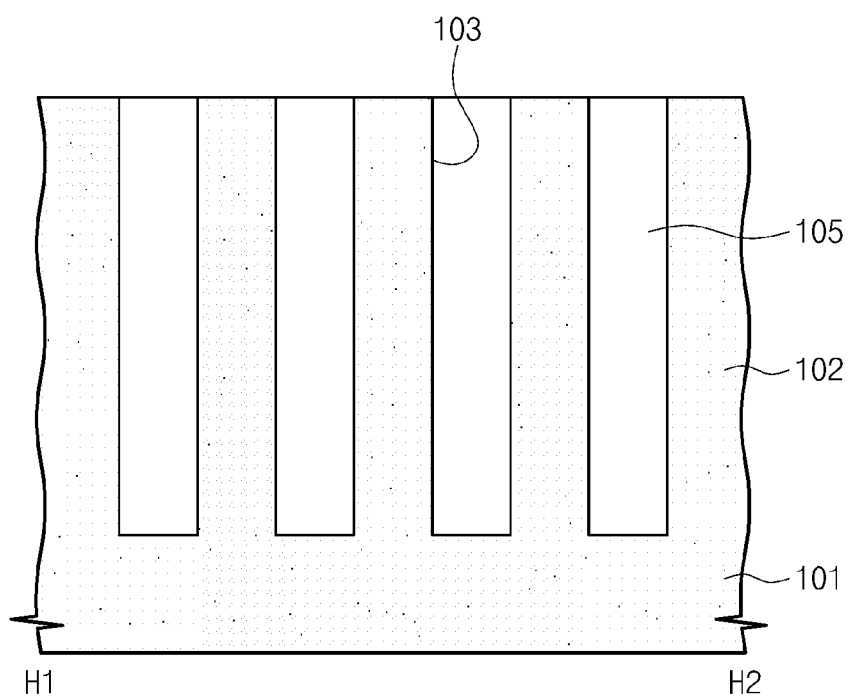
Figure 42D:
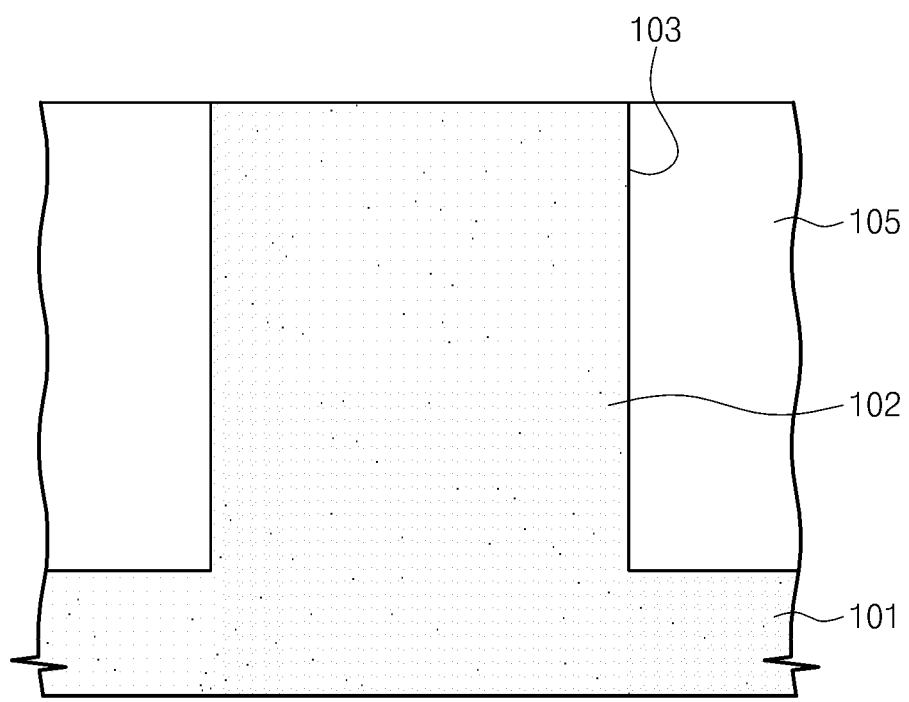
Figure 43:
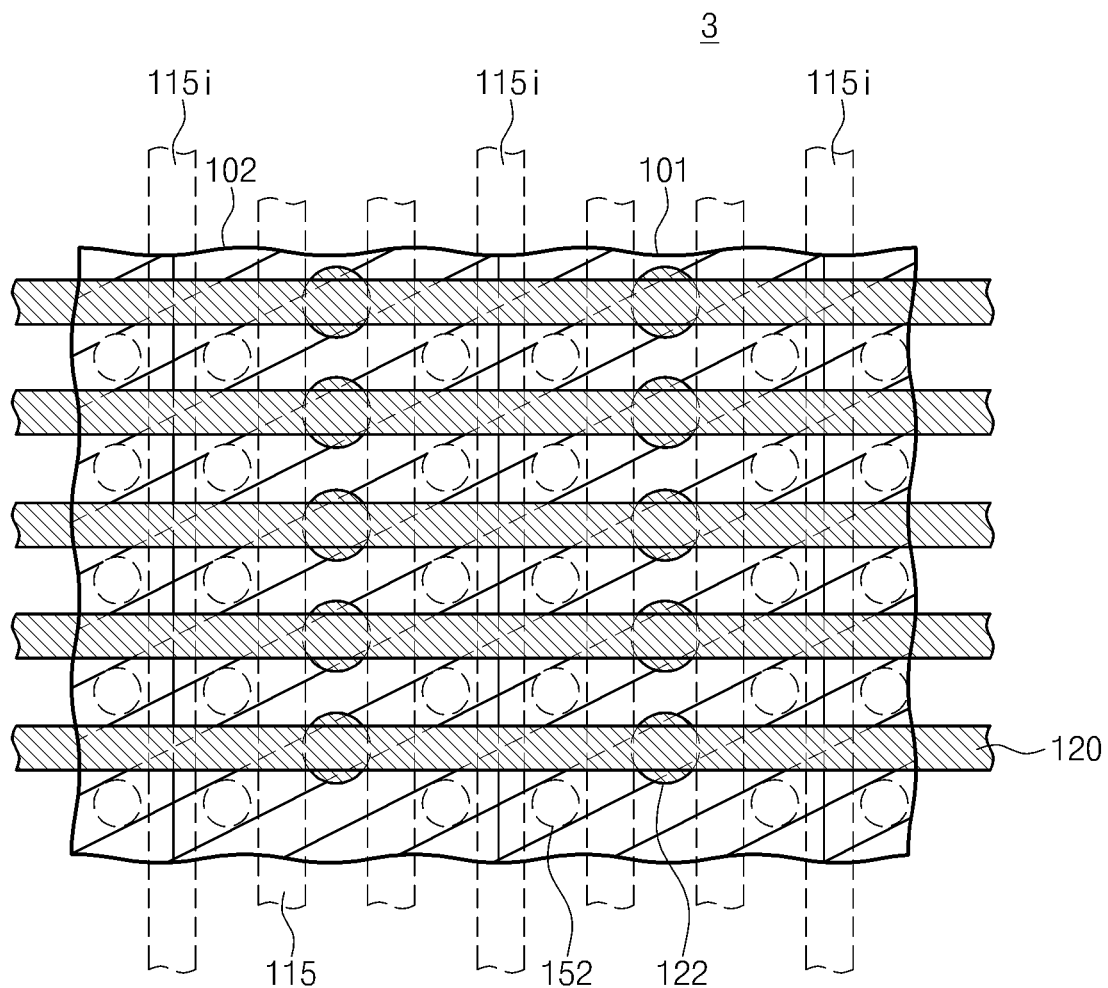
FIG. 43 is a plan view illustrating a semiconductor device according to other example embodiment of the present inventive concepts.

Referring to FIGS. 42A, 42B, 42C and 42D, the trench 103 may be filled with an insulating material to form a device isolation layer 105. Consequently, the substrate 101 may have the active region 102 defined by the device isolation layer 105 and vertically extending from the substrate 101. The active region 102 in the cell region as shown in FIGS. 42B and 42C may have a line shape extending in the diagonal direction W. The active region 102 in the peripheral region as illustrated in FIG. 42D may have an island shape. Alternatively, the active region 102 in the peripheral region may be formed to have a line shape substantially identical or similar to the active region 102 in the cell region.

Referring to FIG. 43, a word line 115 extending in the first direction Y, a contact 122 electrically connected to the active region 102, and a bit line 120 extending in the second direction X may be formed on the substrate 101 having the line-shaped active region 102, thereby fabricating a semiconductor device 3. The contact 122 may electrically connect the bit line 120 to the substrate 101. The semiconductor device 3 may further include a second contact 152 electrically connected to the active region 102 and a capacitor electrically connected to the substrate 101 by the second contact 152.

In some embodiments, adjacent active regions 102 may be in contact with each other. The semiconductor device 3 may further include an isolation word line 115i crossing a contact area between the adjacent active regions 102. Adjacent word lines 115 may be electrically isolated from each other by the isolation word line 115i interposed therebetween. For example, when the semiconductor device 3 is operated by applying a positive voltage to one or more word lines 115, a negative voltage may be applied to the isolation word line 115i. As a result, no current flows under the isolation word line 115i, thereby reducing or preventing current flow between adjacent word lines 115 with the isolation word line 115i interposed therebetween.

Figure 44:
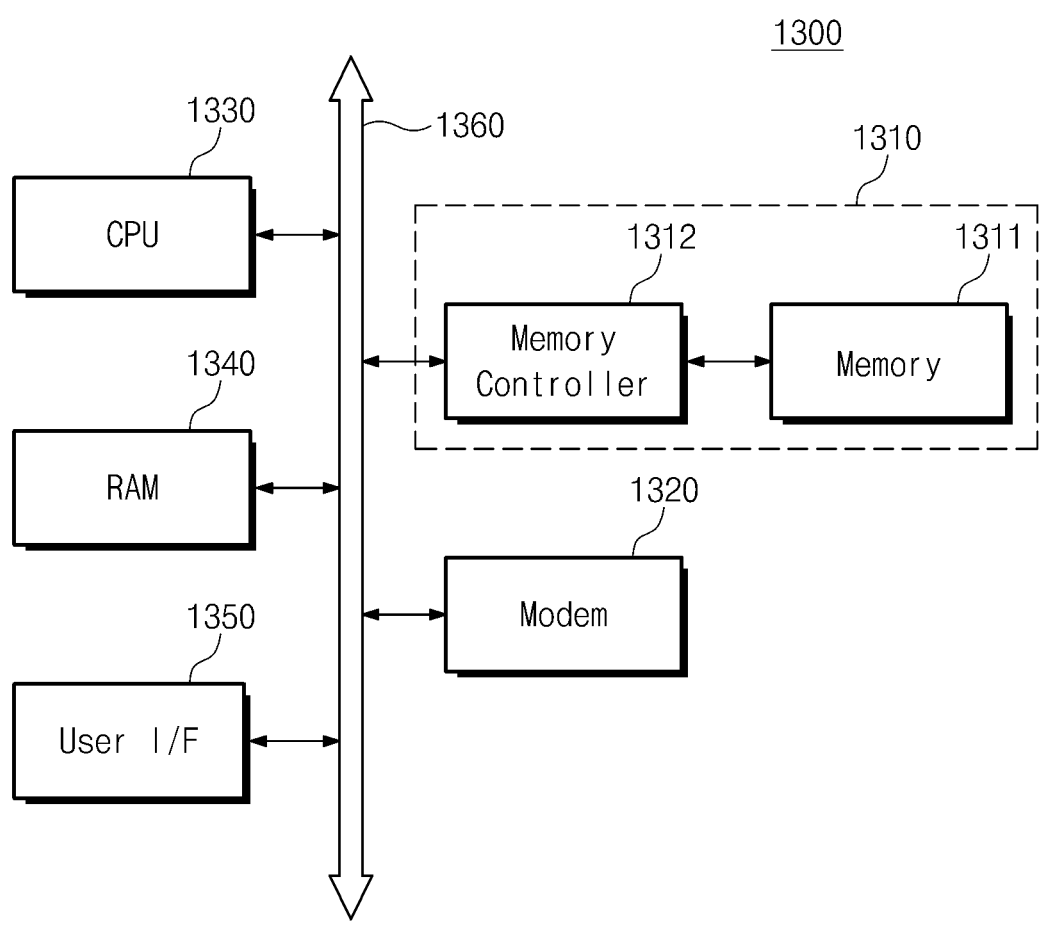
FIG. 44 is a schematic block diagram illustrating an example of information process system including a semiconductor device according to example embodiments of the present inventive concepts.

FIG. 44 is a schematic block diagram illustrating an example of information process system including a semiconductor device according to example embodiments of the present inventive concepts.

Referring to FIG. 44, an information processing system 1300 may include a memory system 1310 having at least one of the semiconductor devices 1, 2 and 3 according to example embodiments of the inventive concepts. The information processing system 1300 may include a mobile device or a computer. For example, the information processing system 1300 may include a modem 1320, a central processing unit 1330, a RAM 1340, and a user interface 1350 electrically connected to the memory system 1310 via a system bus 1360. The memory 1310 may include a memory 1311 and a memory controller 1312. The memory system 1310 may store data processed by the central processing unit 1330 or data input from the outside. The information process system 1300 may be provided as a memory card, a solid state disk, a semiconductor device disk, a camera image sensor, and other application chipsets.

According to embodiments of the present invention, a line patterning process is used to form a mask pattern defining openings arranged in a zigzag fashion. An etching process using the mask pattern as an etch mask is performed to reduce or minimize a space between adjacent contact holes. As a result, it is possible to fabricate a highly integrated semiconductor device. The line patterning process is also used to form active regions having herringbone or parallel line shapes.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method for fabricating a semiconductor device, the method comprising:

providing a substrate;

stacking a conductive layer and a lower mask layer on the substrate;

forming a plurality of hardmask layers each having an island shape on the lower mask layer;

forming a plurality of upper mask patterns on the lower mask layer, the plurality of upper mask patterns having island shapes arranged to expose portions of the lower mask layer;

etching the exposed portions of the lower mask layer to expose portions of the conductive layer; and etching the exposed portions of the conductive layer to form a plurality of contact holes each exposing a portion of the substrate.

2. The method of claim 1, wherein the providing comprises:

forming a plurality of active regions having a herringbone shape arranged in a zigzag fashion along a first direction on the substrate.

3. The method of claim 2, wherein the forming of a plurality of active regions comprises:

forming a first mask layer on the substrate;

forming a plurality of second mask patterns on the first mask layer, the plurality of second mask patterns being spaced apart from each other along a second direction crossing the first direction and extending in a zigzag fashion along the first direction;

patterning the first mask layer by an etching process using the second mask patterns as an etch mask to form a plurality of first mask patterns that are spaced apart from each other along the second direction and extend in a zigzag fashion along the first direction; and patterning the substrate by an etching process using the first mask patterns as an etch mask to form the active regions having the herringbone shape arranged in a zigzag fashion along the first direction and spaced apart from each other along the second direction, wherein the active regions have island shapes discontinuously extending along the first direction, and wherein the island shaped active regions are arranged in a zigzag fashion along the first direction to constitute the herringbone shape.

4. The method of claim 1, wherein the providing comprises:

forming a plurality of active regions having parallel line shapes extending in a zigzag fashion along a direction across the substrate.

5. The method of claim 4, wherein the forming a plurality of active regions comprises:

forming a first mask layer on the substrate;

forming a plurality of second mask patterns on the first mask layer, the second mask layers extending along the direction;

patterning the first mask layer by an etching process using the second mask patterns as an etch mask to form a plurality of first mask patterns extending along the direction; and patterning the substrate by an etching process using the first mask patterns as an etch mask to form the line shaped active regions extending along the direction.

6. The method of claim 1, wherein the etching the exposed portions of the conductive layer comprises:

patterning the lower mask layer by an etching process using the hardmask layers as an etch mask to form a plurality of lower mask patterns each having an island shape; and patterning the conductive layer by an etching process using the lower mask patterns as an etch mask to form the contact holes each exposing the portion of the substrate.

7. The method of claim 6, further comprising:

removing the lower mask patterns to expose the conductive layer;

depositing a conductive material to fill the contact holes; and planarizing the conductive material until the conductive layer is exposed to form contacts that fill the contact holes and are electrically connected to the exposed portions of the substrate.

8. A method for fabricating a semiconductor device, the method comprising:

providing a substrate including an active region formed therein;

forming a conductive layer on the substrate;

forming a lower mask layer covering the conductive layer;

forming a plurality of hardmask layers on the lower mask layer, the hardmask layers having island shapes spaced apart from each other in a first direction and in a second direction crossing the first direction;

forming a plurality of upper mask patterns having island shapes spaced apart from each other in the first and second directions on the lower mask layer to expose portions of the lower mask layer, the exposed potions of the lower mask layer each having an island shape surrounded by the upper mask pattern and the hardmask layer;

etching the exposed portions of the lower mask layer to expose portions of the conductive layer, the exposed portions of the conductive layer each having an island shape; and etching the exposed portions of the conductive layer to form a plurality of contact holes that expose portions of the active region, the exposed portions of the active region each having an island shape.

9. The method of claim 8, further comprising:

filling the contact hole with a conductive material to form a contact that is in contact with the conductive layer and is electrically connected to the active region.

10. The method of claim 8, wherein the forming a plurality of the hardmask layers comprises:

depositing a material different from that of the upper mask patterns.

11. The method of claim 10, wherein the forming a plurality of the upper mask patterns comprises:

depositing a material substantially identical to that of the lower mask layer.

12. The method of claim 11, further comprising:

depositing a material having an etch selectivity with respect to the upper mask patterns on the lower mask layer to form an etch stop layer.

13. The method of claim 8, wherein the etching the exposed portions of the conductive layer comprises:

patterning the lower mask layer by an etching process using the hardmask layers as an etch mask to form a plurality of lower mask patterns having island shapes spaced apart from each other in the first and second directions.

14. The method of claim 13, before the etching the exposed portions of the conductive layer, further comprising:

shrinking the lower mask patterns by a wet etching process.

15. The method of claim 13, before the etching the exposed portions of the conductive layer, further comprising:

forming a spacer layer covering the lower mask patterns; and etching the spacer layer to form spacers on sidewalls of the lower mask patterns.

16. A method for fabricating a semiconductor device, the method comprising:
- forming a plurality of active regions having parallel line shapes extending in a zigzag fashion along a direction across a substrate;
- stacking a conductive layer and a lower mask layer on the substrate;
- forming a plurality of hardmask layers each having an island shape on the lower mask layer;
- forming a plurality of upper mask patterns on the lower mask layer, the plurality of upper mask patterns having island shapes arranged to expose portions of the lower mask layer;
- patterning the lower mask layer by an etching process using the hardmask layers as an etch mask to form a plurality of lower mask patterns each having an island shape; and
- patterning the conductive layer by an etching process using the lower mask patterns as an etch mask to form contact holes each exposing a portion of the active region.

17. The method of claim 16, wherein the forming a plurality of active regions comprises:
- forming a first mask layer on the substrate;
- forming a plurality of second mask patterns on the first mask layer, the second mask layers extending along the direction;
- patterning the first mask layer by an etching process using the second mask patterns as an etch mask to form a plurality of first mask patterns extending along the direction; and
- patterning the substrate by an etching process using the first mask patterns as an etch mask to form the line shaped active regions extending along the direction.

18. The method of claim 17, further comprising:
- removing the lower mask patterns to expose the conductive layer;
- depositing a conductive material to fill the contact holes; and
- planarizing the conductive material until the conductive layer is exposed to form contacts that fill the contact holes and are electrically connected to the active regions.

* * * * *